United States Patent
Lee et al.

(10) Patent No.: US 12,421,255 B2
(45) Date of Patent: Sep. 23, 2025

(54) LUMINESCENCE DEVICE AND POLYCYCLIC COMPOUND FOR LUMINESCENCE DEVICE

(71) Applicants: Samsung Display Co., Ltd., Yongin-si (KR); Lapto Co., Ltd., Seongnam-si (KR)

(72) Inventors: Dongchan Lee, Sejong-si (KR); Eu-gene Oh, Seoul (KR); Munsoo Kim, Seongnam-si (KR); JuWan Maeng, Seongnam-si (KR); Kap-jong Han, Gwangju-si (KR); Sung-Soo Bae, Seoul (KR); Sungwook Kim, Hwaseong-si (KR); Tsuyoshi Naijo, Suwon-si (KR); Hyein Jeong, Suwon-si (KR)

(73) Assignees: Samsung Display Co., Ltd., Yongin-si (KR); Lapto Co., Ltd., Seongnam-si (KR)

( * ) Notice: Subject to any disclaimer, the term of this patent is extended or adjusted under 35 U.S.C. 154(b) by 471 days.

(21) Appl. No.: 17/033,350

(22) Filed: Sep. 25, 2020

(65) Prior Publication Data
US 2021/0098701 A1 Apr. 1, 2021

(30) Foreign Application Priority Data
Sep. 30, 2019 (KR) .................. 10-2019-0121052

(51) Int. Cl.
C07F 5/02 (2006.01)
C07F 5/04 (2006.01)
(Continued)

(52) U.S. Cl.
CPC ................ *C07F 5/027* (2013.01); *C07F 5/04* (2013.01); *C07F 9/6561* (2013.01); *C09K 11/02* (2013.01);
(Continued)

(58) Field of Classification Search
CPC ............... H01L 51/008; H01L 51/0061; H01L 51/0071; C07F 5/04; C07F 9/6561;
(Continued)

(56) References Cited

U.S. PATENT DOCUMENTS 8,999,530 B2 4/2015 Shin et al.
10,033,004 B2 7/2018 Lam et al.
(Continued)

FOREIGN PATENT DOCUMENTS

CN 111471064 A 7/2020
KR 10-1417285 B1 7/2014
(Continued)

*Primary Examiner* — Jenna N Chandhok
(74) *Attorney, Agent, or Firm* — Womble Bond Dickinson (US) LLP

(57) ABSTRACT

An organic luminescence device includes a polycyclic compound represented by Formula 1 in at least one functional layer between a first electrode and a second electrode, wherein in Formula 1, X is O, S, Se, $CR_4R_5$, $SiR_6R_7$, or (Continued)

and at least one selected from $L_1$ and $Ar_1$ is an electron withdrawing group having a Hammett constant greater than 0:

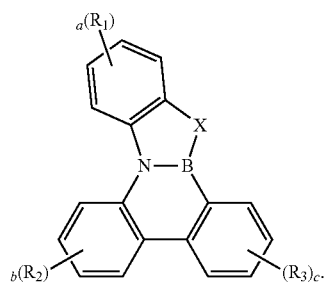

Formula 1

20 Claims, 2 Drawing Sheets

(51) Int. Cl.
| | |
|---|---|
| C07F 9/6561 | (2006.01) |
| C09K 11/02 | (2006.01) |
| C09K 11/06 | (2006.01) |
| H10K 50/11 | (2023.01) |
| H10K 50/15 | (2023.01) |
| H10K 50/16 | (2023.01) |
| H10K 50/17 | (2023.01) |
| H10K 50/18 | (2023.01) |
| H10K 85/30 | (2023.01) |
| H10K 85/60 | (2023.01) |
| H10K 101/20 | (2023.01) |

(52) U.S. Cl.
CPC ............ *C09K 11/06* (2013.01); *H10K 85/322* (2023.02); *H10K 85/658* (2023.02); *C09K 2211/1007* (2013.01); *C09K 2211/1014* (2013.01); *C09K 2211/1018* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 50/181* (2023.02); *H10K 2101/20* (2023.02)

(58) Field of Classification Search
CPC .......... C07F 5/027; C07F 5/02; C07F 9/6596; C09K 2211/1014; C09K 2211/1018; C09K 2211/1096; H10K 85/636; H10K 85/657; H10K 85/322
See application file for complete search history.

(56) References Cited

U.S. PATENT DOCUMENTS

| | | | |
|---|---|---|---|
| 10,301,330 | B2 | 5/2019 | Patil et al. |
| 2012/0261651 | A1* | 10/2012 | Noto ...................... H05B 33/14 257/E51.026 |
| 2016/0351811 | A1 | 12/2016 | Lam et al. |
| 2017/0352809 | A1 | 12/2017 | Lee et al. |
| 2018/0040821 | A1 | 2/2018 | Hatakeyama et al. |
| 2018/0201628 | A1 | 7/2018 | James et al. |
| 2021/0098708 | A1 | 4/2021 | Kim et al. |
| 2021/0098711 | A1 | 4/2021 | Lee et al. |

FOREIGN PATENT DOCUMENTS

| | | |
|---|---|---|
| KR | 1020160141661 A | 12/2016 |
| KR | 10-2017-0126888 A | 11/2017 |
| KR | 10-2021-0038783 A | 4/2021 |
| KR | 10-2021-0038785 A | 4/2021 |

\* cited by examiner

LUMINESCENCE DEVICE AND POLYCYCLIC COMPOUND FOR LUMINESCENCE DEVICE

CROSS-REFERENCE TO RELATED APPLICATION

This application claims priority to and the benefit of Korean Patent Application No. 10-2019-0121052, filed on Sep. 30, 2019, the entire content of which is hereby incorporated by reference.

BACKGROUND

One or more aspects of embodiments of the present disclosure relate to a luminescence device and a polycyclic compound used therein.

Electroluminescence displays are actively being developed as image displays. An electroluminescence display may include or be an organic electroluminescence display, as an example. An organic electroluminescence display is different from a liquid crystal display, and is so-called a self-luminescent display in which display is achieved by subjecting a light-emitting material included in an emission layer to emit light by recombining holes and electrons injected from a first electrode and a second electrode.

In the application of a luminescence device to a display, increased efficiency and/or lifespan of the luminescence device are desired, and development of materials capable of stably accomplishing the requirements for a luminescence device is desired.

SUMMARY

One or more aspects of embodiments of the present disclosure are directed toward a luminescence device having high efficiency.

One or more aspects of embodiments of the present disclosure are directed toward a polycyclic compound that can be applied to a luminescence device, and may accomplish high efficiency.

One or more example embodiments of the present disclosure provide a luminescence device including a first electrode, a second electrode on the first electrode, and at least one functional layer between the first electrode and the second electrode. The at least one functional layer may include a polycyclic compound represented by Formula 1:

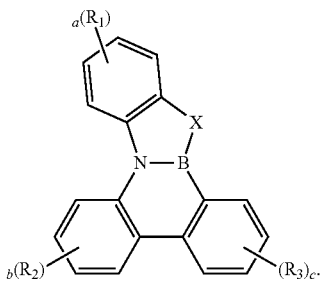

Formula 1

In Formula 1, X may be O, S, Se, $CR_4R_5$, $SiR_6R_7$, or

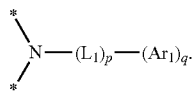

$R_1$ to $R_7$ may be each independently a hydrogen atom, a deuterium atom, a substituted or unsubstituted silyl group of 1 to 30 carbon atoms, a substituted or unsubstituted aryl amine group of 6 to 30 carbon atoms for forming a ring, a substituted or unsubstituted alkyl group of 1 to 30 carbon atoms, a substituted or unsubstituted alkenyl group of 1 to 30 carbon atoms, a substituted or unsubstituted aryl group of 6 to 60 carbon atoms for forming a ring, or a substituted or unsubstituted heteroaryl group of 2 to 60 carbon atoms for forming a ring, or may be combined with an adjacent group to form a ring. "a" to "c" may be each independently an integer of 0 to 4.

When X is O, S, Se, $CR_4R_5$, or $SiR_6R_7$, at least one selected from $R_1$ to $R_3$ may be a substituted or unsubstituted aryl group of 6 to 60 carbon atoms for forming a ring, or a substituted or unsubstituted heteroaryl group of 2 to 60 carbon atoms for forming a ring, and a sum of "a" to "c" may be 1 or more. When X is

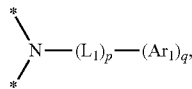

$L_1$ may be a direct linkage, a substituted or unsubstituted arylene group of 6 to 60 carbon atoms for forming a ring, or a substituted or unsubstituted heteroarylene group of 6 to 60 carbon atoms for forming a ring, and $Ar_1$ may be a substituted or unsubstituted aryl group of 6 to 60 carbon atoms for forming a ring, or a substituted or unsubstituted heteroaryl group of 2 to 60 carbon atoms for forming a ring, where at least one selected from $L_1$ and $Ar_1$ may be an electron withdrawing group having a Hammett constant greater than 0. The electron withdrawing group may be a substituted or unsubstituted cyclic azine derivative of 3 to 60 carbon atoms for forming a ring, which includes only N as a heteroatom, a substituted or unsubstituted imidazole derivative of 3 to 60 carbon atoms for forming a ring, a substituted or unsubstituted oxazole derivative of 3 to 60 carbon atoms for forming a ring, an aryl derivative of 6 to 60 carbon atoms for forming a ring, substituted with a phosphine oxide group or a cyano group, a heteroaryl derivative of 2 to 60 carbon atoms for forming a ring, substituted with a phosphine oxide group or a cyano group, or a substituted or unsubstituted aryl borane derivative of 6 to 60 carbon atoms for forming a ring. "p" may be 0 or 1, and "q" may be 1.

In an embodiment, the at least one functional layer may include a hole transport region on the first electrode, an emission layer on the hole transport region, and/or an electron transport region between the emission layer and the second electrode.

In an embodiment, the emission layer may include the polycyclic compound.

In an embodiment, when X is O, S, Se, $CR_4R_5$, or $SiR_6R_7$, the Hammett constant of $R_1$ to $R_3$ may be greater than 0.

In an embodiment, the hole transport region may include the polycyclic compound and X may be O, S, Se, $CR_4R_5$, or $SiR_6R_7$.

In an embodiment, Formula 1 may be represented by one of Formula 1-1 to Formula 1-3:

Formula 1-1

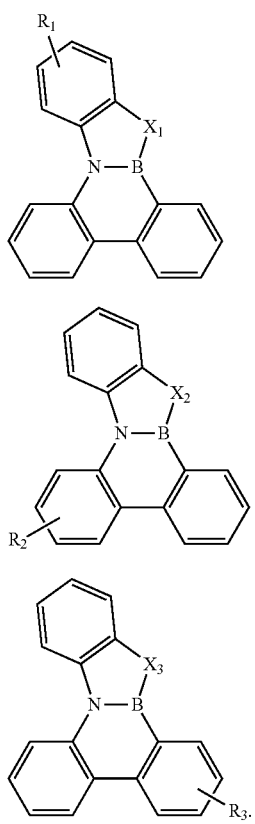

Formula 1-2

Formula 1-3

In Formula 1-1 to Formula 1-3, $X_1$ to $X_3$ may each independently be O or $CR_4R_5$. $R_1$ to $R_5$ may each independently be the same as defined in Formula 1.

In an embodiment, Formula 1 may be represented by Formula 1-4:

Formula 1-4

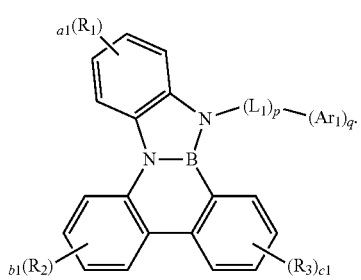

In Formula 1-4, a1 to c1 may each independently be 0 or 1, and the sum of a1 to c1 may be 1 or less. $R_1$ to $R_3$, $L_1$, $Ar_1$, "p", and "q" may each independently be the same as defined in Formula 1. X may be O, S, Se, $CR_4R_5$, or $SiR_6R_7$. $R_1$ to $R_3$ may each independently be represented by Formula 2:

$$*-(L_{11})_r-(Ar_{11})_s.$$ Formula 2

In Formula 2, $L_{11}$ may be a direct linkage, a substituted or unsubstituted arylene group of 6 to 60 carbon atoms for forming a ring, or a substituted or unsubstituted heteroarylene group of 6 to 60 carbon atoms for forming a ring. $Ar_{11}$ may be a substituted or unsubstituted aryl group of 6 to 60 carbon atoms for forming a ring, or a substituted or unsubstituted heteroaryl group of 2 to 60 carbon atoms for forming a ring. "r" may be an integer of 0 to 2. "s" may be 1.

In an embodiment, the polycyclic compound may include at least one selected from compounds represented in Compound Group 1:

Compound Group 1

1-1

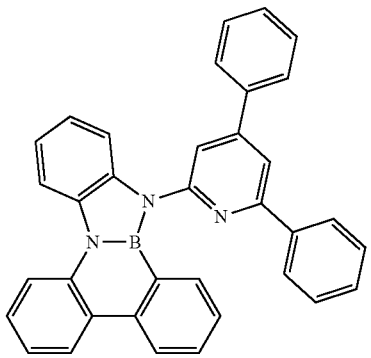

1-2

1-3

1-4

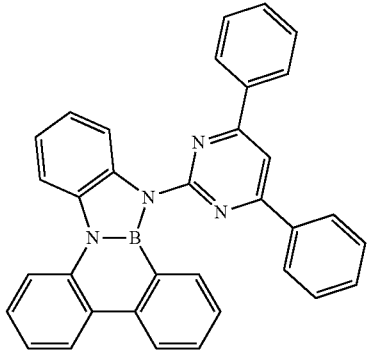

1-5

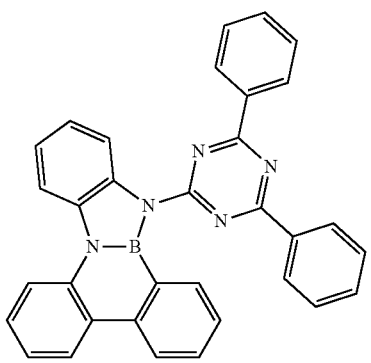

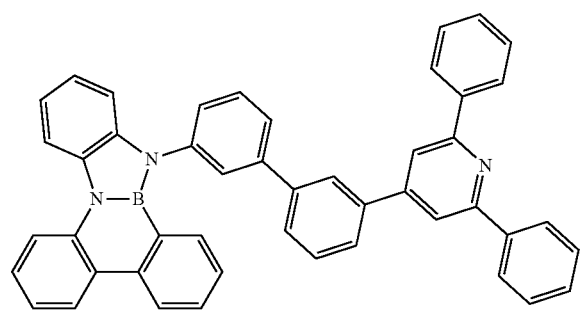
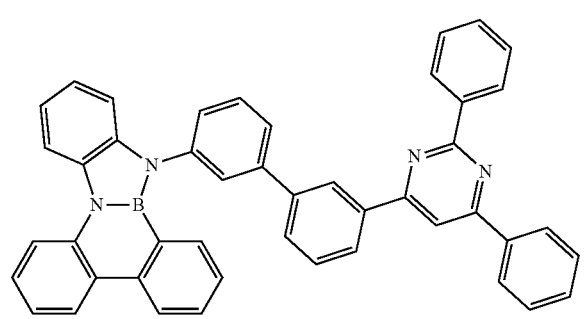
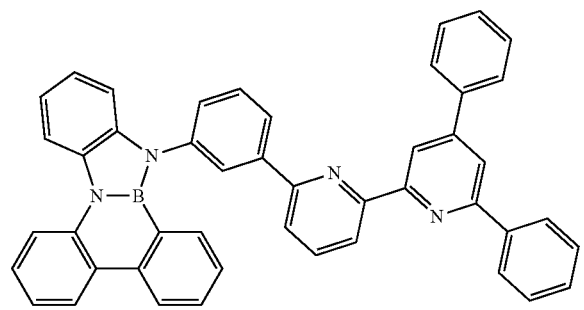

-continued
1-15
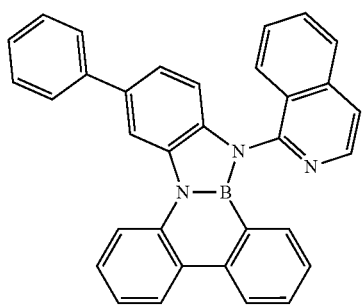
1-16
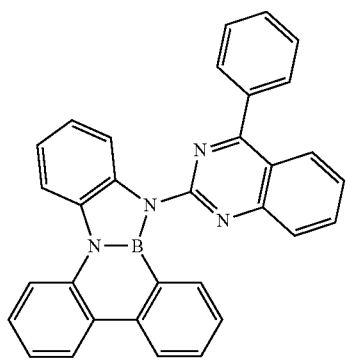
1-17
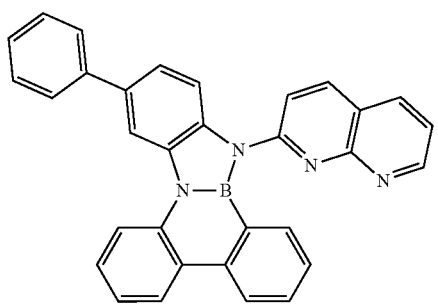
1-18
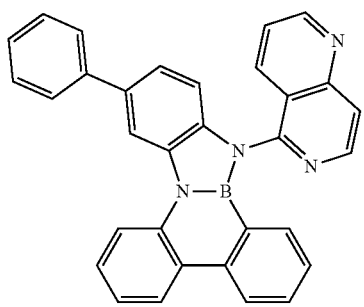
1-19
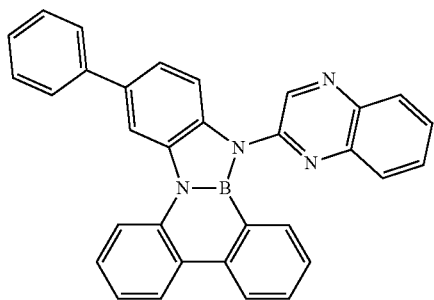
-continued
1-20
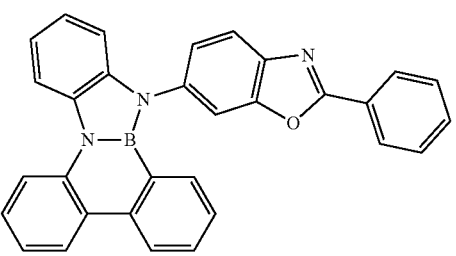
1-21
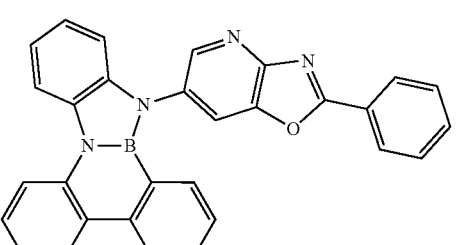
1-22
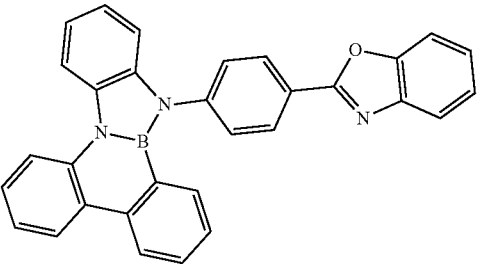
1-23
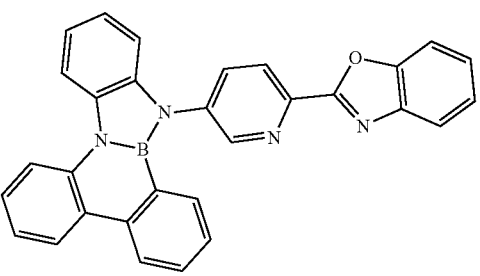
1-24
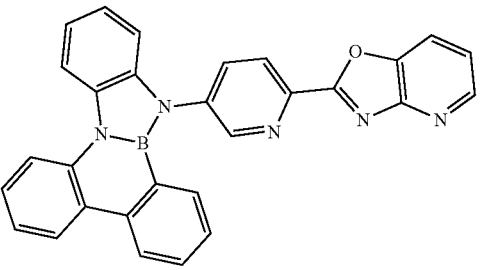

1-25
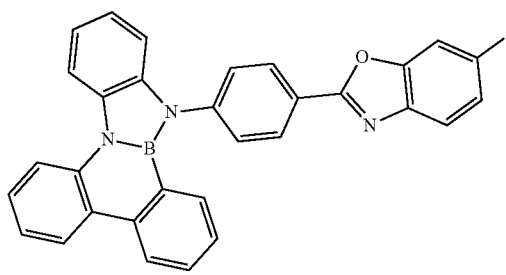
1-26
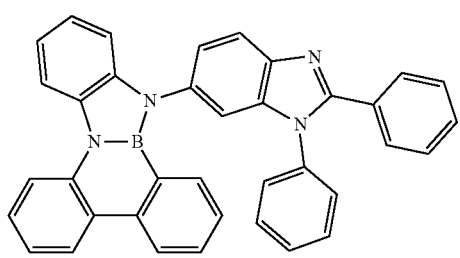
1-27
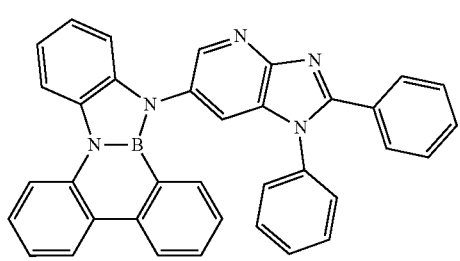
1-28
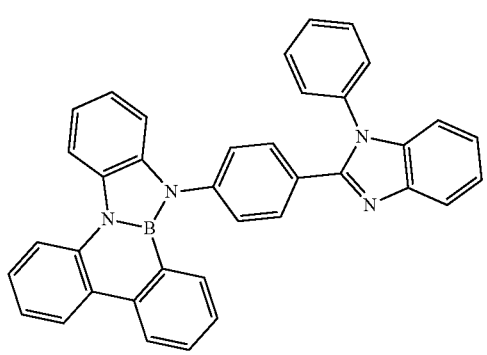
1-29
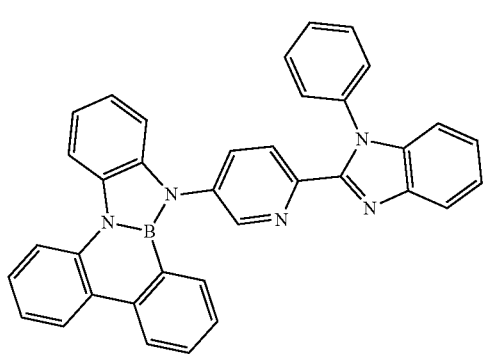
1-30
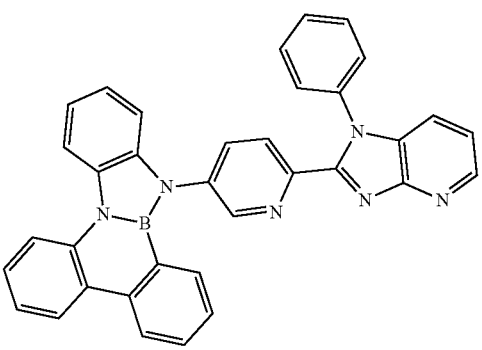
1-31
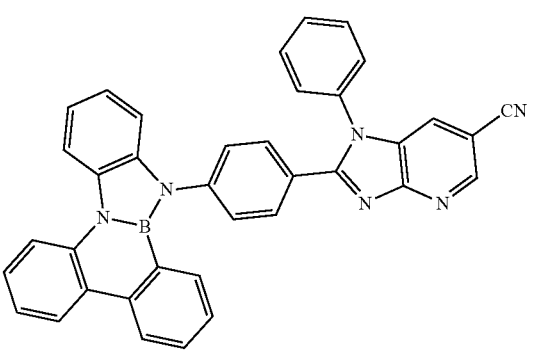
1-32
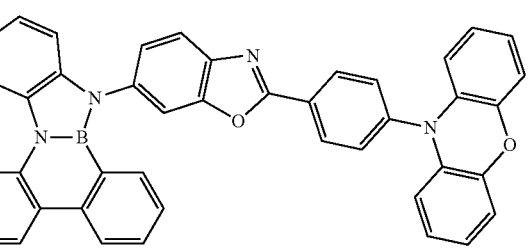
1-33
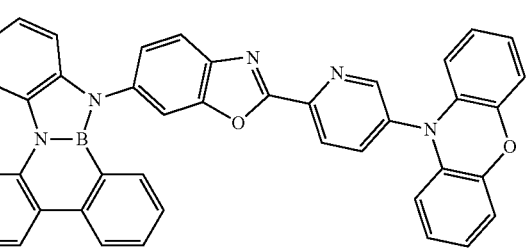
1-34
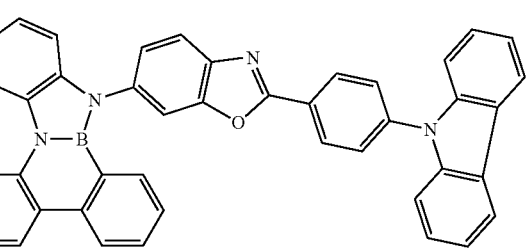

-continued
1-35
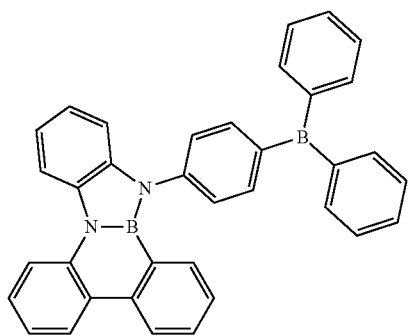
1-36
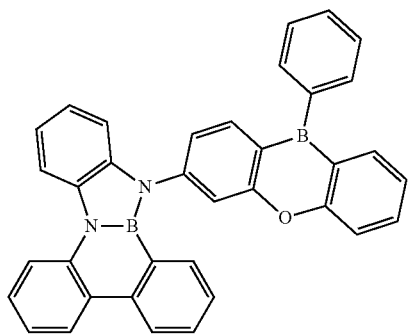
1-37
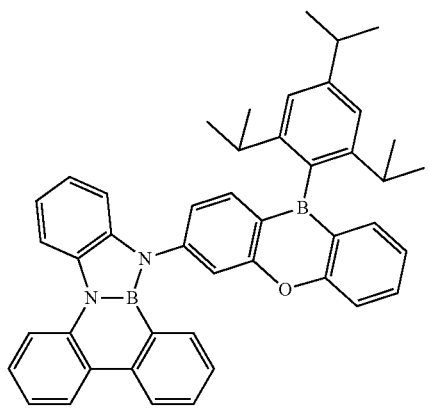
1-38
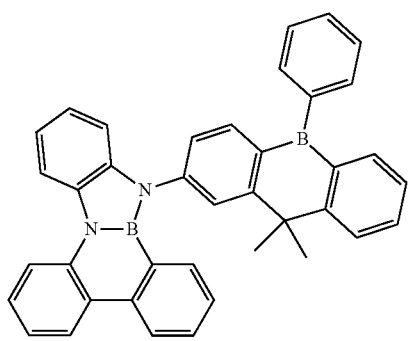
-continued
1-39
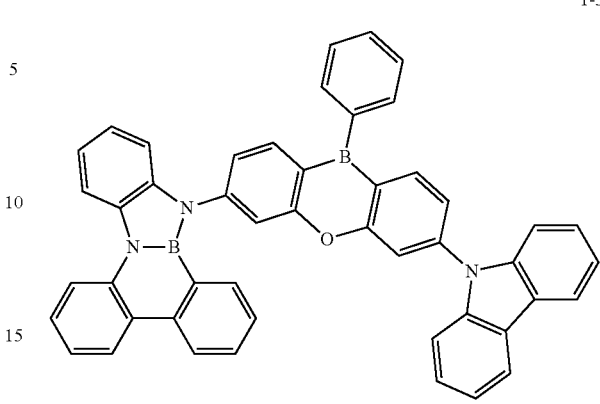
1-40
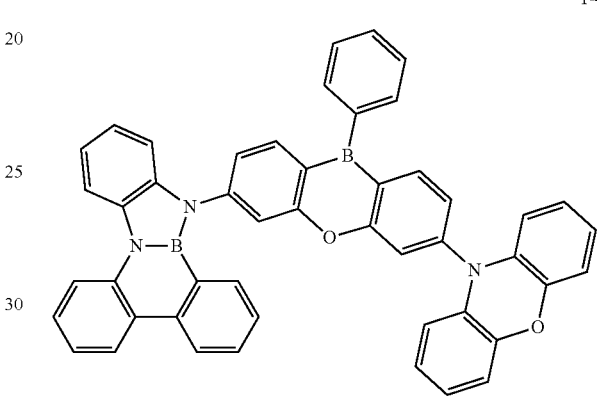
1-41
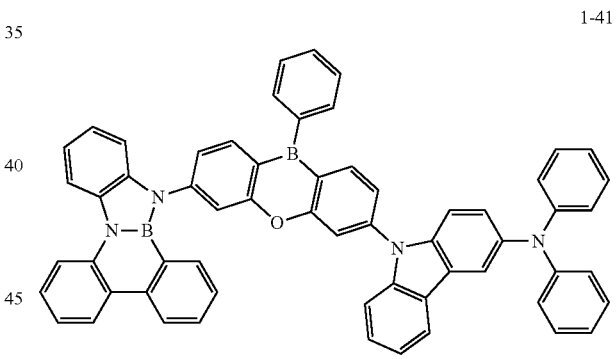
1-42
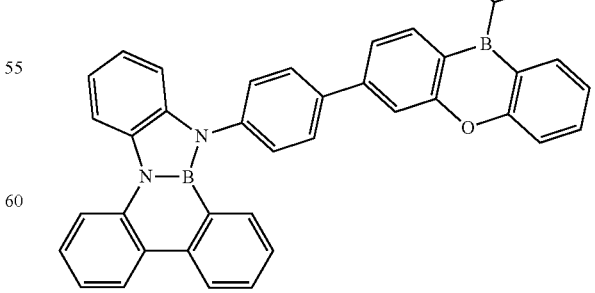

1-43
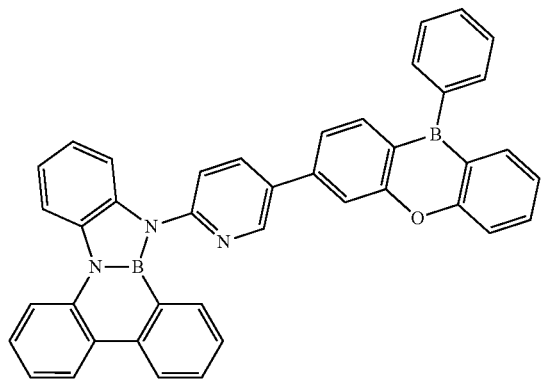
1-44
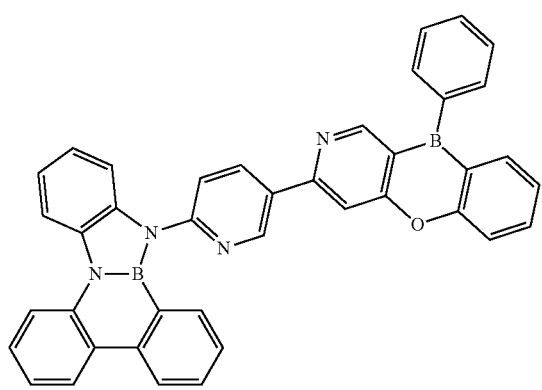
1-45
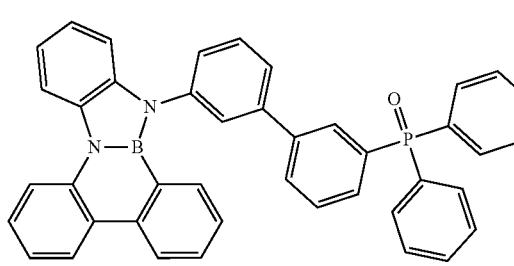
1-46
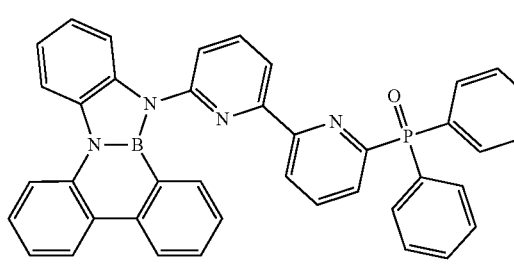
1-47
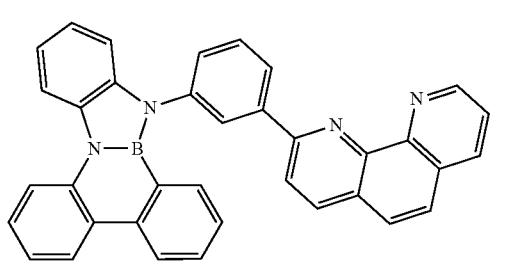
1-48
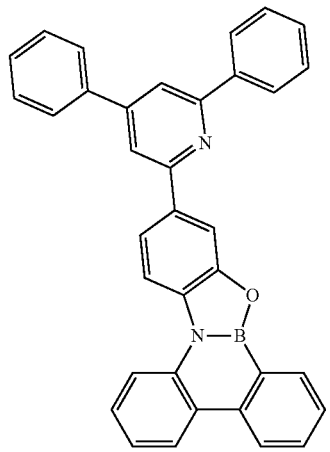
In an embodiment, the polycyclic compound may include at least one selected from compounds represented in Compound Group 2:
Compound Group 2
2-1
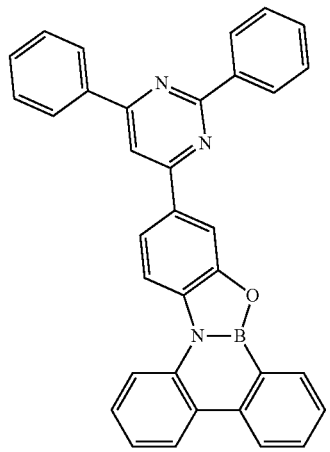
2-2

-continued
2-3
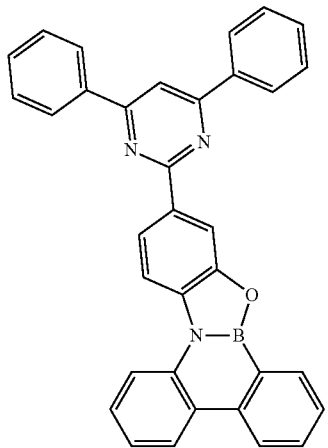
2-4
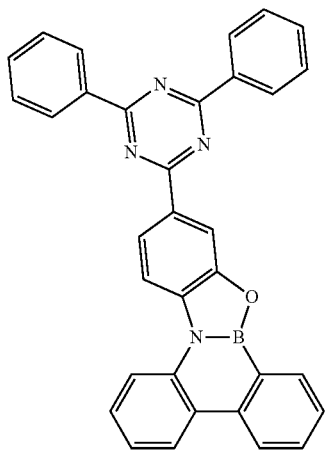
2-5
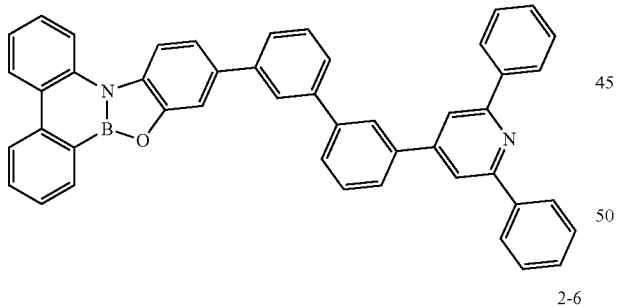
2-6
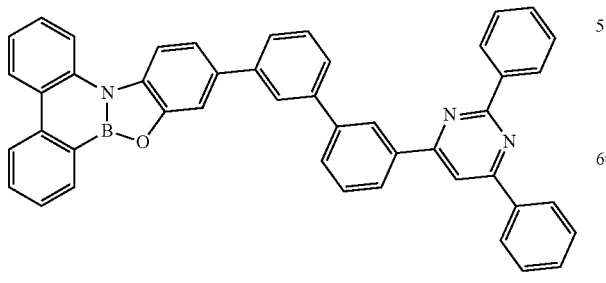
-continued
2-7
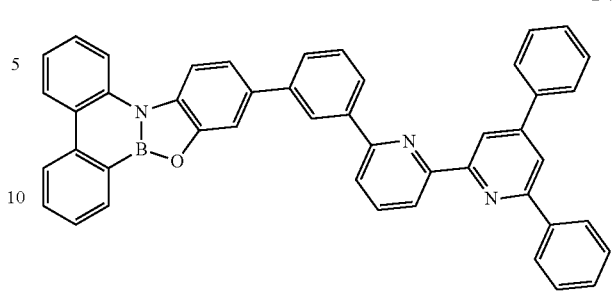
2-8
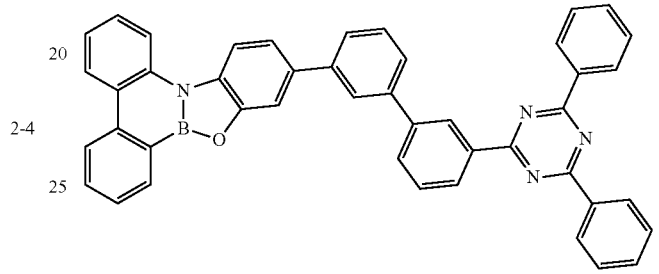
2-9
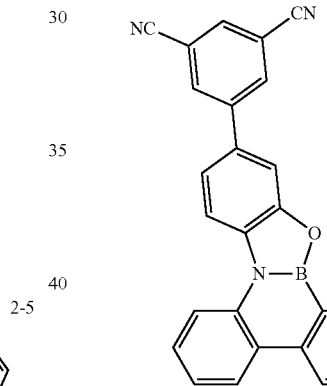
2-10
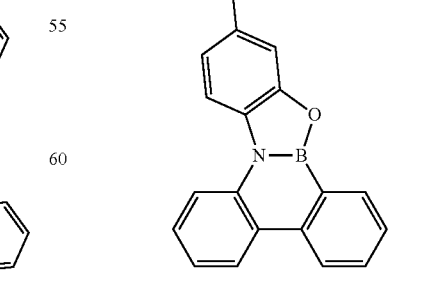

2-11
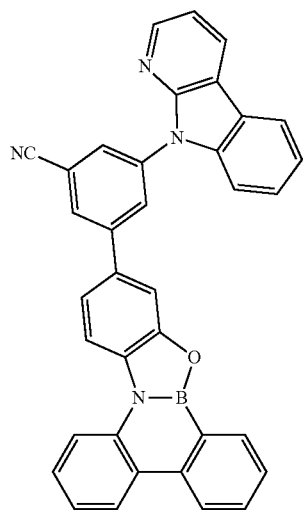
2-12
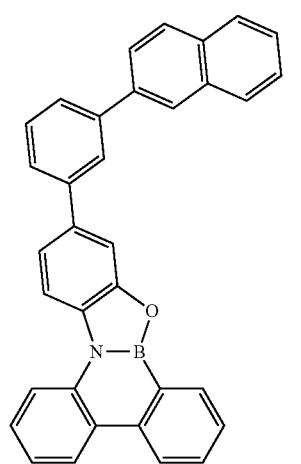
2-13
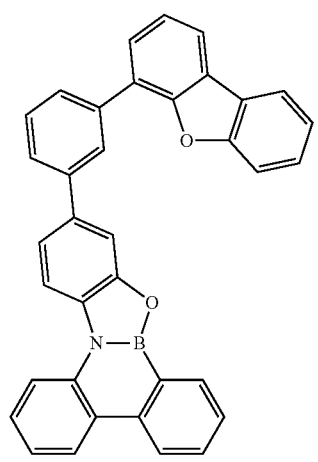
2-14
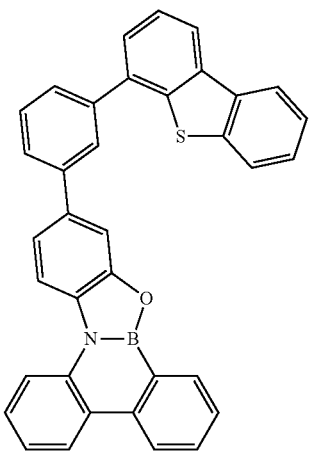
2-15
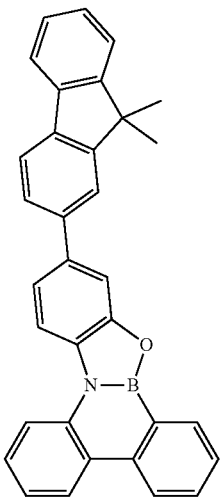
2-16
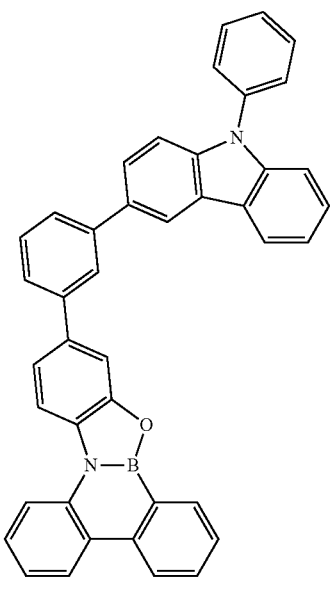

2-17
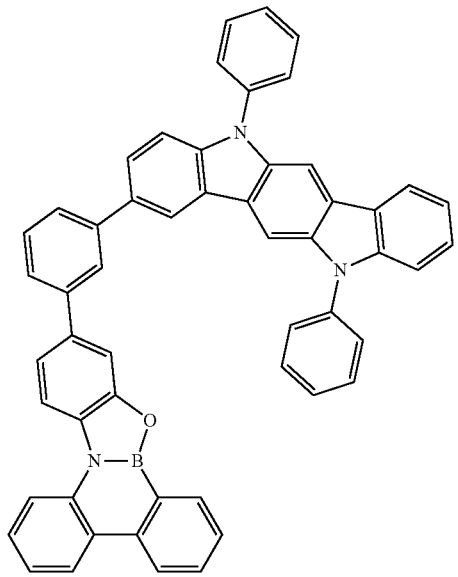
2-18
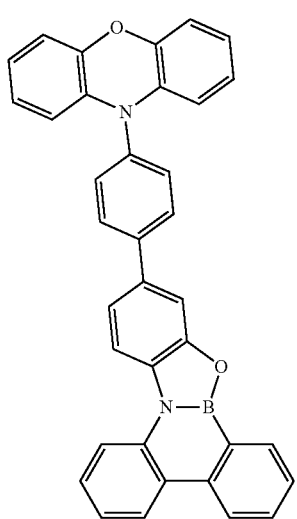
2-19
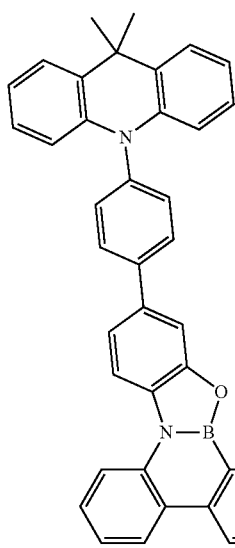
2-20
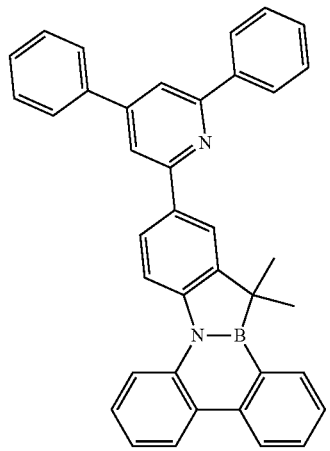
2-21
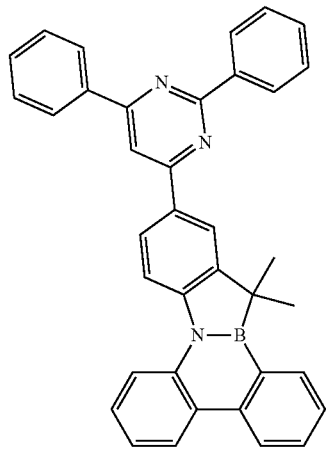
2-22
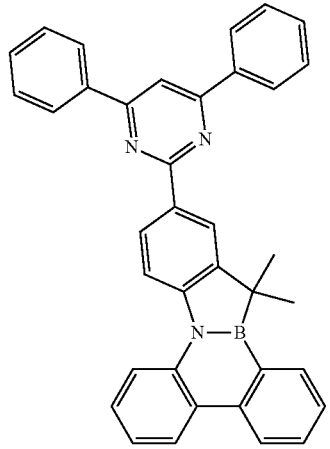

2-23
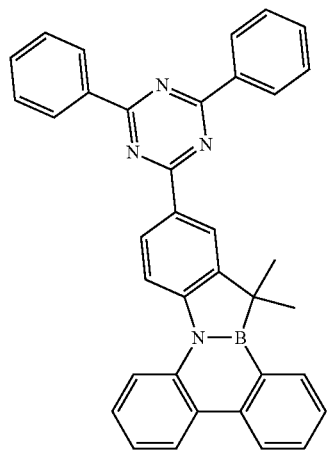
2-24
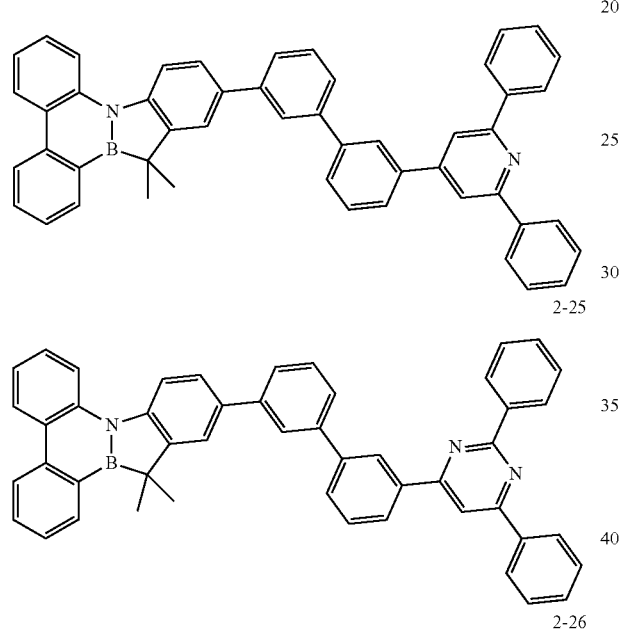
2-25
2-26
2-27
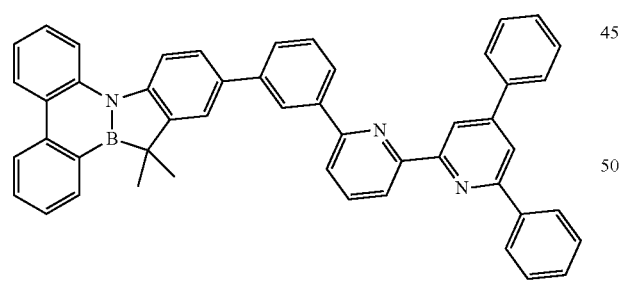
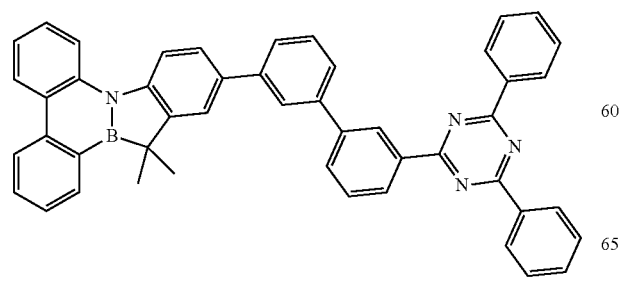
2-28
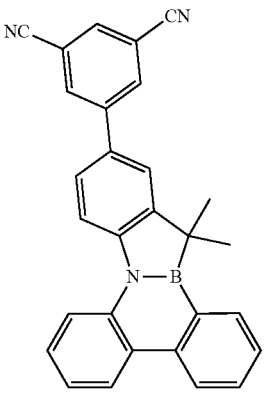
2-29
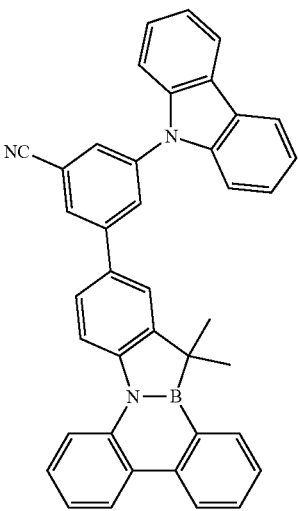
2-30
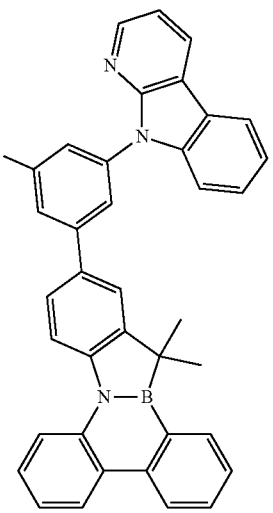

2-31
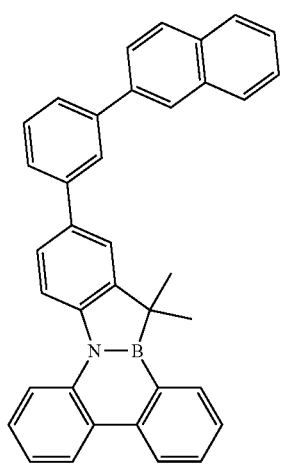
2-32
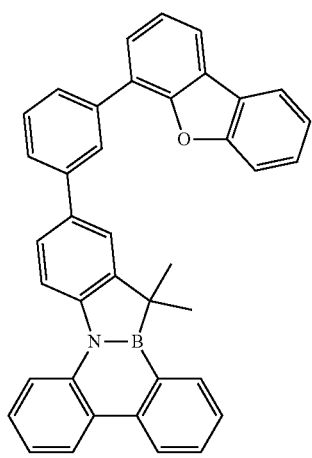
2-33
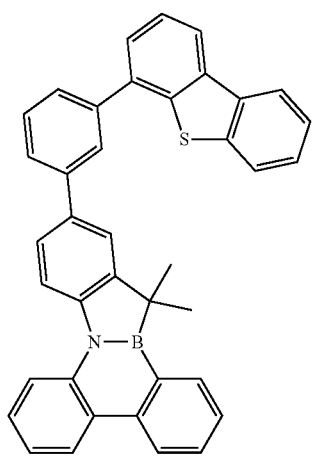
2-34
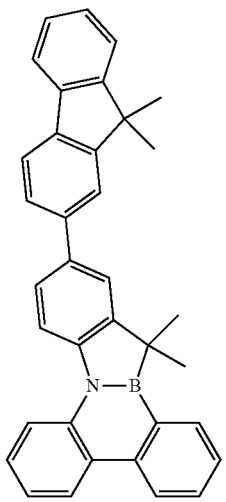
2-35
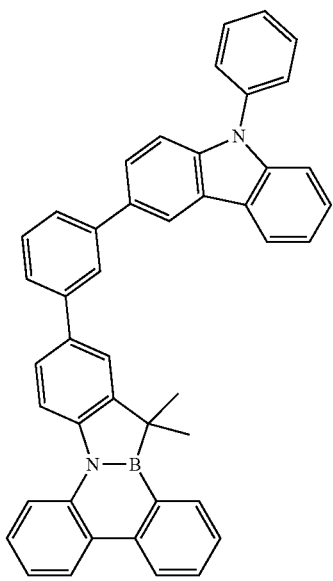
2-36
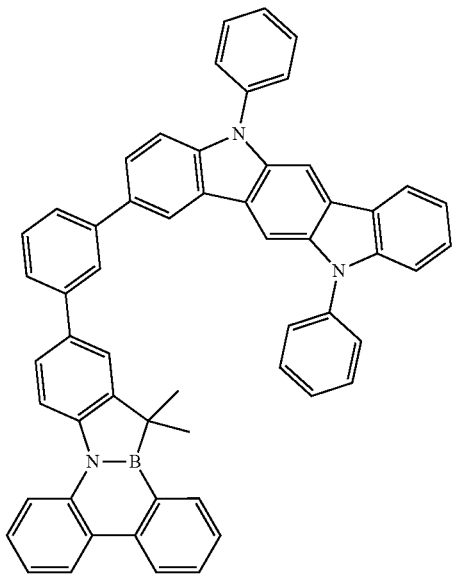

2-37
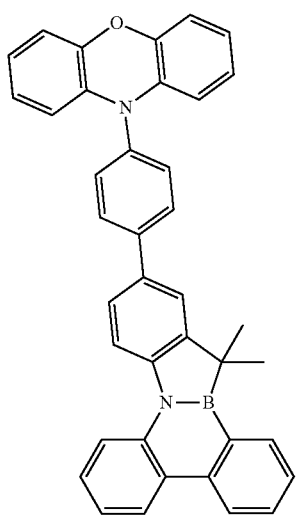
2-38
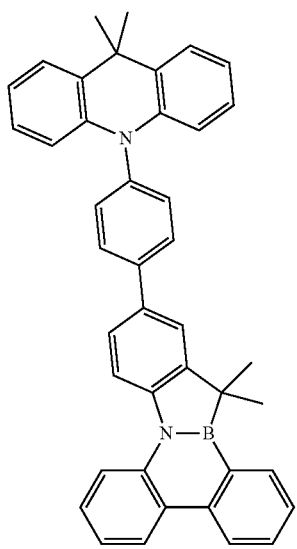
2-39
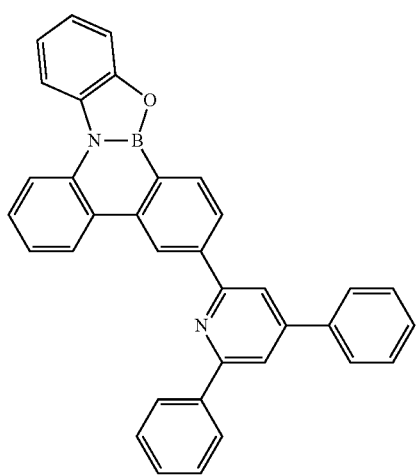
2-40
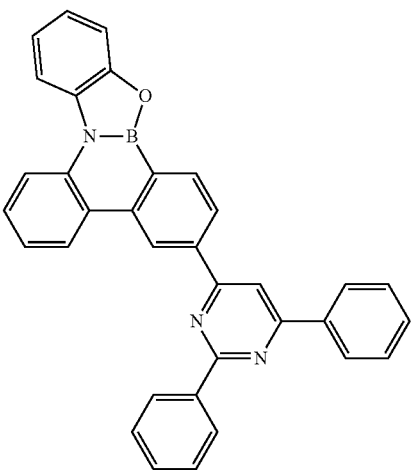
2-41
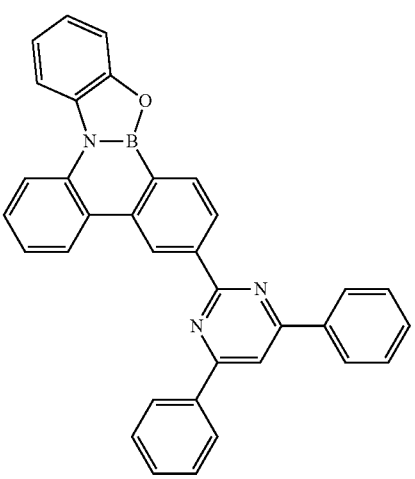
2-42
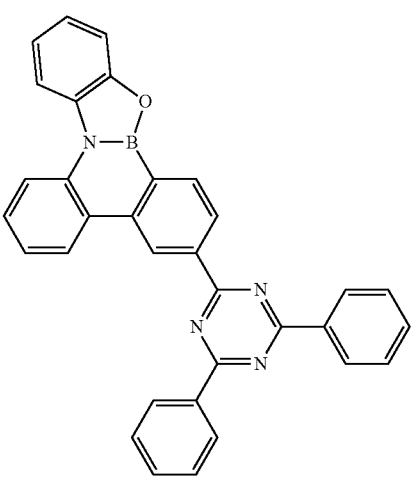

2-43
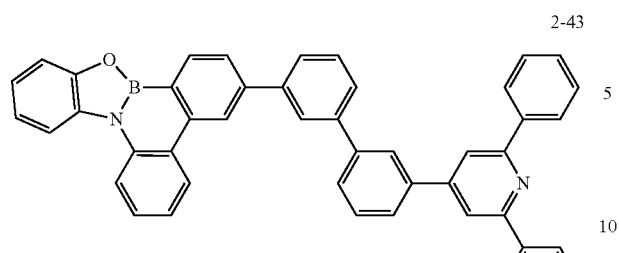
2-44
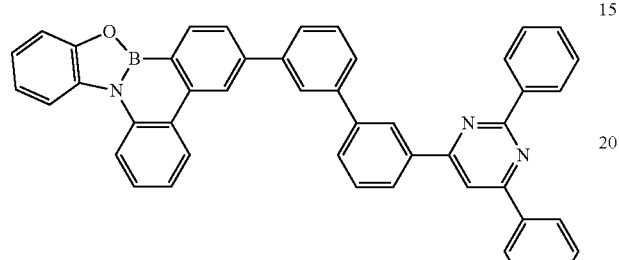
2-48
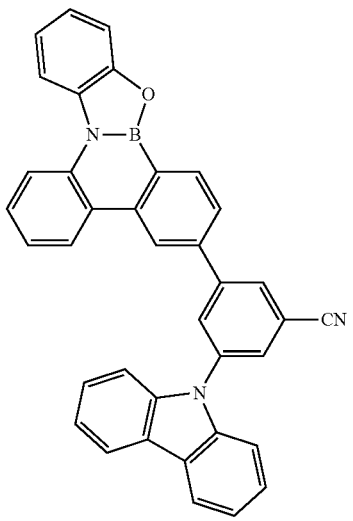
2-45
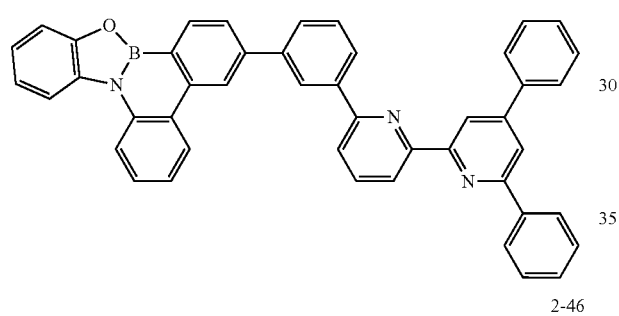
2-46
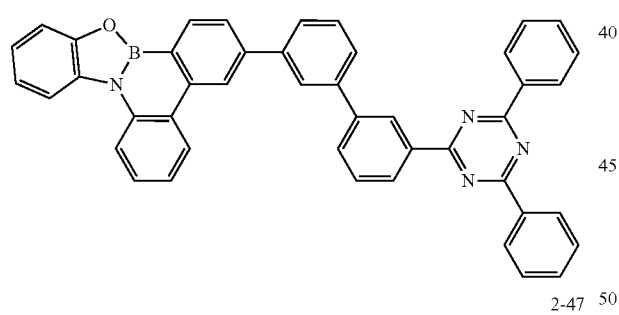
2-49
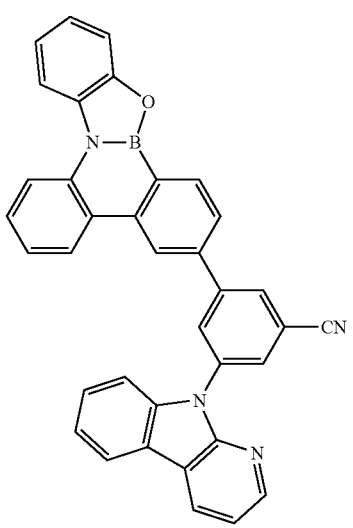
2-47
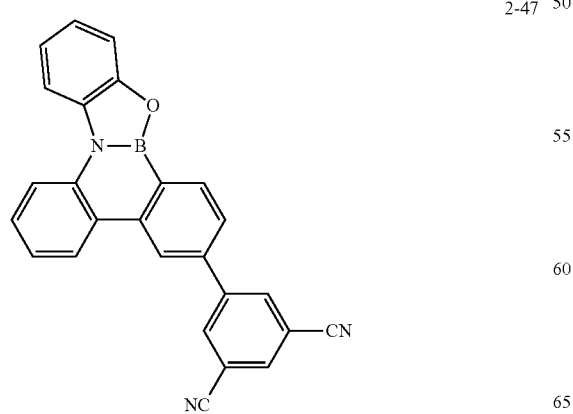
2-50

2-51
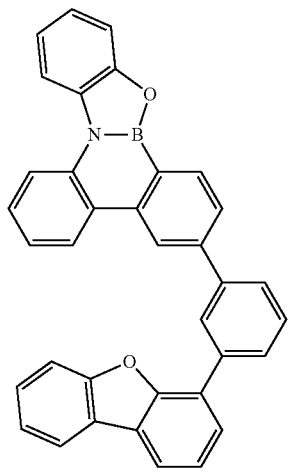
2-52
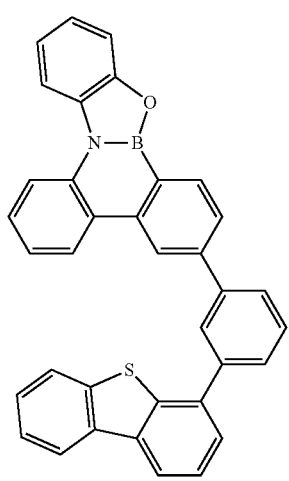
2-53
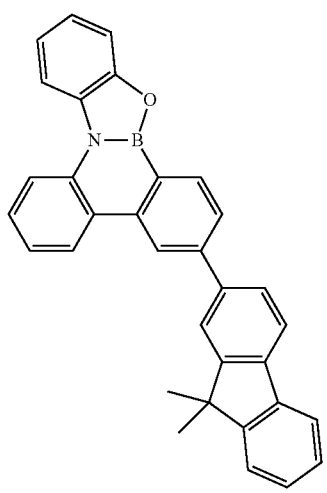
2-54
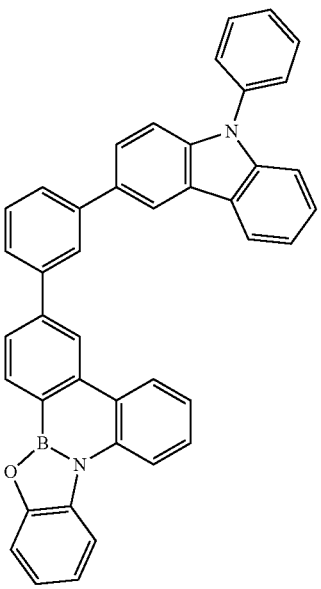
2-55

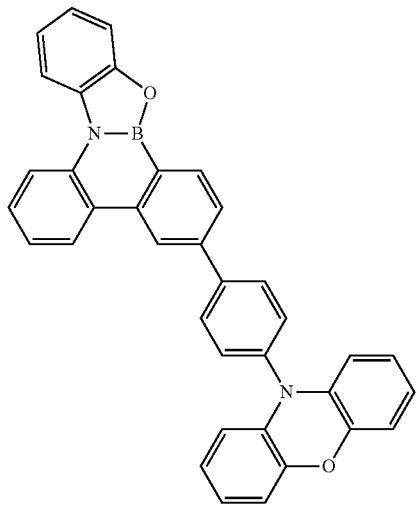

2-56

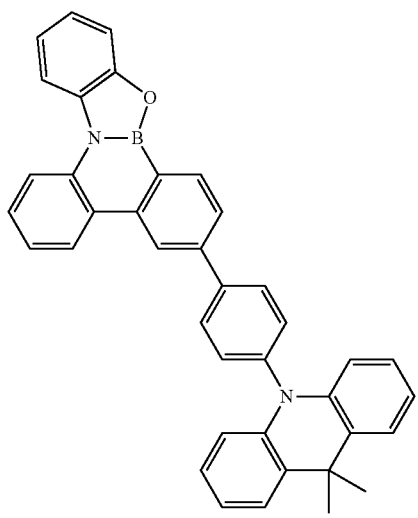

2-57

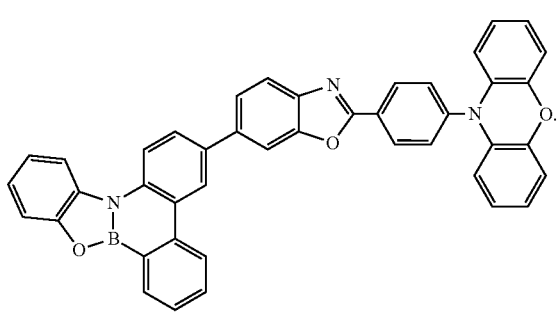

2-58

One or more example embodiments of the present disclosure provide a luminescence device including a first electrode, a second electrode on the first electrode, and an emission layer between the first electrode and the second electrode and comprising a host and a dopant. The dopant may be a polycyclic compound represented by Formula A:

DU-AU  Formula A

In Formula A, DU may be represented by Formula A-1, and AU may be represented by Formula A-2:

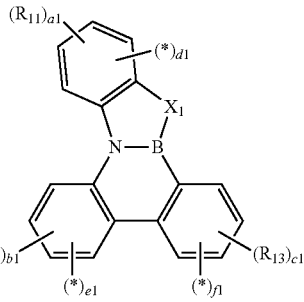

Formula A-1

*—$(L_{21})_{p1}$—$(Ar_{21})_{q1}$.  Formula A-2

In Formula A-1, $X_1$ may be O, S, Se, $CR_{14}R_{15}$, $SiR_{16}R_{17}$, or N—*. $R_{11}$ to $R_{17}$ may be each independently a hydrogen atom, a deuterium atom, a substituted or unsubstituted silyl group of 1 to 30 carbon atoms, a substituted or unsubstituted aryl amine group of 6 to 30 carbon atoms for forming a ring, a substituted or unsubstituted alkyl group of 1 to 30 carbon atoms, a substituted or unsubstituted alkenyl group of 1 to 30 carbon atoms, a substituted or unsubstituted aryl group of 6 to 60 carbon atoms for forming a ring, or a substituted or unsubstituted heteroaryl group of 2 to 60 carbon atoms for forming a ring, or combined with an adjacent group to form a ring. a1 to c1 may be each independently an integer of 0 to 4. d1 to f1 may be each independently 0 or 1. —* may be a part connected (e.g., a connection point) with Formula A-2. In Formula 2, $L_{21}$ may be a direct linkage, a substituted or unsubstituted arylene group of 6 to 60 carbon atoms for forming a ring, or a substituted or unsubstituted heteroarylene group of 6 to 60 carbon atoms for forming a ring. $Ar_{21}$ may be a substituted or unsubstituted aryl group of 6 to 60 carbon atoms for forming a ring, or a substituted or unsubstituted heteroaryl group of 2 to 60 carbon atoms for forming a ring. At least one selected from $L_{21}$ and $Ar_{21}$ may be an electron withdrawing group having a Hammett constant greater than 0. p1 may be 0 or 1, and q1 may be 1.

In an embodiment, the emission layer may be to emit thermally activated delayed fluorescence.

In an embodiment, the polycyclic compound may have an energy difference between a lowest singlet excitation energy level and a lowest triplet excitation energy level of about 0.05 eV.

In an embodiment, the emission layer may be to emit light having a central wavelength of about 490 nm to about 750 nm.

In an embodiment, the electron withdrawing group may include or be a substituted or unsubstituted cyclic azine derivative of 3 to 60 carbon atoms for forming a ring, which includes only N as a heteroatom, a substituted or unsubstituted imidazole derivative of 3 to 60 carbon atoms for forming a ring, a substituted or unsubstituted oxazole derivative of 3 to 60 carbon atoms for forming a ring, an aryl derivative of 6 to 60 carbon atoms for forming a ring substituted with a phosphine oxide group or a cyano group, a heteroaryl derivative of 2 to 60 carbon atoms for forming a ring substituted with a phosphine oxide group or a cyano group, or a substituted or unsubstituted aryl borane derivative of 6 to 60 carbon atoms for forming a ring.

One or more example embodiments of the present disclosure provide a polycyclic compound represented by Formula 1 or Formula A.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
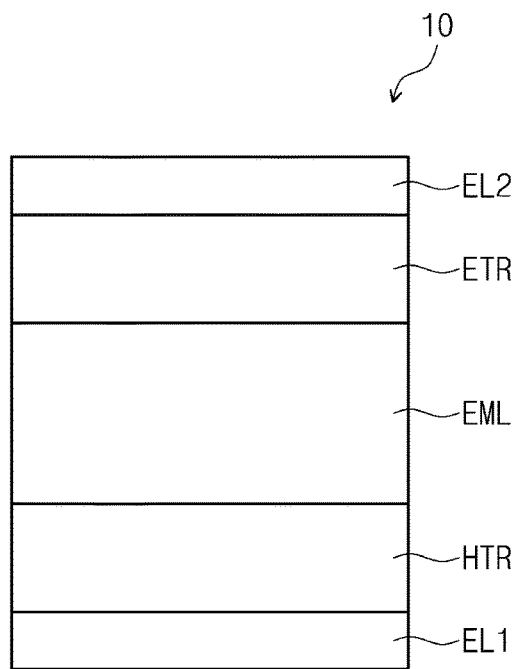
FIG. 1 is a cross-sectional schematic view illustrating a luminescence device according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as being limited to the embodiments set forth herein. Rather, all modifications, equivalents, and substituents that are included in the spirit and technical scope of the present disclosure should be included herein.

Like reference numerals refer to like elements throughout, and duplicative descriptions thereof may not be provided. In the drawings, the dimensions of structures may be exaggerated for clarity of illustration. It will be understood that, although the terms first, second, etc. may be used herein to describe various elements, these elements should not be limited by these terms. These terms are only used to distinguish one element from another element. Thus, a first element could be alternatively termed a second element without departing from the teachings of the present disclosure. Similarly, a second element could be termed a first element. As used herein, singular forms such as "a," "an," and "the" are intended to include the plural forms as well, unless the context clearly indicates otherwise.

It will be further understood that the terms "includes," "including," "comprises," and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

As used herein, expressions such as "at least one of", "one of", and "selected from", when preceding a list of elements, modify the entire list of elements and do not modify the individual elements of the list. As used herein, the term "and/or" includes any and all combinations of one or more of the associated listed items. Further, the use of "may" when describing embodiments of the present disclosure refers to "one or more embodiments of the present disclosure".

It will also be understood that when a layer, a film, a region, a plate, etc. is referred to as being "on" or "above" another part, it can be "directly on" the other part, or intervening layers may also be present. When a layer, a film, a region, a plate, etc. is referred to as being "under" or "below" another part, it can be "directly under" the other part, or intervening layers may also be present. Also, when an element is referred to as being disposed "on" another element, it can be disposed under the other element.

In the description, the term "substituted or unsubstituted" corresponds to a state of being unsubstituted, or being substituted or with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents may be further substituted or unsubstituted. For example, a biphenyl group may be interpreted as an aryl group or a phenyl group substituted with a phenyl group.

In the description, the term "forming a ring via combination with an adjacent group" may refer to forming a substituted or unsubstituted hydrocarbon ring, or a substituted or unsubstituted heterocycle when the group or atom is bonded to adjacent group. The term "hydrocarbon ring" includes an aliphatic hydrocarbon ring and an aromatic hydrocarbon ring. The term "heterocycle" includes an aliphatic heterocycle and an aromatic heterocycle. The ring formed via combination with an adjacent group may be a monocyclic ring or a polycyclic ring. In some embodiments, the ring formed via combination with an adjacent group may be further combined with another ring to form a spiro structure.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, the two methyl groups may be interpreted as "adjacent groups" to each other, and in 1,1-diethylcyclopentane, the two ethyl groups may be interpreted as "adjacent groups" to each other . . .

In the description, the term "halogen atom" may refer to a fluorine atom, a chlorine atom, a bromine atom or an iodine atom.

In the description, the term "alkyl" may refer to a linear, branched or cyclic alkyl group. The carbon number of the alkyl may be 1 to 50, 1 to 30, 1 to 20, 1 to 10, or 1 to 6. Non-limiting examples of the alkyl include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc.

In the description, the term "hydrocarbon ring" may refer to an optional functional group or substituent derived from an aliphatic hydrocarbon ring. The hydrocarbon ring group may be a saturated hydrocarbon ring group of 5 to 20 carbon atoms for forming a ring.

In the description, the term "aryl group" may refer to an optional functional group or substituent derived from an aromatic hydrocarbon ring. The aryl group may be a monocyclic aryl group or a polycyclic aryl group. The carbon number for forming a ring in the aryl group may be 6 to 60, 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc.

In the description, the fluorenyl group may be substituted (e.g., at the 9H position), and two substituents at the 9H position may be combined with each other to form a spiro structure. Non-limiting examples of a substituted fluorenyl group are as follows. However, an embodiment of the present disclosure is not limited thereto:

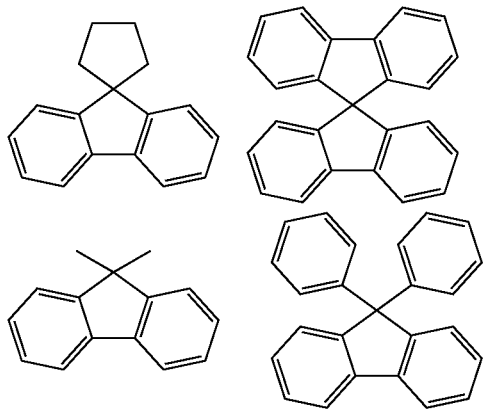

In the description, the term "heterocyclic group" may refer to a group including one or more boron (B), oxygen (O), nitrogen (N), phosphorus (P), silicon (Si), and sulfur(S) atoms as heteroatoms. When the heterocyclic group includes two or more heteroatoms, the two or more heteroatoms may be the same or different. The heterocyclic group may be a monocyclic heterocyclic group or a polycyclic heterocyclic group, and in some embodiments may be a heteroaryl group. The carbon number for forming a ring of the heteroaryl group may be 2 to 60, 2 to 30, 2 to 20, or 2 to 10.

In the description, the term "aliphatic heterocyclic group" may refer to a group including one or more B, O, N, P, Si and S atoms as heteroatoms. The carbon number for forming a ring of the aliphatic heterocyclic group may be 2 to 60, 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, the carbon number for forming a ring of the heteroaryl group may be 2 to 60, 2 to 30, 2 to 20, or 2 to 10. Non-limiting examples of the heteroaryl group include thiophene, furan, pyrrole, imidazole, thiazole, oxazole, oxadiazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, isooxazole, oxadiazole, thiadiazole, phenothiazine, dibenzosilole, dibenzofuran, etc.

In the description, the term "arylene group" may refer to a group substantially similar to an aryl group except that the arylene group is a divalent group. The term "heteroarylene group" may refer to a group substantially similar to an heteroaryl group except that the heteroarylene group is a divalent group.

In the description, the term "silyl group" includes an alkyl silyl group and an aryl silyl group. Non-limiting examples of the silyl group include trimethylsilyl, triethylsilyl, t-butyldimethylsilyl, vinyldimethylsilyl, propyldimethylsilyl, triphenylsilyl, diphenylsilyl, phenylsilyl, etc. However, an embodiment of the present disclosure is not limited thereto.

In the description, the carbon number of the amino group is not specifically limited, but may be 1 to 30. The amino group may include an alkyl amino group, an aryl amino group, or a heteroaryl amino group. Non-limiting examples of the amino group include a methylamino group, a dimethylamino group, a phenylamino group, a diphenylamino group, a naphthylamino group, a 9-methyl-anthracenylamino group, etc.

In the description, the term "boron group" includes an alkyl boron group and an aryl boron group. Non-limiting examples of the boron group include a trimethylboron group, a triethylboron group, a t-butyldimethylboron group, a triphenylboron group, a diphenylboron group, a phenylboron group, etc.

In the description, the term "alkenyl group" may refer to a linear chain or a branched chain alkenyl. The carbon number is not specifically limited, but may be 2 to 30, 2 to 20, or 2 to 10. Non-limiting examples of the alkenyl group include a vinyl group, a 1-butenyl group, a 1-pentenyl group, a 1,3-butadienyl aryl group, a styrenyl group, a styrylvinyl group, etc.

In the description, the alkyl group in the alkylthio group, alkylsulfoxy group, alkylaryl group, alkylamino group, alkylboron group, alkyl silyl group, or alkyl amine group may be the same as described in connection with the general alkyl group.

In the description, the aryl group in the aryl boron group and aryl silyl group may be the same as described in connection with the general aryl group.

In the description, the term "direct linkage" may refer to a single bond.

FIG. 1 is a cross-sectional schematic view showing a luminescence device according to an embodiment of the present disclosure. The luminescence device 10 according to an embodiment may include a first electrode EL1, a hole transport region HTR, an emission layer EML, an electron transport region ETR, and a second electrode EL2 stacked in order.

FIGS. 1 to 4 are cross-sectional schematic views showing luminescence devices 10 according to example embodiments of the present disclosure. Referring to FIGS. 1 to 4, in a luminescence device 10 according to an embodiment, a first electrode EL1 and a second electrode EL2 are oppositely disposed, and an emission layer EML may be between the first electrode EL1 and the second electrode EL2.

The luminescence device 10 of an embodiment may further include a plurality of functional layers between the first electrode EL1 and the second electrode EL2 in addition to the emission layer EML. The plurality of the functional layers may include a hole transport region HTR and an electron transport region ETR. For example, the luminescence device 10 of an embodiment may include a first electrode EL1, a hole transport region HTR, an emission layer EML, an electron transport region ETR, and a second electrode EL2, stacked in order. In some embodiments, the luminescence device 10 of an embodiment may include a capping layer CPL on the second electrode EL2.

The luminescence device 10 of an embodiment may include a polycyclic compound of an embodiment in the emission layer EML, which is disposed between the first electrode EL1 and the second electrode EL2. However, an embodiment of the present disclosure is not limited thereto, and the luminescence device 10 of an embodiment may include a polycyclic compound of an embodiment in the hole transport region HTR or the electron transport region ETR, which are functional layers disposed between the first electrode EL1 and the second electrode EL2, or in the capping layer CPL disposed on the second electrode EL2, in addition to the emission layer EML.

Figure 2:
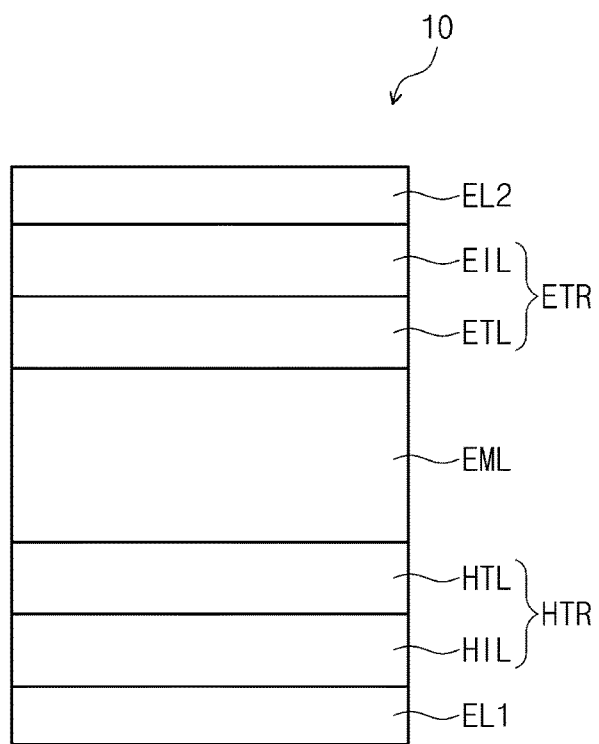
FIG. 2 is a cross-sectional schematic view illustrating a luminescence device according to an embodiment of the present disclosure.
Figure 3:
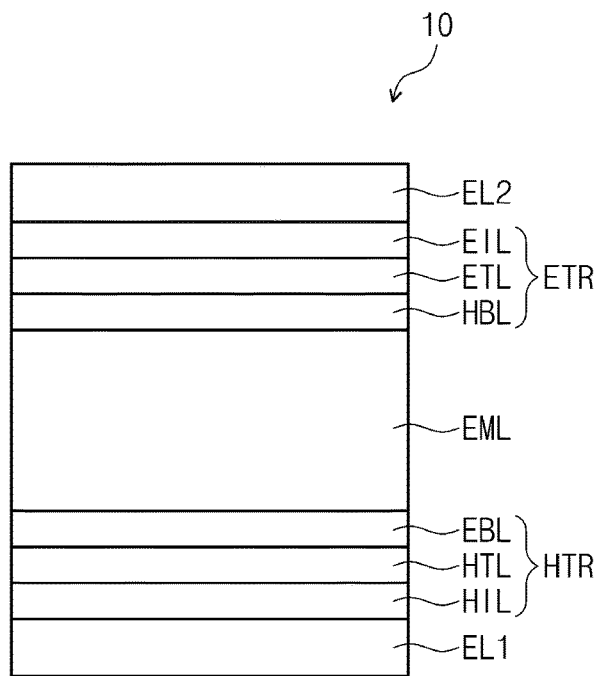
FIG. 3 is a cross-sectional schematic view illustrating a luminescence device according to an embodiment of the present disclosure.
Figure 4:
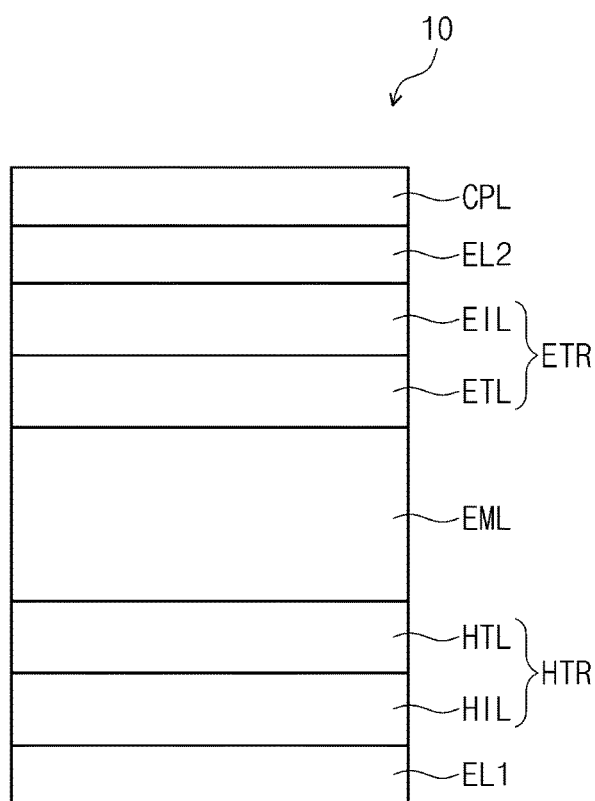
FIG. 4 is a cross-sectional schematic view illustrating a luminescence device according to an embodiment of the present disclosure.

FIG. 2 shows the cross-sectional view of a luminescence device 10 of an embodiment, wherein the hole transport region HTR includes a hole injection layer HIL and a hole transport layer HTL, and the electron transport region ETR includes an electron injection layer EIL and an electron transport layer ETL. FIG. 3 shows the cross-sectional view of a luminescence device 10 of an embodiment, wherein the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. FIG. 4 shows the cross-sectional view of a luminescence device 10 of an embodiment, including a capping layer CPL disposed on the second electrode EL2.

At least one functional layer may include a polycyclic compound represented by Formula 1:

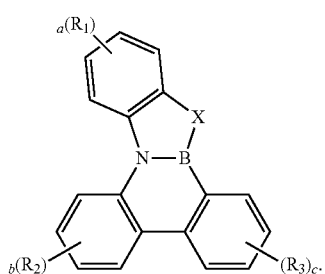

Formula 1

In Formula 1,
X may be O, S, Se, $CR_4R_5$, $SiR_6R_7$, or

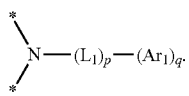

$R_1$ to $R_7$ may each independently be a hydrogen atom, a deuterium atom, a silyl group, an aryl amine group, an alkyl group, an alkenyl group, an aryl group, or a heteroaryl group, or may be combined with an adjacent group to form a ring. The silyl group may be a substituted or unsubstituted silyl group of 1 to 30 carbon atoms. The aryl amine group may be a substituted or unsubstituted aryl amine group of 6 to 30 carbon atoms for forming a ring. The alkyl group may be a substituted or unsubstituted alkyl group of 1 to 30 carbon atoms. The alkenyl group may be a substituted or unsubstituted alkenyl group of 2 to 30 carbon atoms. The aryl group may be a substituted or unsubstituted aryl group of 6 to 60 carbon atoms for forming a ring. The heteroaryl group may be a substituted or unsubstituted heteroaryl group of 2 to 60 carbon atoms.

"a" to "c" may each independently be an integer of 0 to 4. When "a" is an integer of 2 or more, the plurality of $R_1$ groups may be the same or different. When "b" is an integer of 2 or more, the plurality of $R_2$ groups may be the same or different. When "c" is an integer of 2 or more, the plurality of $R_3$ groups may be the same or different.

In the polycyclic compound of an embodiment, when X is O, S, Se, $CR_4R_5$, or $SiR_6R_7$, the polycyclic compound of an embodiment may include at least one among an aryl group and a heteroaryl group as a substituent. For example, when X is O, S, Se, $CR_4R_5$, or $SiR_6R_7$, the sum of "a" to "c" may be 1 or more, and at least one of $R_1$ to $R_3$ may be an aryl group or a heteroaryl group.

$L_1$ may be a direct linkage, an arylene group, or a heteroarylene group. The arylene group may be a substituted or unsubstituted arylene group of 6 to 60 carbon atoms for forming a ring. The heteroarylene group may be a substituted or unsubstituted heteroarylene group of 2 to 60, for example, 6 to 60 carbon atoms for forming a ring.

$Ar_1$ may be an aryl group, or a heteroaryl group. The aryl group may be a substituted or unsubstituted aryl group of 6 to 60 carbon atoms for forming a ring. The heteroaryl group may be a substituted or unsubstituted heteroaryl group of 2 to 60 carbon atoms for forming a ring.

"p" may be 0 or 1, and "q" may be 1.

At least one among $L_1$ and $Ar_1$ may be an electron withdrawing group having a Hammett constant (e.g., as used in the Hammett equation to predict the effect of a substituent on the reactivity of a species) greater than 0. For example, $L_1$ and $Ar_1$ may each be an electron withdrawing group having a Hammett constant of 0.2 or more. In the description, the term "Hammett constant" may refer to the average value of the Hammett constant value at a para position and the Hammett constant value at a meta position.

The electron withdrawing group may be an azine derivative (which includes only N as a heteroatom), an imidazole derivative, an oxazole derivative, an aryl derivative substituted with a phosphine oxide group or a cyano group, a heteroaryl derivative substituted with a phosphine oxide group or a cyano group, or an aryl borane derivative. The azine group may be a substituted or unsubstituted cyclic azine derivative including 3 to 60 carbon atoms for forming a ring and only N as a heteroatom. The imidazole derivative may be a substituted or unsubstituted imidazole derivative of 3 to 60 carbon atoms for forming a ring. The oxazole derivative may be a substituted or unsubstituted oxazole derivative of 3 to 60 carbon atoms for forming a ring. The aryl derivative substituted with a phosphine oxide group or a cyano group may be an aryl derivative of 6 to 60 carbon atoms for forming a ring, where the ring is substituted with a phosphine oxide group or a cyano group. The heteroaryl derivative substituted with a phosphine oxide group or a cyano group may be a heteroaryl derivative of 2 to 60 carbon atoms for forming a ring, where the ring is substituted with a phosphine oxide group or a cyano group. The aryl borane (aryl boron) derivative may be a substituted or unsubstituted aryl borane derivative of 6 to 60 carbon atoms for forming a ring.

The electron withdrawing group may additionally include a nitrogen atom. For example, the electron withdrawing group may include a nitrogen atom as a heteroatom in an aromatic ring group.

When the electron withdrawing group is a substituted group, the electron withdrawing group may be substituted with a cyano group, a halogen atom, an alkyl group or a phenyl group. The alkyl group may be a methyl group, an ethyl group, an isopropyl group, an isobutyl group, or a t-butyl group.

The cyclic azine derivative may be a phenyl group, a naphthyl group or a phenanthryl group in which at least one ring-forming carbon atom is substituted with a nitrogen atom. For example, the cyclic azine derivative may be a substituted or unsubstituted pyridinyl group, a substituted or unsubstituted quinolinyl group, a substituted or unsubstituted diazinyl group, or a substituted or unsubstituted triazinyl group. The substituted or unsubstituted diazinyl group may be a substituted or unsubstituted pyridazinyl group, a substituted or unsubstituted pyrimidyl group, a substituted or unsubstituted pyrazinyl group, a substituted or unsubstituted cinnolinyl group, a substituted or unsubstituted quinazolinyl group, a substituted or unsubstituted quinoxalinyl group, a substituted or unsubstituted naphthyridinyl group, or a substituted or unsubstituted phenanthrolinyl group. The substituted or unsubstituted triazinyl group may be a 1,3,5-triazinyl group.

The substituted or unsubstituted imidazole derivative may be, for example, a substituted or unsubstituted benzimidazolyl group, or a substituted or unsubstituted imidazopyridinyl group.

The substituted or unsubstituted oxazole derivative may be, for example, a substituted or unsubstituted benzoxazolyl group, or a substituted or unsubstituted oxazolopyridinyl group.

The aryl derivative substituted with a phosphine oxide group or a cyano group may be further substituted with another substituent. The aryl derivative substituted with a phosphine oxide group or a cyano group may be, for example, a phenyl group substituted with at least one cyano group, or a phenyl group substituted with at least one phosphine oxide group. The phosphine oxide group may be a diaryl phosphine oxide group, and for example, a diphenyl phosphine oxide group. The aryl group may be the same as described in connection with the diaryl phosphine oxide group. The heteroaryl group substituted with a phosphine oxide group or a cyano group may be, for example, a pyridinyl group substituted with at least one cyano group, or a pyridinyl group substituted with at least one phosphine oxide group.

The aryl group of the substituted or unsubstituted aryl borane derivative may be combined with an adjacent group to form a ring. In some embodiments, the aryl groups of the aryl borane derivative may be combined with each other to form a ring. For example, the substituted or unsubstituted aryl borane derivative may be a substituted or unsubstituted diphenyl boranyl group, a substituted or unsubstituted dibenzo[b,e]borinine group, or a substituted or unsubstituted dibenzo-1,4-oxaborinine group. The substituted or unsubstituted dibenzo[b,e]borinine group, or the substituted or unsubstituted dibenzo-1,4-oxaborinine group may be obtained by replacing at least one benzene ring carbon with a boron atom.

In some embodiments, Formula 1 may be represented by one of Formula 1-1 to Formula 1-3:

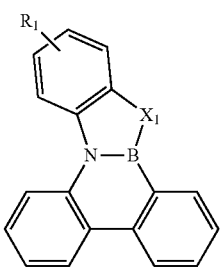

Formula 1-1

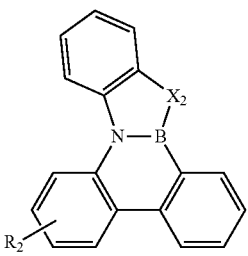

Formula 1-2

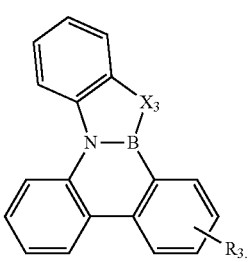

Formula 1-3

Formula 1-1 to Formula 1-3 correspond to Formula 1 where "a" to "c" are embodied as set values (e.g., respective structures in which one of a to c is 1, and the rest of a to c are 0). In Formula 1-1 to Formula 1-3, $X_1$ to $X_3$ may each independently be O, S, or $CR_4R_5$. In some embodiments, $X_1$ to $X_3$ may each independently be O, or $CR_4R_5$. $R_1$ to $R_5$ may each independently be the same as defined in connection with Formula 1.

Formula 1 may be represented by Formula 1-4:

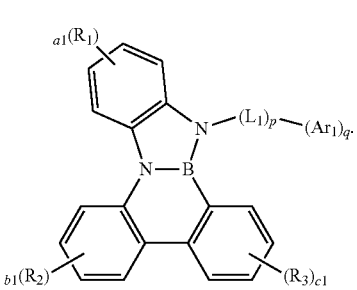

Formula 1-4

Formula 1-4 corresponds to Formula 1 where X is embodied as N. In Formula 1-4, a1 to c1 may each independently be 0 or 1. The sum of a1 to c1 may be 1 or less. Each of a1 to c1 may be 0. $R_1$ to $R_3$, $L_1$, $Ar_1$, "p", and "q" may each independently be the same as defined in connection with Formula 1.

In Formula 1, $R_1$ to $R_3$ may each independently be represented by Formula 2. For example, in Formula 1, X may be O, S, Se, $CR_4R_5$, or $SiR_6R_7$, and $R_1$ to $R_3$ may each independently be represented by Formula 2:

$$*\text{-}(L_{11})_r\text{—}(Ar_{11})_s. \quad \text{Formula 2}$$

In Formula 2, $L_{11}$ may be a direct linkage, an arylene group, or a heteroarylene group. The arylene group may be a substituted or unsubstituted arylene group of 6 to 60 carbon atoms for forming a ring. The heteroarylene group may be a substituted or unsubstituted heteroarylene group of 2 to 60, for example, 6 to 60 carbon atoms for forming a ring.

$Ar_{11}$ may be an aryl group or a heteroaryl group. The aryl group may be a substituted or unsubstituted aryl group of 6 to 60 carbon atoms for forming a ring. The heteroaryl group may be a substituted or unsubstituted heteroaryl group of 2 to 60 carbon atoms for forming a ring.

In some embodiments, when $Ar_{11}$ is the aryl group, $Ar_1$ may include or be a substituted or unsubstituted phenyl group, a substituted or unsubstituted biphenyl group, a substituted or unsubstituted terphenyl group, a substituted or unsubstituted naphthyl group, or a substituted or unsubstituted fluorenyl group. When $Ar_{11}$ is the substituted or unsubstituted heteroaryl group, $Ar_{11}$ may include or be a substituted or unsubstituted carbazolyl group, a substituted or unsubstituted indolocarbazolyl group, a substituted or unsubstituted acridinyl group, or a substituted or unsubstituted phenoxazine group. When $L_{11}$ is an arylene group, $L_{11}$ may be the same as $Ar_{11}$ except that the arylene group is a divalent group. When $L_1$ is a heteroarylene group, $L_{11}$ may be the same as $Ar_1$ except that the heteroarylene group is a divalent group.

$L_{11}$ and $Ar_{11}$ may each independently include an electron withdrawing group. When $L_1$ or $Ar_{11}$ is an electron withdrawing group, these groups may be the same as the electron withdrawing group described above.

"r" may be an integer of 0 to 2. "s" may be 1. When "r" is 2, the plurality of $L_{11}$ groups may be the same or different.

The polycyclic compound may include at least one among the compounds represented in Compound Group 1 and Compound Group 2:

Compound Group 1

1-1

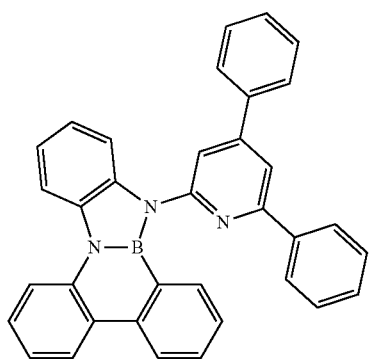

-continued 1-2

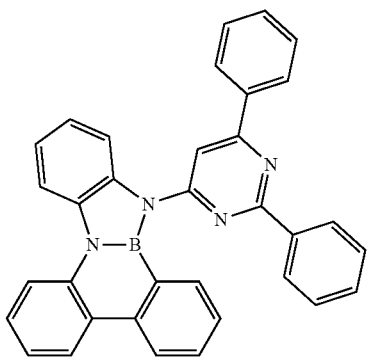

1-3

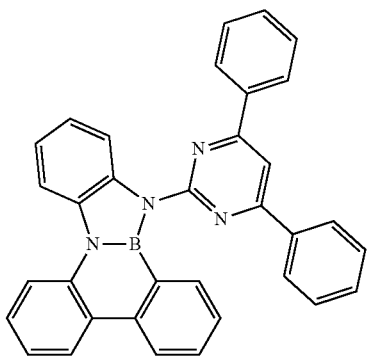

1-4

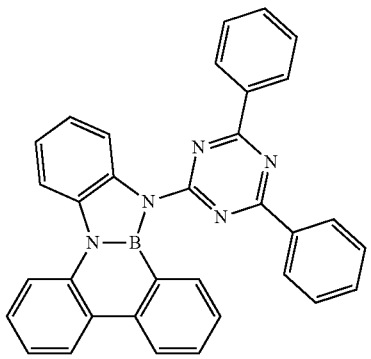

1-5

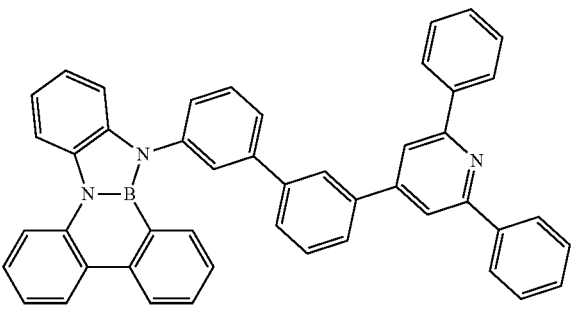

1-6
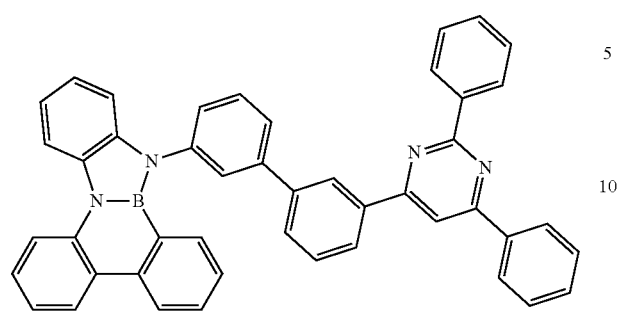
1-7
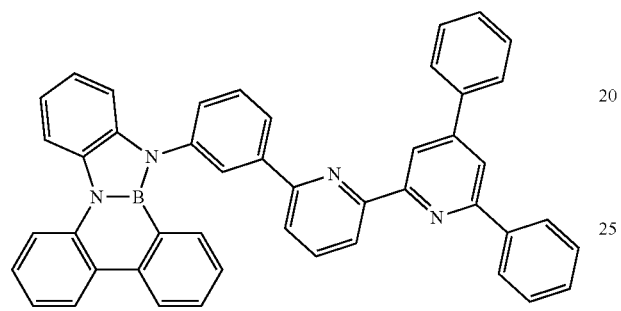
1-8
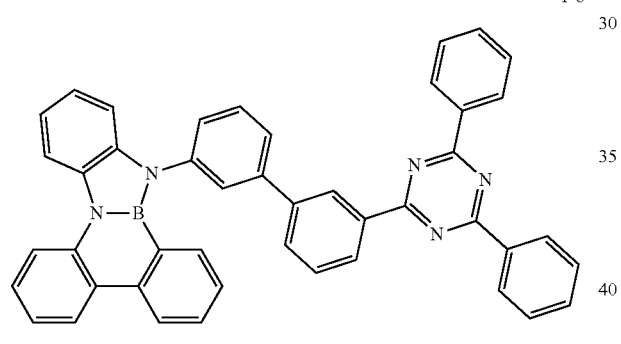
1-9
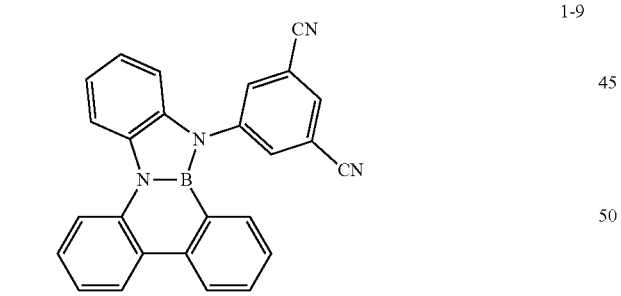
1-10
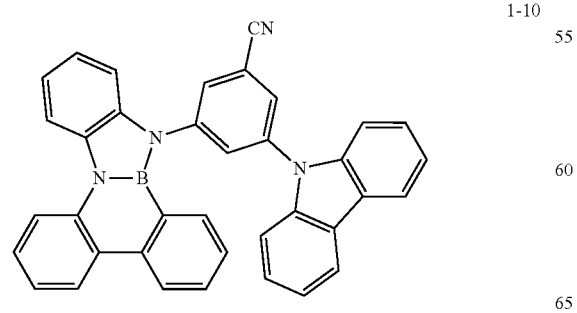
1-11
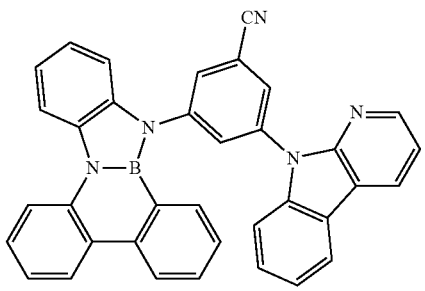
1-12
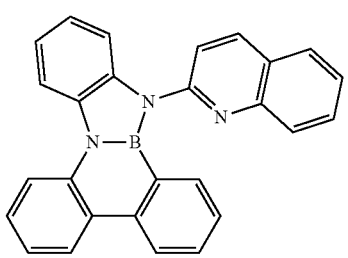
1-13
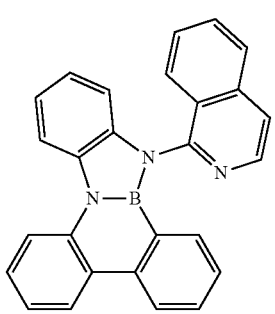
1-14
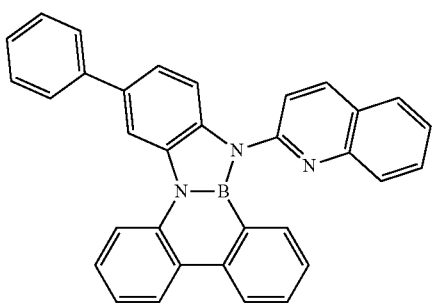
1-15
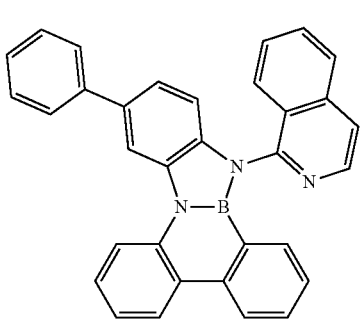

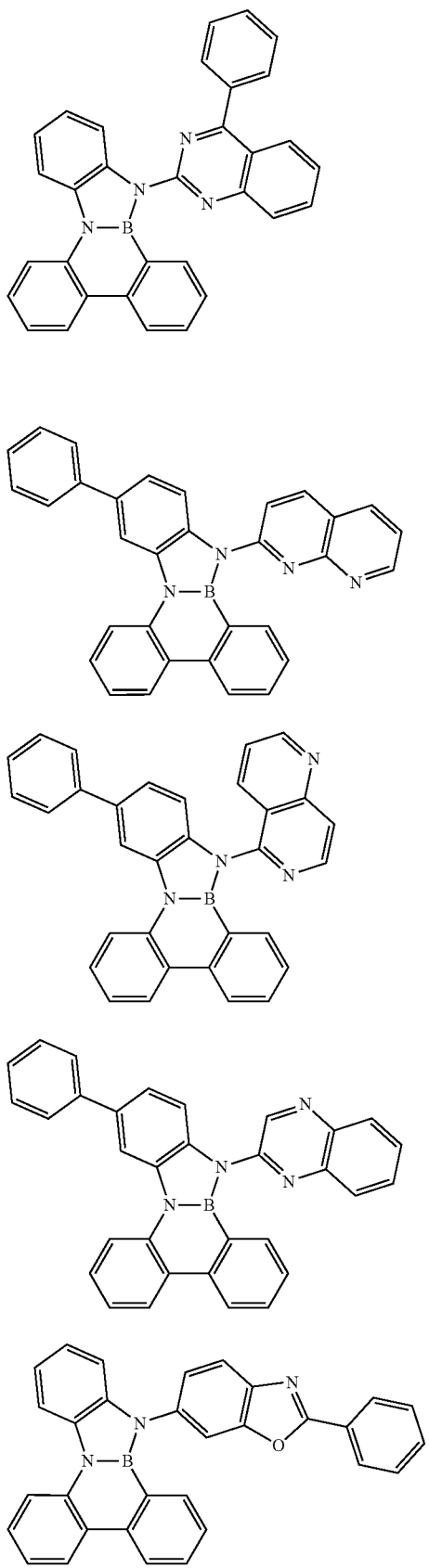
1-16
1-17
1-18
1-19
1-20
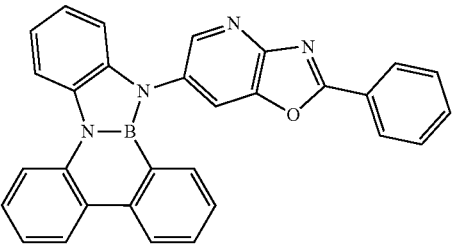
1-21
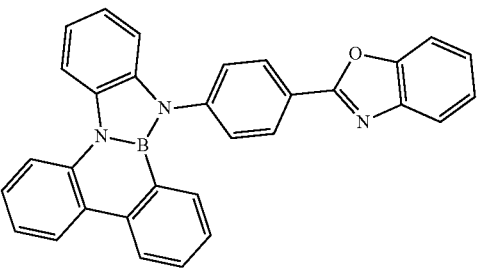
1-22
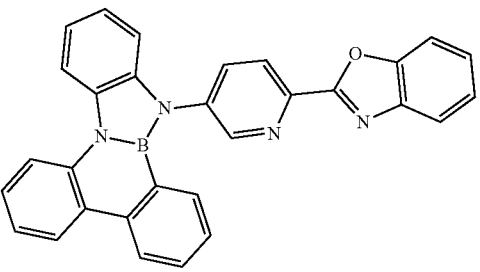
1-23
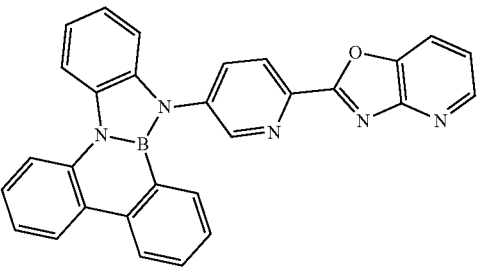
1-24
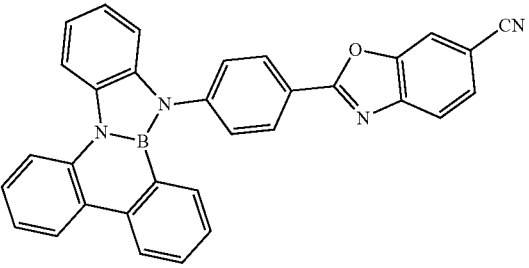
1-25

1-26
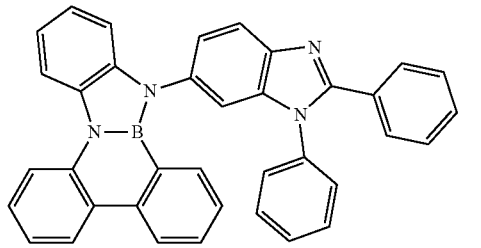
1-27
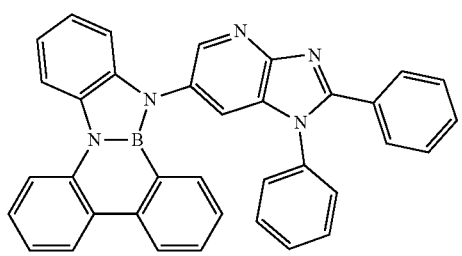
1-28
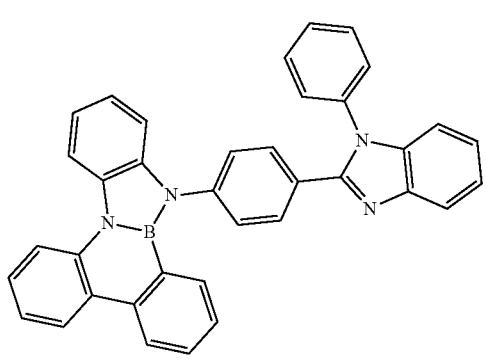
1-29
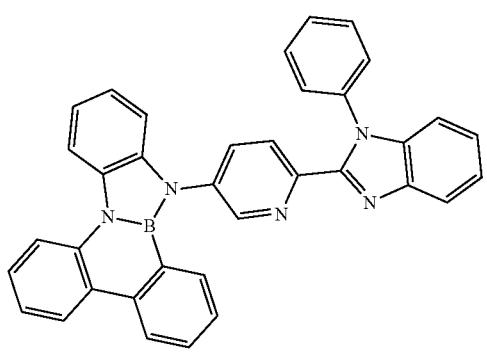
1-30
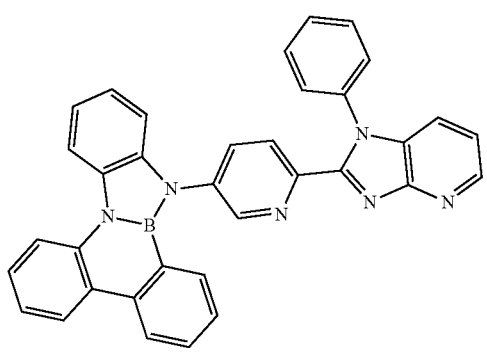
1-31
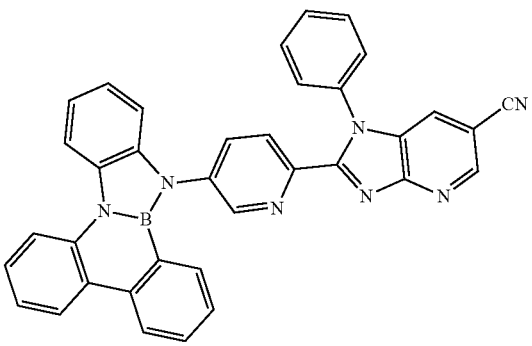
1-32
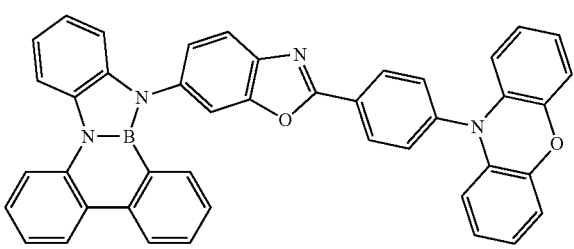
1-33
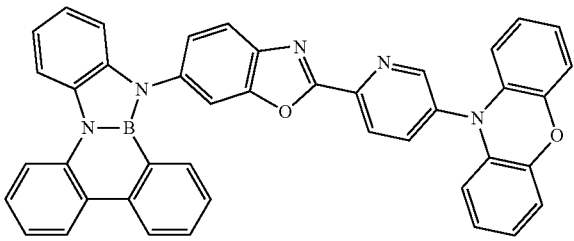
1-34
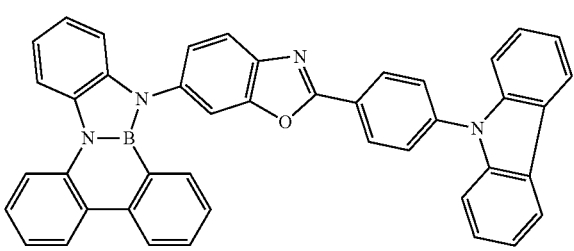
1-35
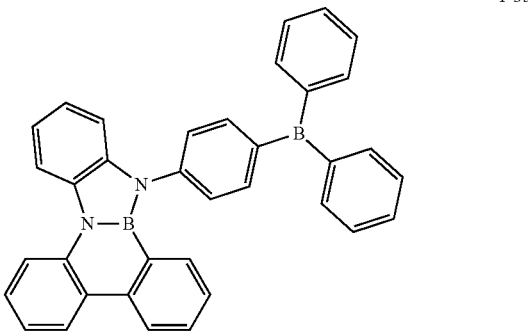

-continued
1-36
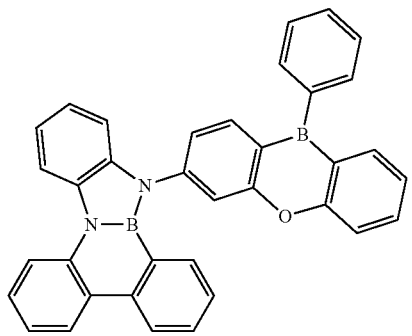
1-37
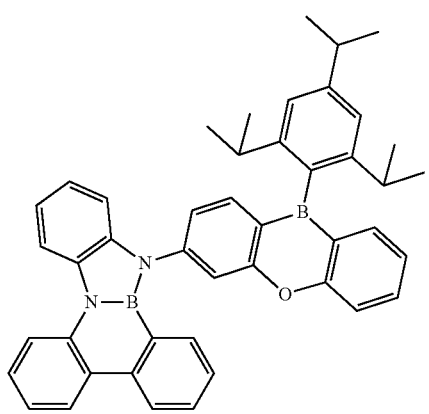
1-38
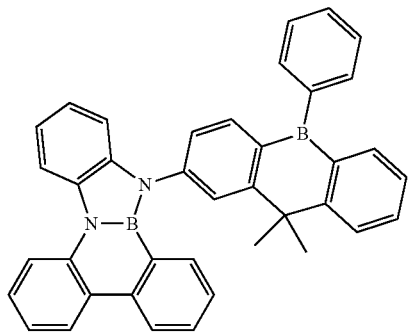
1-39
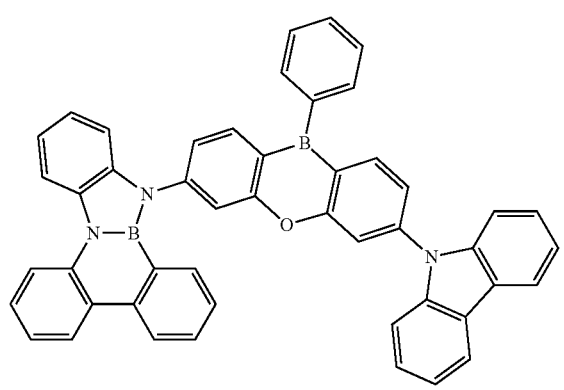
-continued
1-40
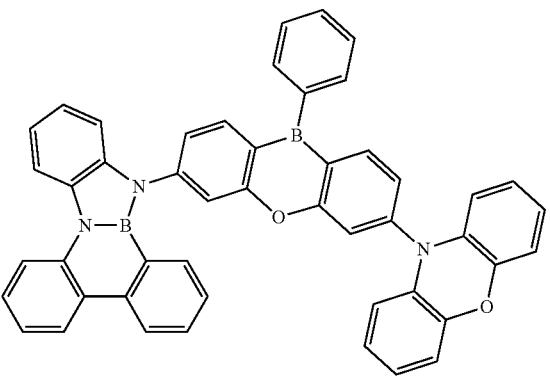
1-41
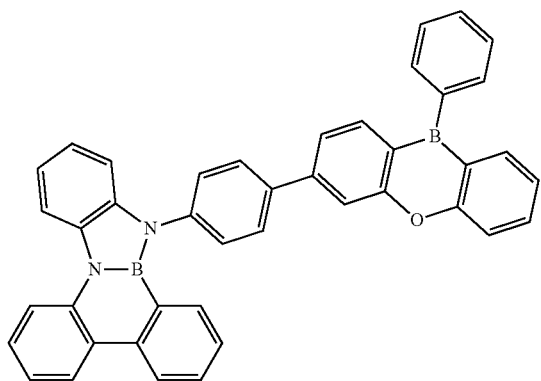
1-42
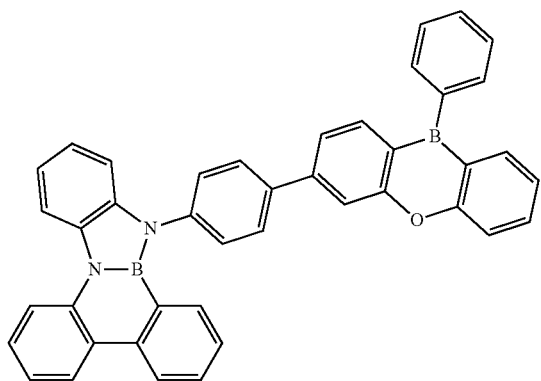
1-43
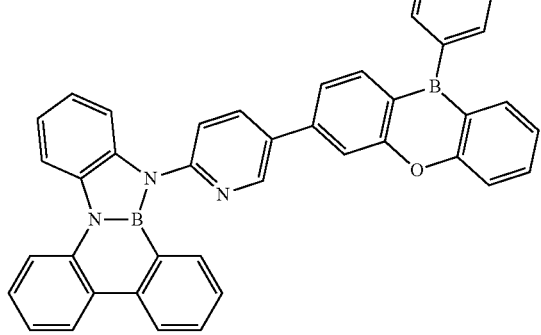

1-44
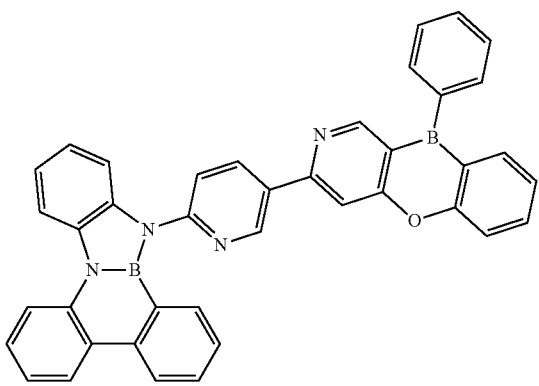
1-45
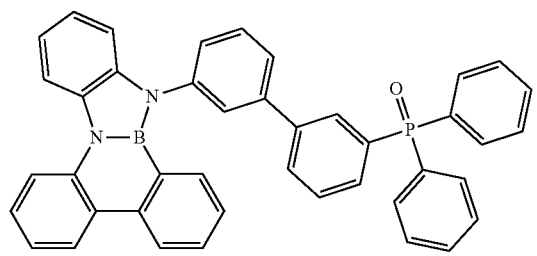
1-46
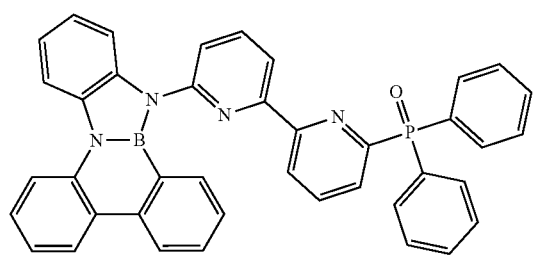
1-47
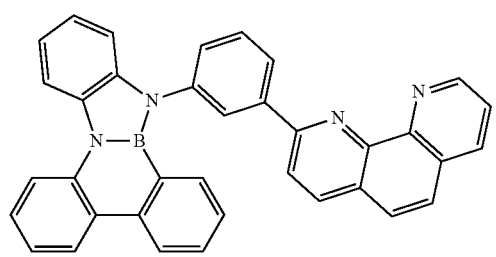
1-48
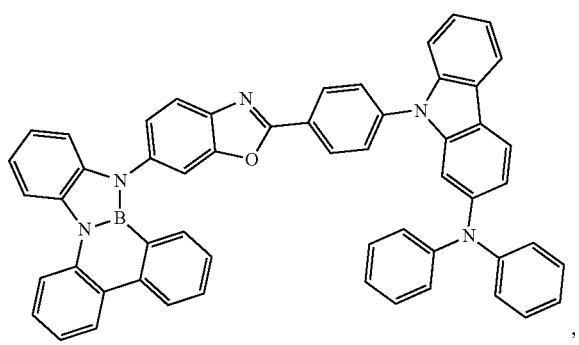
Compound Group 2
2-1
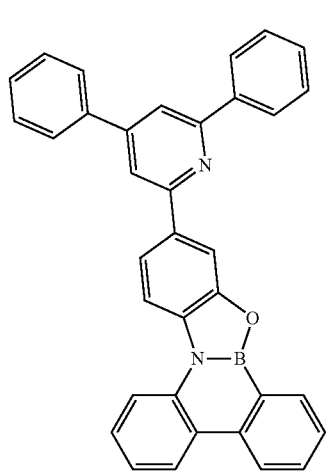
2-2
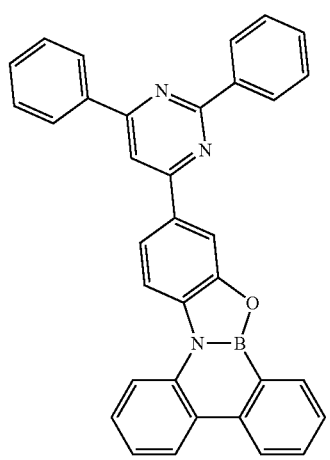
2-3
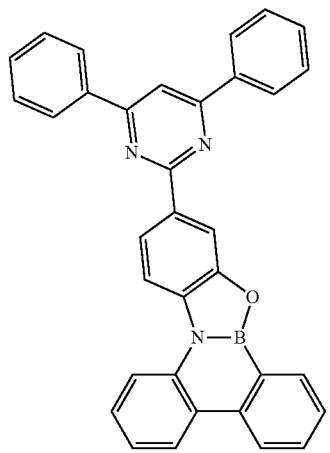

2-4
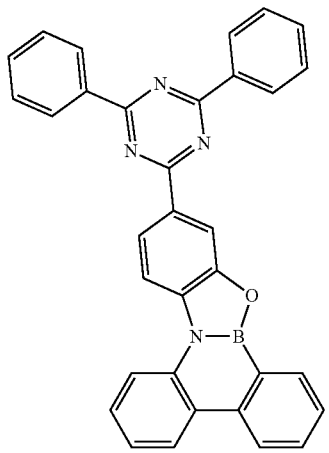
2-5
2-6
2-7
2-8
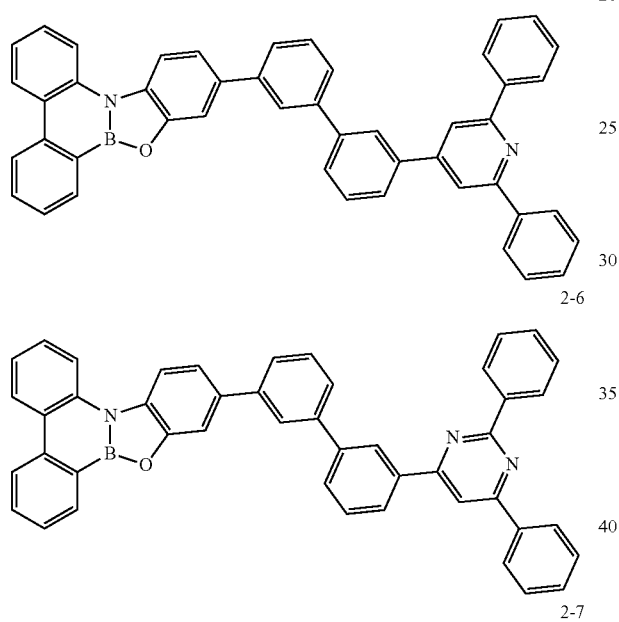
2-9
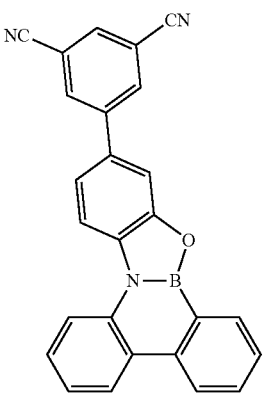
2-10
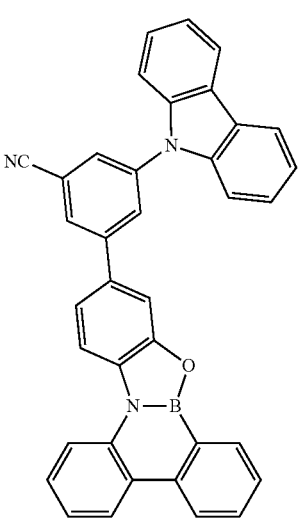
2-11
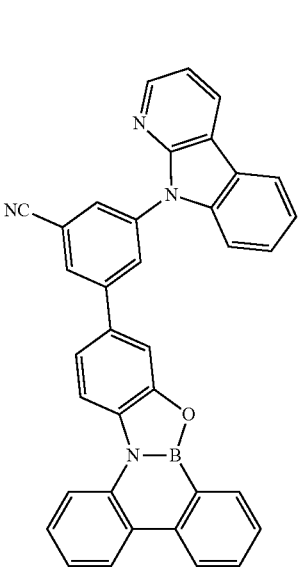

2-12
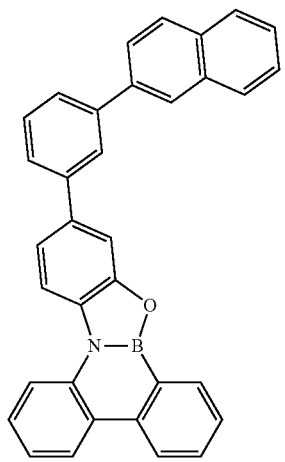
2-13
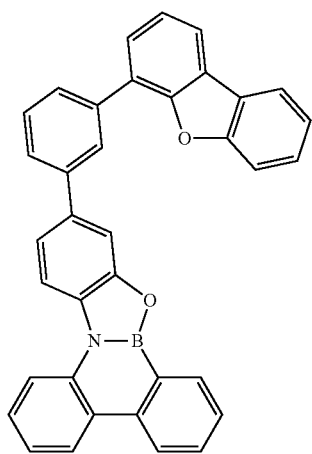
2-14
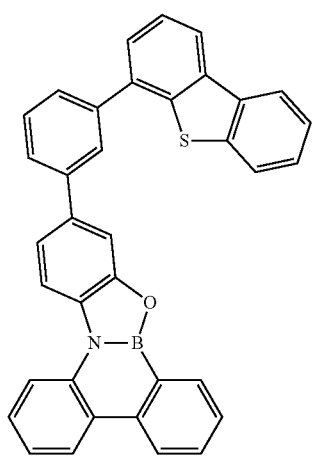
2-15
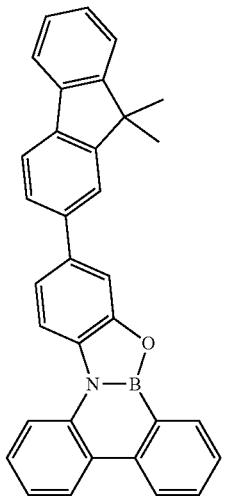
2-16
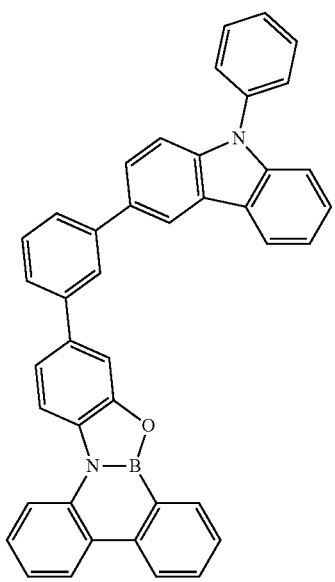
2-17
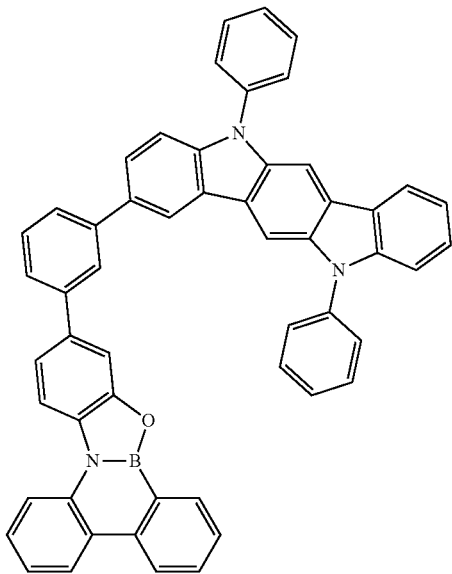

2-18
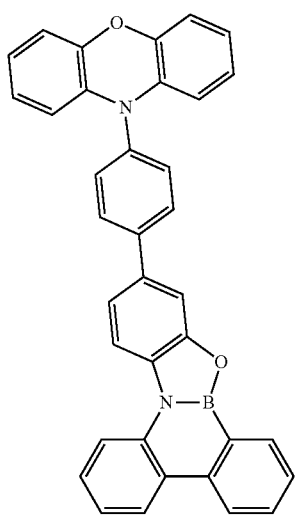
2-19
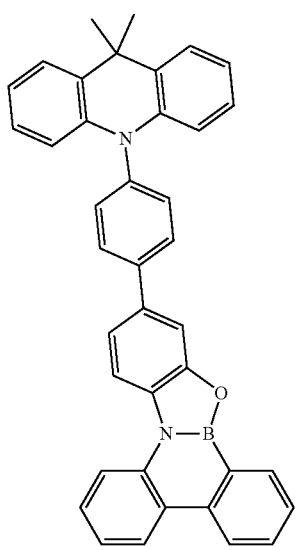
2-20
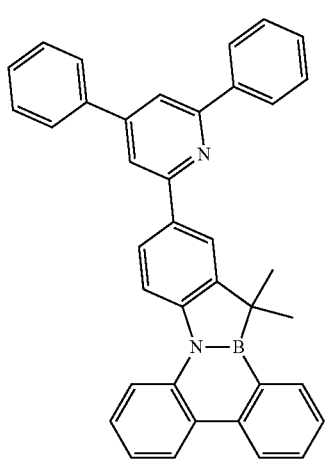
2-21
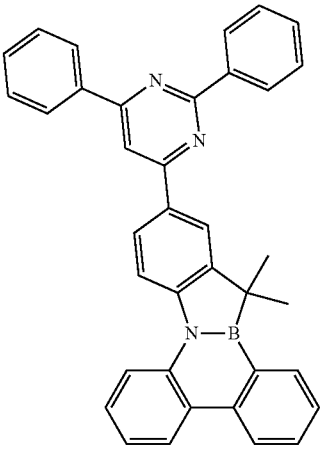
2-22
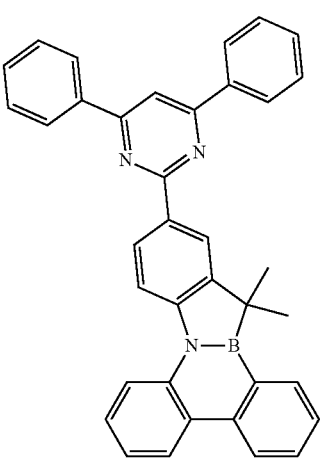
2-23
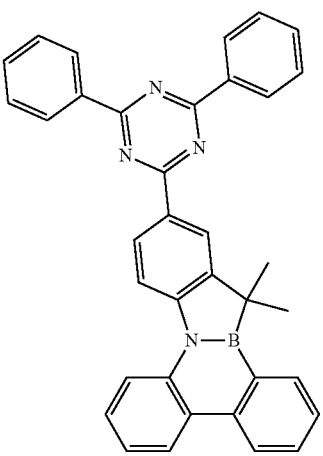
2-24
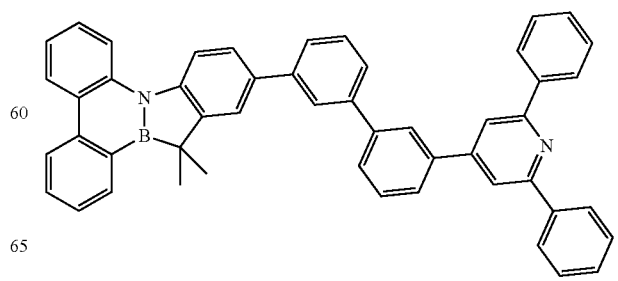

-continued
2-25
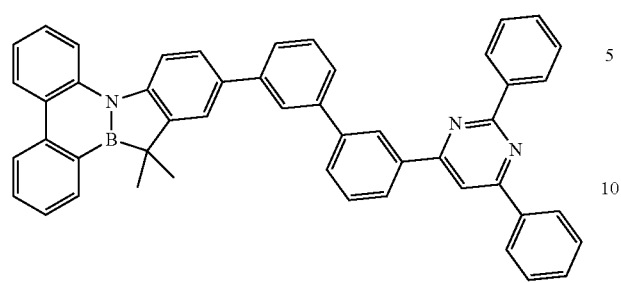
2-26
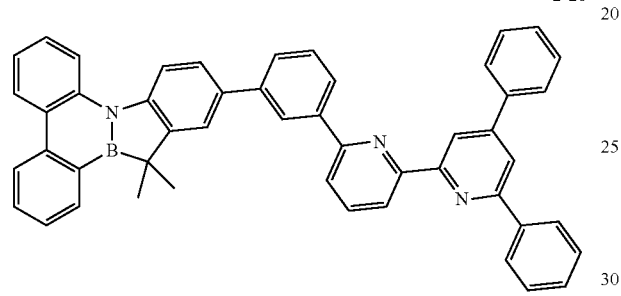
2-27
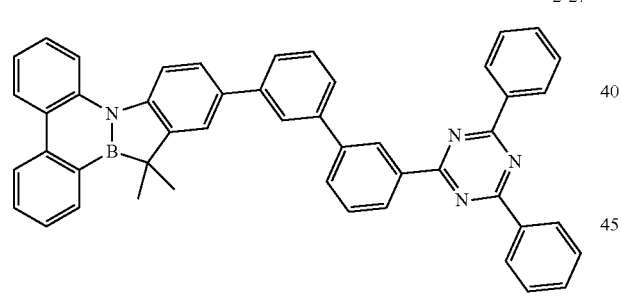
2-28
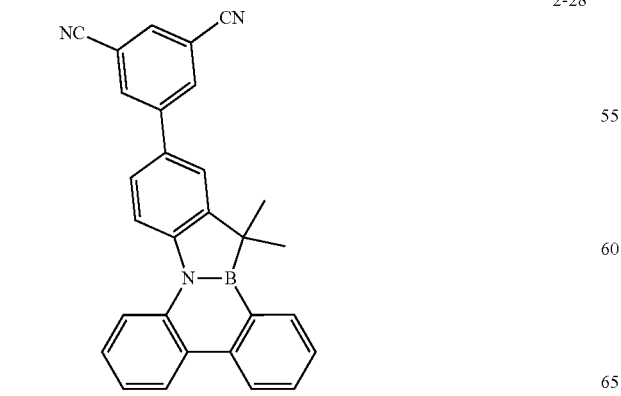
-continued
2-29
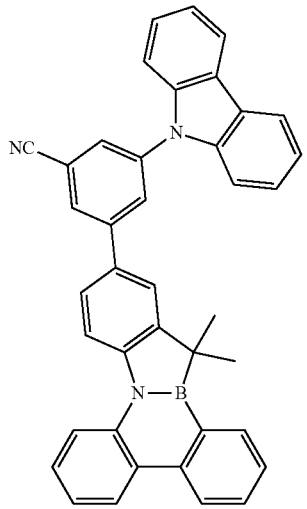
2-30
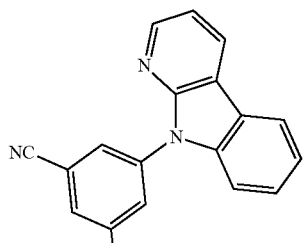
2-31
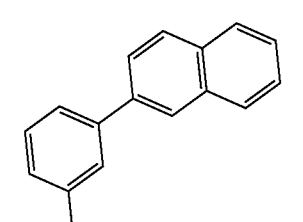
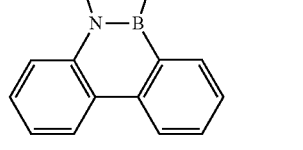

2-32 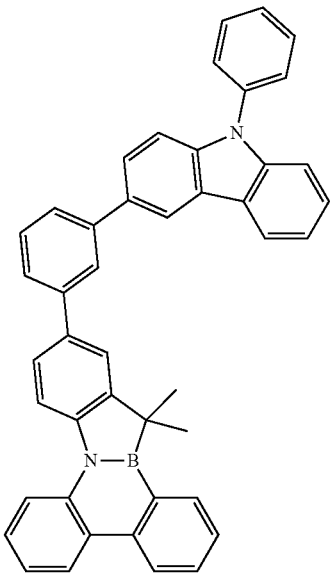
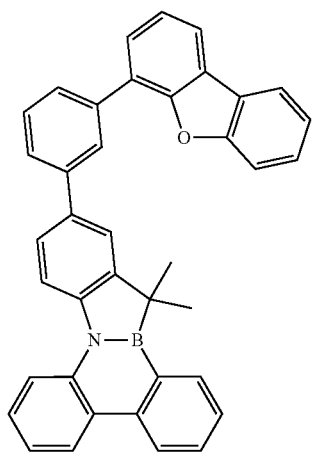
2-35 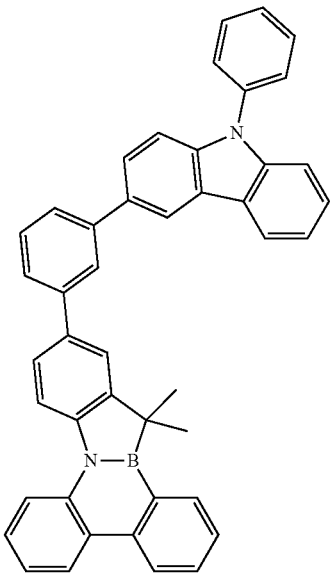
2-33 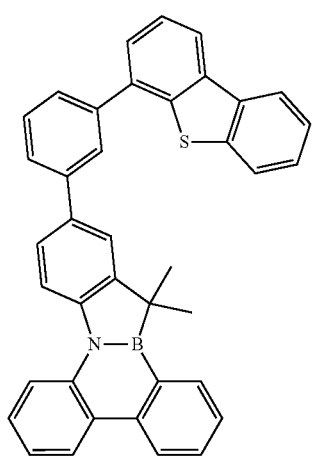
2-36 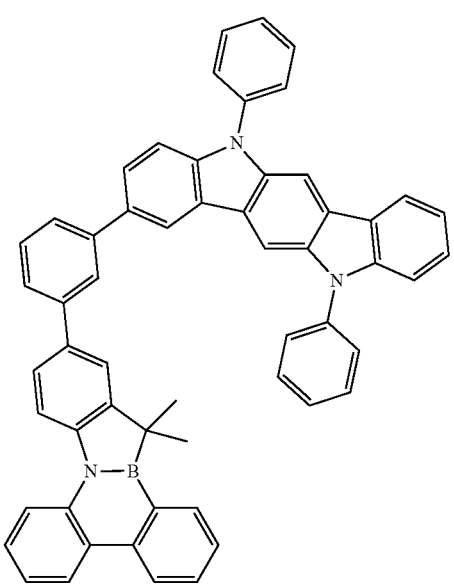
2-34 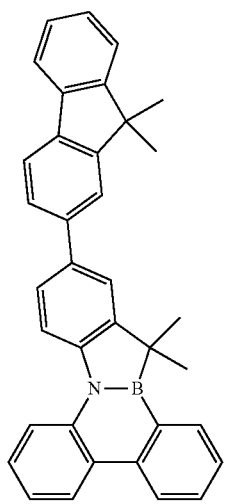
2-37 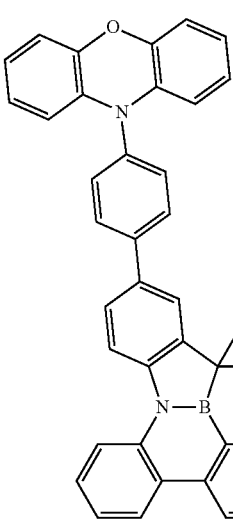

-continued
2-38
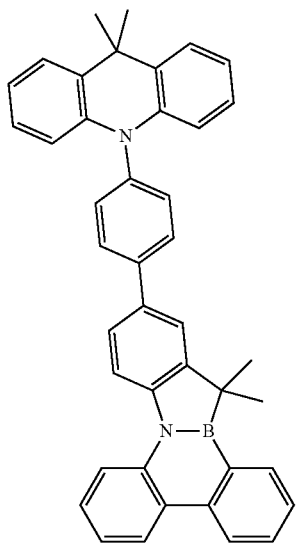
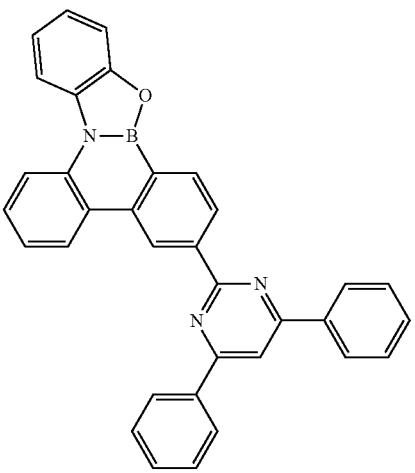
2-41
2-39
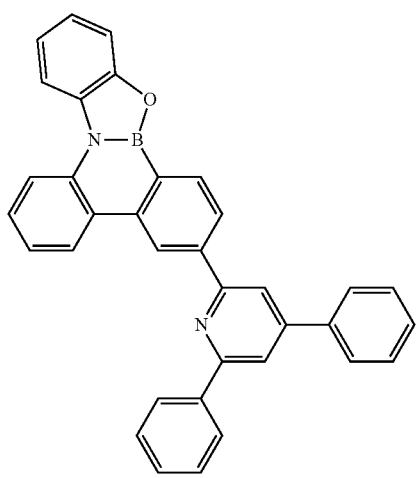
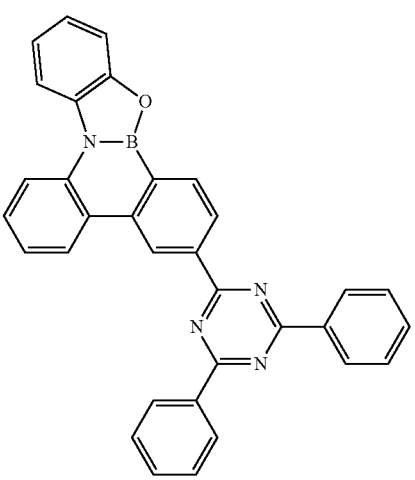
2-42
2-40
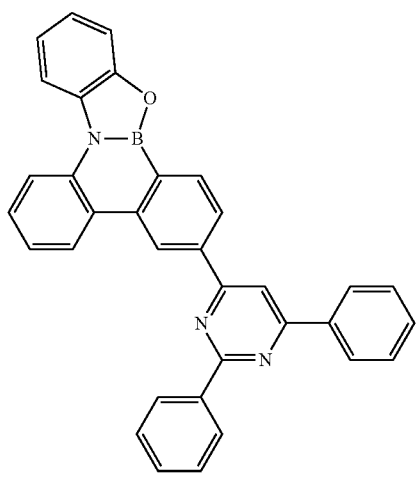
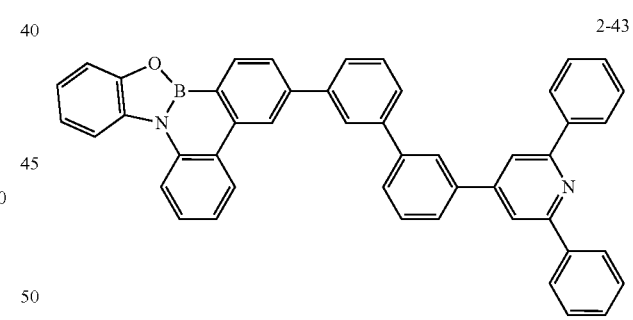
2-43
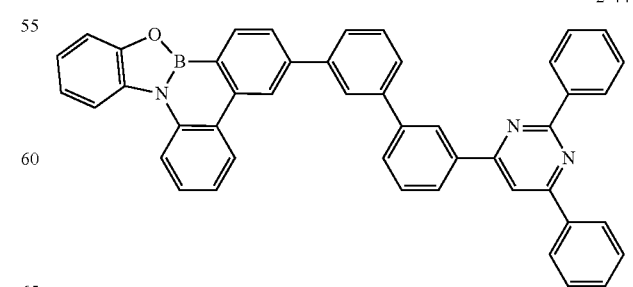
2-44

-continued
2-45
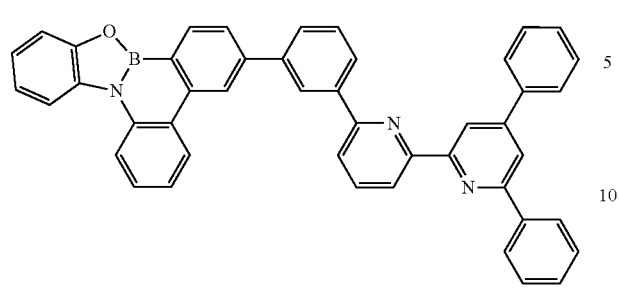
2-46
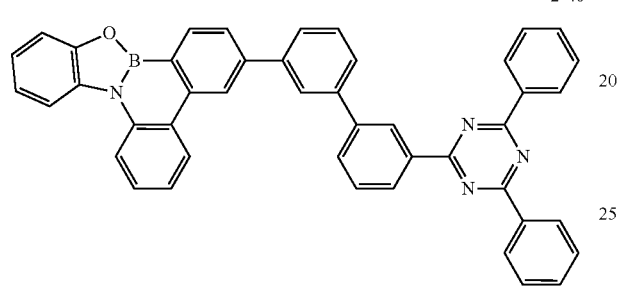
2-47
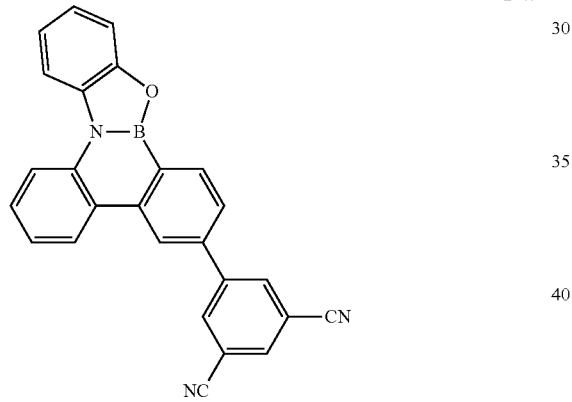
2-48
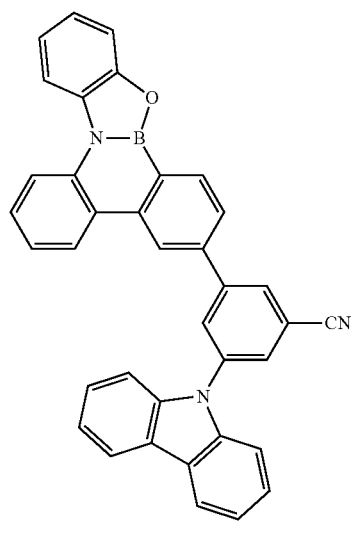
2-49
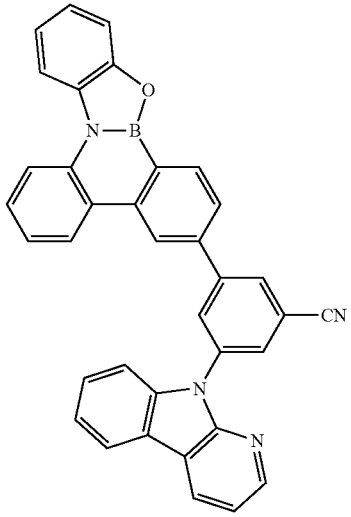
2-50
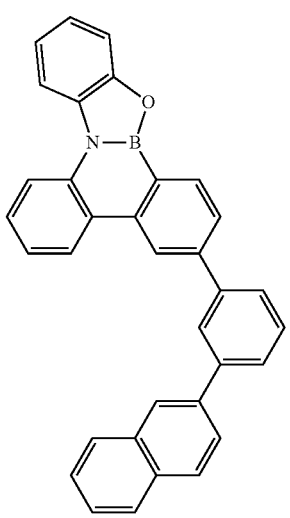
2-51
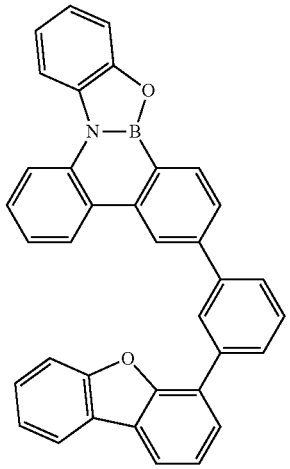

67
-continued
2-52
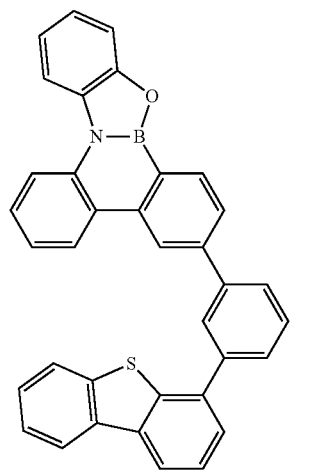
2-53
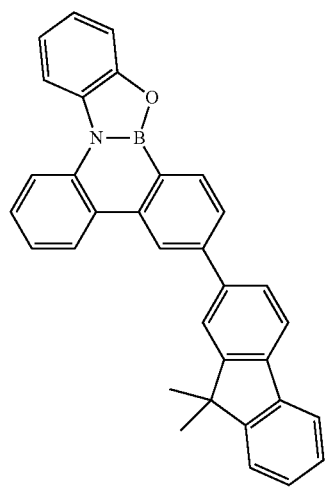
2-54
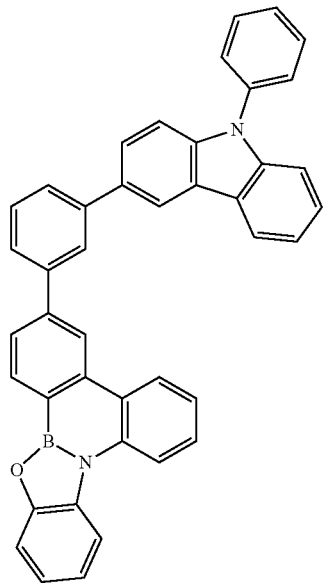
68
-continued
2-55
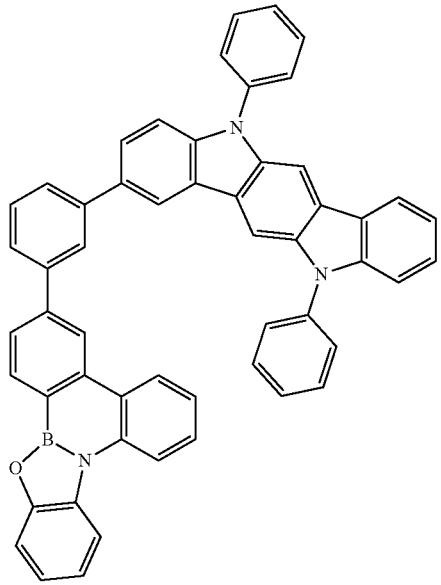
2-56
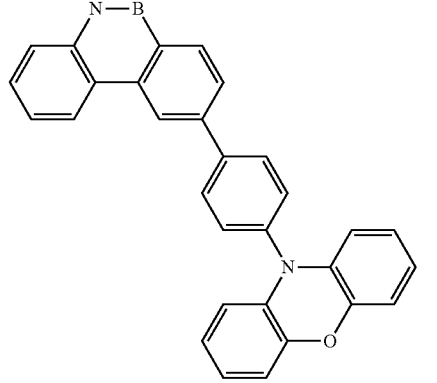
2-57
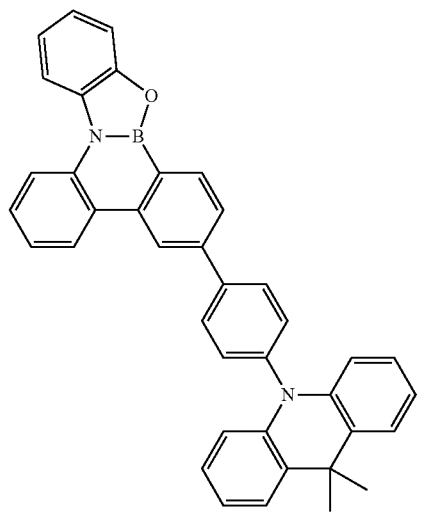

2-58

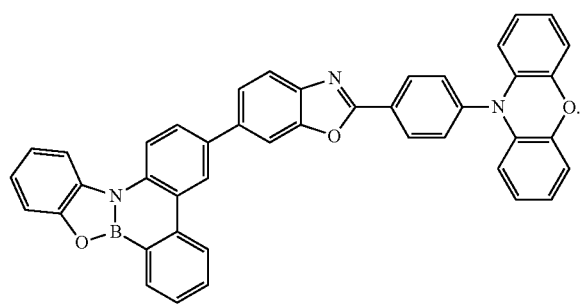

At least one layer selected from the hole transport region HTR and the emission layer EML may include the polycyclic compound of an embodiment.

The first electrode EL1 may have conductivity (e.g., be conductive). The first electrode EL1 may be formed using a metal alloy or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include or be formed of a transparent metal oxide, for example, indium tin oxide (ITO), indium zinc oxide (IZO), zinc oxide (ZnO), and indium tin zinc oxide (ITZO), etc. When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or any mixture thereof (for example, a mixture of Ag and Mg). In some embodiments, the first electrode EL1 may have a structure including a plurality of layers including a reflective layer or a transflective layer formed using the above materials, and a transmissive conductive layer formed using ITO, IZO, ZnO, ITZO, etc. For example, the first electrode EL1 may include a three-layer structure of ITO/Ag/ITO. However, an embodiment of the present disclosure is not limited thereto. The thickness of the first electrode EL1 may be about 1,000 Å to about 10,000 Å, for example, about 1,000 Å to about 3,000 Å.

The hole transport region HTR is disposed on the first electrode EL1. The hole transport region HTR may include at least one of a hole injection layer HIL, a hole transport layer HTL, a hole buffer layer, or an electron blocking layer EBL.

The hole transport region HTR may have a single layer formed using a single material, a single layer formed using a plurality of different materials, or a multilayer structure including a plurality of layers formed using a plurality of different materials.

For example, the hole transport region HTR may have a single layer structure including the hole injection layer HIL or the hole transport layer HTL, or a single layer structure formed using a hole injection material and a hole transport material (e.g., together). In some embodiments, the hole transport region HTR may have a structure of a single layer formed using a plurality of different materials, or a structure stacked from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may include the polycyclic compound of an embodiment. For example, at least one layer among a hole injection layer HIL, a hole transport layer HTL, a hole buffer layer, or an electron blocking layer EBL may include the polycyclic compound of an embodiment.

When the polycyclic compound of an embodiment is included in the hole transport region HTR, X may be O, S, Se, $CR_4R_5$, or $SiR_6R_7$ in Formula 1, but an embodiment of the present disclosure is not limited thereto. $R_1$ to $R_3$ may exclude (e.g., may be selected from groups other than) the electron withdrawing group.

The hole transport region HTR may be formed using any suitable method such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-biphenyl-4,4'-diamine (DNTPD), 4,4', 4"-tris(3-methylphenylphenylamino)triphenylamine (m-MTDATA), 4,4', 4"-tris(N,N-diphenylamino)triphenylamine (TDATA), 4,4', 4"-tris {N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyether ketone (TPAPEK), 4-isopropyl-4'-methyldiphenyliodonium tetrakis (pentafluorophenyl) borate, and dipyrazino[2,3-f: 2', 3'-h]quinoxaline-2,3,6,7,10,11-hexacarbonitrile (HAT-CN).

The hole transport layer HTL may include, for example, carbazole derivatives (such as N-phenyl carbazole and polyvinyl carbazole), fluorine-based derivatives, N,N'-bis(3-methylphenyl)-N,N'-diphenyl-[1,1-biphenyl]-4,4'-diamine (TPD), triphenylamine-based derivatives (such as 4,4', 4"-tris(carbazol-9-yl)triphenylamine (TCTA)), N,N'-di (naphthalene-1-yl)-N,N'-diphenyl-benzidine (NPB), 4,4'-bis [N,N-bis(4-methylphenyl)benzeneamine](TAPC), 4,4'-bis [N,N'-(3-tolyl)amino]-3,3'-dimethylbiphenyl (HMTPD), 1,3-bis(N-carbazolyl)benzene (mCP), 9-(4-tert-butylphenyl)-3,6-bis(triphenylsilyl)-9H-carbazole (CzSi), etc.

The thickness of the hole transport region HTR may be about 100 Å to about 10,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL each satisfy the above-described ranges, satisfactory hole transport properties may be achieved without a substantial increase in driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may be a quinone derivative, metal oxide, or cyano group-containing compound, without limitation. Non-limiting examples of the p-dopant include quinone derivatives (such as tetracyanoquinodimethane (TCNQ) and/or 2,3,5,6-tetrafluoro-7,7,8,8-tetracyanoquinodimethane (F4-TCNQ)), metal oxides (such as tungsten oxide and/or molybdenum oxide), etc.

As described above, the hole transport region HTR may further include at least one of a hole buffer layer or an electron blocking layer EBL in addition to the hole injection layer HIL and the hole transport layer HTL. The hole buffer layer may compensate for an optical resonance distance according to the wavelength of light emitted from an emission layer EML to increase light emission efficiency. Materials that may be included in the hole transport region HTR may also be included in the hole buffer layer. The electron blocking layer EBL may prevent or reduce electron injection from the electron transport region ETR to the hole transport region HTR.

The emission layer EML is disposed on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the luminescence device 10 of an embodiment, the emission layer EML may include anthracene derivatives, pyrene derivatives, fluoranthene derivatives, chrysene derivatives, dihydrobenzanthracene derivatives, or triphenylene derivatives. In some embodiments, the emission layer EML may include anthracene derivatives or pyrene derivatives.

In the luminescence devices 10 of example embodiments as shown in FIG. 1 to FIG. 4, the emission layer EML may include a host and a dopant, and the emission layer EML may include one or more of the above compounds as host or dopant materials.

The emission layer EML may further include any suitable host materials available in the art. For example, the emission layer EML may include as a host material, at least one of bis[2-(diphenylphosphino)phenyl]ether oxide (DPEPO), 4,4'-bis(carbazol-9-yl) biphenyl (CBP), 1,3-bis(carbazol-9-yl)benzene (mCP), 2,8-bis(diphenylphosphoryl)dibenzo[b,d]furan (PPF), 4,4', 4"-tris(carbazol-9-yl)triphenylamine or 1,3,5-tris(1-phenyl-1H-benzo[d]imidazol-2-yl)benzene (TPBi).

However, embodiments of the present disclosure are not limited thereto. For example, tris(8-hydroxyquinolino)aluminum (Alq3), 4,4'-bis(N-carbazolyl)-1,1'-biphenyl (CBP), poly (N-vinylcarbazole) (PVK), 9,10-di(naphthalene-2-yl) anthracene (ADN), 3-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis (naphthalen-2-yl) anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO3), octaphenylcyclotetra siloxane (DPSiO4), 2,8-bis(diphenylphosphoryl)dibenzofuran (PPF), 9-(4-tert-butylphenyl)-3,6-bis(triphenylsilyl)-9H-carbazole, etc. may be used as the host material.

In an embodiment, the emission layer EML may include as the dopant material, styryl derivatives (for example, 1,4-bis[2-(3-N-ethylcarbazoryl) vinyl]benzene (BCzVB), 4-(di-p-tolylamino)-4'-[(di-p-tolylamino) styryl]stilbene (DPAVB), and/or N-(4-((E)-2-(6-((E)-4-(diphenylamino) styryl) naphthalen-2-yl) vinyl)phenyl)-N-phenylbenzenamine (N-BDAVBi)), perylene and derivatives thereof (for example, 2,5,8, 11-tetra-t-butylperylene (TBP)), pyrene and derivatives thereof (for example, 1,1'-dipyrene, 1,4-dipyrenylbenzene, 1,4-bis(N,N-diphenylamino) pyrene), etc.

In an embodiment, the emission layer EML may include the polycyclic compound of an embodiment as the host or the dopant. The emission layer EML may include the polycyclic compound of an embodiment as the dopant. In some embodiments, the emission layer EML may include the polycyclic compound of an embodiment as a thermally activated delayed fluorescence dopant.

When the polycyclic compound of an embodiment is included as the dopant of the emission layer EML, the polycyclic compound of an embodiment may include the above-described electron withdrawing group. The difference (ΔEST) between the lowest singlet excitation energy level and the lowest triplet excitation energy level of the polycyclic compound of an embodiment may be less than about 0.1 eV, about 0.05 eV or less, about 0.02 eV or less, or about 0.01 eV or less.

When the polycyclic compound of an embodiment is included in the emission layer EML, and X is O, S, Se, $CR_4R_5$, or $SiR_6R_7$, the Hammett constant of each of $R_1$ to $R_3$ may be greater than 0.

When the polycyclic compound of an embodiment is included in the emission layer EML, the polycyclic compound of an embodiment may include a donor and an acceptor. The donor may be a group having a Hammett constant of less than 0 or less than −0.2. The acceptor may be a group having a Hammett constant of greater than 0 or 0.2 or more. The polycyclic compound of an embodiment may include one donor and one acceptor. The donor and the acceptor may be connected by an aryl group as a linker, but an embodiment of the present disclosure is not limited thereto. The polycyclic compound of an embodiment may include a plurality of donors and one acceptor. For example, the acceptor may have a structure in which two donors are substituted.

The polycyclic compound of an embodiment may be included in the emission layer EML and may be to emit green light or red light. For example, light having a central wavelength of about 490 nm to about 750 nm may be emitted.

In an embodiment, the emission layer EML may be to emit delayed fluorescence. For example, thermally activated delayed fluorescence may be emitted.

When the polycyclic compound of an embodiment is included as the dopant of the emission layer EML, the polycyclic compound of an embodiment may be represented by Formula A:

DU-AU    Formula A

In Formula A, DU may be represented by Formula A-1, and AU may be represented by Formula A-2:

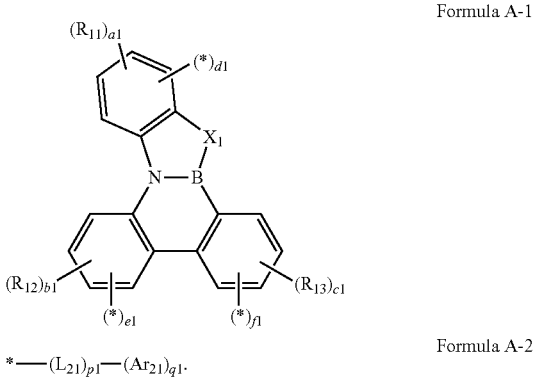

Formula A-1

Formula A-2

$*$—$(L_{21})_{p1}$—$(Ar_{21})_{q1}$.

In Formula A-1, $X_1$ may be O, S, Se, $CR_{14}R_{15}$, $SiR_{16}R_{17}$, or N—$*$ $R_{11}$ to $R_{17}$ may each independently be the same as defined in connection with $R_1$ to $R_7$ in Formula 1. a1 to c1 may be the same as defined in connection with "a" to "c" in Formula 1.

d1 to f1 may each independently be 0 or 1. For example, when $X_1$ is O, S, Se, $CR_{14}R_{15}$, or $SiR_{16}R_{17}$, each of d1 to f1 may be 1. When $X_1$ is N—$*$, each of di to f1 may be 0.

—$*$ refers to a connection point with Formula A-2.

$L_{21}$ and $Ar_{21}$ may each independently be the same as defined in connection with $L_{11}$ and $Ar_{11}$, respectively, in Formula 2. In Formula A-2, at least one among $L_{21}$ and $Ar_{21}$ may be an electron withdrawing group having a Hammett constant greater than 0. The electron withdrawing group may be the same as described above.

p1 and q1 may each independently be the same as defined in connection with "p" and "q" in Formula 1.

The emission layer EML of an embodiment may include a thermally activated delayed fluorescence dopant (such as 4CzIPN) as a dopant material.

In the luminescence devices 10 of embodiments as shown in FIGS. 1 to 4, the electron transport region ETR is disposed on the emission layer EML. The electron transport region ETR may include at least one of a hole blocking layer HBL, an electron transport layer ETL, or an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

In some embodiments, for example, the electron transport region ETR may have a single layer structure of an electron injection layer EIL or an electron transport layer ETL, or a single layer structure formed using an electron injection material and an electron transport material (e.g., together). In some embodiments, the electron transport region ETR may have a single layer structure formed using a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

When the electron transport region ETR includes an electron transport layer ETL, the electron transport region ETR may include an anthracene-based compound. An embodiment of the present disclosure is not limited thereto, but the electron transport region ETR may include, for example, tris(8-hydroxyquinolinato)aluminum (Alq3), 1,3, 5-tri[(3-pyridyl)-phen-3-yl]benzene, 2,4,6-tris(3'-(pyridin-3-yl) biphenyl-3-yl)-1,3,5-triazine, 2-(4-(N-phenylbenzo-imidazol-1-ylphenyl)-9,10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-di-phenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxa-diazole (tBu-PBD), bis(2-methyl-8-quinolinolato-N1,08)-(1,1'-biphenyl-4-olato)aluminum (BAlq), beryllium bis(ben-zoquinolin-10-olate) ($Bebq_2$), 9,10-di(naphthalene-2-yl) anthracene (ADN), 1,3-bis[3,5-di(pyridine-3-yl)phenyl] benzene (BmPyPhB), or any mixture thereof. The thickness of the electron transport layer ETL may be about 100 Å to about 1,000 Å and may be, for example, about 150 Å to about 500 Å. When the thickness of the electron transport layer ETL satisfies the above-described range, satisfactory electron transport properties may be obtained without substantial increase of a driving voltage.

When the electron transport region ETR includes the electron injection layer EIL, the electron transport region ETR may use a metal halide (such as LiF, NaCl, CsF, RbCl, Rbl, and/or CuI), a lanthanide metal (such as ytterbium (Yb)), a metal oxide (such as $Li_2O$ and/or BaO), or lithium quinolate (LiQ). However, an embodiment of the present disclosure is not limited thereto. The electron injection layer EIL may also be formed using a mixture of an electron transport material and an insulating organo metal salt. The organo metal salt may be a material having an energy band gap of about 4 eV or more. The organo metal salt may include, for example, metal acetates, metal benzoates, metal acetoacetates, metal acetylacetonates, and/or metal stearates. The thickness of the electron injection layer EIL may be about 1 Å to about 100 Å, or about 3 Å to about 90 Å. When the thickness of the electron injection layer EIL satisfies the above described range, satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP) or 4,7-diphenyl-1,10-phenanthroline (Bphen). However, an embodiment of the present disclosure is not limited thereto.

The second electrode EL2 is disposed on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be formed using a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or any mixture thereof (for example, a mixture of Ag and Mg). In some embodiments, the second electrode EL2 may have a multi-layered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the luminescence device 10 of an embodiment. The capping layer CPL may include, for example, α-NPD, NPB, TPD, m-MT-DATA, Alq3, CuPc, N4, N4,N4', N4'-tetra (biphenyl-4-yl) biphenyl-4,4'-diamine (TPD15), 4,4', 4"-tris(carbazol-9-yl) triphenylamine (TCTA), N,N'-bis(naphthalen-1-yl), etc.

The above-described compound of an embodiment may be included in an organic layer other than the hole transport region HTR as a material for the luminescence device 10. The luminescence device 10 according to an embodiment of the present disclosure may include the above-described polycyclic compound in at least one organic layer disposed between the first electrode EL1 and the second electrode EL2, and/or in the capping layer CPL disposed on the second electrode EL2.

In the luminescence device 10, according to the application of voltages to the first electrode EL1 and second electrode EL2, respectively, holes injected from the first electrode EL1 may move via the hole transport region HTR to the emission layer EML, and electrons injected from the second electrode EL2 may move via the electron transport region ETR to the emission layer EML. The electrons and the holes may recombine in the emission layer EML to produce excitons, and the excitons may emit light upon transitioning from an excited state to the ground state.

Hereinafter, the compound according to an embodiment of the present disclosure and the luminescence device of an embodiment including the compound of an embodiment will be particularly explained referring to embodiments and comparative embodiments. The following embodiments are only illustrations to assist the understanding of the present disclosure, and the scope of the present disclosure is not limited thereto.

1. Synthetic Examples

The polycyclic compound of an embodiment may be synthesized, for example, by the following synthetic methods. However, synthetic methods for the polycyclic compound of an embodiment is not limited thereto.

1-1. Synthesis of Compound 1-1

Polycyclic Compound 1-1 of an embodiment may be synthesized, for example, by Reaction 1:

Reaction 1

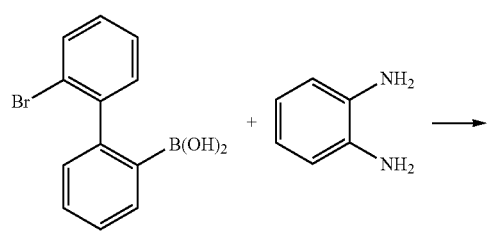

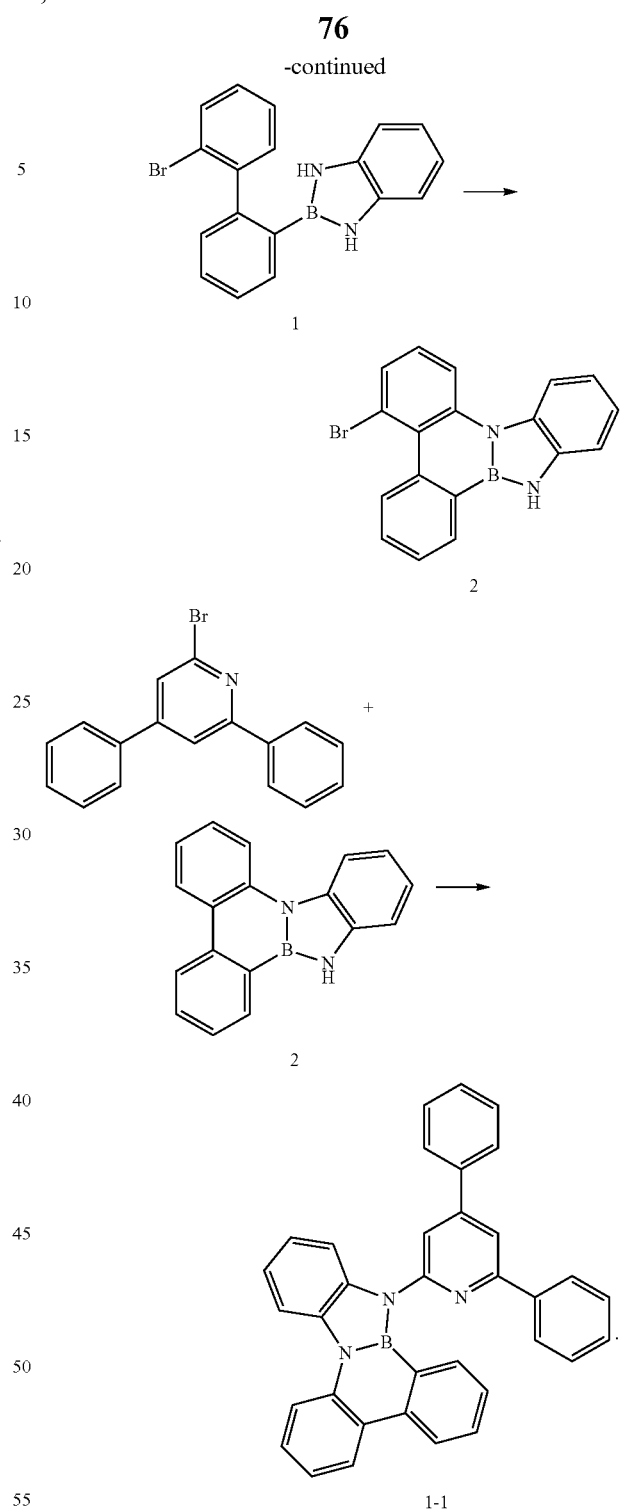

Synthesis of Intermediate 1

In a One-Neck, 1 L Flask, 30.0 g (108.0 Mmol) of 2-Bromobiphenyl-2'-Boronic acid, 14.1 g (130.0 mmol) of o-phenylenediamine, and 430 mL of toluene were refluxed and stirred using a dean-stark trap for about 24 hours. After cooling the reaction product, solvents were completely removed, and the crude product thus obtained was separated by silica gel column chromatography (methylene chloride: hexane=1:4) to obtain 35.5 g (yield: 94.1%) of a white solid compound (Intermediate 1).

Synthesis of Intermediate 2

In a one-neck, 2 L flask, 35.5 g (102.0 mmol) of Intermediate 1, 5.9 g (10.2 mmol) of Pd(dba)₂, 20 mL (40.7 mmol, a 50 wt % toluene solution) of P(tBu)₃, 14.7 g (153.0 mmol) of NaO Bu, and 850 mL of xylene were stirred at about 110° C. for about one hour. After cooling the reaction product, impurities were removed through Celite filtration. After removing the solvents, the resultant material was dissolved in 800 mL of boiling chloroform and then, separated by silica gel column chromatography (trichloromethane: hexane=5:1). The solid thus obtained was filtered using methanol to obtain 18.8 g (yield: 68.9%) of a white solid compound (Intermediate 2).

Synthesis of Compound 1-1

In a one-neck, 250 mL flask, 2.1 g (6.6 mmol) of 2-bromo-4,6-diphenylpyridine, 1.9 g (6.9 mmol) of Intermediate 2, 0.2 g (0.3 mmol) of Pd(dba)₂, 0.3 mL (0.7 mmol, a 50 wt % toluene solution) of P(tBu)₃, 1.3 g (13.2 mmol) of NaOtBu, and 44 mL of xylene were refluxed and stirred for about 30 minutes. After cooling the reaction product to room temperature, impurities were removed through Celite filtration. After completely removing the solvents, the resultant material was separated by silica gel column chromatography (methylene chloride: hexane=1:2). The solid thus obtained was filtered using acetone and methanol to obtain 2.3 g (yield: 54.3%) of Compound 1-1 as a yellow solid.

1-2. Synthesis of Compound 1-12

Polycyclic Compound 1-12 of an embodiment may be synthesized, for example, by the following Reaction 2:

Reaction 2

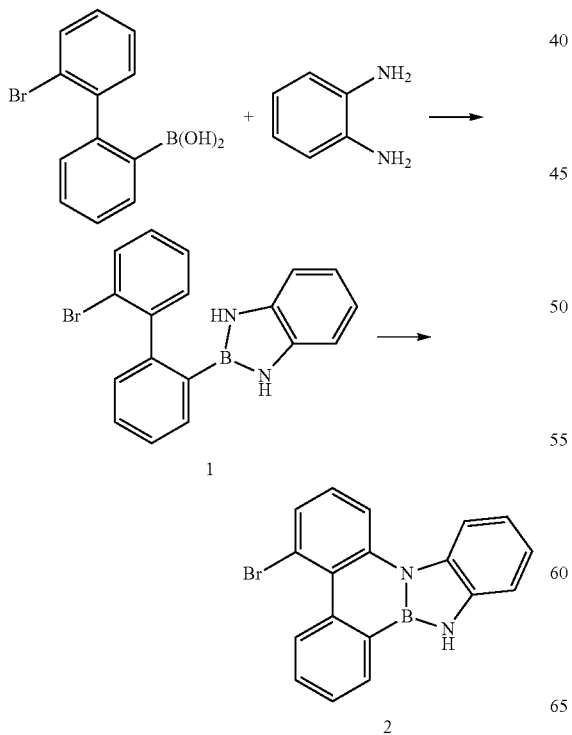

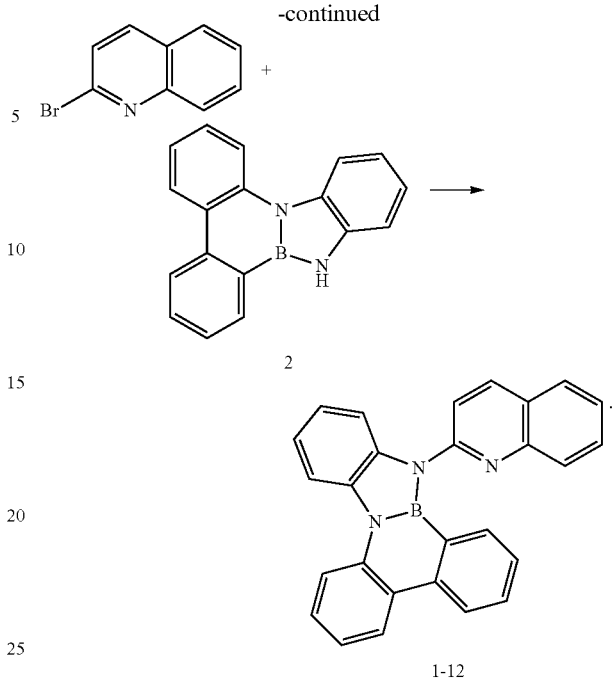

Synthesis of Compound 1-12

In a one-neck, 250 mL flask, 1.4 g (6.6 mmol) of 2-bromoquinoline, 1.9 g (6.9 mmol) of Intermediate 2, 0.2 g (0.3 mmol) of Pd(dba) 2, 0.3 mL (0.7 mmol, a 50 wt % toluene solution) of P(tBu)₃, 1.3 g (13.2 mmol) of NaO Bu and 44 mL of xylene were refluxed and stirred for about 30 minutes. The reaction product was cooled to room temperature, and impurities were removed through Celite filtration. The solvents were removed, and the crude product thus obtained was separated by silica gel column chromatography (methylene chloride: hexane=1:2). The solid thus obtained was filtered using acetone and methanol to obtain 1.7 g (yield: 51.5%) of Compound 1-12 as a yellow solid.

1-3. Synthesis of Compound 1-20

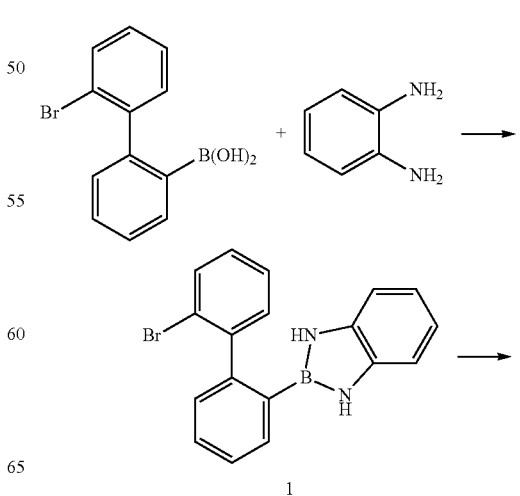

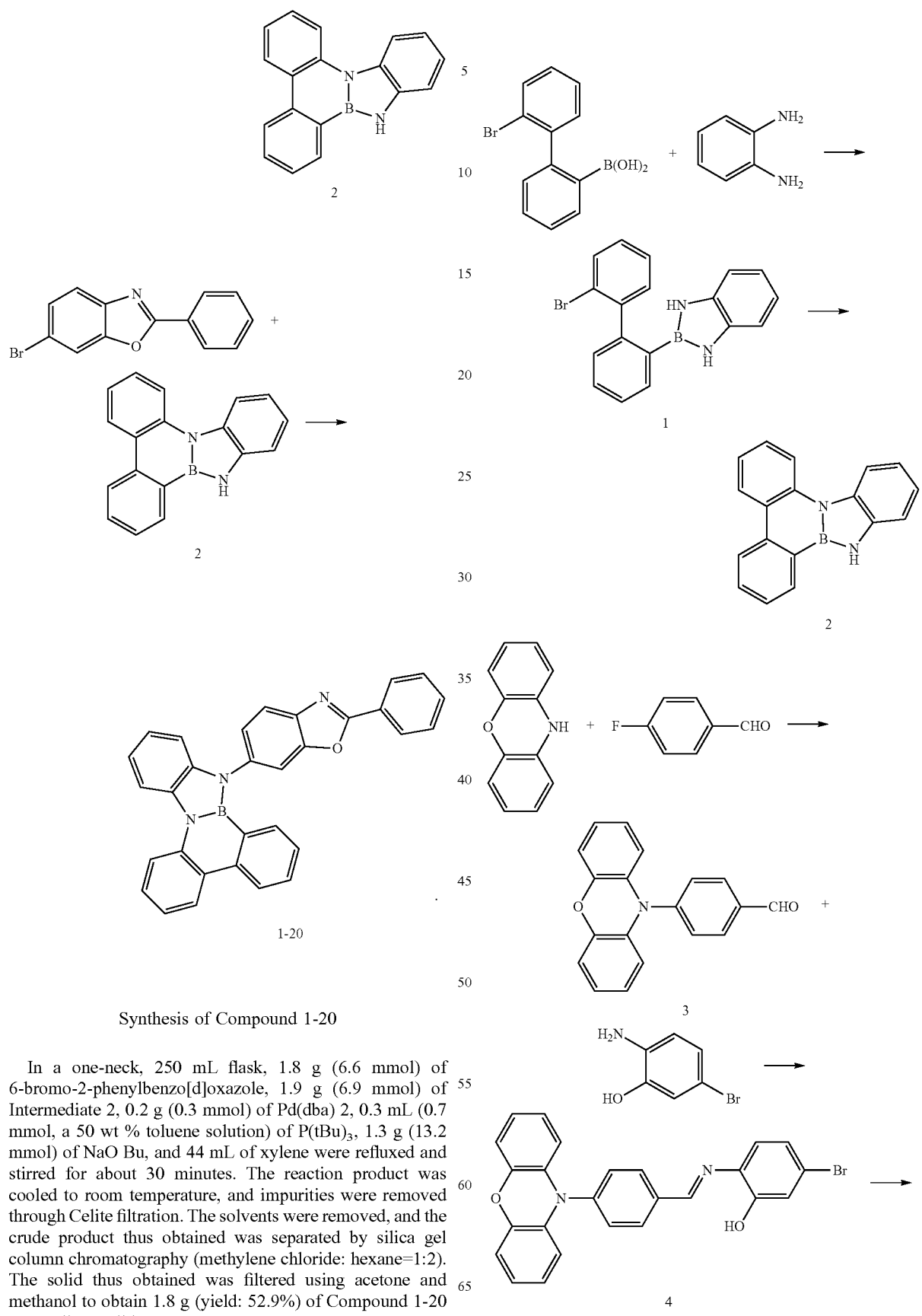

1-4. Synthesis of Compound 1-32

Synthesis of Compound 1-20

In a one-neck, 250 mL flask, 1.8 g (6.6 mmol) of 6-bromo-2-phenylbenzo[d]oxazole, 1.9 g (6.9 mmol) of Intermediate 2, 0.2 g (0.3 mmol) of Pd(dba) 2, 0.3 mL (0.7 mmol, a 50 wt % toluene solution) of P(tBu)$_3$, 1.3 g (13.2 mmol) of NaO Bu, and 44 mL of xylene were refluxed and stirred for about 30 minutes. The reaction product was cooled to room temperature, and impurities were removed through Celite filtration. The solvents were removed, and the crude product thus obtained was separated by silica gel column chromatography (methylene chloride: hexane=1:2). The solid thus obtained was filtered using acetone and methanol to obtain 1.8 g (yield: 52.9%) of Compound 1-20 as a yellow solid.

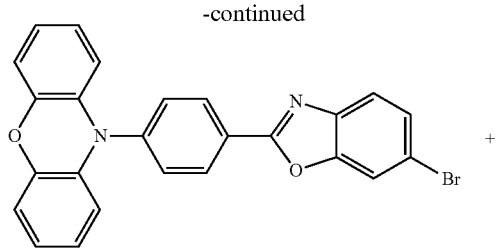

5

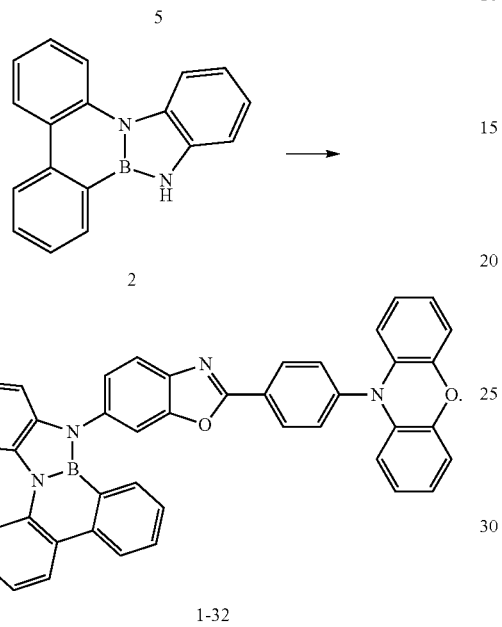

2

→

1-32

Synthesis of Intermediate 3

To a one-neck, 250 ml flask, 30.0 g (163.8 mmol) of 10H-phenoxazine, 24.4 g (196.5 mmol) of 4-fluorobenzaldehyde, 67.9 g (491.3 mmol) of $K_2CO_3$, and 2,500 mL of DMF were added and reacted at about 140° C. for two days. After the reaction was complete, the reaction product was cooled to room temperature, ice water was added thereto, and the resultant mixture was stirred. The solid thus obtained was filtered and washed with water. Then, the solid was dissolved in ethyl acetate and the resultant solution was distilled under reduced pressure to obtain a solid. The solid thus obtained was dissolved in dichloromethane and solidified with ethanol to obtain 15.0 g (yield: 31.9%) of a yellow solid compound (Intermediate 3).

Synthesis of Intermediate 4

In one-neck, 1 L flask, 13.0 g (45.3 mmol) of Intermediate 3 and 8.5 g (45.3 mmol) of 2-amino-5-bromophenol were mixed with 260 mL of ethanol, followed by stirring at about 70° C. for about 12 hours. After the reaction was complete, the reaction product was cooled to room temperature and distilled under reduced pressure to obtain 20.7 g (crude) of a yellow solid compound (Intermediate 4). (The subsequent reaction was performed without additional separation or purification.)

Synthesis of Intermediate 5

In a one-neck, 1 L flask, 20.7 g (45.3 mmol) of Intermediate 4 was dissolved in 260 mL of dichloromethane. Then, 12.3 g (54.3 mmol) of 2,3-dichloro-5,6-dicyano-p-benzoquinone (DDQ) was added thereto, followed by stirring at about 40° C. for about 12 hours. The reaction product was separated by silica gel column chromatography ($CHCl_3$) and then dissolved in dichloromethane. Ethanol was slowly added thereto dropwisely and the resultant mixture was stirred. The solid thus formed was filtered to obtain 17.0 g (yield: 82.6%) of a yellow solid compound (Intermediate 5).

Synthesis of Compound 1-32

In a one-neck, 250 mL flask, 3.0 g (6.6 mmol) of Intermediate 5, 1.9 g (6.9 mmol) of Intermediate 2, 0.2 g (0.3 mmol) of Pd(dba) 2, 0.3 mL (0.7 mmol, a 50 wt % toluene solution) of $P(tBu)_3$, 1.3 g (13.2 mmol) of NaO Bu, and 44 mL of xylene were refluxed and stirred about 30 minutes. The reaction product was cooled to room temperature, and impurities were removed through Celite filtration. The solvents were removed, and the crude product thus obtained was separated by silica gel column chromatography (methylene chloride: hexane=1:2). The solid thus obtained was filtered using acetone and methanol to obtain 2.5 g (yield: 58.9%) of Compound 1-32 as a yellow solid.

1-5. Synthesis of Compound 1-36

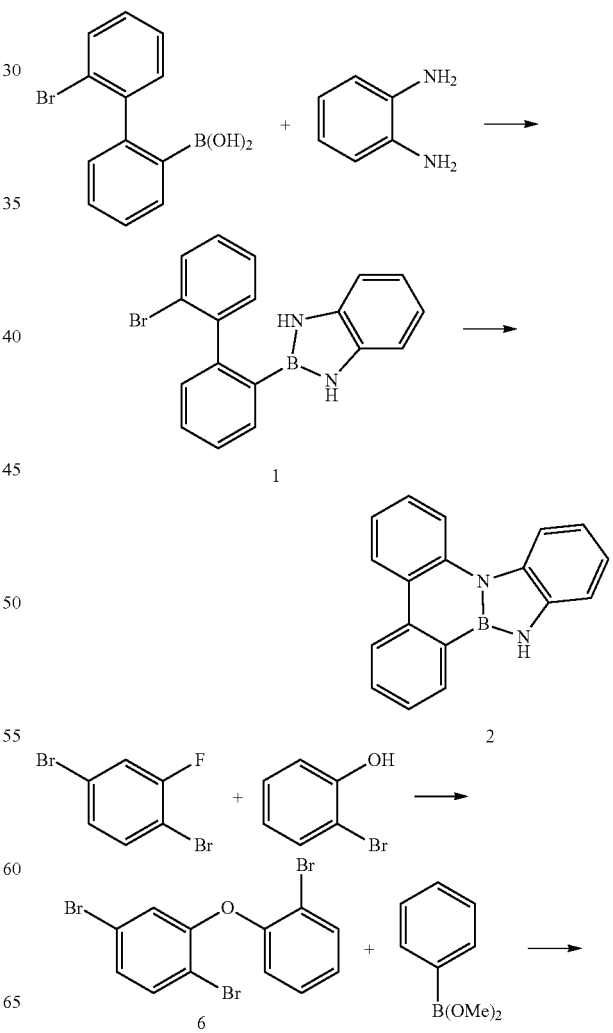

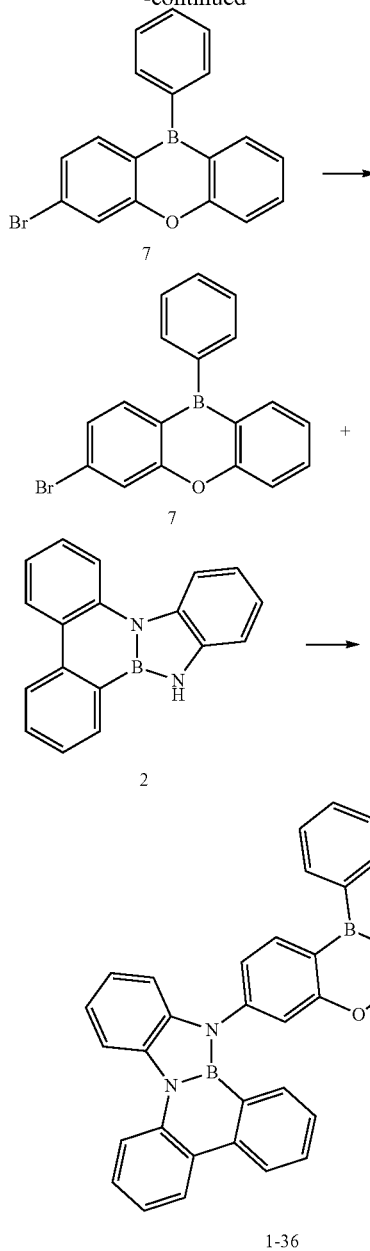

1-36

Synthesis of Intermediate 6

To a one-neck, 250 ml flask, 49.0 g (0.2 mol) of 1,4-dibromo-2-fluorobenzene, 50.0 g (0.3 mol) of 2-bromophenol, 52.5 g (0.4 mol) of K₂CO₃, and 19 mL of triglyme were added, followed by refluxing and stirring at about 190° C. for about 12 hours. When the reaction was complete (as confirmed by e.g., NMR or thin film chromatography), the reaction product was cooled to room temperature, filtered using Celite, and washed with dichloromethane. The solvents were removed under reduced pressure, and the mixture thus obtained was separated by silica gel column chromatography (hexane: trichloromethane=20:1) to obtain 62.0 g (yield: 80.2%) of a colorless liquid compound (Intermediate 6).

Synthesis of Intermediate 7

In a three-neck, 500 mL flask, 22.0 g (54.0 mmol) of Intermediate 6 was dissolved in 52 mL of anhydrous diethyl ether and cooled to about 0° C. At the same temperature, 44 mL (111.0 mmol) of n-butyllithium (n-BuLi, a 2.5 M hexane solution) was slowly added thereto dropwisely. The reaction product was stirred at about 0° C. for about 10 minutes, and then 8.1 g (54 mmol) of dimethyl phenylboronate was slowly added thereto dropwisely. The temperature was slowly elevated to about 30-40° C., and the reaction produce was stirred for about 2 hours. The reaction product was cooled to room temperature, and the solvents were removed under reduced pressure. Distilled water was dropwisely added to the concentrated solution, and the resultant solution was extracted with toluene. The separated organic layer was dried with anhydrous sodium sulfate, and the solvents were removed under reduced pressure. The mixture thus obtained was separated by silica gel column chromatography (hexane: methylene chloride=9:1) to obtain 11.0 g (yield: 54.0%) of a white solid compound (Intermediate 7).

Synthesis of Compound 1-36

To a one-neck, 250 mL flask, 1.9 g (6.9 mmol) of Intermediate 2, 2.2 g (6.6 mmol) of Intermediate 7, 0.2 g (0.3 mmol) of Pd(dba)₂, 0.3 mL (0.7 mmol, a 50 wt % toluene solution) of P(tBu)₃, 1.3 g (13.2 mmol) of NaOtBu, and 44 mL of xylene were refluxed and stirred for about 30 minutes. The reaction product was cooled to room temperature, and impurities were removed through Celite filtration. The solvents were completely removed, and the crude product thus obtained was separated by silica gel column chromatography (methylene chloride: hexane=1:2). The solid thus obtained was filtered using acetone and methanol to obtain 2.2 g (yield: 42.2%) of Compound 1-36 as a yellow solid.

1-6. Synthesis of Compound 1-45

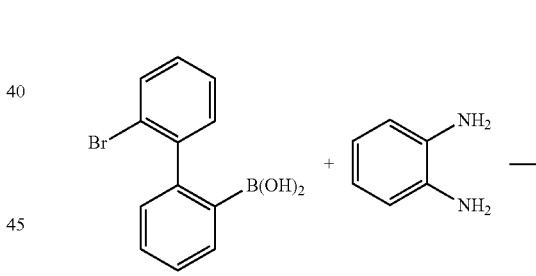

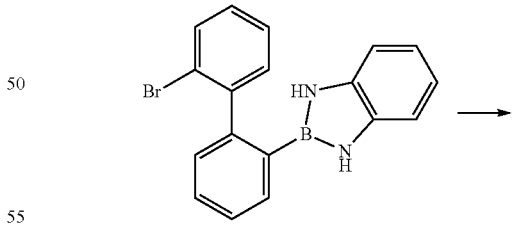

1

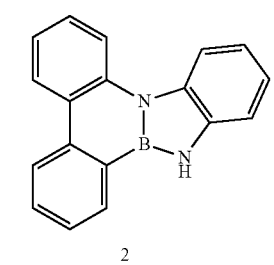

2

85

-continued

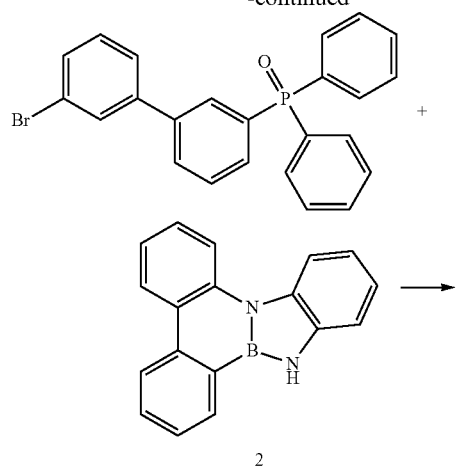

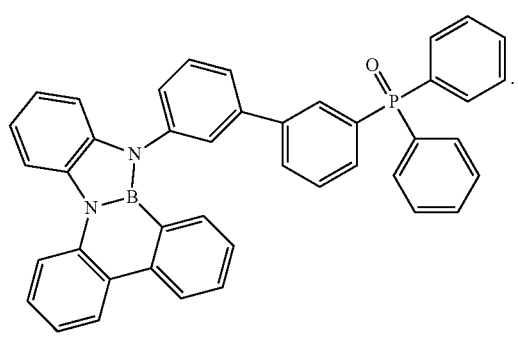
1-45

Synthesis of Compound 1-45

In a one-neck, 250 ml flask, 2.9 g (6.6 mmol) of 3'-bromo-([1,1'-biphenyl]-3-yl)diphenylphosphine oxide, 1.9 g (6.9 mmol) of Intermediate 2, 0.2 g (0.3 mmol) of Pd(dba)$_2$, 0.3 mL (0.7 mmol, a 50 wt % toluene solution) of P(tBu)$_3$, 1.3 g (13.2 mmol) of NaO Bu, and 44 mL of xylene were refluxed and stirred for about 30 minutes. The reaction product was cooled to room temperature, and the impurities were removed through Celite filtration. After completely removing solvents, the crude product thus obtained was separated by silica gel column chromatography (methylene chloride: hexane=1:2). The solid thus obtained was filtered using acetone and methanol to obtain 1.9 g (yield: 46.4%) of Compound 1-45 as a yellow solid.

1-7. Synthesis of Compound 1-48

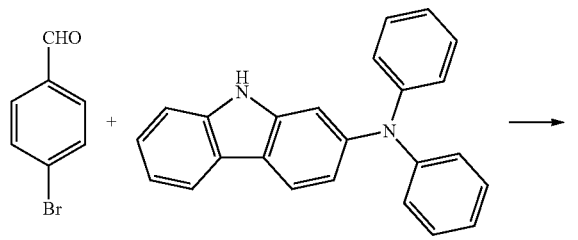

86

-continued

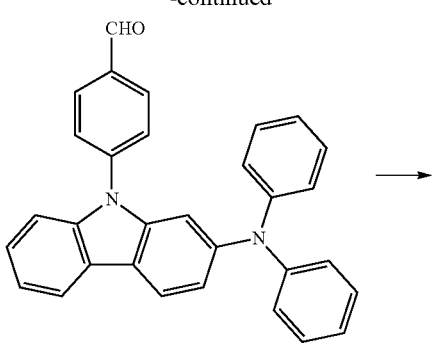
8

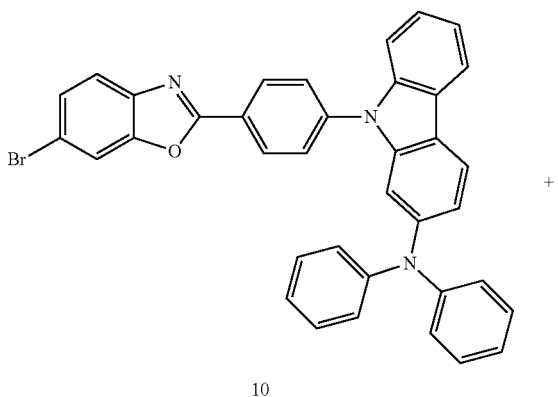

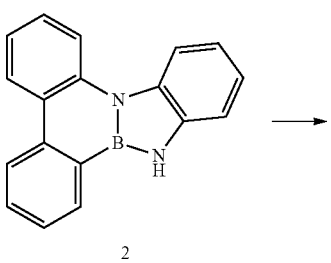
2

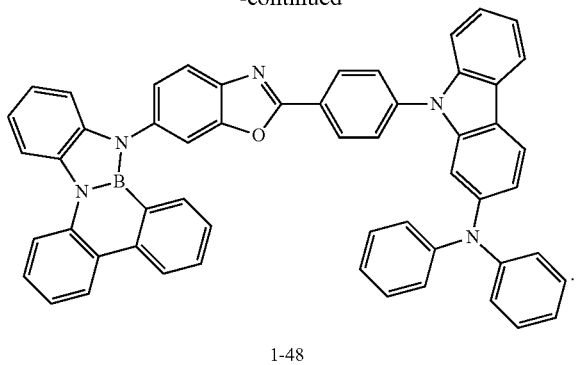

1-48

Synthesis of Intermediate 8

In a one-neck, 250 mL flask, 6.0 g (32.4 mmol) of 4-bromobenzaldehyde, 10.8 g (32.4 mmol) of N,N-diphenyl-(9H-carbazol-2-yl)amine, 0.51 g (2.3 mmol) of Pd(OAc)$_2$, 2.0 g (4.9 mmol) of S-Phos, 26.4 g (81.1 mmol) of Cs$_2$CO$_3$, and 160 mL of toluene were stirred at about 100° C. for about 3 hours. The reaction product was cooled to room temperature, and impurities were removed through Celite filtration. The solvents were completely removed, and the crude product thus obtained was separated by silica gel column chromatography (methylene chloride: hexane=1:2) to obtain 14.1 g (yield: 99.8%) of a yellow solid compound (Intermediate 8).

Synthesis of Intermediate 9

In a one-neck, 500 mL flask, 14.1 g (32.2 mmol) of Intermediate 8, 9.1 g (48.3 mmol) of 2-amino-5-bromophenol, and 180 mL of ethanol were refluxed and stirred for about 24 hours. When the reaction was complete (as confirmed by e.g., NMR or thin film chromatography), the reaction product was filtered while hot to obtain 17.2 g (yield: 87.8%) of a yellow solid compound (Intermediate 9).

Synthesis of Intermediate 10

While stirring 17.2 g (28.3 mmol) of Intermediate 9 and 280 mL of dichloromethane at room temperature in a one-neck, 1 L flask, 7.1 g (31.1 mmol) of 2,3-dichloro-5,6-dicyano-p-benzoquinone (DDQ) was slowly added. Stirring was performed at room temperature for about 3 hours or more and then, 300 mL of methylene chloride was slowly added thereto to completely dissolve all materials. The resultant solution was separated by silica gel column chromatography (100% methylene chloride). The resultant product was filtered with acetone to obtain 16.2 g (yield: 94.8%) of a white solid compound (Intermediate 10).

Synthesis of Compound 1-48

In a one-neck, 250 mL flask, 3.2 g (5.3 mmol) of Intermediate 10, 1.4 g (5.3 mmol) of Intermediate 2, 0.2 g (0.3 mmol) of Pd(dba) 2, 0.1 mL (0.5 mmol, a 50 wt % toluene solution) of P(tBu)$_3$, 1.01 g (10.6 mmol) of NaO Bu, and 26 mL of xylene were stirred at about 100° C. for about 1 hour. The reaction product was cooled to room temperature and impurities were removed through Celite filtration. The solvents were completely removed, and the crude product thus obtained was separated by silica gel column chromatography (methylene chloride: hexane=1:1). The solid thus obtained was completely dissolved in 200 mL of boiling ethyl acetate, and then solidified (e.g., precipitated) with 100 ml of methanol. The solid thus obtained was filtered to obtain 1.7 g (yield: 40.2%) of Compound 1-48 as a yellow solid.

1-8. Synthesis of Compound 2-1

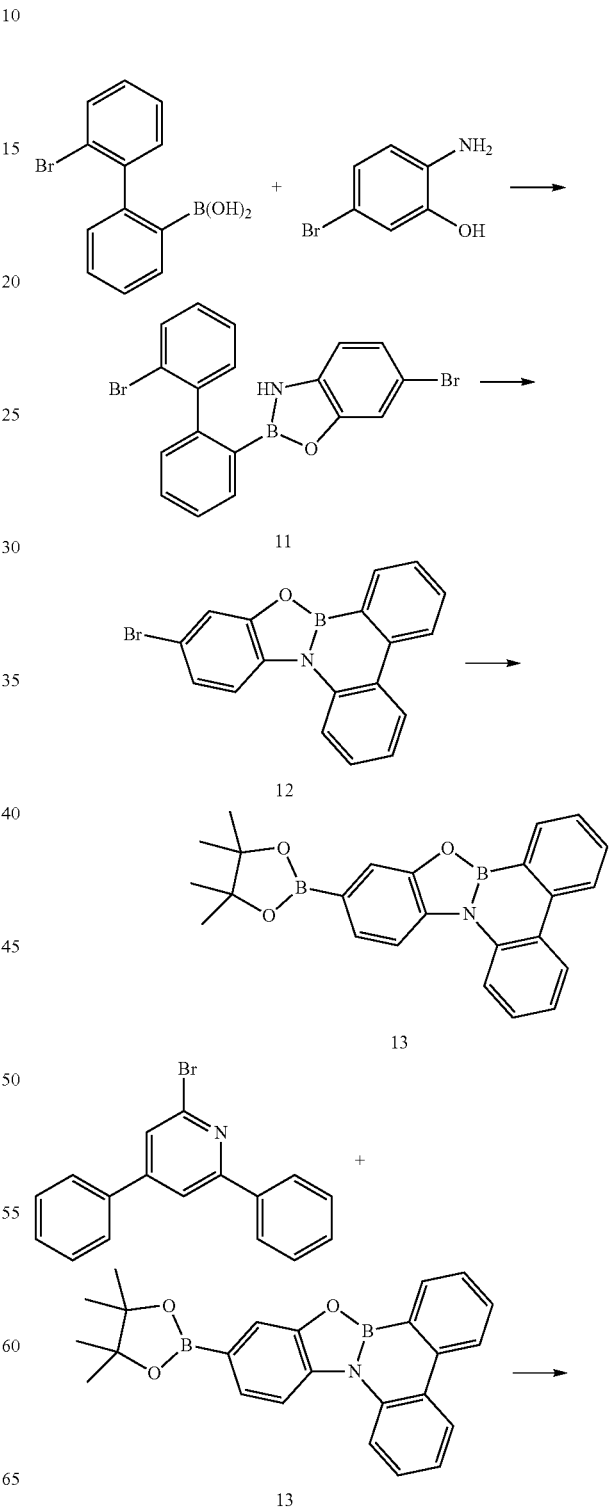

-continued

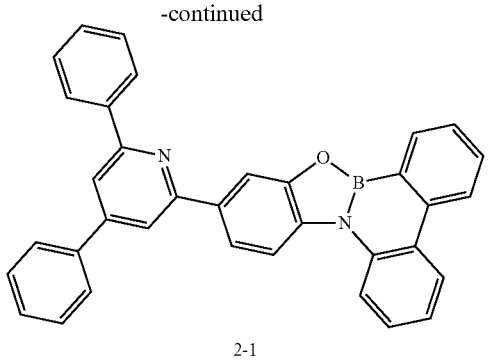

2-1

Synthesis of Intermediate 11

In a one-neck, 1 L flask, 10.0 g (36.1 mmol) of 2-bromobiphenyl-2'-boronic acid, 3.7 g (19.7 mmol) of 2-amino-5-bromophenol, and 120 mL of toluene were refluxed and stirred for about 24 hours using a Dean-Stark trap. The reaction product was cooled, the solvents were completely removed, and the crude product thus obtained was separated by silica gel column chromatography (methylene chloride: hexane=1:4) to obtain 4.2 g (yield: 34.8%) of a white solid compound (Intermediate 11).

Synthesis of Intermediate 12

In a one-neck, 2 L flask, 4.2 g (9.8 mmol) of Intermediate 11, 0.3 g (0.5 mmol) of $Pd(dba)_2$, 0.4 g (1.0 mmol, a 50 wt % toluene solution) of $P(tBu)_3$, 1.7 g (17.6 mmol) of NaOtBu, and 50 mL of xylene were stirred at about 110° C. for about one hour. After cooling the reaction product to room temperature, impurities were removed through Celite filtration. The solvents were removed, and the resultant material was dissolved in 80 mL of boiling chloroform and separated by silica gel column chromatography (trichloromethane: hexane=5:1). The solid thus obtained was filtered using methanol to obtain 1.7 g (yield: 49.9%) of a white solid compound (Intermediate 12).

Synthesis of Intermediate 13

A mixture of 1.7 g (4.9 mmol) of Intermediate 12, 1.9 g (7.3 mmol) of bis(pinacolato)diboron, 0.2 g (244.3 μmol) of $Pd(dppf)Cl_2·CH_2Cl_2$, 0.9 g (8.8 mmol) of potassium acetate (KOAc), and 20 mL of 1,4-dioxane was stirred at about 90° C. for about 12 hours. The reaction product was cooled to room temperature and concentrated. The residue thus concentrated was dissolved in dichloromethane and washed with water. The organic layer was separated, dried with anhydrous sodium sulfate, and filtered. The filtrate was concentrated and the mixture thus concentrated was separated by column chromatography to obtain 1.8 g (yield: 94.3%) of a white solid compound (Intermediate 13).

Synthesis of Compound 2-1

A mixture of 1.5 g (4.6 mmol) of 2-bromo-4,6-diphenylpyridine, 1.8 g (4.6 mmol) of Intermediate 13, 0.3 g (230.6 μmol) of $Pd(PPh_3)_4$, 5 mL (9.2 mmol) of 2 M sodium carbonate, 20 mL of toluene, and 10 mL of ethanol was refluxed and stirred for about 12 hours. The reaction product was cooled to room temperature, diluted with 50 mL of toluene, and washed with water. The organic layer was separated, dried with anhydrous magnesium sulfate, and filtered. The filtrate was concentrated and the concentrated mixture thus obtained was separated by column chromatography to obtain 1.5 g (yield: 65.4%) of Compound 2-1 as a solid.

1-9. Synthesis of Compound 2-12

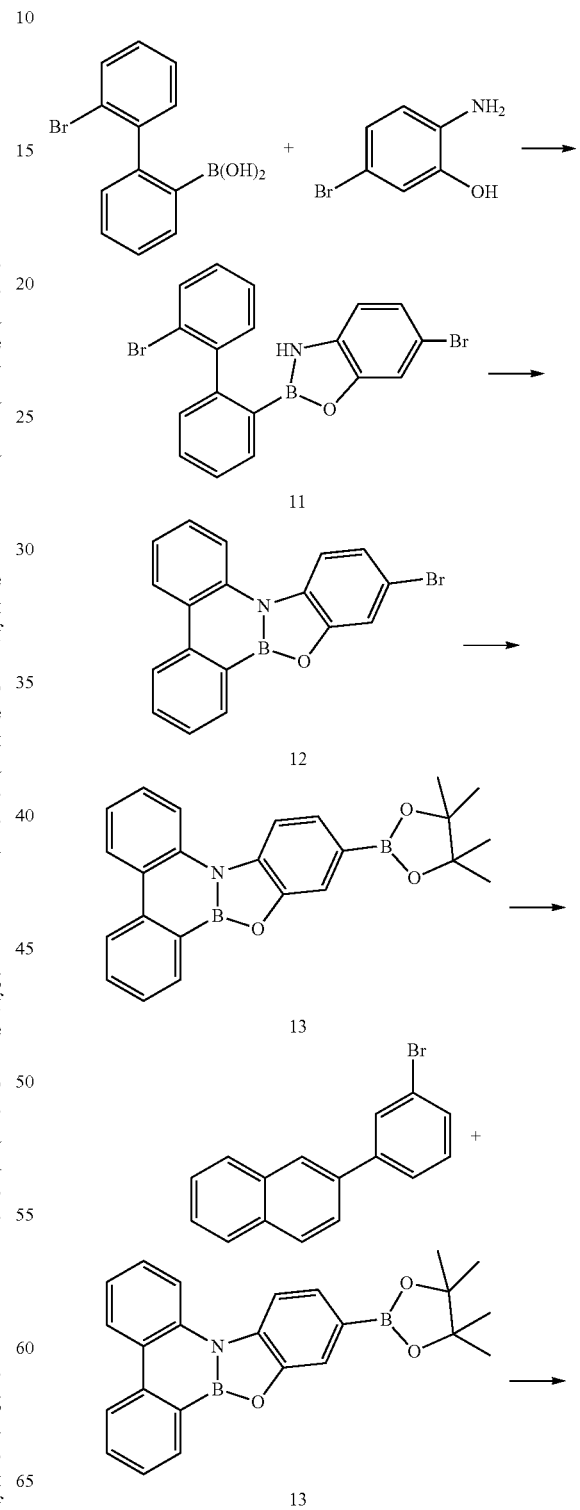

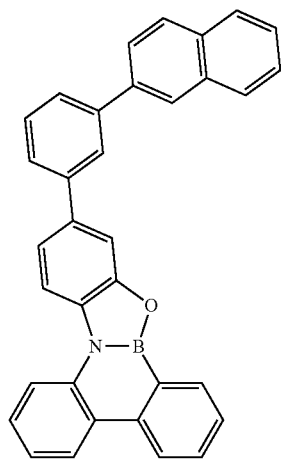

2-12

Synthesis of Compound 2-12

A mixture of 1.1 g (4.6 mmol) of 2-(3-bromophenyl)naphthalene, 1.8 g (4.6 mmol) of Intermediate 13, 0.3 g (230.6 μmol) of Pd(PPh$_3$)$_4$, 5 mL (9.2 mmol) of 2 M sodium carbonate, 20 mL of toluene and 10 mL of ethanol was refluxed and stirred for about 12 hours. The reaction product was cooled to room temperature, diluted with 50 mL of toluene, and washed with water. The organic layer was separated, dried with anhydrous magnesium sulfate, and filtered. The filtrate was concentrated, and the concentrated mixture thus obtained was separated by column chromatography to obtain 1.6 g (yield: 73.8%) of Compound 2-12 as a solid.

1-10. Synthesis of Compound 2-13

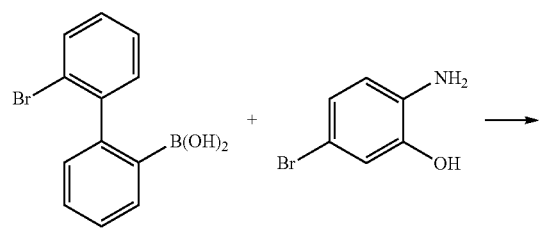

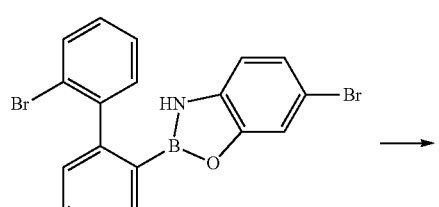

11

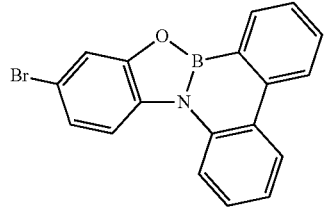

12

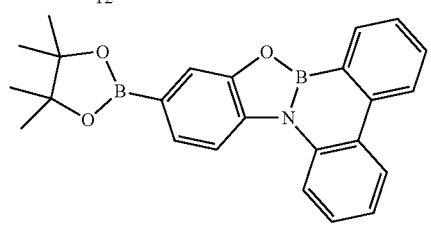

13

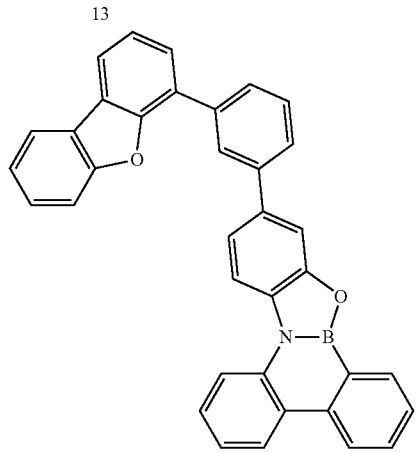

13

2-13

Synthesis of Compound 2-13

A mixture of 1.5 g (4.6 mmol) of 4-(3-bromophenyl)dibenzo[b,d]furan, 1.8 g (4.6 mmol) of Intermediate 13, 0.3 g (230.6 μmol) of Pd(PPh$_3$)$_4$, 5 mL (9.2 mmol) of 2 M sodium carbonate, 20 mL of toluene, and 10 mL of ethanol was refluxed and stirred for about 12 hours. The reaction product was cooled to room temperature, diluted with 50 mL of toluene, and washed with water. The organic layer was separated, dried with anhydrous magnesium sulfate, and filtered. The filtrate was concentrated, and the concentrated mixture thus obtained was separated by column chromatography to obtain 1.5 g (yield: 63.8%) of Compound 2-13 as a solid.

1-11. Synthesis of Compound 2-20

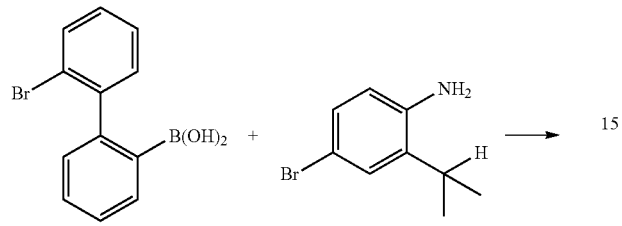

14

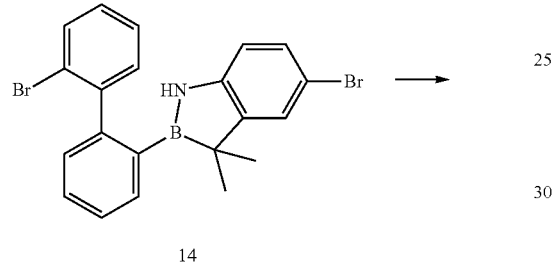

15

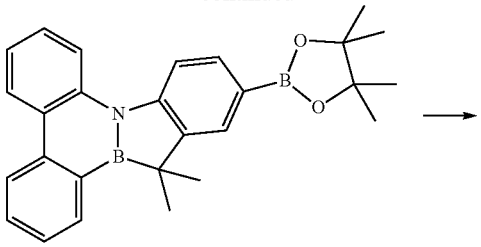

16

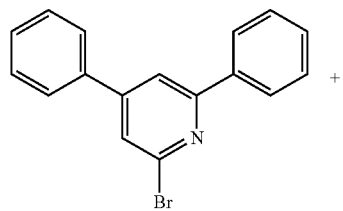

+

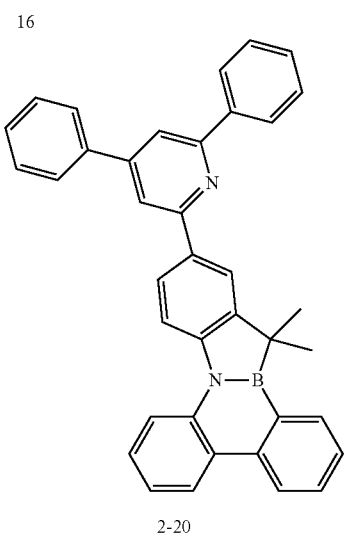

16

2-20

Synthesis of Intermediate 14

In a one-neck, 1 L flask, 10.0 g (36.1 mmol) of 2-bromobiphenyl-2'-boronic acid, 7.2 g (33.7 mmol) of 4-bromo-2-isopropylaniline, and 120 mL of toluene were refluxed and stirred for about 24 hours using a Dean-Stark trap. The reaction product was cooled, the solvents were completely removed, and the crude product thus obtained was separated by silica gel column chromatography (methylene chloride: hexane=1:4) to obtain 4.2 g (yield: 34.8%) of a white solid compound (Intermediate 14).

Synthesis of Intermediate 15

In a one-neck, 2 L flask, 4.5 g (9.8 mmol) of Intermediate 14, 0.3 g (0.5 mmol) of Pd(dba)$_2$, 0.4 g (1.0 mmol, a 50 wt % toluene solution) of P(tBu)$_3$, 1.7 g (17.6 mmol) of NaOtBu, and 50 mL of xylene were stirred at about 110° C. for about one hour. The reaction product was cooled to room temperature, and impurities were removed through Celite filtration. The solvents were removed, and the resultant material was dissolved in 80 mL of boiling chloroform and then separated by silica gel column chromatography (trichloromethane: hexane=5:1). The solid thus obtained was filtered using methanol to obtain 1.5 g (yield: 50.2%) of a white solid compound (Intermediate 15).

Synthesis of Intermediate 16

A mixture of 1.8 g (4.9 mmol) of Intermediate 15, 1.9 g (7.3 mmol) of bis(pinacolato)diboron, 0.2 g (244.3 μmol) of Pd(dppf)Cl$_2$·CH$_2$Cl$_2$, 0.9 g (8.8 mmol) of potassium acetate (KOAc), and 20 mL of 1,4-dioxane was stirred at about 90°

C. for about 12 hours. The reaction product was cooled to room temperature and concentrated. The residue thus concentrated was dissolved in dichloromethane and washed with water. The organic layer was separated, dried with anhydrous sodium sulfate, and filtered. The filtrate was concentrated, and the mixture thus concentrated was separated by column chromatography to obtain 1.9 g (yield: 93.2%) of a white solid compound (Intermediate 16).

Synthesis of Compound 2-20

A mixture of 1.9 g (4.6 mmol) of Intermediate 16, 1.5 g (4.6 mmol) of 2-bromo-4,6-diphenylpyridine, 0.3 g (230.6 μmol) of Pd(PPh$_3$)$_4$, 5 mL (9.2 mmol) of 2 M sodium carbonate, 20 mL of toluene, and 10 mL of ethanol was refluxed and stirred for about 12 hours. The reaction product was cooled to room temperature, diluted with 50 mL of toluene, and washed with water. The organic layer was separated, dried with anhydrous magnesium sulfate, and filtered. The filtrate was concentrated and the concentrated mixture thus obtained was separated by column chromatography to obtain 1.6 g (yield: 66.6%) of Compound 2-20 as a solid.

1-12. Synthesis of Compound 2-32

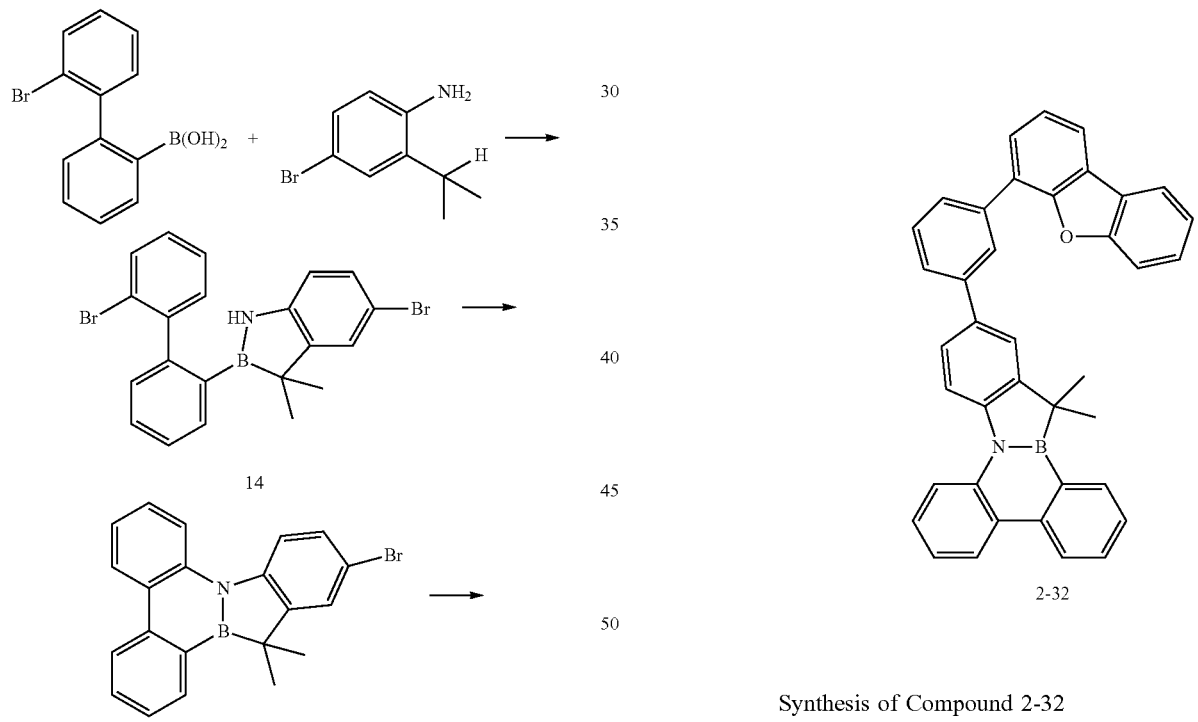

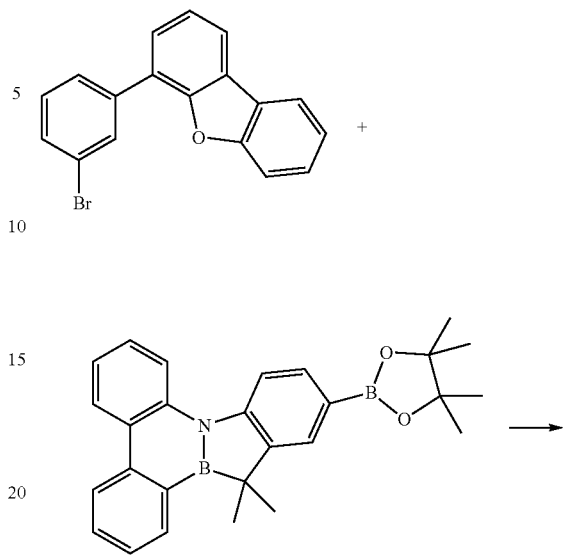

Synthesis of Compound 2-32

A mixture of 1.9 g (4.6 mmol) of Intermediate 16, 1.5 g (4.6 mmol) of 4-(3-bromophenyl)dibenzo[b,d]furan, 0.3 g (230.6 μmol) of Pd(PPh$_3$)$_4$, 5 mL (9.2 mmol) of 2 M sodium carbonate, 20 mL of toluene, and 10 mL of ethanol was refluxed and stirred for about 12 hours. The reaction product was cooled to room temperature, diluted with 50 mL of toluene, and washed with water. The organic layer was separated, dried with anhydrous magnesium sulfate, and filtered. The filtrate was concentrated, and the concentrated mixture thus obtained was separated by column chromatography to obtain 1.5 g (yield: 60.7%) of Compound 2-32 as a solid.

1-13. Synthesis of Compound 2-58

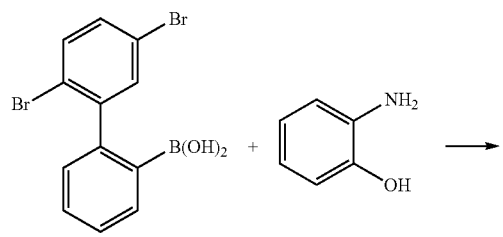

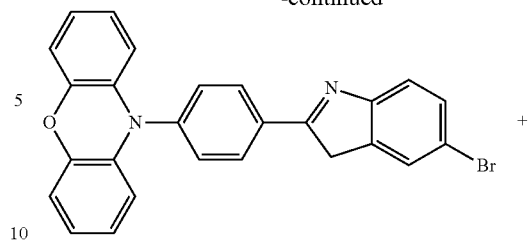

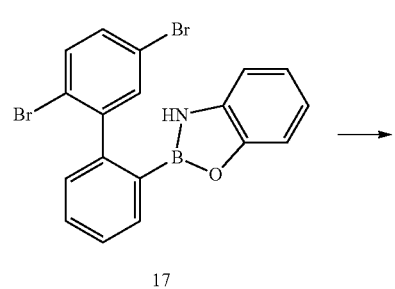

17

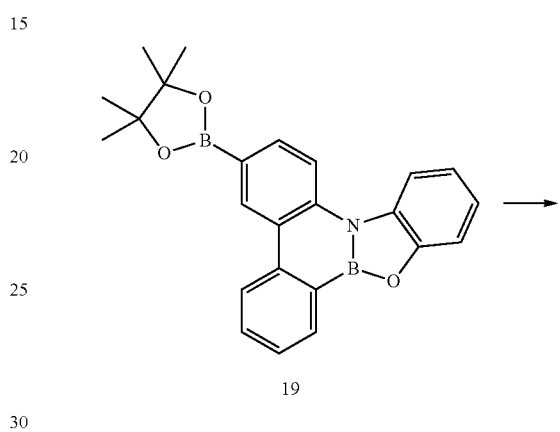

19

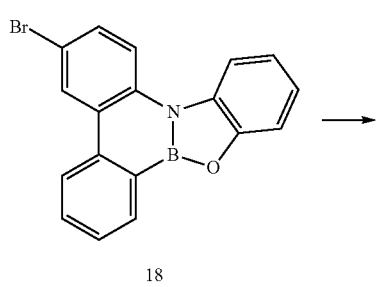

18

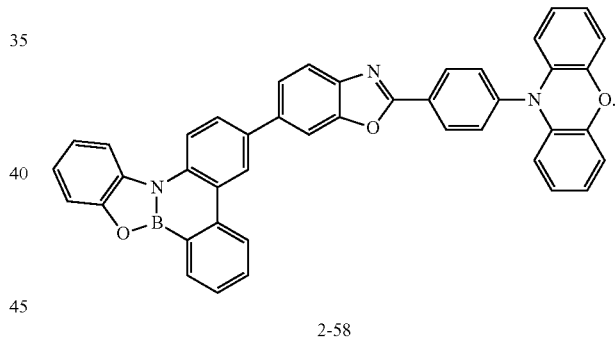

2-58

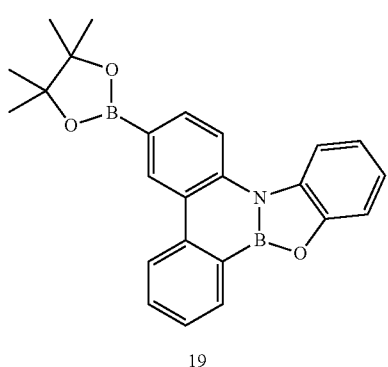

19

Synthesis of Compound 2-58

Intermediate 17 to Intermediate 19 were synthesized in the same manner as Intermediate 11 to Intermediate 13, except that 2,5-dibromobiphenyl-2'-boronic acid was used instead of 2-bromobiphenyl-2'-boronic acid, and 2-aminophenol was used instead of 2-amino-5-bromophenol.

A mixture of 2.1 g (4.6 mmol) of Intermediate 5, 1.8 g (4.6 mmol) of Intermediate 19, 0.3 g (230.6 μmol) of Pd(PPh$_3$)$_4$, 5 mL (9.2 mmol) of 2 M sodium carbonate, 20 mL of toluene, and 10 mL of ethanol was refluxed and stirred for about 12 hours. The reaction product was cooled to room temperature, diluted with 50 ml of toluene, and washed with water. The organic layer was separated, dried with anhydrous magnesium sulfate, and filtered. The filtrate was concentrated, and the concentrated mixture thus obtained was separated by column chromatography to obtain 1.5 g (yield: 50.5%) of Compound 2-58 as a solid.

2. Manufacture and Evaluation of Luminescence Device Including Polycyclic Compound
2-1. Example of Luminescence Device Including Polycyclic Compound
Example Compounds
1-1
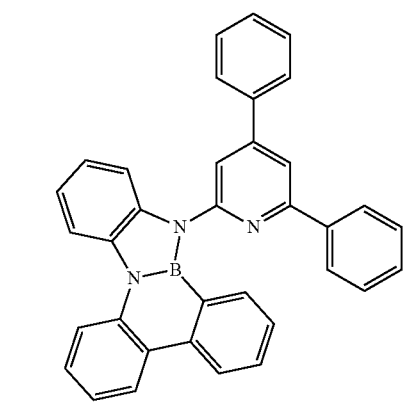
1-12
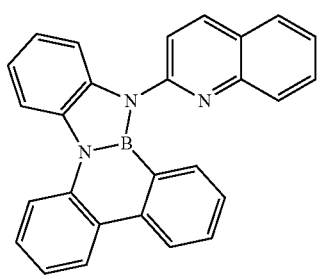
1-20
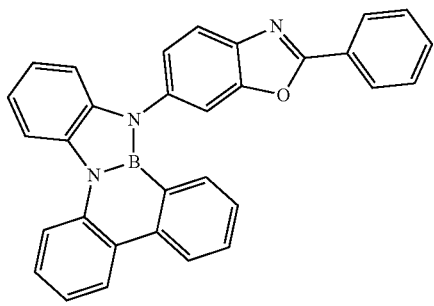
1-32
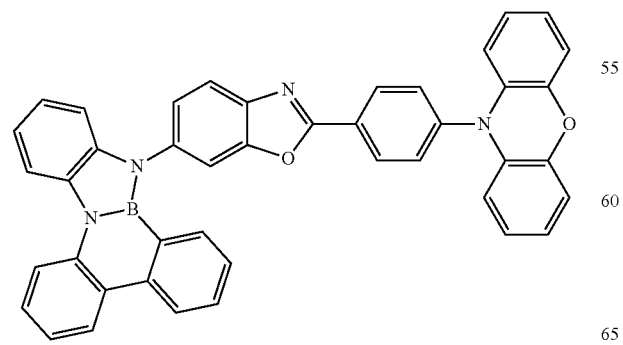
1-36
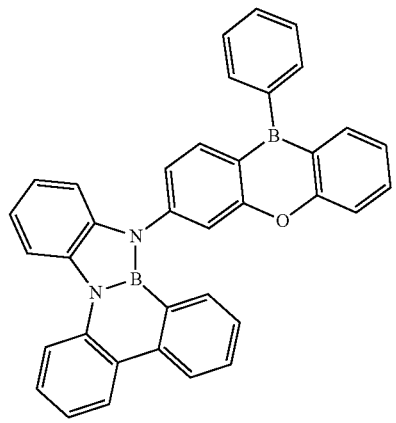
1-48
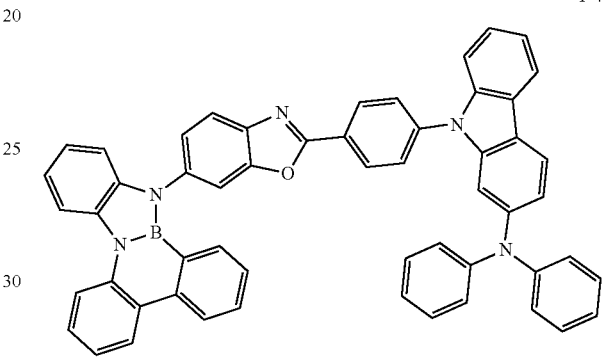
2-1
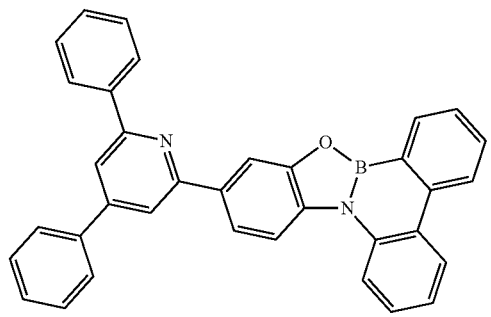
2-12
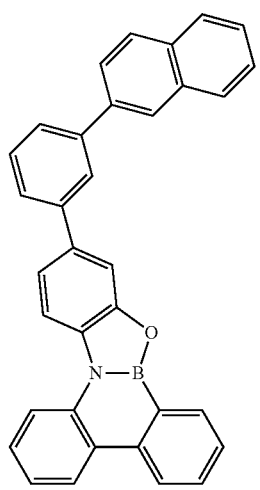

2-13
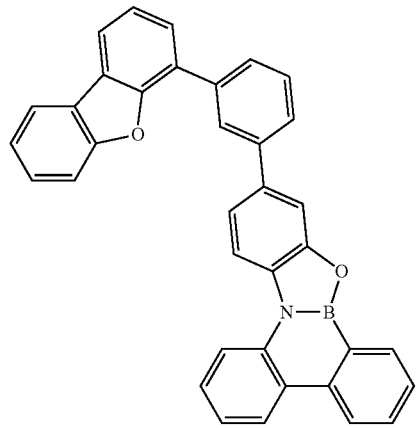
2-20
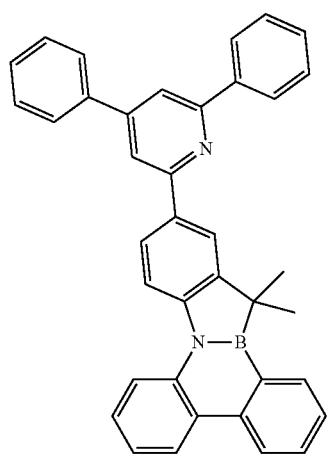
2-32
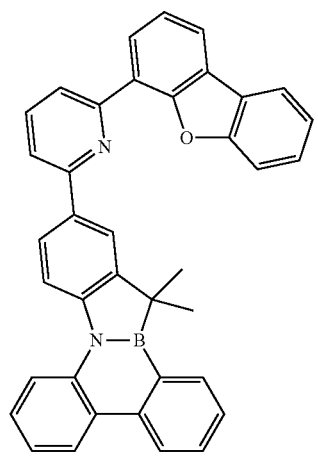
2-58
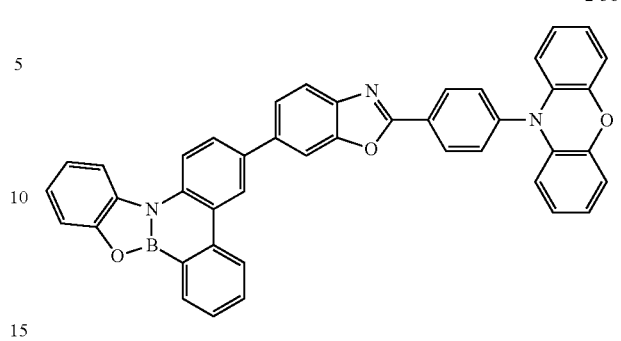
Reference Compounds
R1
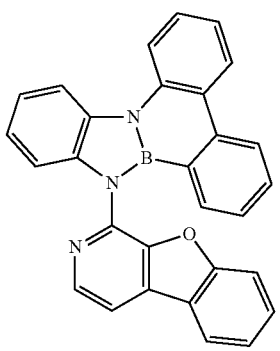
R2
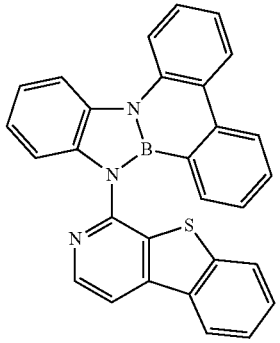
Comparative Compounds
C1
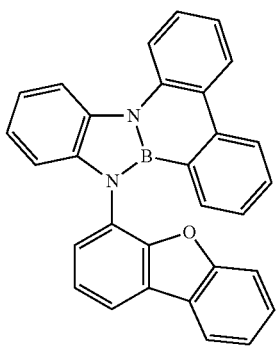

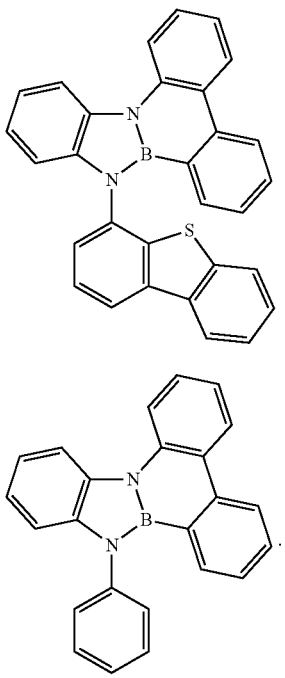

Evaluation of $\Delta E_{ST}$ Value

The difference ($\Delta E_{ST}$) between the lowest singlet excitation energy level and the lowest triplet excitation energy level of each of the Example Compounds and Reference Compounds was calculated using a nonempirical molecular orbital method (e.g., density functional theory, DFT). The calculation was conducted using B3LYP as a functional and 6-31G(d) as a basis function in Gaussian09 (Gaussian Co.).

TABLE 1

| Compound | $\Delta E_{ST}$ | Emission color |
| --- | --- | --- |
| Example Compound 1-1 | 0.01 | Green |
| Example Compound 1-12 | 0.02 | Green |
| Example Compound 1-20 | 0.02 | Green |
| Example Compound 1-32 | 0.01 | Green |
| Example Compound 1-36 | 0.01 | Green |
| Example Compound 1-48 | 0.02 | Green |
| Example Compound 2-1 | 0.01 | Green |
| Example Compound 2-20 | 0.02 | Green |
| Example Compound 2-58 | 0.02 | Green |
| Reference Compound R1 | 0.1 | Green |
| Reference Compound R2 | 0.1 | Green |

Manufacture of Luminescence Device

Each of the luminescence devices of Examples 1 to 9 and Reference Examples 1 and 2 was manufactured as follows. A glass substrate including an ITO electrode with a thickness of about 100 nm was washed by sonicating in ultrapure water, exposed to UV for about 30 minutes, and treated with ozone. A hole injection layer HIL with a thickness of about 120 nm was formed using HT1, and a hole transport layer HTL with a thickness of about 10 nm was formed using HT2. mCBP (host compound) and the Example Compound or Reference Compound as a dopant compound were co-deposited in a ratio of 80:20 to form an emission layer EML to a thickness of about 40 nm. Then, ET and LiQ were mixed in a ratio of 5:5 and deposited to form an electron transport layer ETL to a thickness of about 30 nm, and an electron injection layer EIL with a thickness of about 1 nm was formed using LiQ. After that, a second electrode EL2 with a thickness of about 10 nm was formed using Mg:Al (10:1). All layers were formed using a vacuum deposition method.

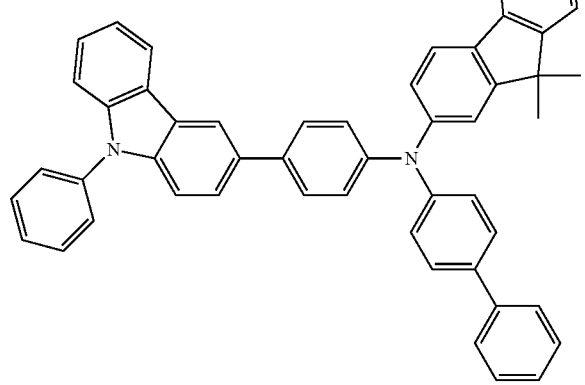

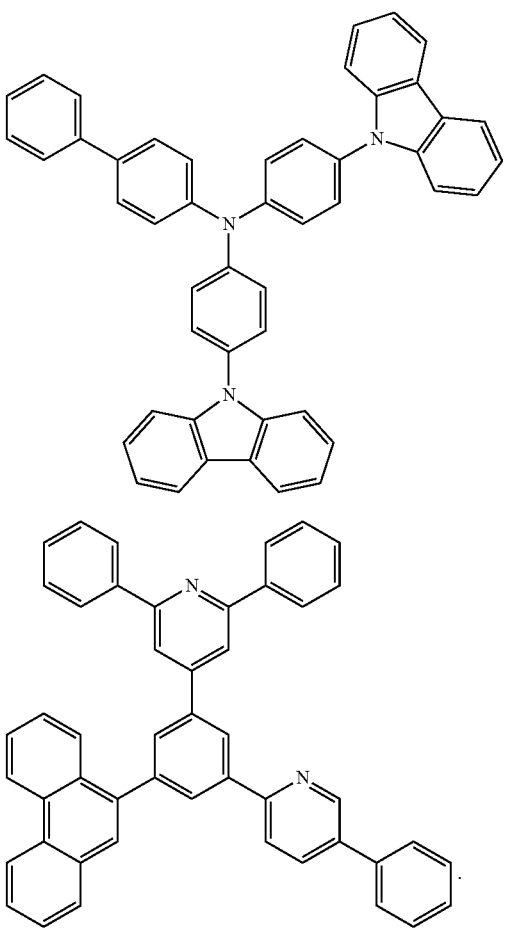

Each of the luminescence devices 10 of Examples 10 to 12 and Comparative Examples 1 to 3 was formed using the same method as that of the luminescence devices 10 of Examples 1 to 9 and Reference Examples 1 and 2, except that a hole transport layer HTL with a thickness of about 10 nm was formed using the Example Compound or Comparative Compound, and an emission layer EML with a thickness of about 40 nm was formed by co-depositing mCBP host compound with 4CzIPN as a dopant compound in a ratio of 80:20.

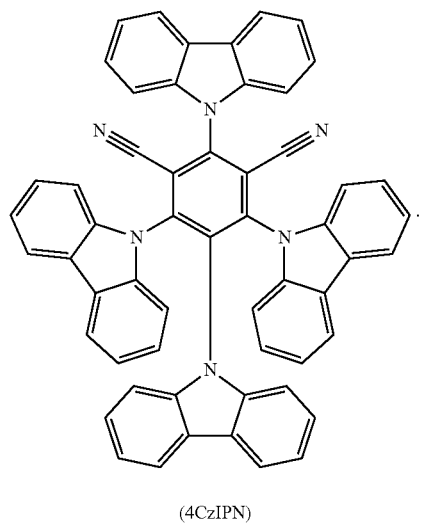 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]

(4CzIPN)

Evaluation of Properties of Luminescence Device

In order to evaluate the properties of the luminescence devices thus manufactured, a C9920-11 brightness light distribution characteristics measurement system of HAMAMATSU Photonics Co. was used. In order to evaluate the properties of the luminescence devices according to the Examples, Reference Examples, and Comparative Examples, a driving voltage, emission efficiency and luminance half-life were measured. The driving voltage was the value needed to achieve a luminescence of about 1,000 cd/m². The emission efficiency was measured at a current density of about 10 mA/cm². The luminance half-life represents the time required for decreasing a luminescence from about 1,000 cd/m² to 50% of the original value.

The luminescence devices used in Examples 1 to 9, and Reference Examples 1 and 2 were organic electroluminescence devices emitting green light as delayed fluorescence. The evaluation results in Table 2 are shown based on (100%) the emission efficiency and luminance half-life of Reference Example 1 using Reference Compound $R_1$ as the dopant material of an emission layer.

The luminescence devices used in Examples 10 to 12 and Comparative Examples 1 to 3 were organic electroluminescence devices emitting green light. The evaluation results in Table 3 are shown as relative values, based on a value of (100%) of the driving voltage, emission efficiency, and luminance half-life of Comparative Example 1 using Comparative Compound C1 as the material of a hole transport layer.

TABLE 2

| Device manufacturing example | Material of emission layer | Emission efficiency | Luminance half-life |
|---|---|---|---|
| Example 1 | Example Compound 1-1 | 120% | 120% |
| Example 2 | Example Compound 1-12 | 125% | 130% |

TABLE 2-continued

| Device manufacturing example | Material of emission layer | Emission efficiency | Luminance half-life |
|---|---|---|---|
| Example 3 | Example Compound 1-20 | 130% | 130% |
| Example 4 | Example Compound 1-32 | 140% | 140% |
| Example 5 | Example Compound 1-36 | 130% | 135% |
| Example 6 | Example Compound 1-48 | 130% | 165% |
| Example 7 | Example Compound 2-1 | 115% | 110% |
| Example 8 | Example Compound 2-20 | 110% | 120% |
| Example 9 | Example Compound 2-58 | 135% | 170% |
| Reference Example 1 | Reference Compound R1 | 100% | 100% |
| Reference Example 2 | Reference Compound R2 | 95% | 90% |

TABLE 3

| Device manufacturing example | Material of hole transport layer | Driving voltage | Emission efficiency | Luminance half-life |
|---|---|---|---|---|
| Example 10 | Example Compound 2-12 | 90% | 110% | 130% |
| Example 11 | Example Compound 2-13 | 95% | 105% | 115% |
| Example 12 | Example Compound 2-32 | 90% | 110% | 120% |
| Comparative Example 1 | Comparative Compound C1 | 100% | 100% | 100% |
| Comparative Example 2 | Comparative Compound C2 | 100% | 100% | 100% |
| Comparative Example 3 | Comparative Compound C3 | 105% | 95% | 90% |

Referring to the results of Table 2, when the polycyclic compound according to an embodiment of the present disclosure was applied to an organic electroluminescence device as a material for an emission layer, high efficiency and long life were achieved. For example, it was confirmed that Example 1 to Example 9 achieved higher efficiency and longer life compared to the Reference Example 1 and Reference Example 2. Referring to Table 1, the polycyclic compounds of embodiments used in Example 1 to Example 9 each had a low $\Delta E_{ST}$ value of about 0.02 eV or less, or about 0.01 eV or less. In contrast, Reference Compounds $R_1$ and $R_2$ had a relatively high $\Delta E_{ST}$ value of about 0.1 eV. Accordingly, the polycyclic compounds of Example 1 to Example 9 are considered to achieve high efficiency and long life. However, it is considered that thermally activated delayed fluorescence could be emitted, though using Reference Compounds as the dopants of the emission layer.

Referring to the results of Table 3, when the polycyclic compound according to an embodiment of the present disclosure is applied to an organic electroluminescence device as the material of a hole transport layer, high efficiency and long life could be achieved. For example, it was confirmed that Example 10 to Example 12 achieved higher efficiency and longer life when compared with Comparative Example 1 to Comparative Example 3. The Example Compounds have a different chemical structure from the Comparative Compounds and due to the resulting stereochemical and electrochemical properties, hole transport efficiency was increased and accordingly, high emission efficiency and long life were achieved.

The luminescence device of an embodiment includes the polycyclic compound represented by Formula 1. Accordingly, the luminescence device of an embodiment may achieve high efficiency and long life. By applying the polycyclic compound of an embodiment to a luminescence device, the high efficiency and long life of a device may be achieved.

The luminescence device according to an embodiment of the present disclosure may achieve high efficiency.

The polycyclic compound according to an embodiment of the present disclosure may be applied to a luminescence device to achieve high efficiency.

As used herein, the terms "substantially", "about", and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments but various changes and modifications can be made by one ordinary skilled in the art within the spirit and scope of the present disclosure, as set forth in the following claims and equivalents thereof.

The invention claimed is:
1. A luminescence device, comprising:
a first electrode;
a second electrode on the first electrode; and
at least one functional layer between the first electrode and the second electrode,
wherein the at least one functional layer comprises a polycyclic compound represented by Formula 1:

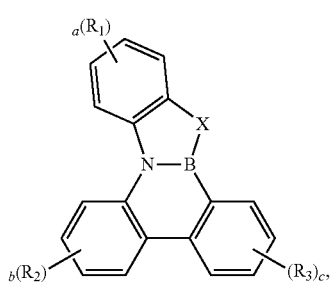

Formula 1 wherein in Formula 1,
X is O, S, Se, CR$_4$R$_5$, SiR$_6$R$_7$, or

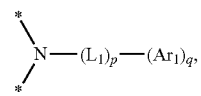

R$_1$ to R$_7$ are each independently a hydrogen atom, a deuterium atom, a substituted or unsubstituted silyl group of 1 to 30 carbon atoms, a substituted or unsubstituted aryl amine group of 6 to 30 carbon atoms for forming a ring, a substituted or unsubstituted alkyl group of 1 to 30 carbon atoms, a substituted or unsubstituted alkenyl group of 2 to 30 carbon atoms, a substituted or unsubstituted aryl group of 6 to 60 carbon atoms for forming a ring, or a substituted or unsubstituted heteroaryl group of 2 to 60 carbon atoms for forming a ring, or are combined with an adjacent group to form a ring, "a" to "c" are each independently an integer of 0 to 4, and wherein, when X is O, S, CR$_4$R$_5$, or SiR$_6$R$_7$,
at least one selected from among a to c is 1 to 4, and a corresponding at least one selected from among R$_1$ to R$_3$ are each independently represented by any one from RO-1 to RO-14 and RO-16 to RO-20:

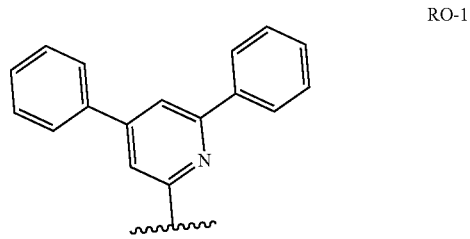

RO-1

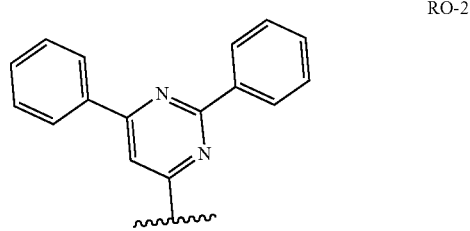

RO-2

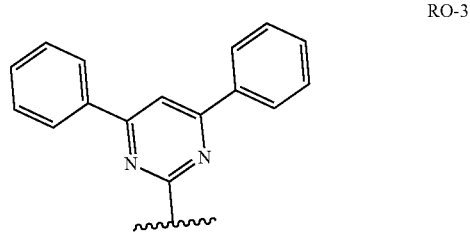

RO-3

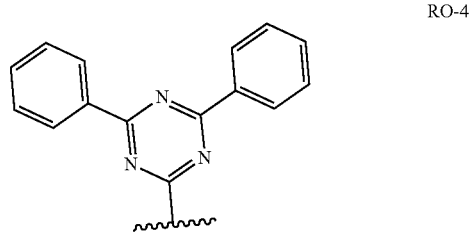

RO-4

RO-5
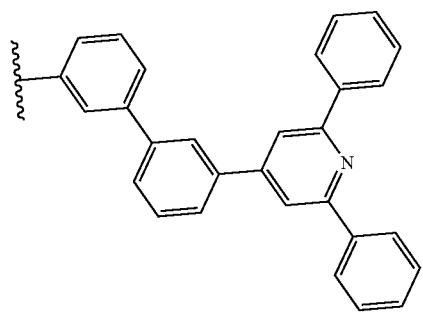
RO-6
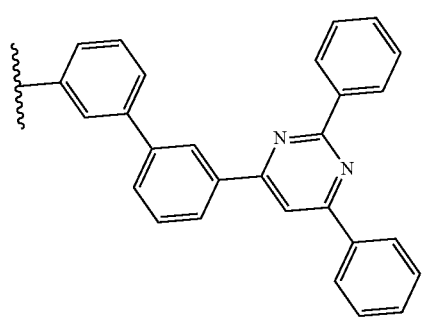
RO-7
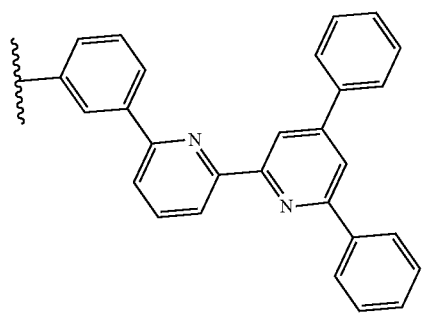
RO-8
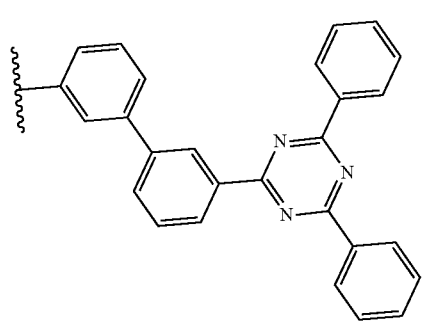
RO-9
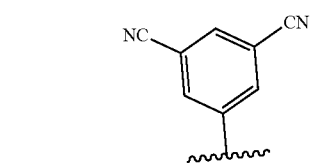
RO-10
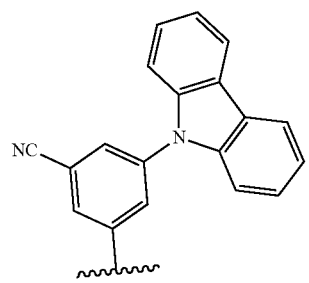
RO-11
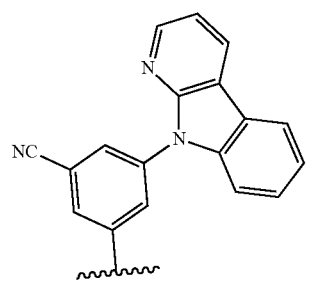
RO-12
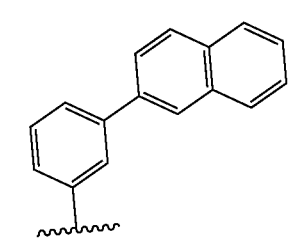
RO-13
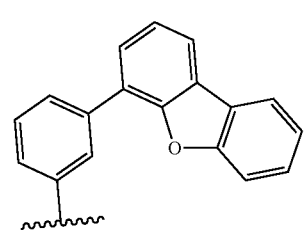
RO-14
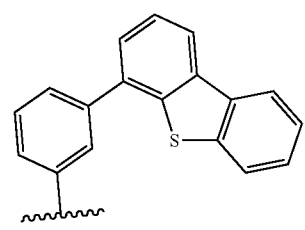
RO-16
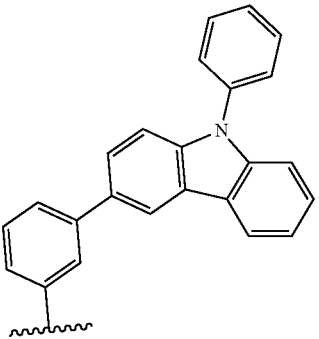

-continued
RO-17
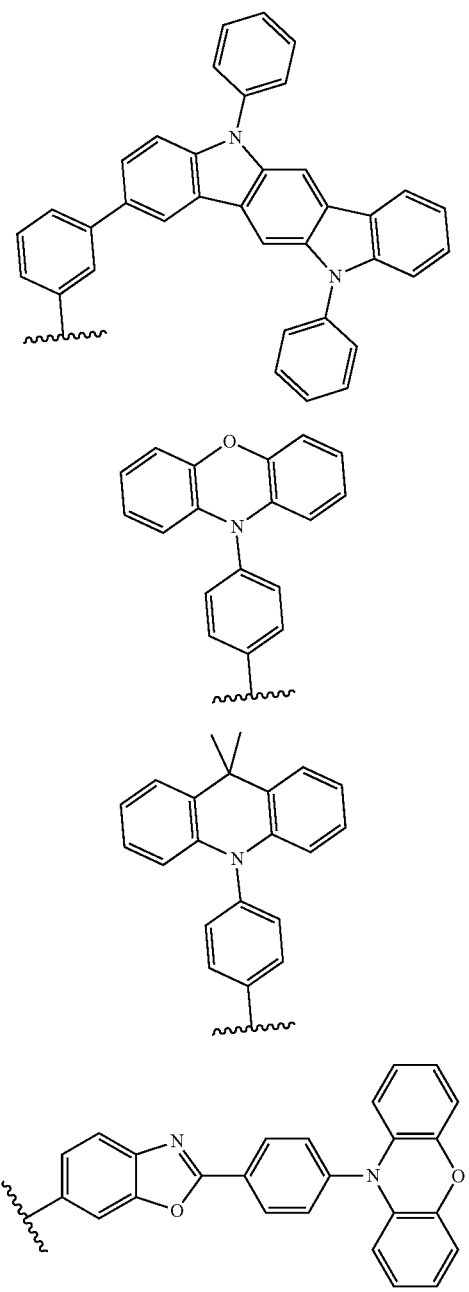
RO-18
RO-19
RO-20
when X is Se,
    at least one selected from $R_1$ to $R_3$ is a substituted or unsubstituted aryl group of 6 to 60 carbon atoms for forming a ring, or a substituted or unsubstituted heteroaryl group of 2 to 60 carbon atoms for forming a ring, and
    a sum of "a" to "c" is 1 or more, and
when X is
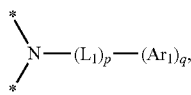
-$(L_1)_p$-$(Ar_1)_q$ is represented by any one from RN-1 to RN-11, RN-16 to RN-18 and RN-20 to RN-48:
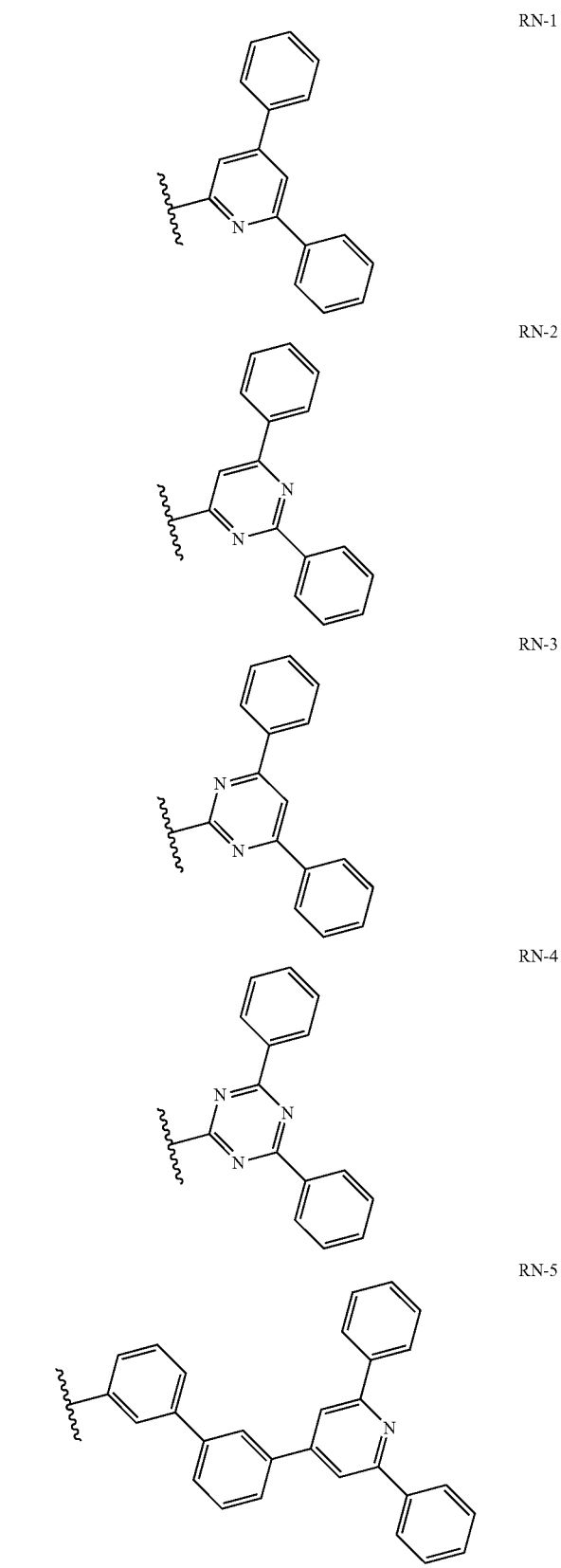

-continued
RN-6
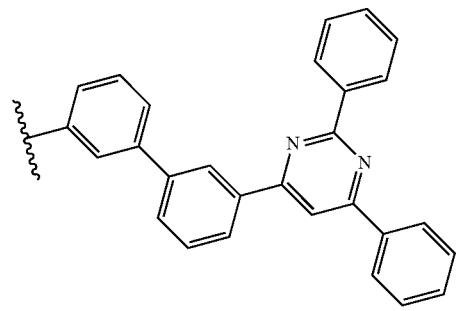
RN-7
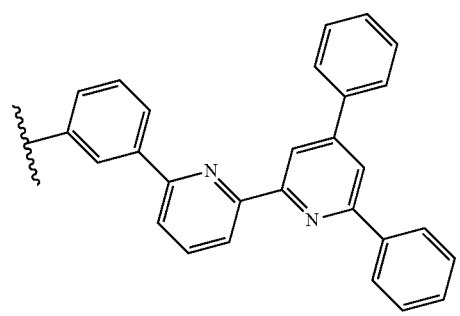
RN-8
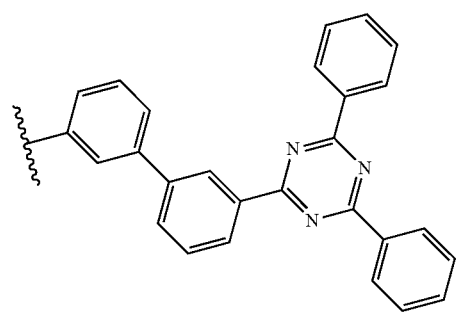
RN-9
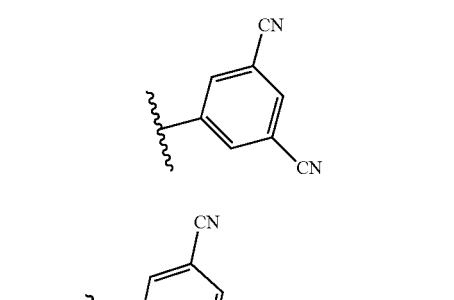
RN-10
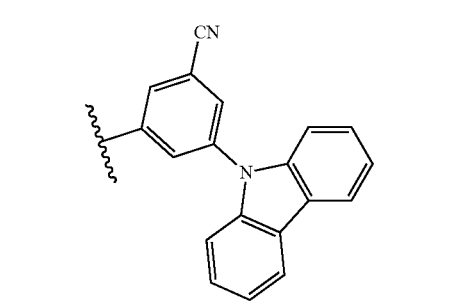
RN-11
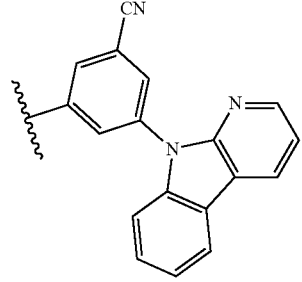
RN-16
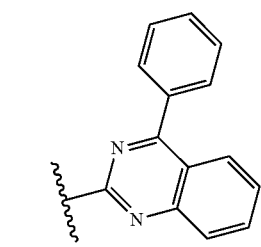
RN-17
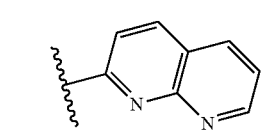
RN-18
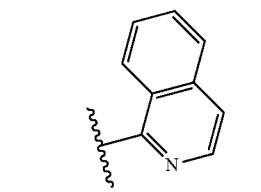
RN-20
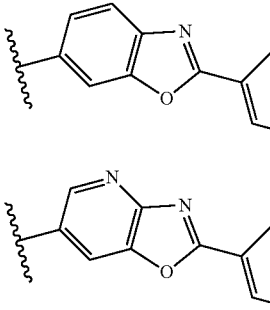
RN-21
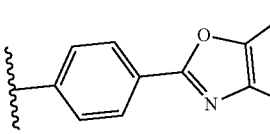
RN-22
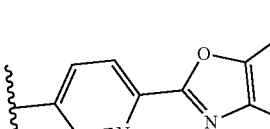
RN-23
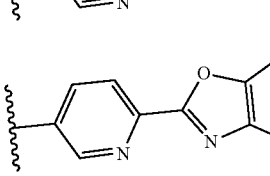
RN-24

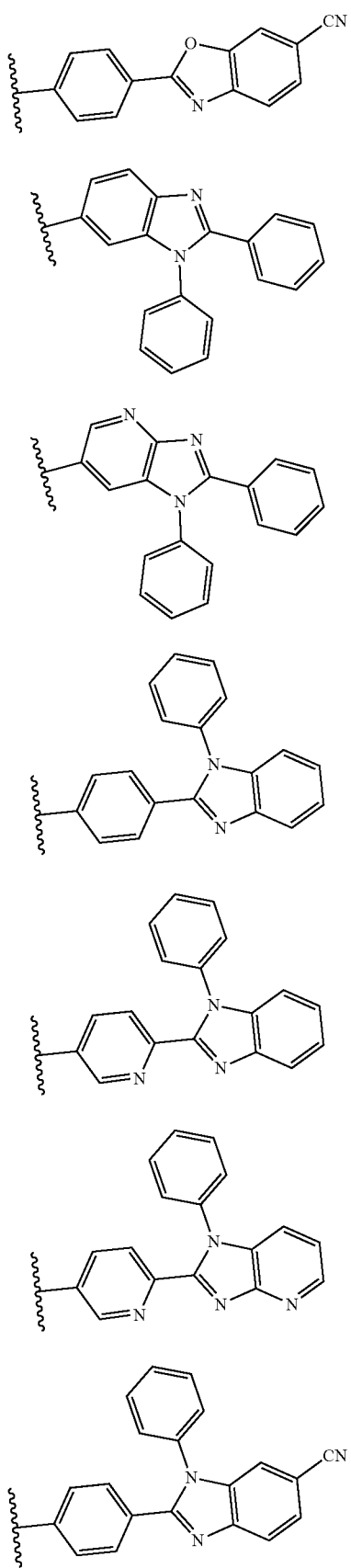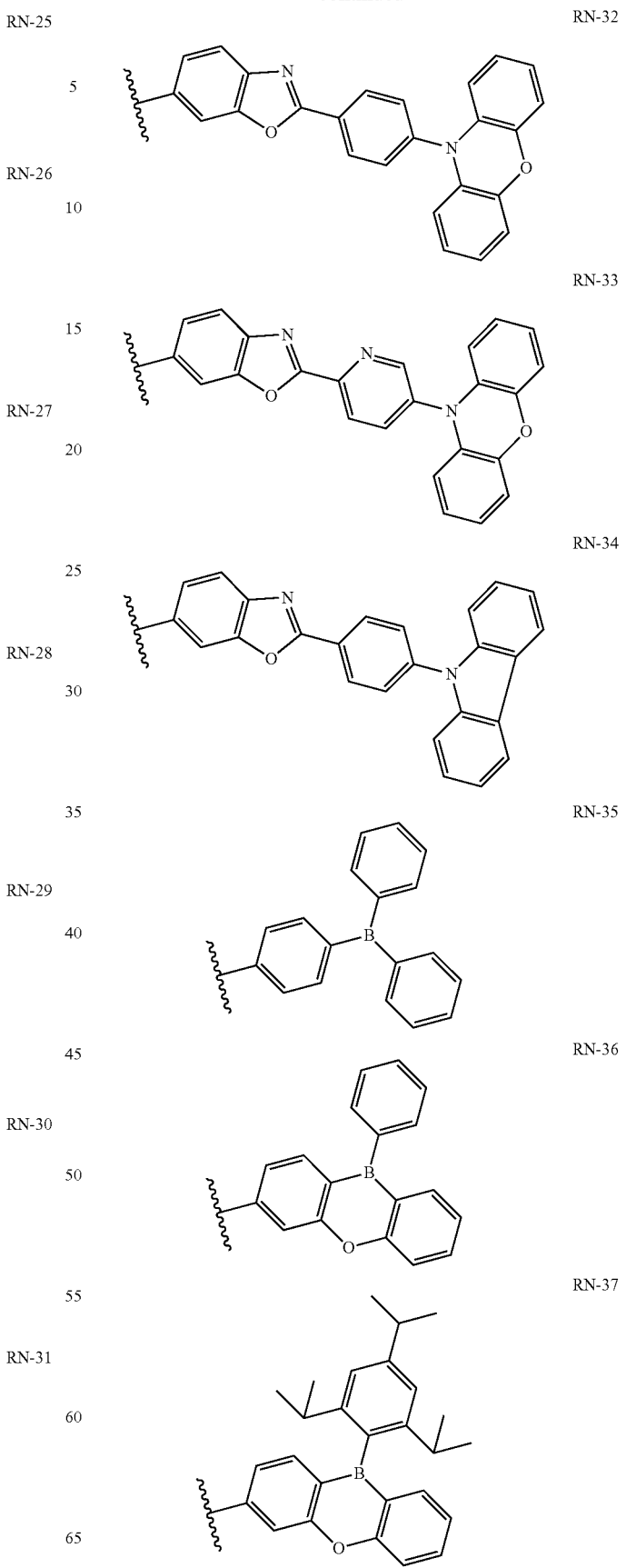

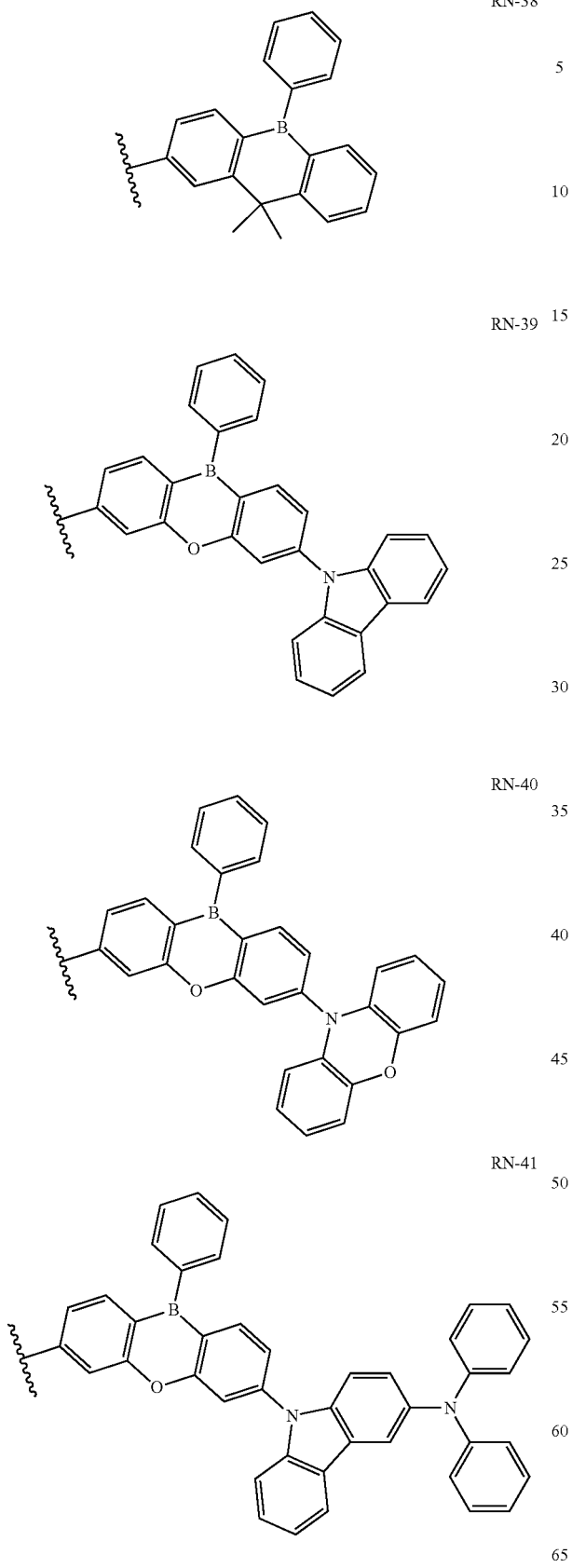
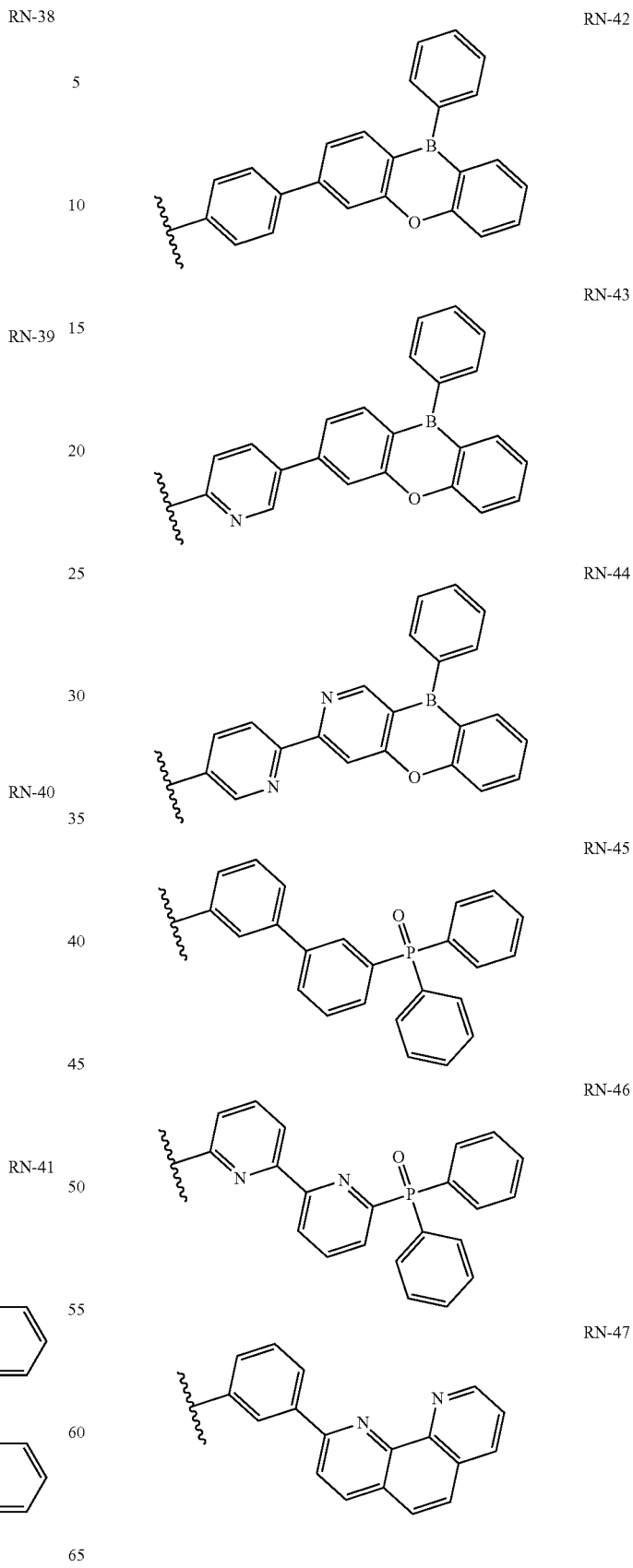

-continued

RN-48

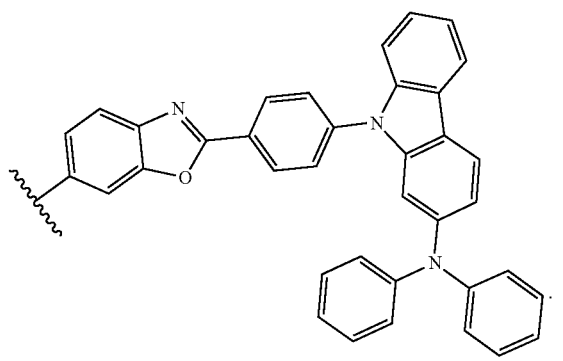

2. The luminescence device of claim 1, wherein the at least one functional layer comprises:
a hole transport region on the first electrode;
an emission layer on the hole transport region; and
an electron transport region between the emission layer and the second electrode.

3. The luminescence device of claim 2, wherein the emission layer comprises the polycyclic compound.

4. The luminescence device of claim 3, wherein when X is O, S, Se, $CR_4R_5$, or $SiR_6R_7$, a Hammett constant of each of $R^1$ to $R_3$ is greater than 0.

5. The luminescence device of claim 2, wherein the hole transport region comprises the polycyclic compound, and X is O, S, Se, $CR_4R_5$, or $SiR_6R_7$.

6. The luminescence device of claim 1, wherein Formula 1 is represented by one of Formula 1-1 to Formula 1-3:

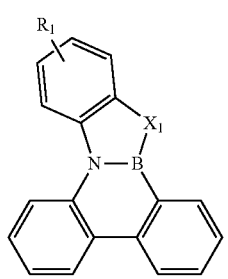

Formula 1-1

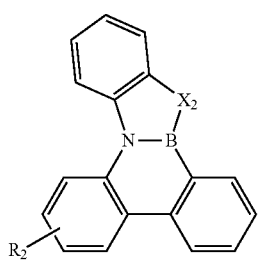

Formula 1-2

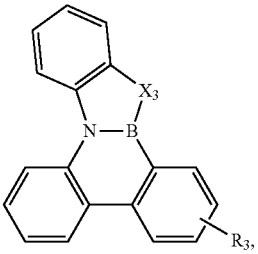

Formula 1-3 wherein in Formula 1-1 to Formula 1-3,
$X_1$ to $X_3$ are each independently O, or $CR_4R_5$, and
$R_1$ to $R_3$ are each independently the same as defined in Formula 1.

7. The luminescence device of claim 1, wherein Formula 1 is represented by Formula 1-4:

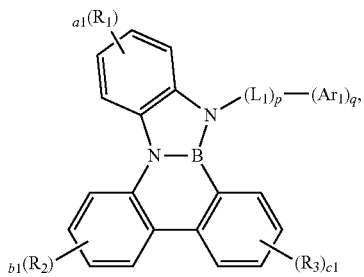

Formula 1-4 wherein in Formula 1-4,
a1 to c1 are each independently 0 or 1,
the sum of a1 to c1 is 1 or less, and
$R_1$ to $R_3$, $L_1$, $Ar_1$, "p", and "q" are each independently the same as defined in Formula 1.

8. The luminescence device of claim 1, wherein X is Se and $R_1$ to $R_3$ are each independently represented by Formula 2:

$$*\text{-}(L_{11})_r\text{-}(Ar_{11})_s,$$  Formula 2 wherein in Formula 2,
$L_{11}$ is a direct linkage, a substituted or unsubstituted arylene group of 6 to 60 carbon atoms for forming a ring, or a substituted or unsubstituted heteroarylene group of 2 to 60 carbon atoms for forming a ring,
$Ar_{11}$ is a substituted or unsubstituted aryl group of 6 to 60 carbon atoms for forming a ring, or a substituted or unsubstituted heteroaryl group of 2 to 60 carbon atoms for forming a ring,
"r" is an integer of 0 to 2, and "s" is 1.

9. The luminescence device of claim 1, wherein the polycyclic compound comprises at least one selected from compounds represented in Compound Group 1:

Compound Group 1
1-1
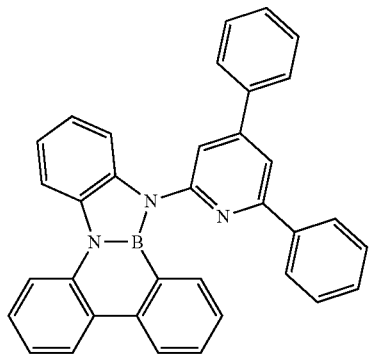
1-2
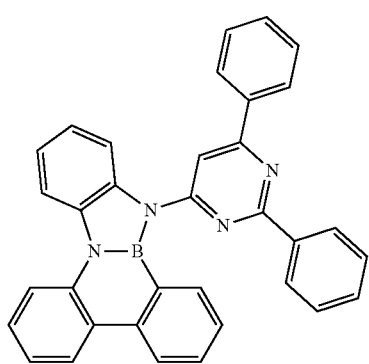
1-3
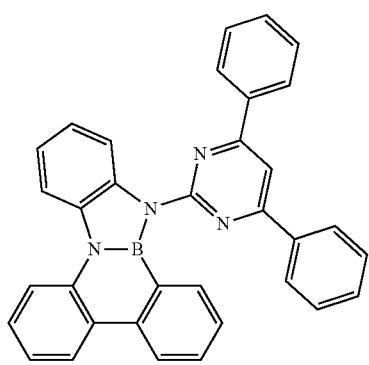
1-4
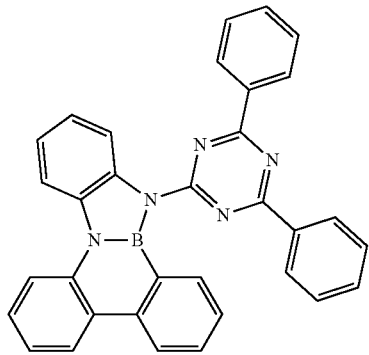
1-5
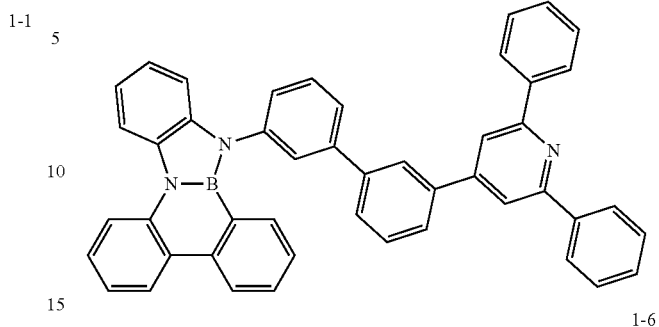
1-6
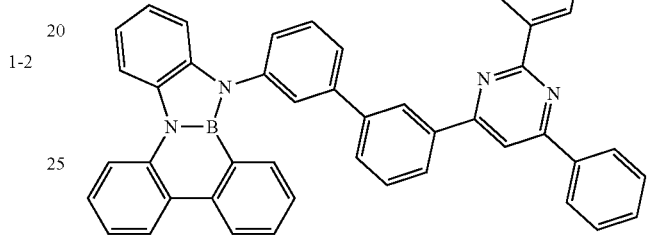
1-7
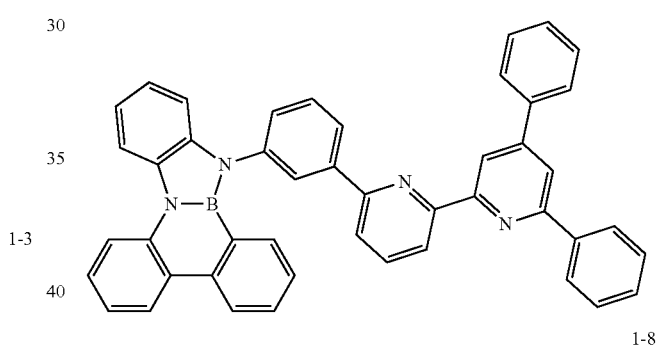
1-8
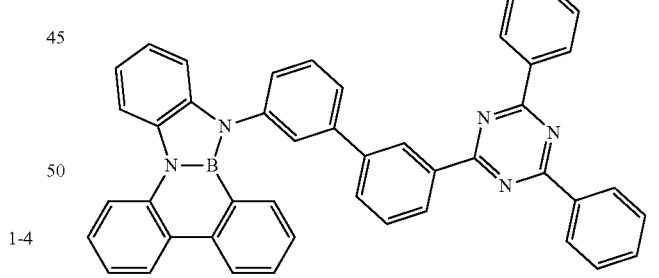
1-9
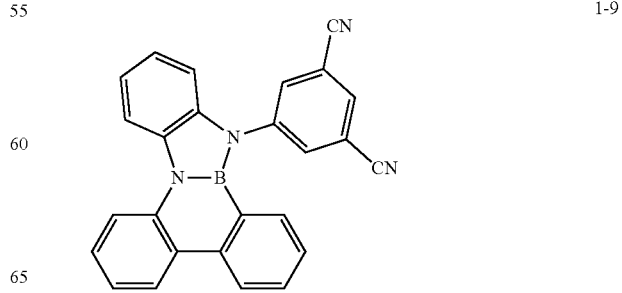

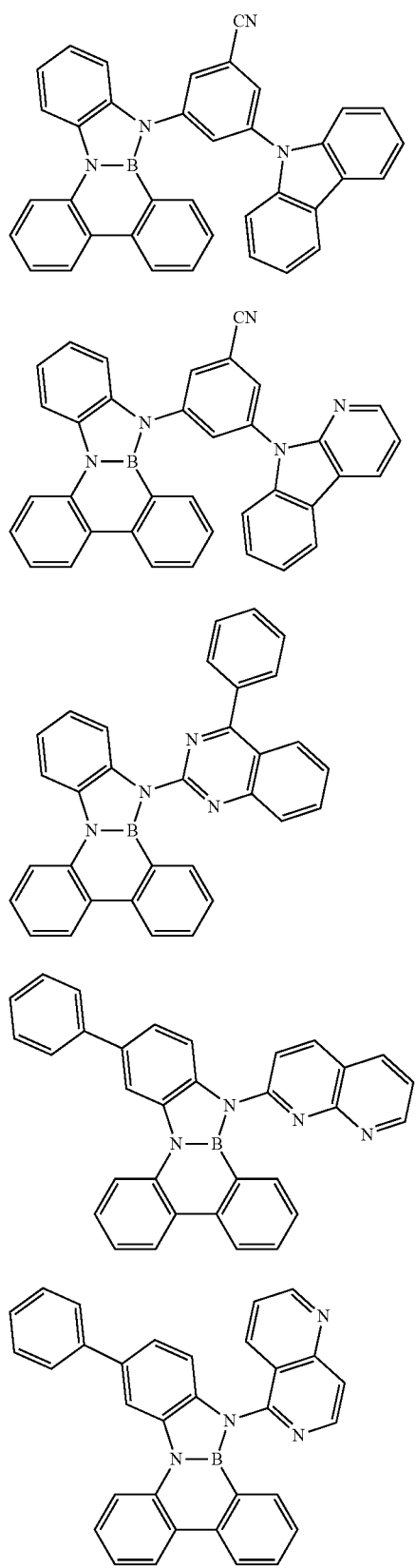
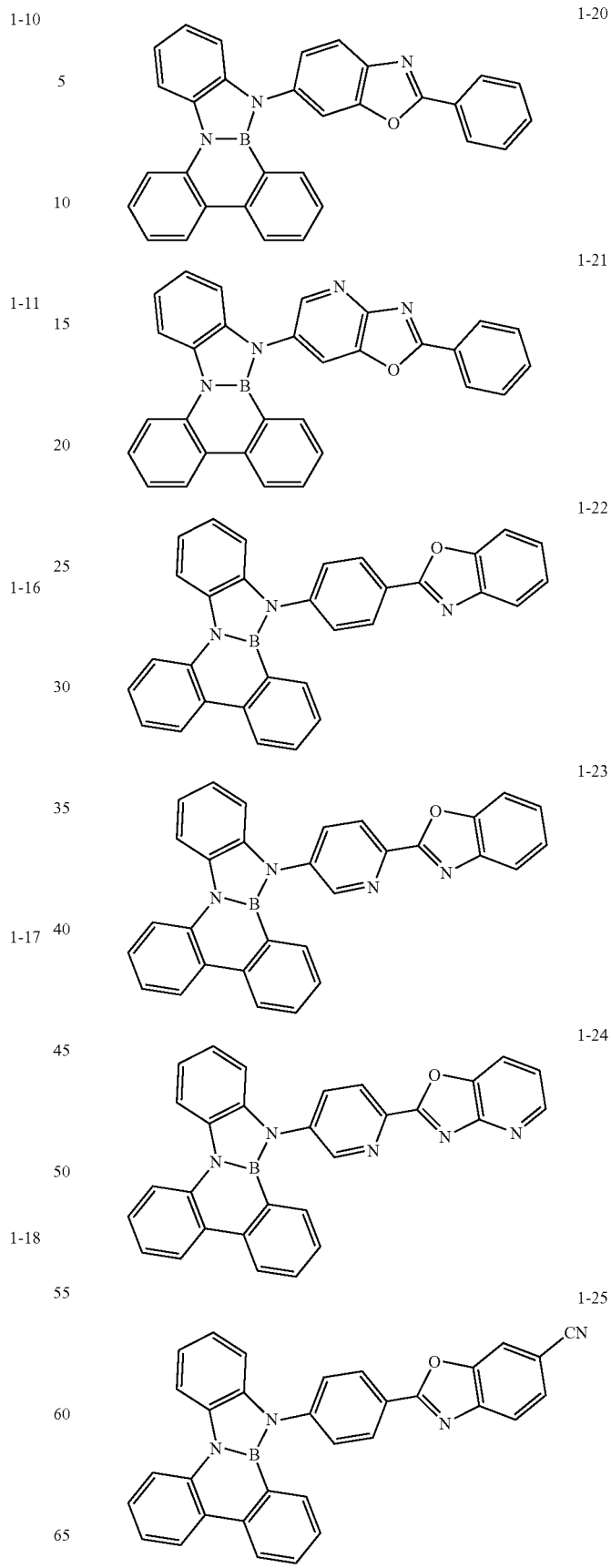

1-26
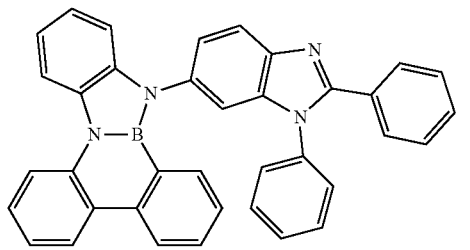
1-27
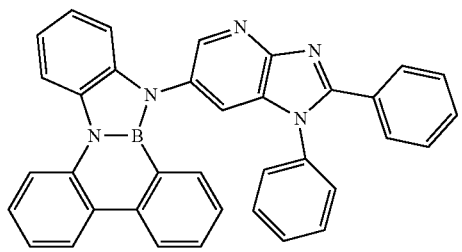
1-28
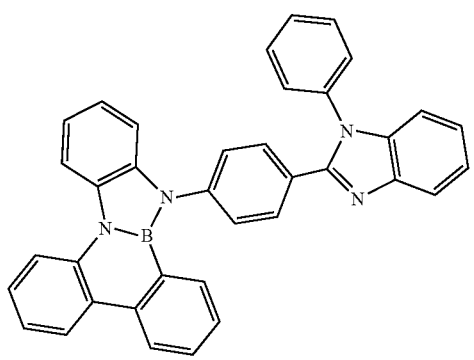
1-29
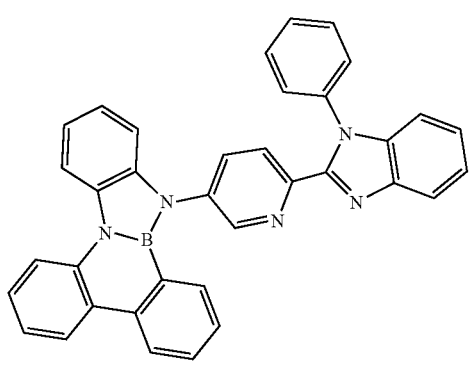
1-30
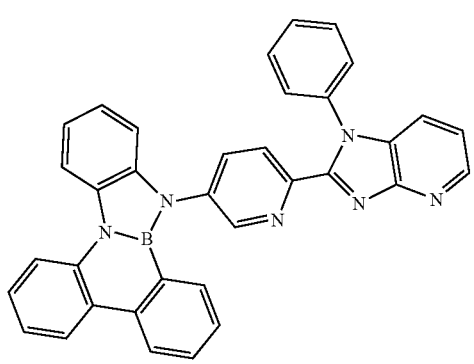
1-31
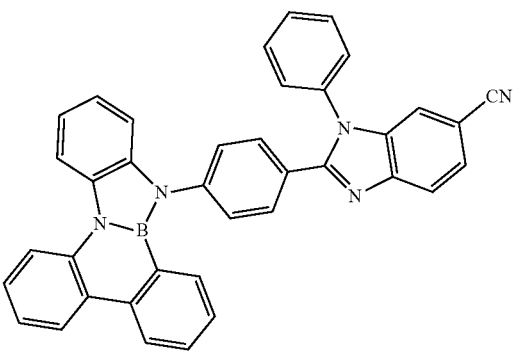
1-32
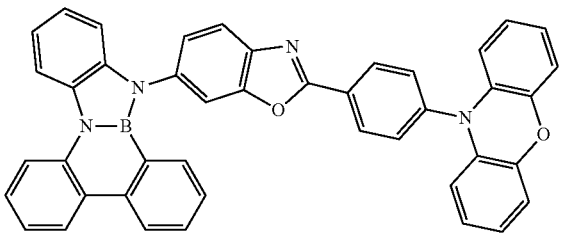
1-33
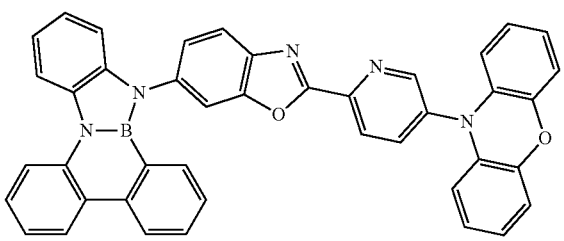
1-34
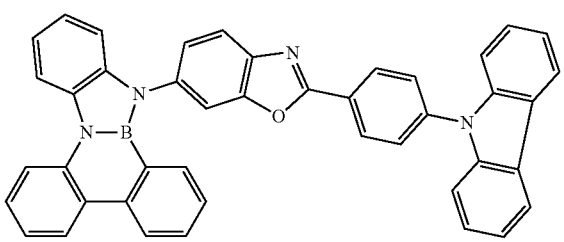
1-35
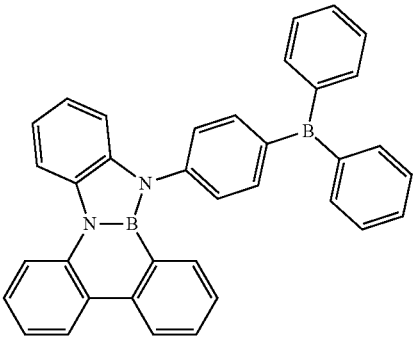

1-36
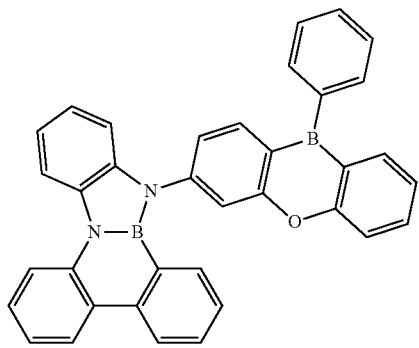
1-37
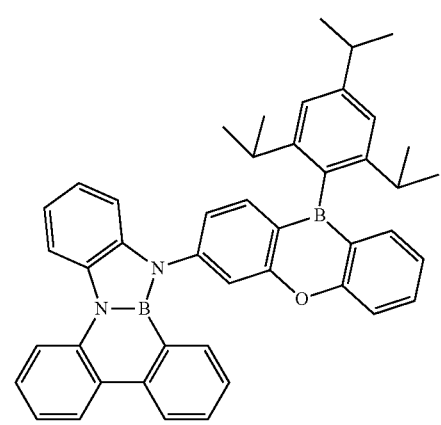
1-38
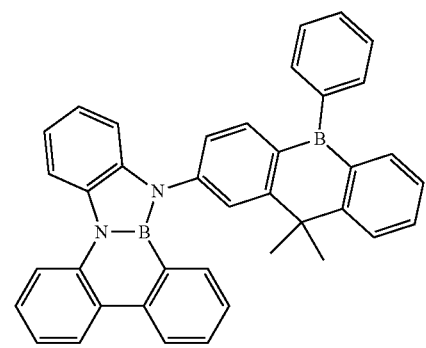
1-39
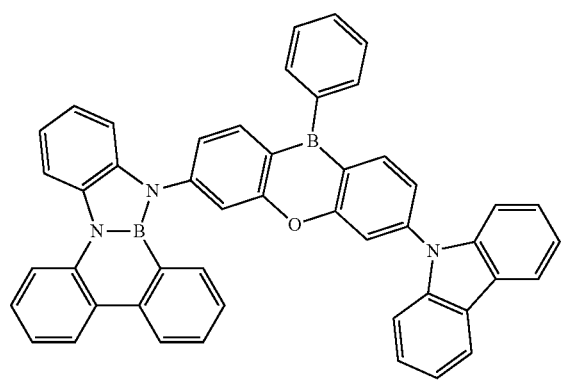
1-40
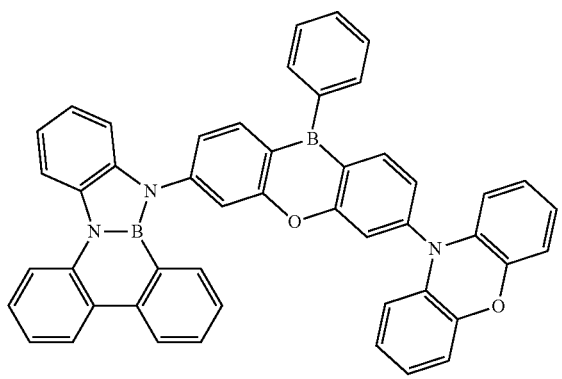
1-41
1-42
1-43
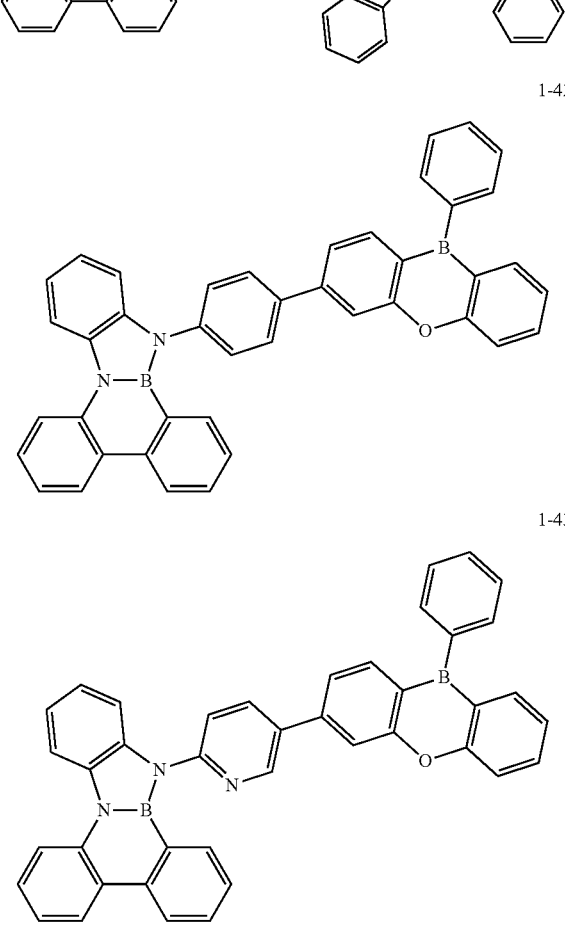

-continued
1-44
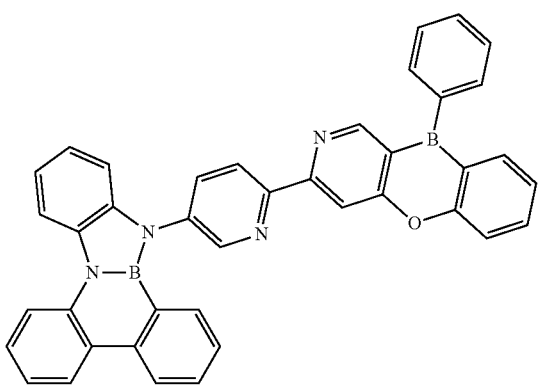
1-45
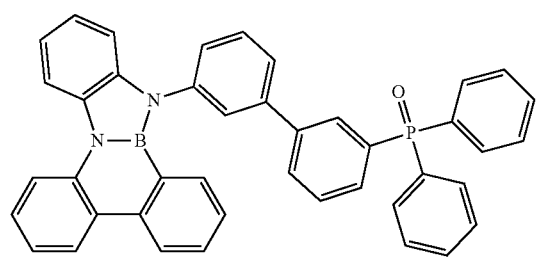
1-46
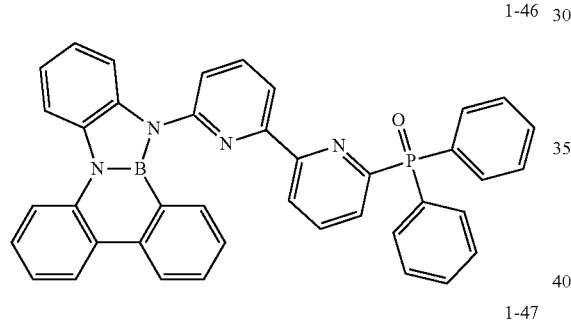
1-47
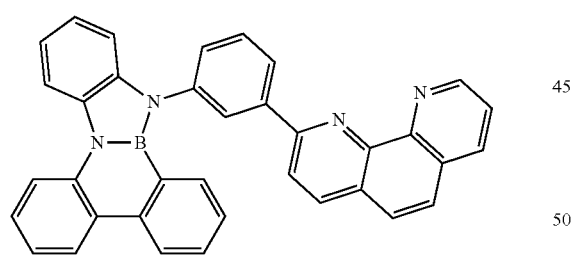
1-48
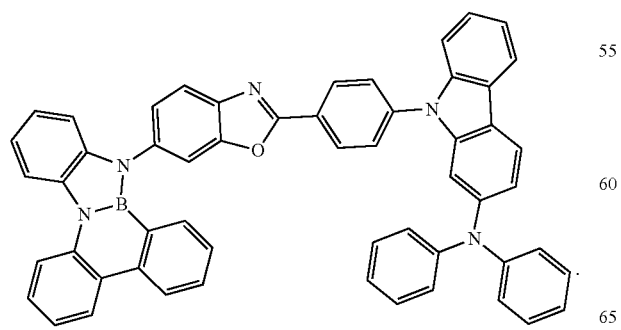
10. The luminescence device of claim 1, wherein the polycyclic compound comprises at least one selected from compounds represented in Compound Group 2:
Compound Group 2
2-1
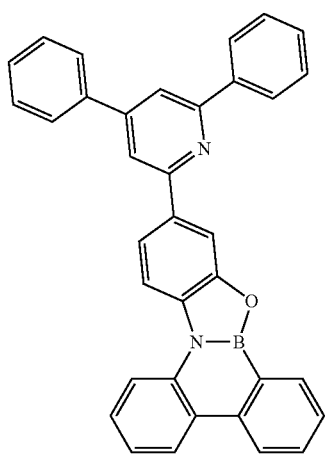
2-2
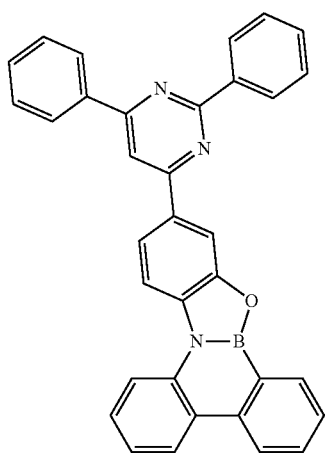
2-3
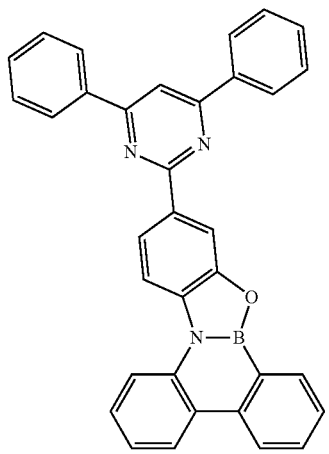

2-4
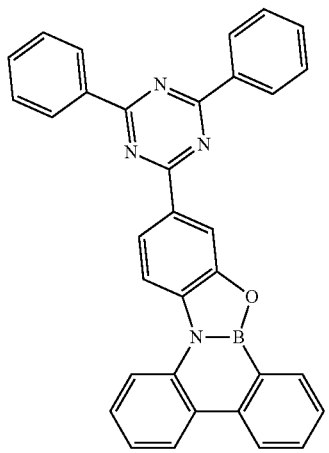
2-9
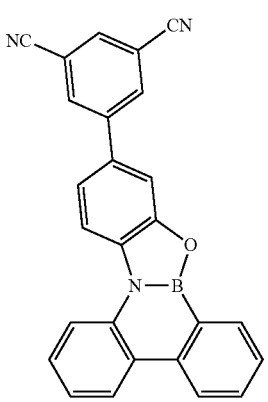
2-5
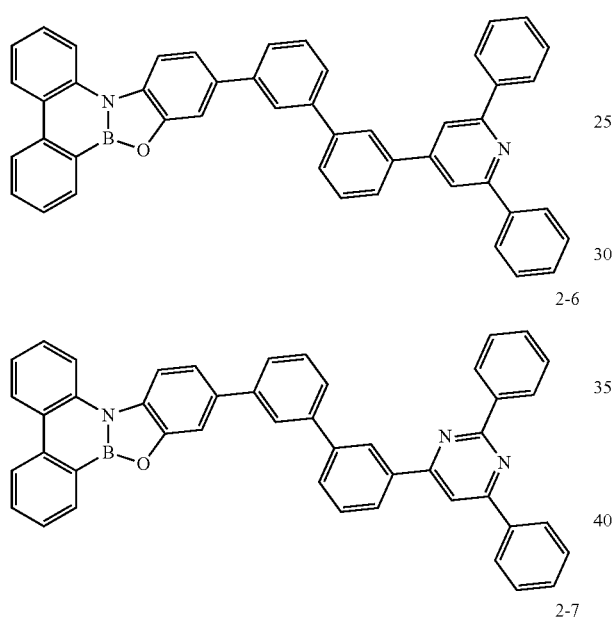
2-10
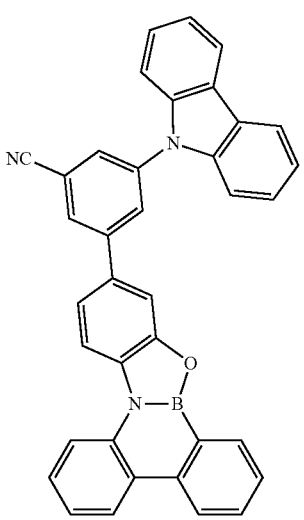
2-6
2-7
2-11
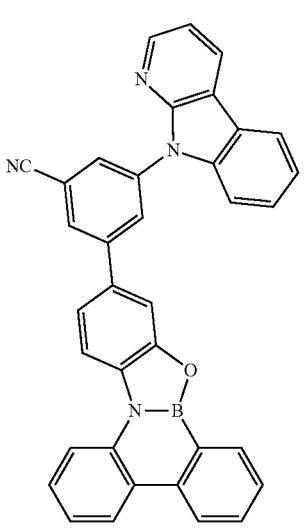
2-8
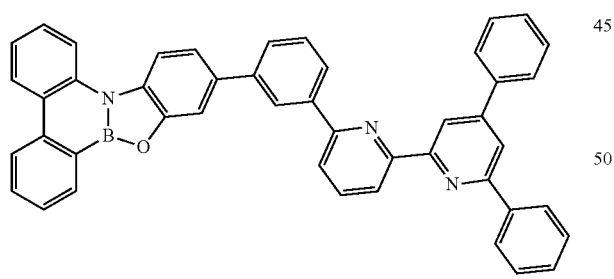
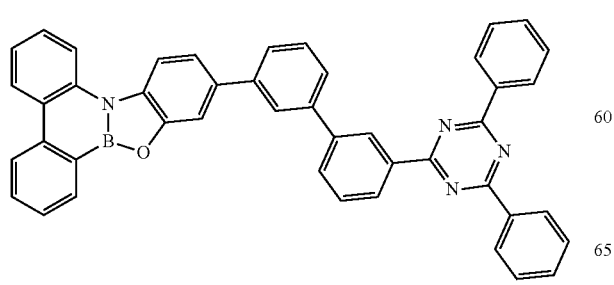

2-12
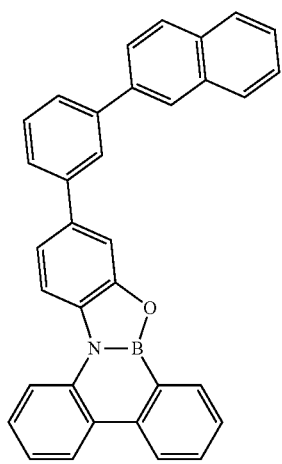
2-13
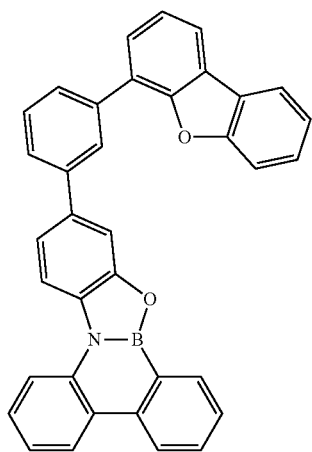
2-14
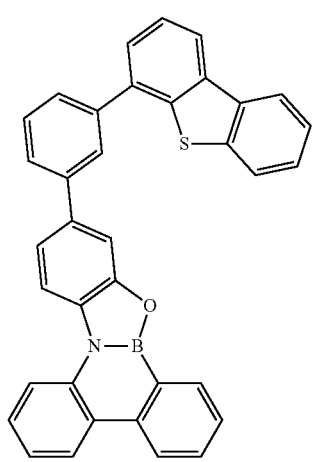
2-16
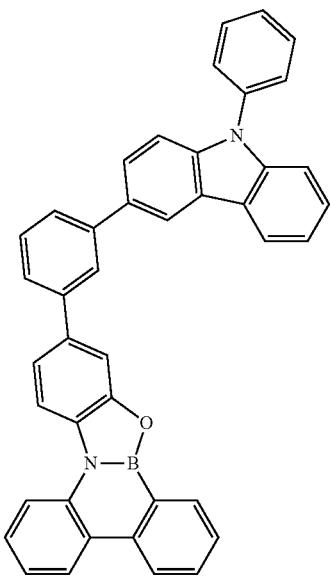
2-17
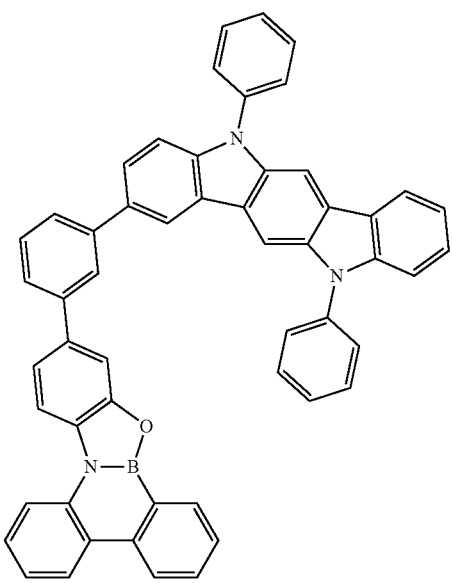
2-18
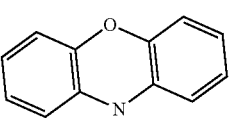
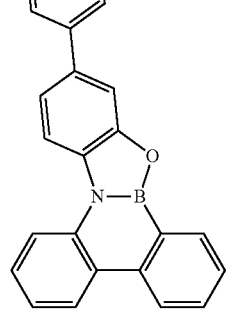

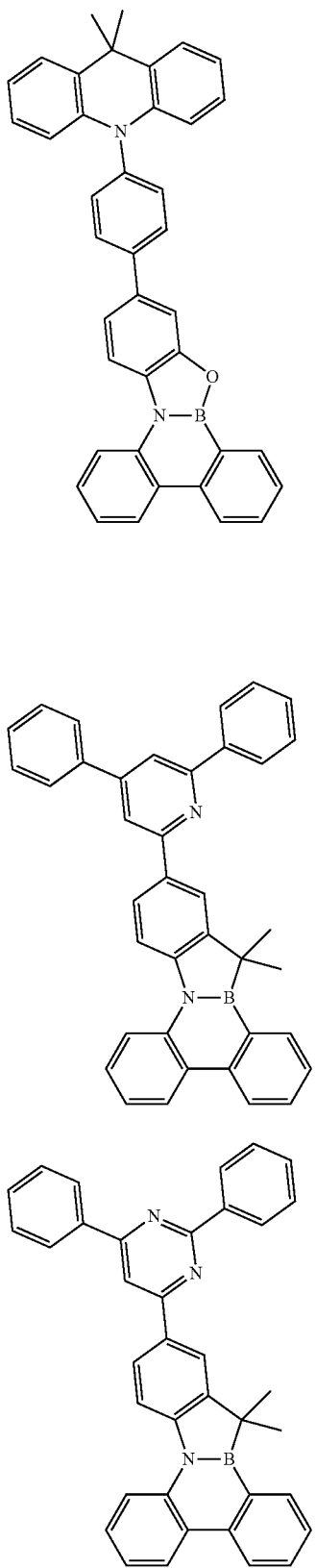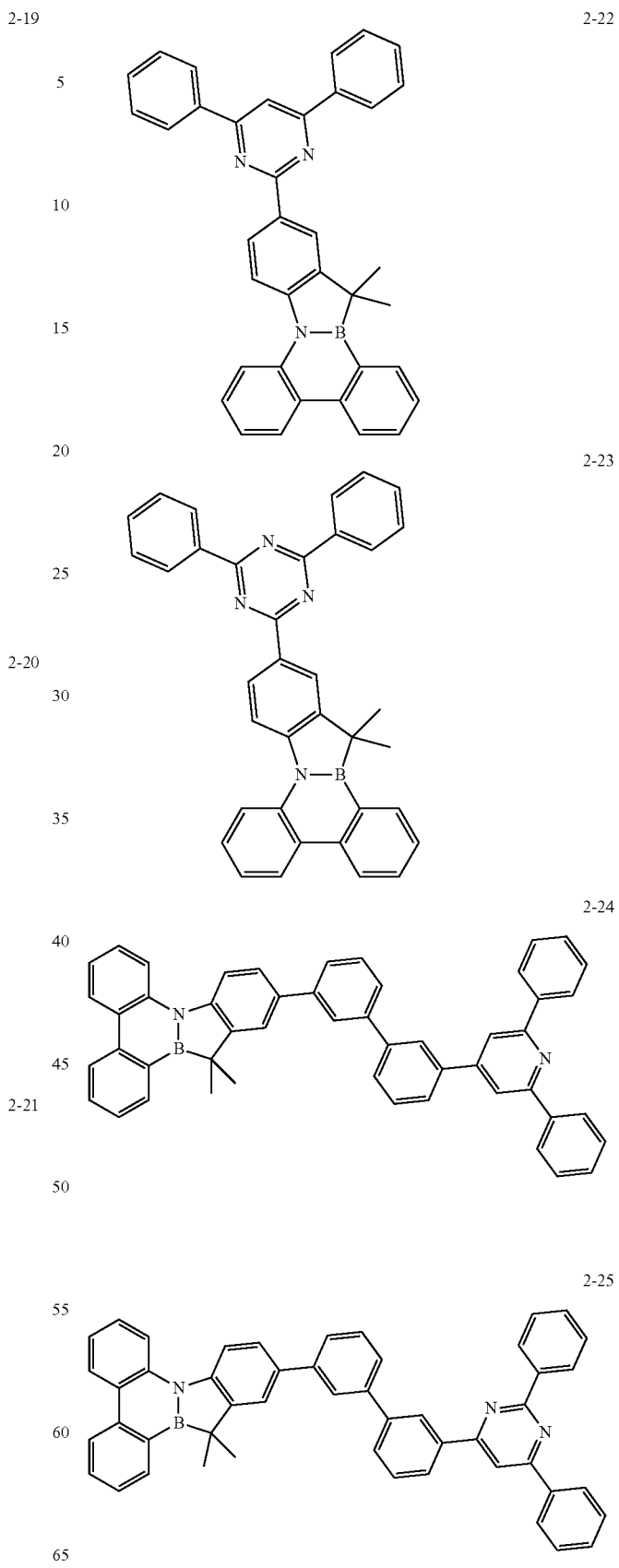

2-26
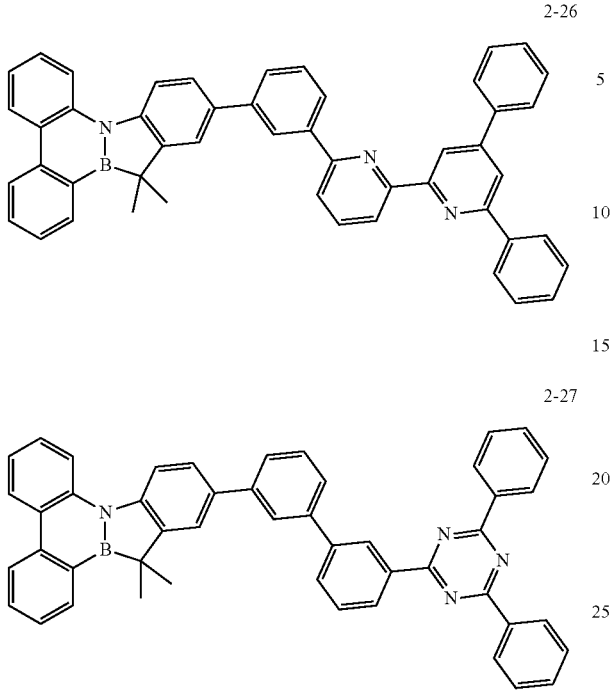
2-27
2-28
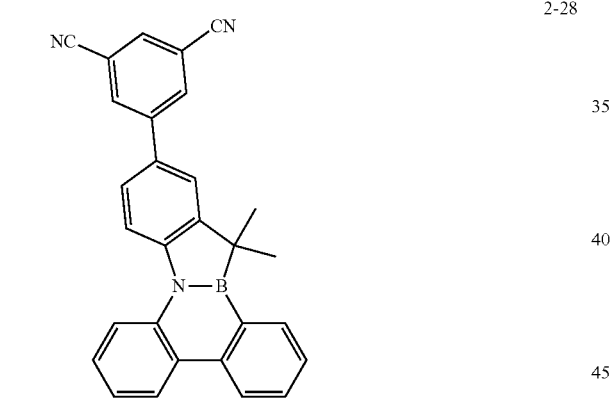
2-29
2-30
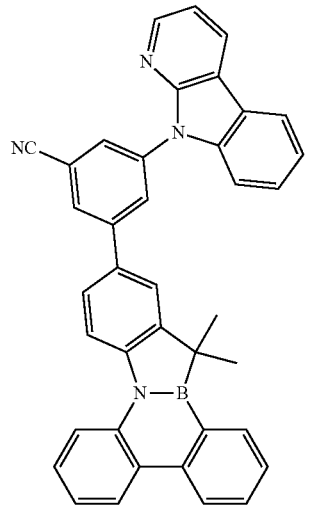
2-31
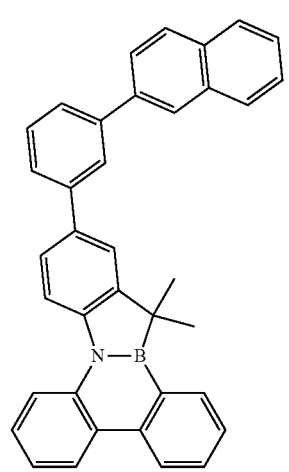
2-32
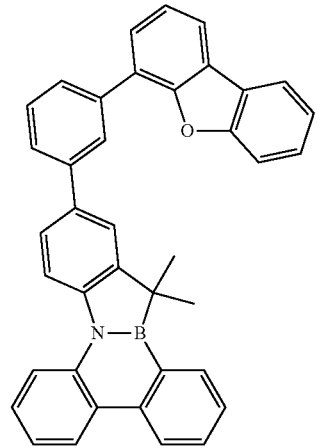

-continued
2-33
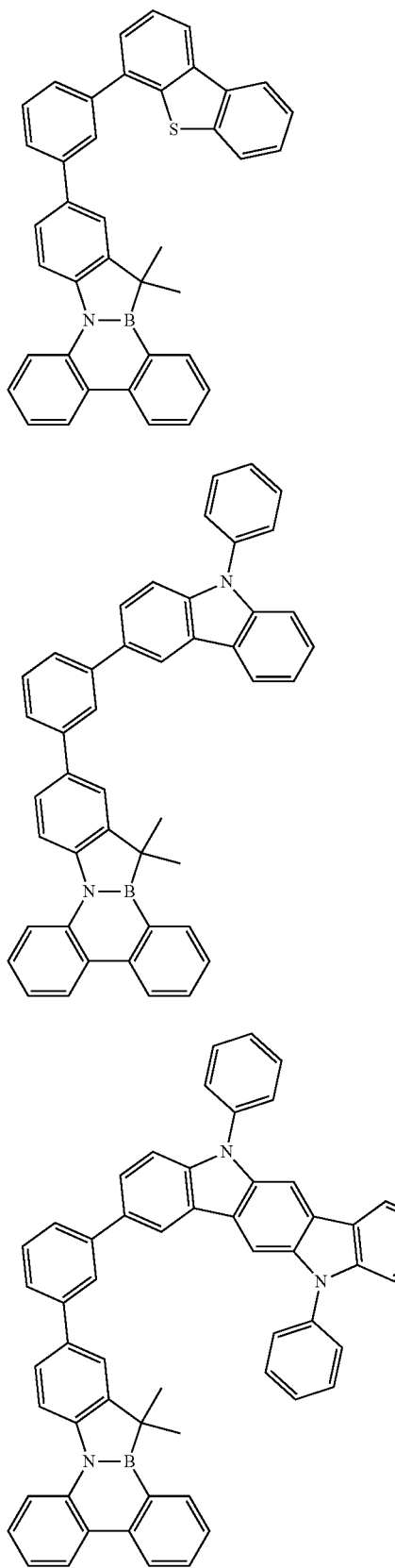
2-35
2-36
-continued
2-37
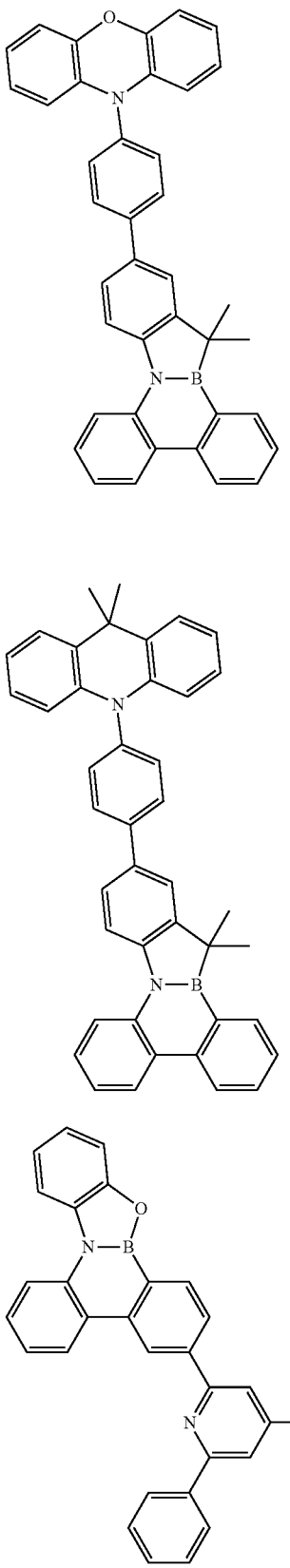
2-38
2-39

141
-continued
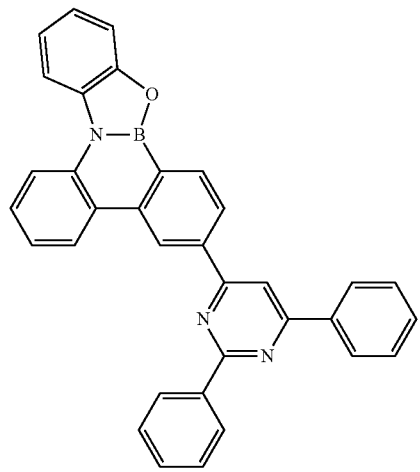
2-40
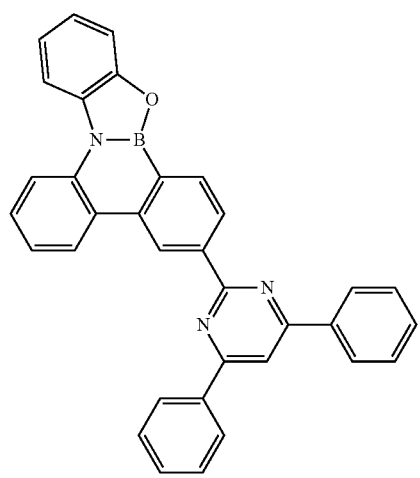
2-41
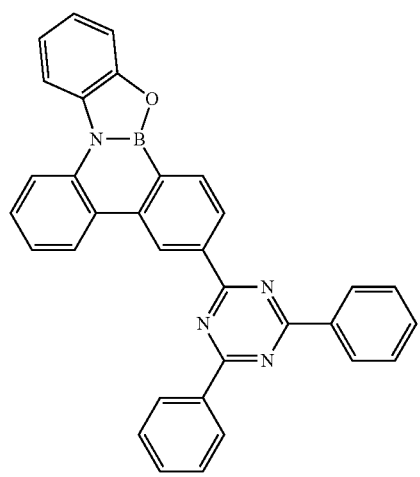
2-42
142
-continued
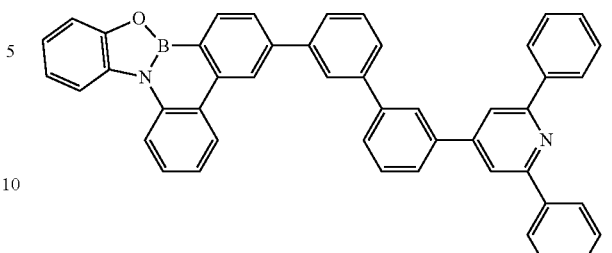
2-43
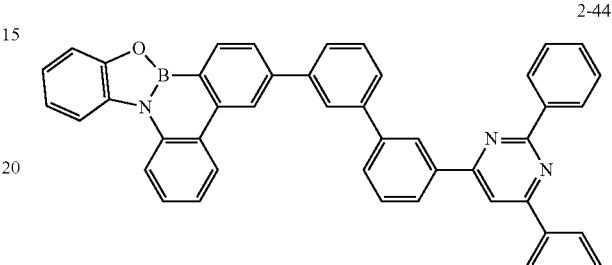
2-44
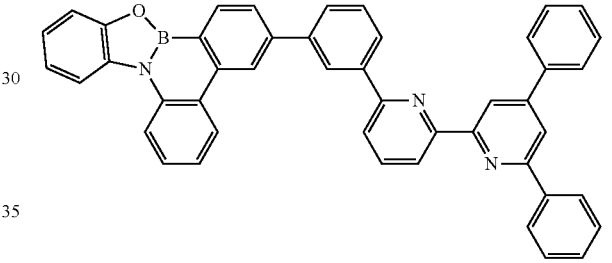
2-45
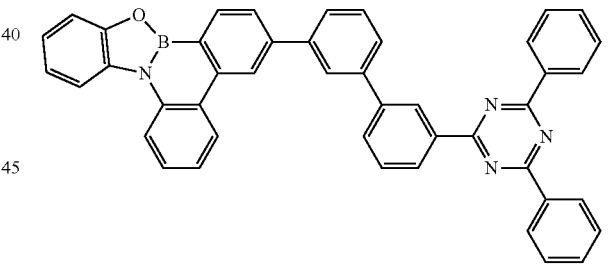
2-46
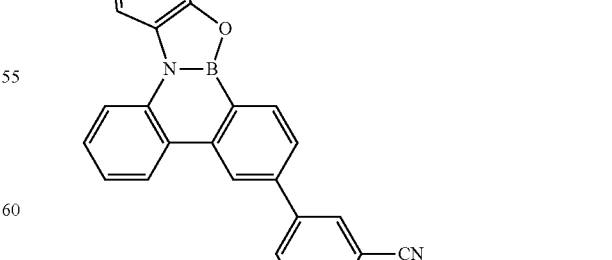
2-47

-continued
2-48
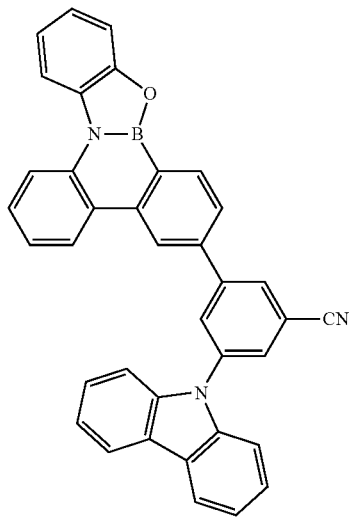
2-49
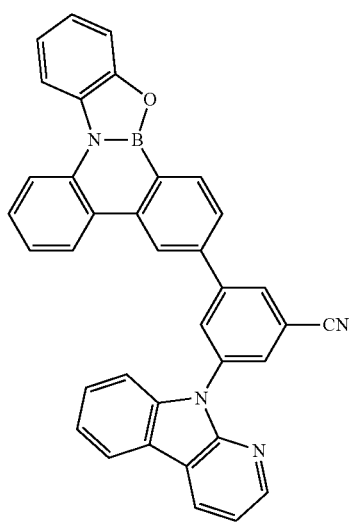
2-50
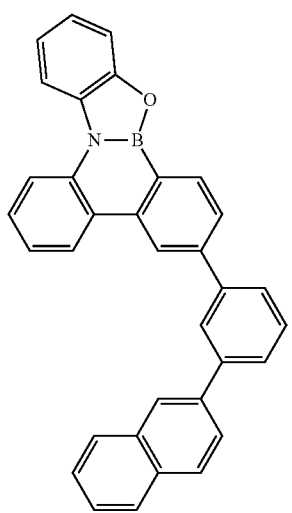
-continued
2-51
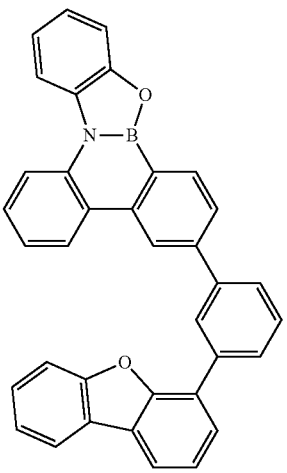
2-52
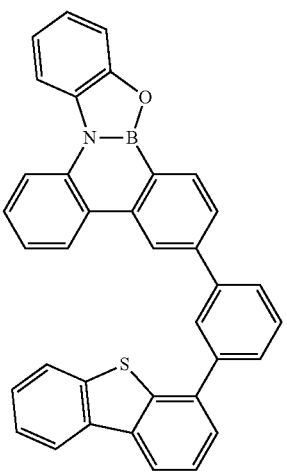
2-54
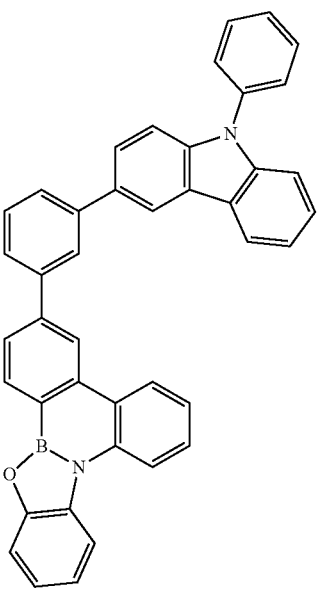

2-55

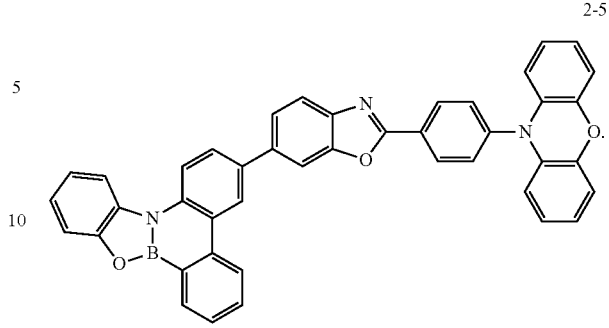

2-58

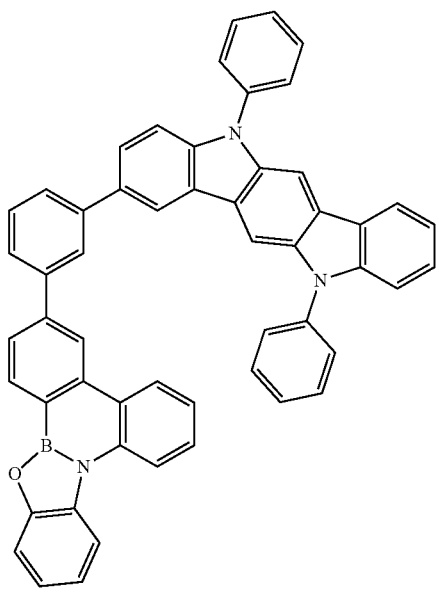

2-56

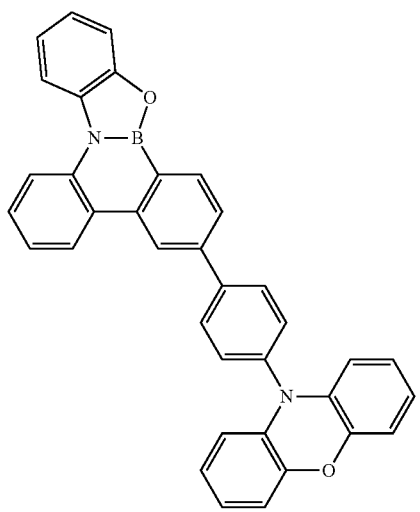

2-57

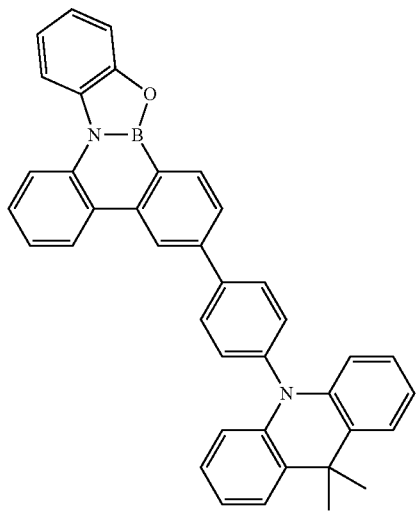

11. A luminescence device comprising:
a first electrode;
a second electrode on the first electrode; and
an emission layer between the first electrode and the second electrode and comprising a host and a dopant,
wherein the dopant is a polycyclic compound represented by Formula A:

DU-AU   Formula A wherein in Formula A, DU is represented by Formula A-1, and AU is represented by Formula A-2:

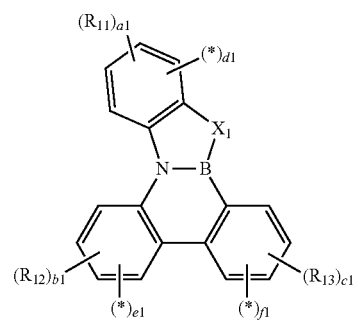

Formula A-1

*—$(L_{21})_{p1}$—$(Ar_{21})_{q1}$   Formula A-2 wherein in Formula A-1,
$X_1$ is O, S, Se, $CR_{14}R_{15}$, $SiR_{16}R_{17}$, or N—*
$R_{11}$ to $R_{17}$ are each independently a hydrogen atom, a deuterium atom, a substituted or unsubstituted silyl group of 1 to 30 carbon atoms, a substituted or unsubstituted aryl amine group of 6 to 30 carbon atoms for forming a ring, a substituted or unsubstituted alkyl group of 1 to 30 carbon atoms, a substituted or unsubstituted alkenyl group of 2 to 30 carbon atoms, a substituted or unsubstituted aryl group of 6 to 60 carbon atoms for forming a ring, or a substituted or unsubstituted heteroaryl group of 2 to 60 carbon atoms for forming a ring, or combined with an adjacent group to form a ring,
a1 to c1 are each independently an integer of 0 to 4,
d1 to f1 are each independently 0 or 1, and
—* is a connection point with Formula A-2,
wherein in Formula A-2,
$L_{21}$ is a direct linkage, a substituted or unsubstituted arylene group of 6 to 60 carbon atoms for forming a ring, or a substituted or unsubstituted heteroarylene group of 2 to 60 carbon atoms for forming a ring, $Ar_{21}$ is a substituted or unsubstituted aryl group of 6 to 60 carbon atoms for forming a ring, or a substituted or unsubstituted heteroaryl group of 2 to 60 carbon atoms for forming a ring, at least one selected from $L_{21}$ and $Ar_{21}$ is an electron withdrawing group having a Hammett constant greater than 0, p1 is 0 or 1, and q1 is 1, and wherein when $X_1$ is O, S, $CR_{14}R_{15}$, or $SiR_{16}R_{17}$, d1 to f1 is each 0, at least one selected from among a1 to c1 is 1 to 4, and a corresponding at least one selected from among $R_{11}$ to $R_{13}$ are each independently represented by any one from RO-1 to RO-14 and RO-16 to RO-20:

RO-1
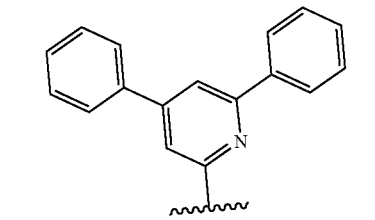

RO-2
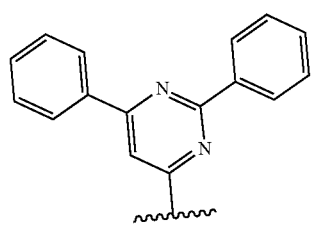

RO-3
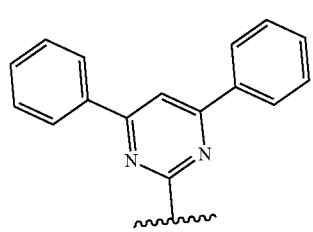

RO-4
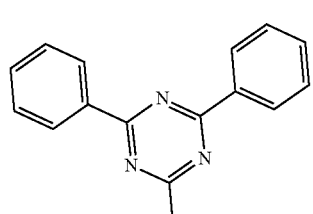

RO-5
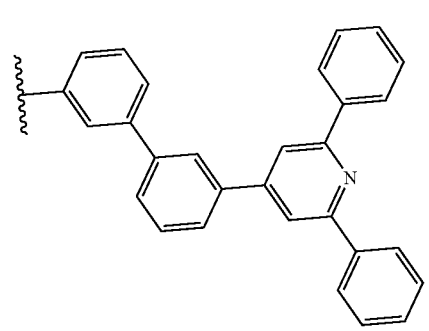

-continued

RO-6
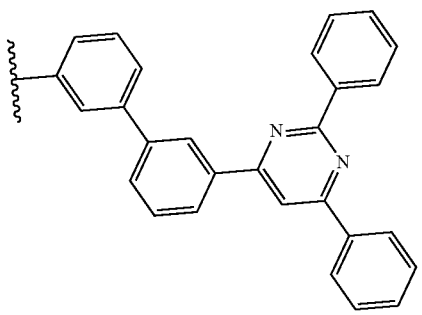

RO-7
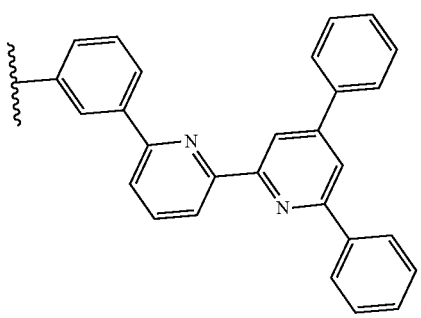

RO-8
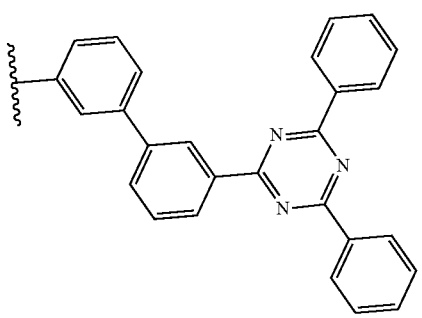

RO-9
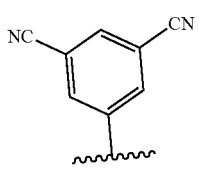

RO-10
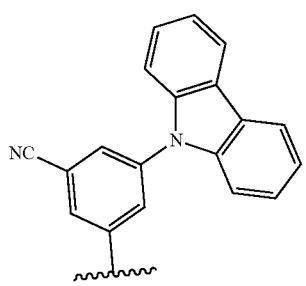

RO-11
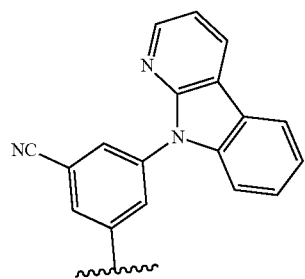
RO-12
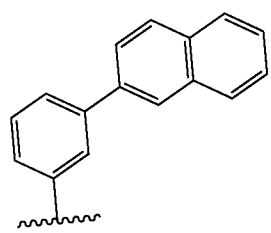
RO-13
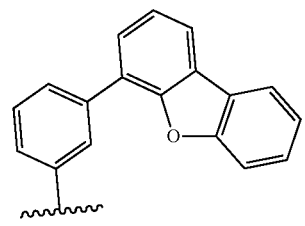
RO-14
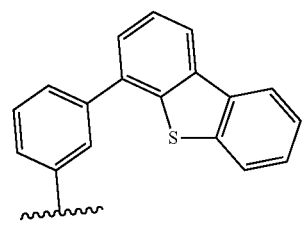
RO-16
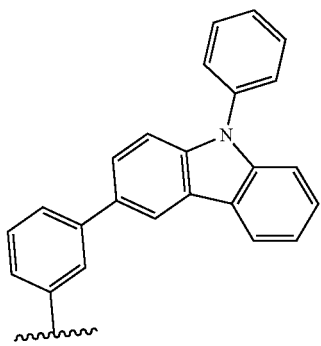
RO-17
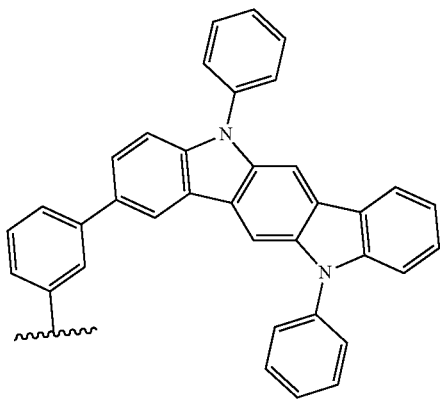
RO-18
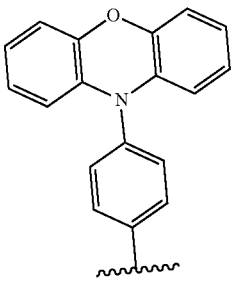
RO-19
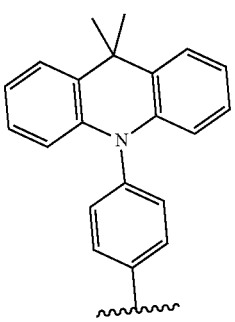
RO-20
wherein when $X_1$ is N—*, *—$(L_{21})_{p1}$-$(Ar_{21})_{q1}$ is represented by any one from RN-1 to RN-11, RN-16 to RN-18 and RN-20 to RN-48:

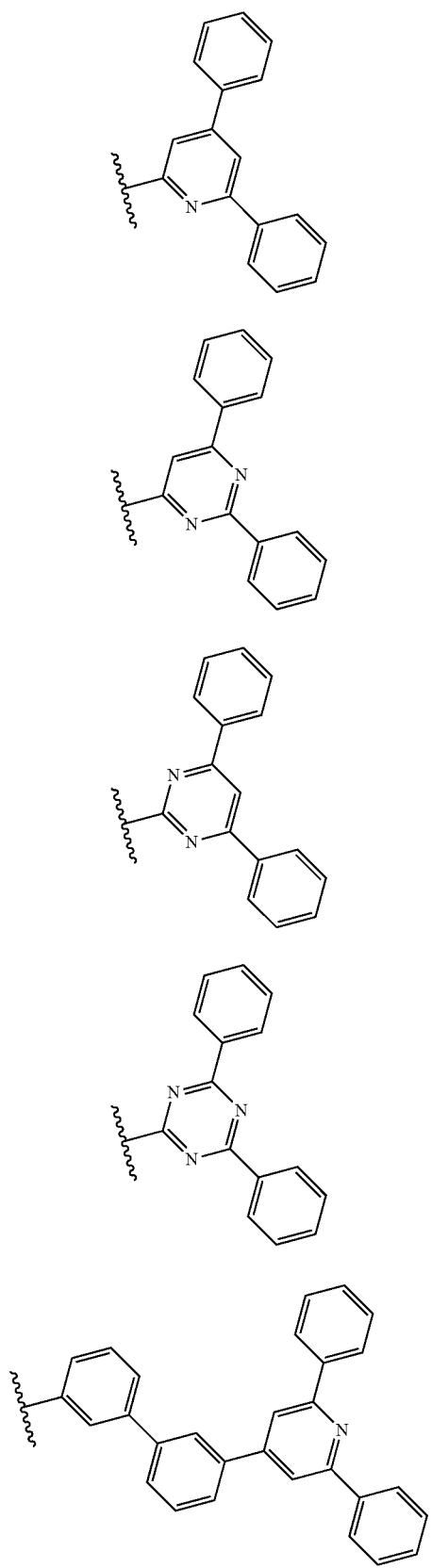
RN-1
RN-2
RN-3
RN-4
RN-5
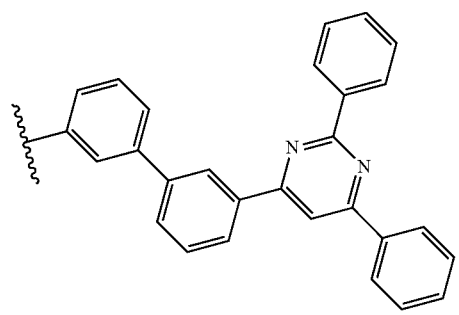
RN-6
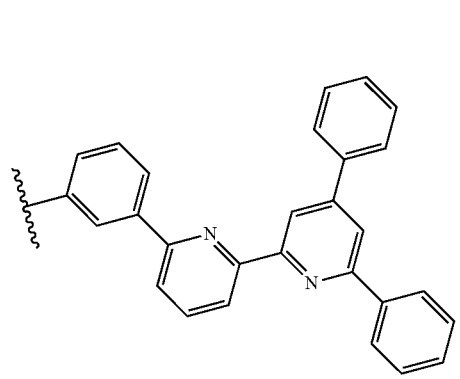
RN-7
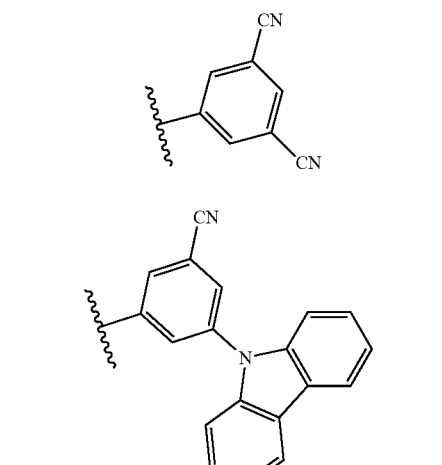
RN-8
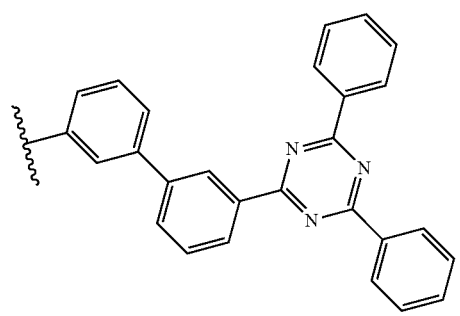
RN-9
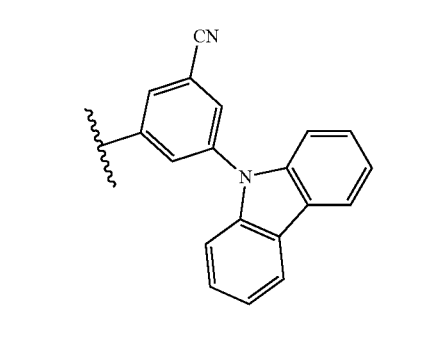
RN-10

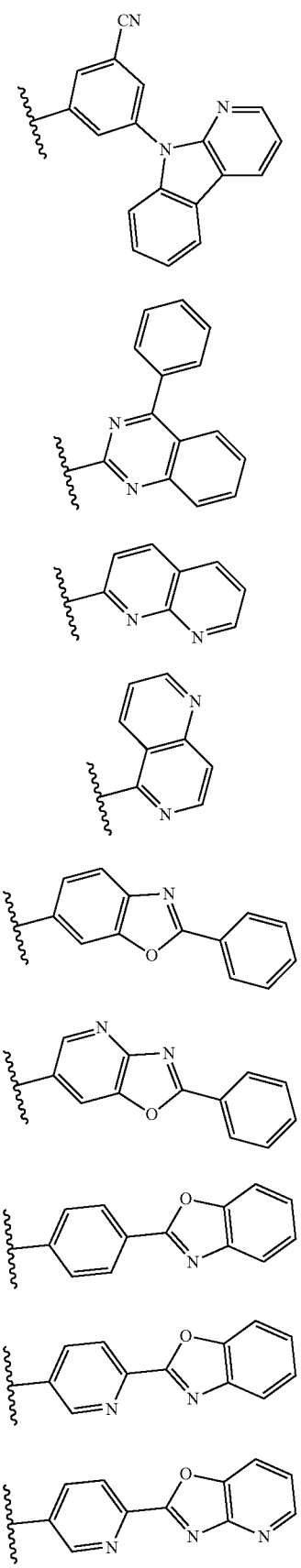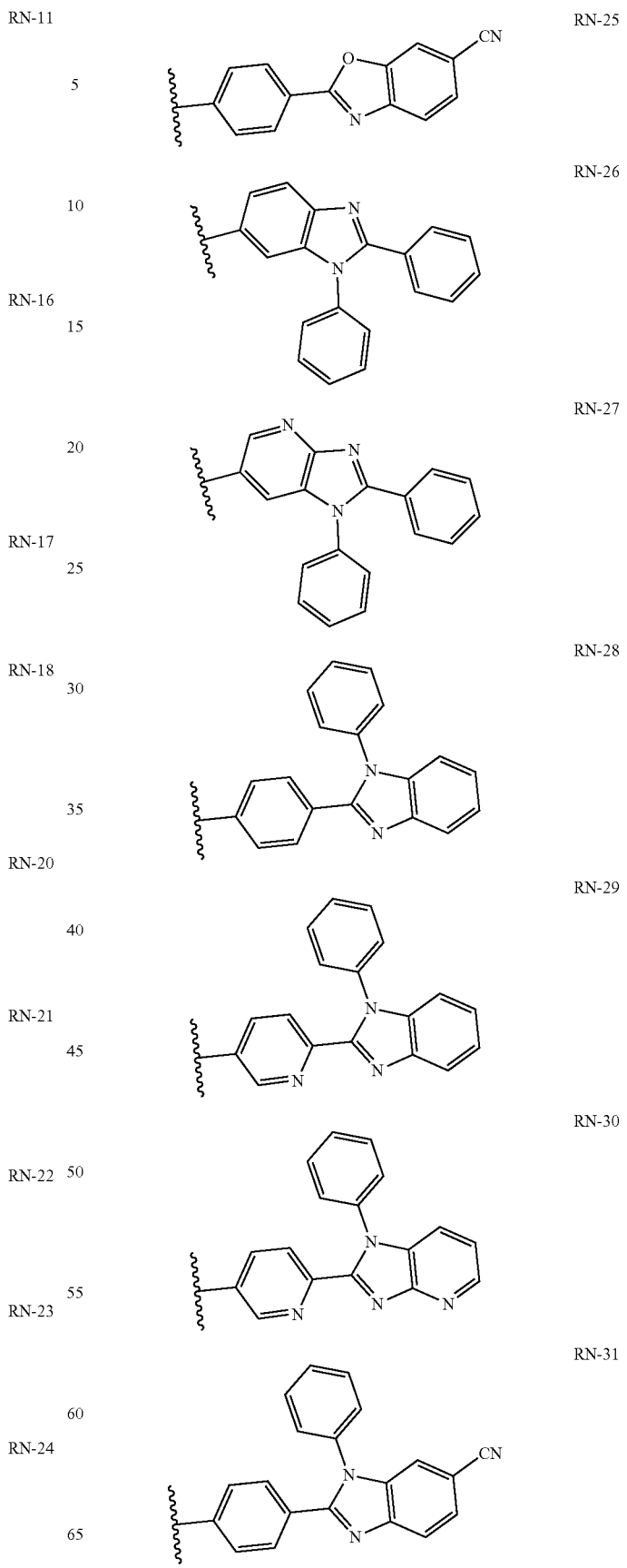

RN-32
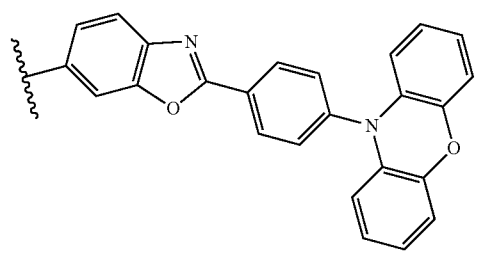
RN-33
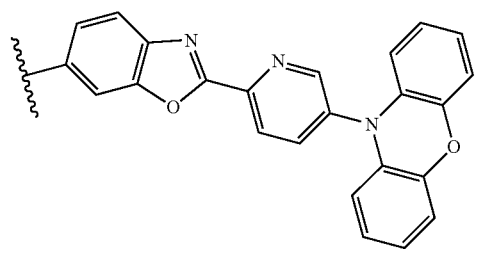
RN-34
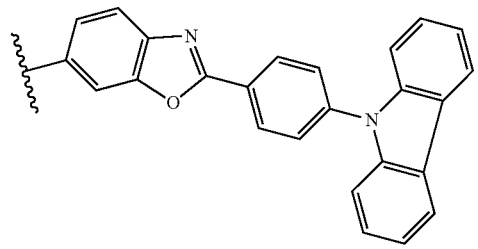
RN-35
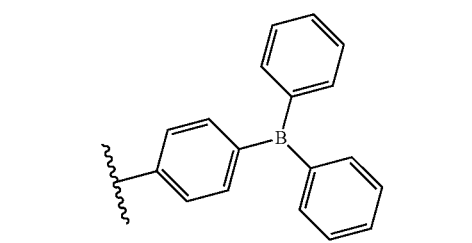
RN-36
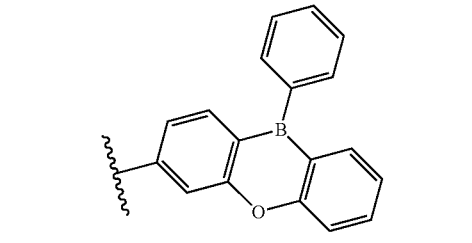
RN-37
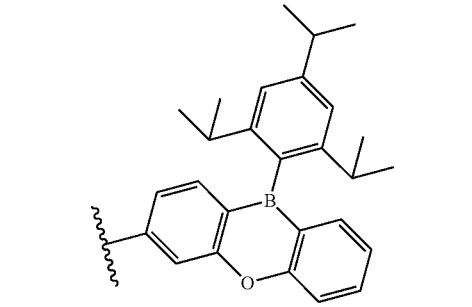
RN-38
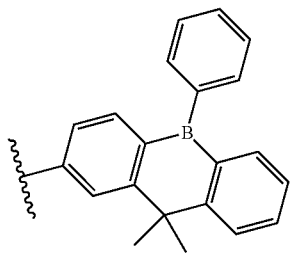
RN-39
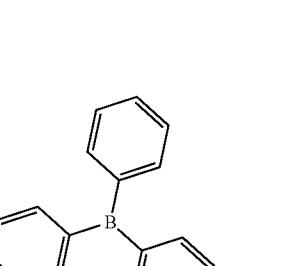
RN-40
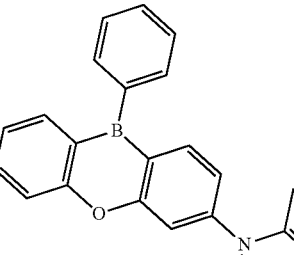
RN-41
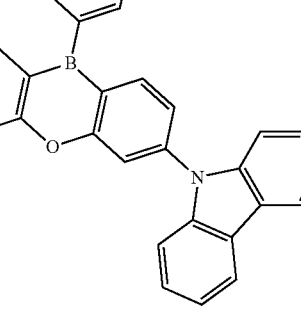

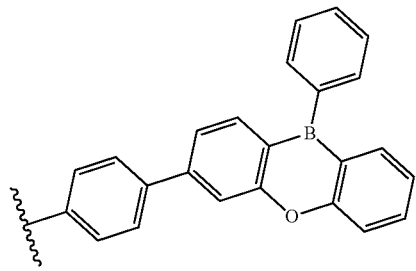
RN-42

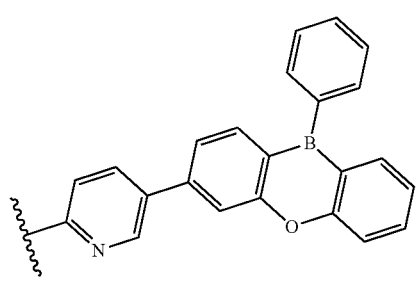
RN-43

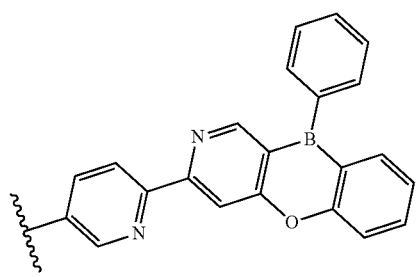
RN-44

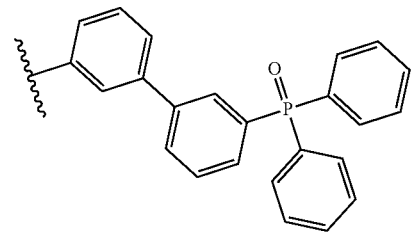
RN-45

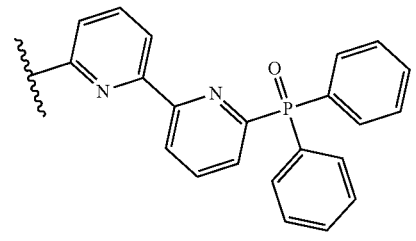
RN-46

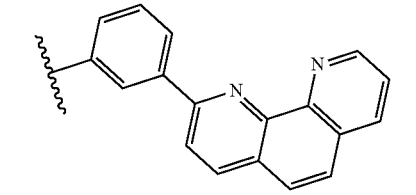
RN-47

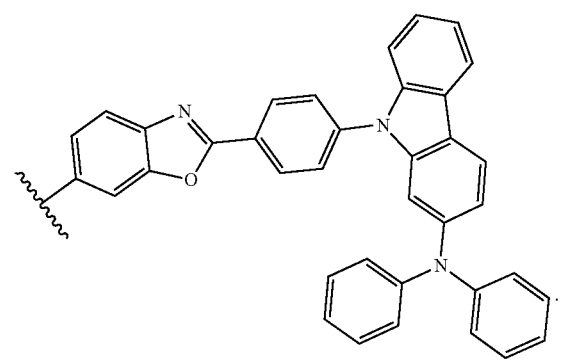
RN-48

12. The luminescence device of claim 11, wherein the emission layer is to emit thermally activated delayed fluorescence.

13. The luminescence device of claim 11, wherein the polycyclic compound has a difference between a lowest singlet excitation energy level and a lowest triplet excitation energy level of about 0.05 eV.

14. The luminescence device of claim 11, wherein the emission layer is to emit light having a central wavelength of about 490 nm to about 750 nm.

15. A polycyclic compound represented by Formula 1:

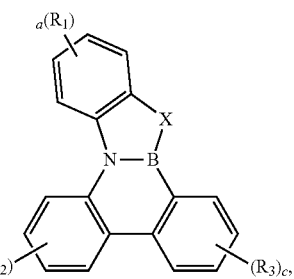

Formula 1 wherein in Formula 1,

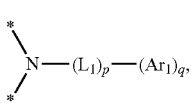

X is O, S, Se, $CR_4R_5$, $SiR_6R_7$, or $R_1$ to $R_7$ are each independently a hydrogen atom, a deuterium atom, a substituted or unsubstituted silyl group of 1 to 30 carbon atoms, a substituted or unsubstituted aryl amine group of 6 to 30 carbon atoms for forming a ring, a substituted or unsubstituted alkyl group of 1 to 30 carbon atoms, a substituted or unsubstituted alkenyl group of 2 to 30 carbon atoms, a substituted or unsubstituted aryl group of 6 to 60 carbon atoms for forming a ring, or a substituted or unsubstituted heteroaryl group of 2 to 60 carbon atoms for forming a ring, or combined with an adjacent group to form a ring, "a" to "c" are each independently an integer of 0 to 4, and wherein, when X is O, S, $CR_4R_5$, or $SiR_6R_7$, at least one selected from among a to c is 1 to 4, and a corresponding at least one selected from among $R_1$ to R₃ are each independently represented by any one from RO-1 to RO-14 and RO-16 to RO-20:
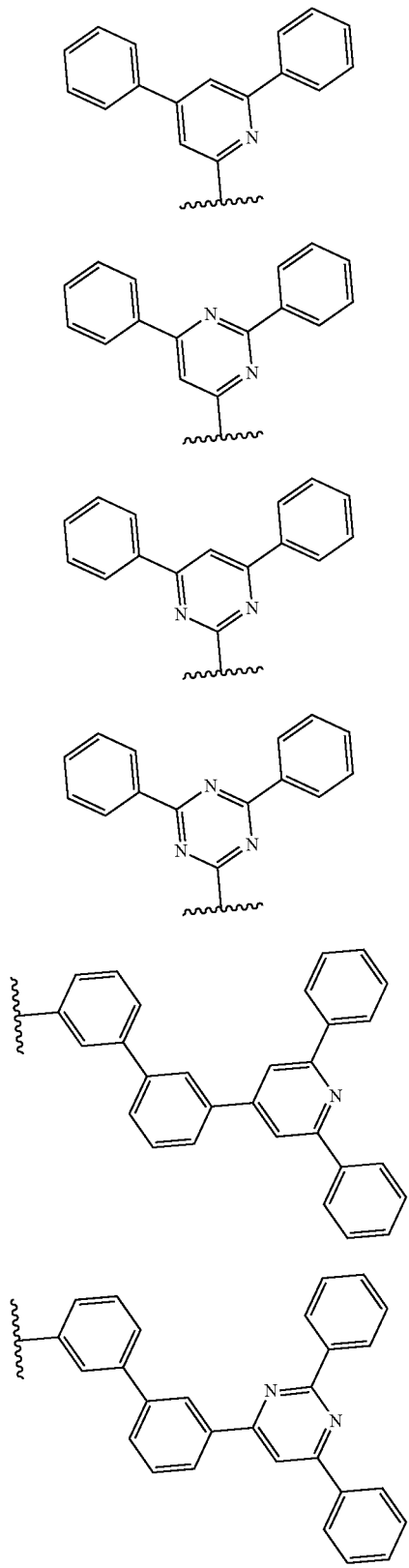
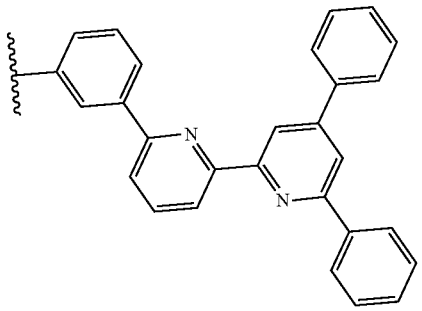
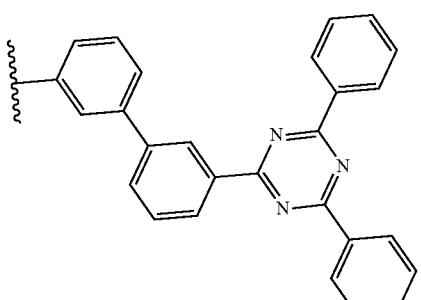
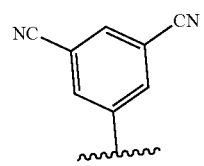
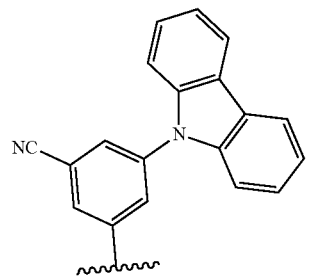
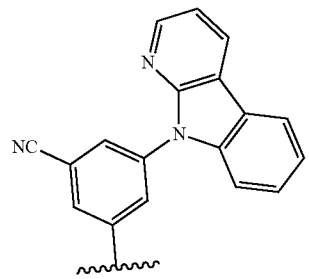
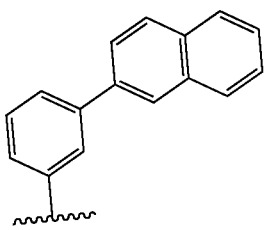

-continued

RO-13
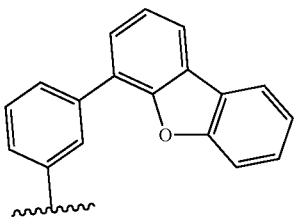

RO-14
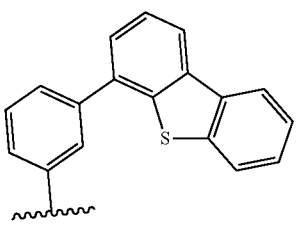

RO-16
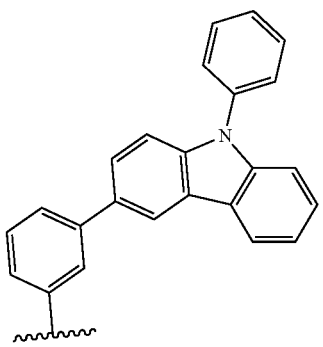

RO-17
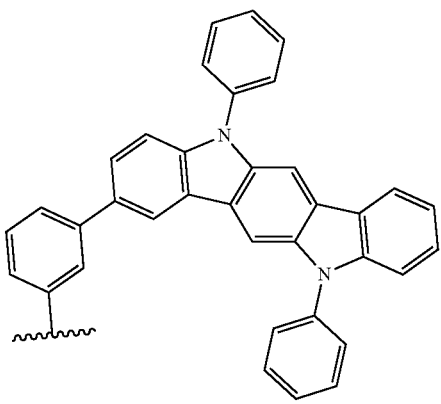

RO-18
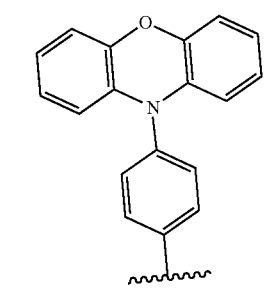

-continued

RO-19
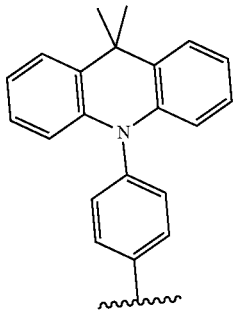

RO-20
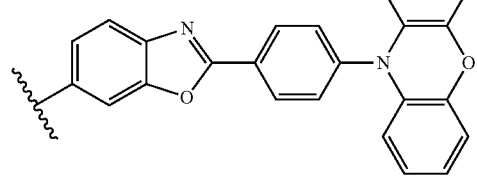

when X is Se,
at least one selected from $R_1$ to $R_3$ is a substituted or unsubstituted aryl group of 6 to 60 carbon atoms for forming a ring, or a substituted or unsubstituted heteroaryl group of 2 to 60 carbon atoms for forming a ring, and
a sum of "a" to "c" is 1 or more, and
when X is

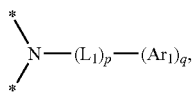

$(L_1)_p$-$(Ar_1)_q$ is represented by any one from RN-1 to RN-11, RN-16 to RN-18 and RN-20 to RN-48:

RN-1
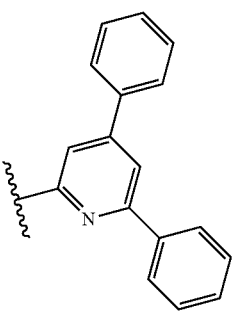

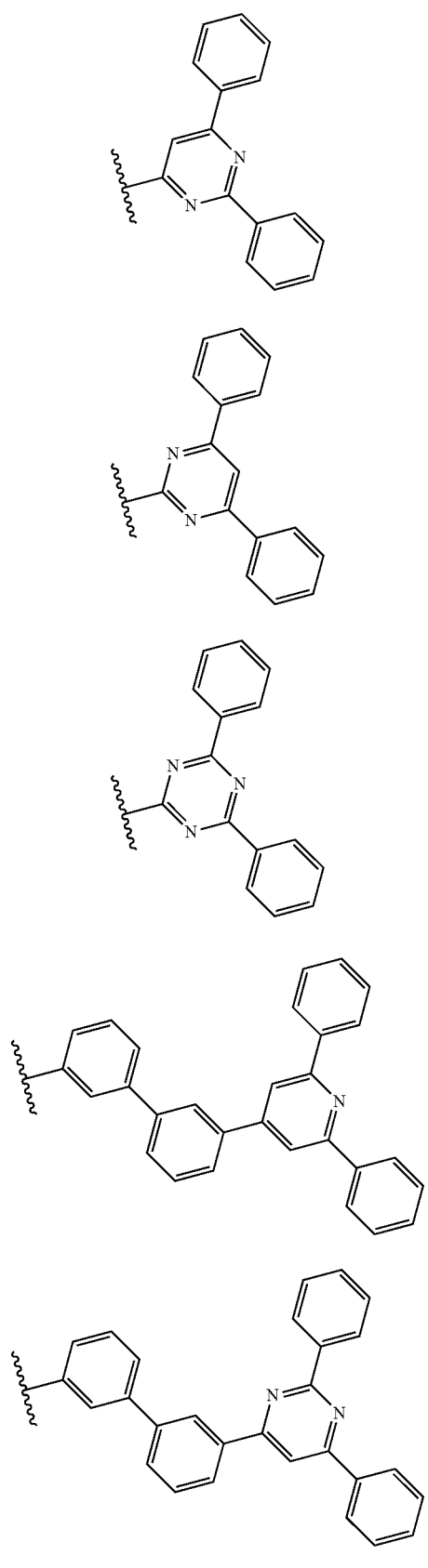

RN-17
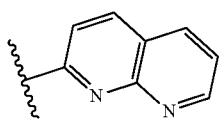
RN-18
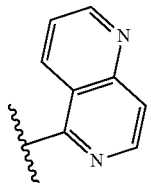
RN-20
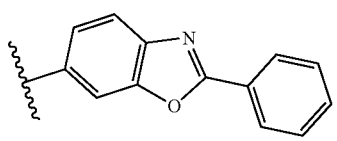
RN-21
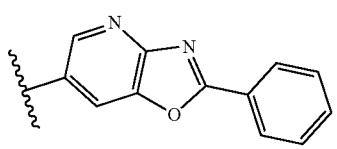
RN-22
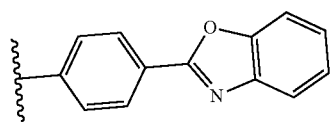
RN-23
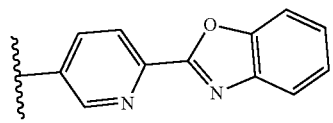
RN-24
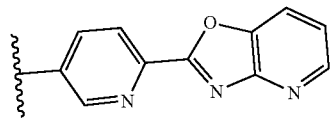
RN-25
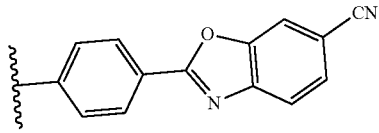
RN-26
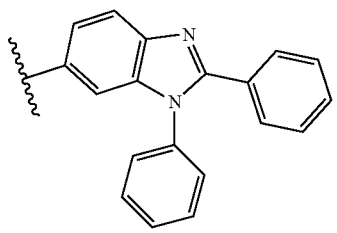
RN-27
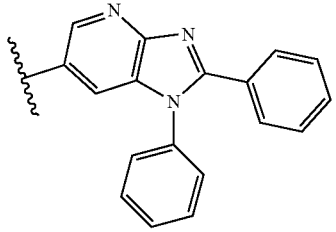
RN-28
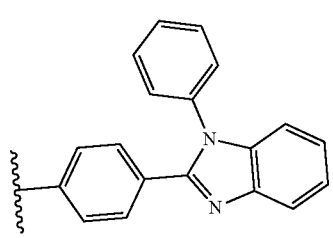
RN-29
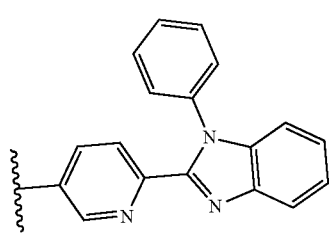
RN-30
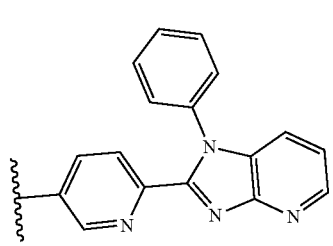
RN-31
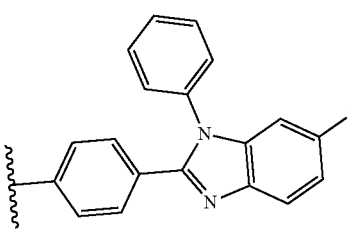
RN-32
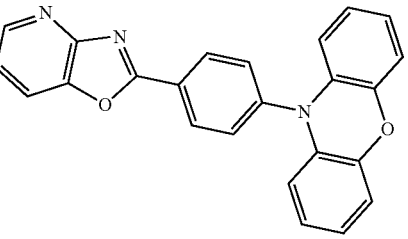

RN-33
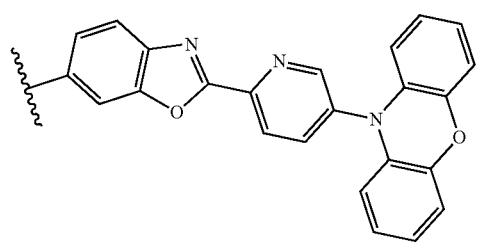
RN-34
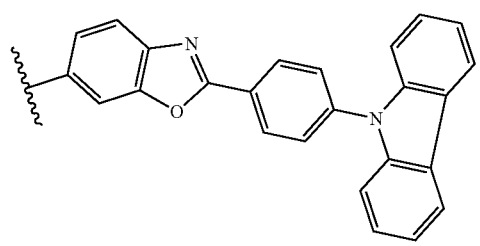
RN-35
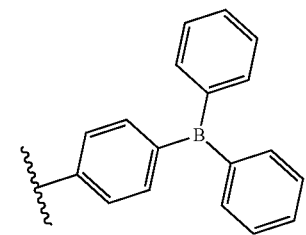
RN-36
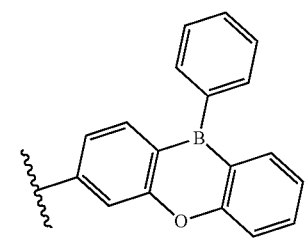
RN-37
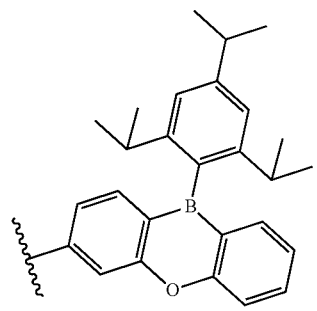
RN-38
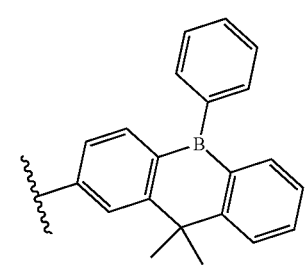
RN-39
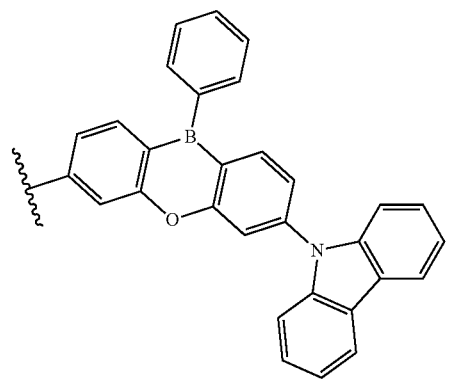
RN-40
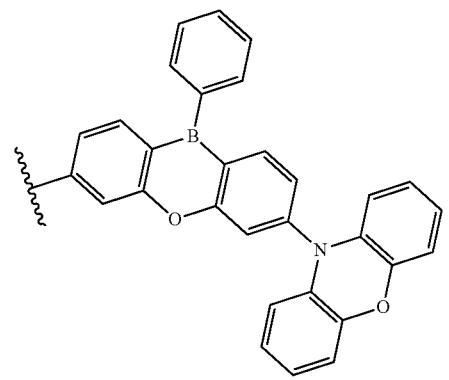
RN-41
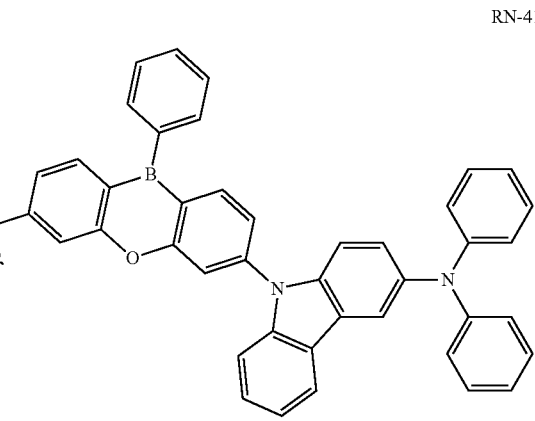
RN-42
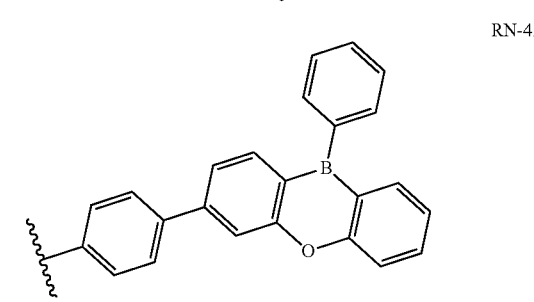

-continued

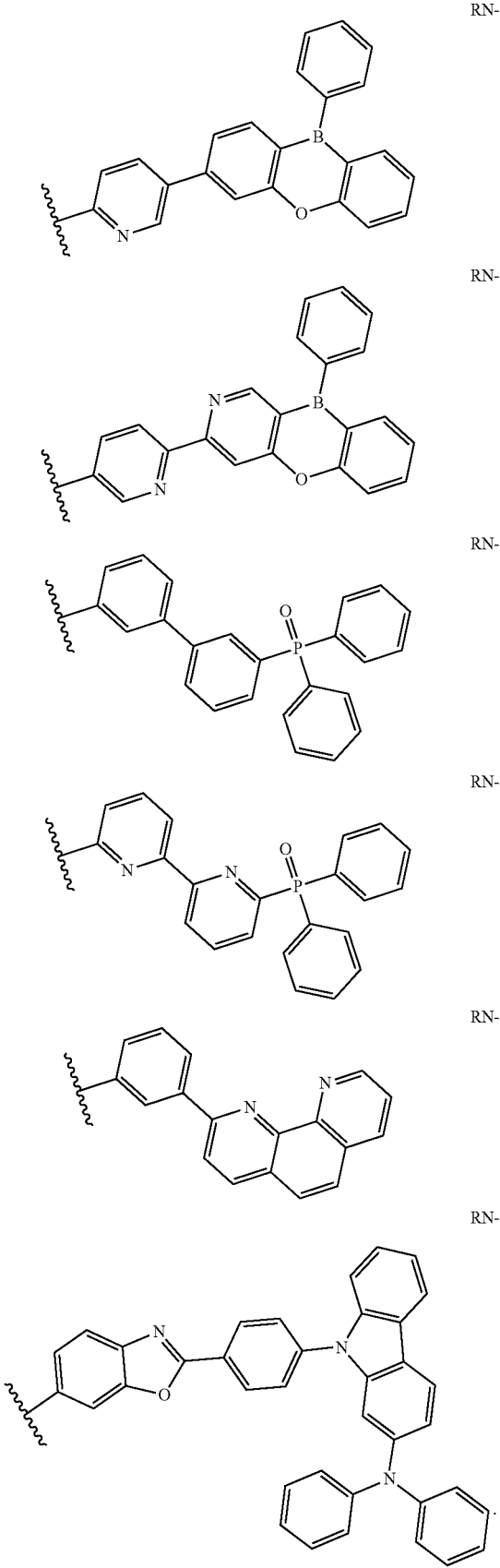

RN-43

RN-44

RN-45

RN-46

RN-47

RN-48

16. The polycyclic compound of claim 15, wherein Formula 1 is represented by one selected from Formula 1-1 to Formula 1-3:

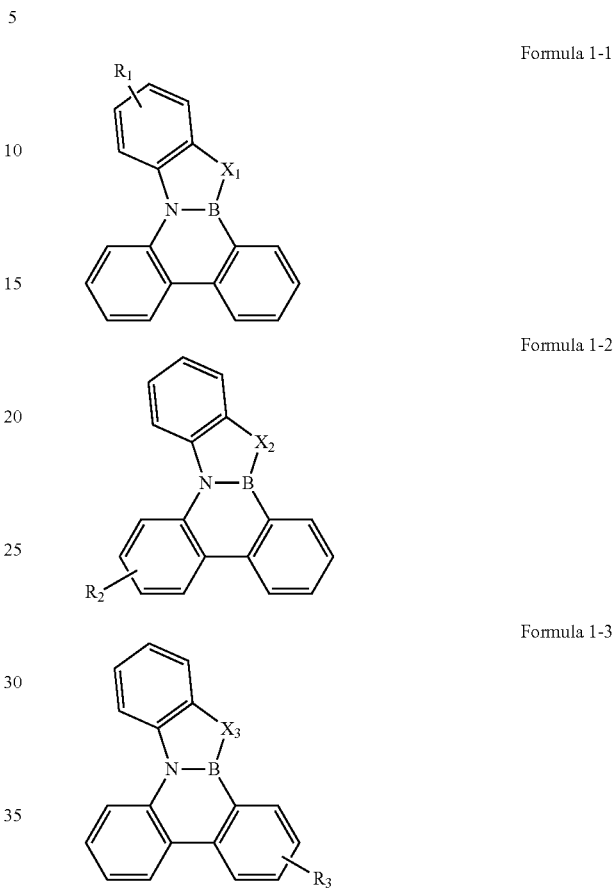

Formula 1-1

Formula 1-2

Formula 1-3 wherein in Formula 1-1 to Formula 1-3, $X_1$ to $X_3$ are each independently O, or $CR_4R_5$, and $R_1$ to $R_5$ are each independently the same as defined in Formula 1.

17. The polycyclic compound of claim 15, wherein Formula 1 is represented by Formula 1-4:

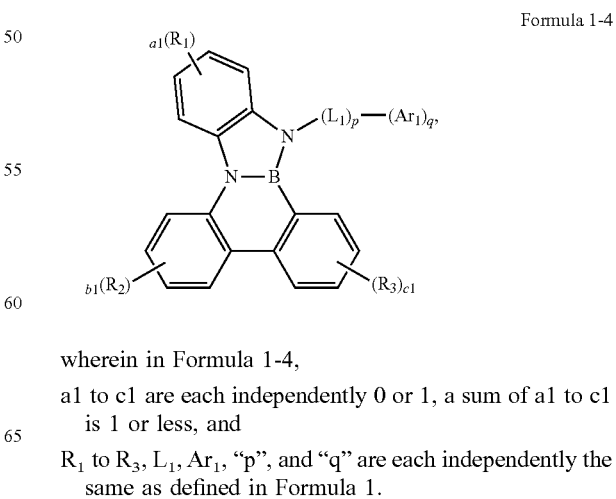

Formula 1-4 wherein in Formula 1-4, a1 to c1 are each independently 0 or 1, a sum of a1 to c1 is 1 or less, and $R_1$ to $R_3$, $L_1$, $Ar_1$, "p", and "q" are each independently the same as defined in Formula 1.

18. The polycyclic compound of claim 15, wherein X is Se and
R₁ to R₃ are each independently represented by Formula 2:

$$*\text{-}(L_{11})_r\text{-}(Ar_{11})_s,$$  Formula 2 wherein in Formula 2,
L₁₁ is a direct linkage, a substituted or unsubstituted arylene group of 6 to 60 carbon atoms for forming a ring, or a substituted or unsubstituted heteroarylene group of 2 to 60 carbon atoms for forming a ring,
Ar₁₁ is a substituted or unsubstituted aryl group of 6 to 60 carbon atoms for forming a ring, or a substituted or unsubstituted heteroaryl group of 2 to 60 carbon atoms for forming a ring,
"r" is an integer of 0 to 2, and
"s" is 1.

19. A polycyclic compound comprises at least one selected from compounds represented in Compound Group 1:

Compound Group 1

1-1
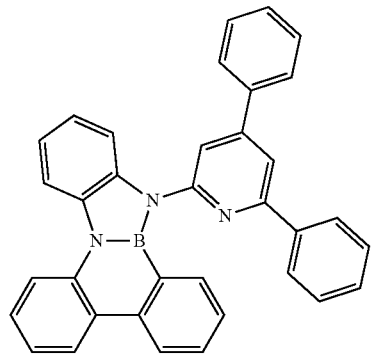

1-2
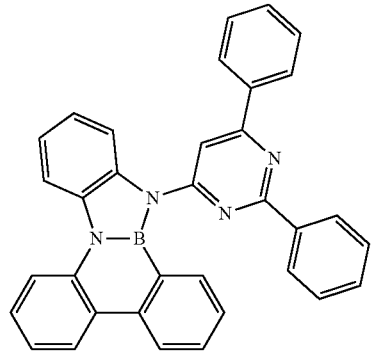

1-3
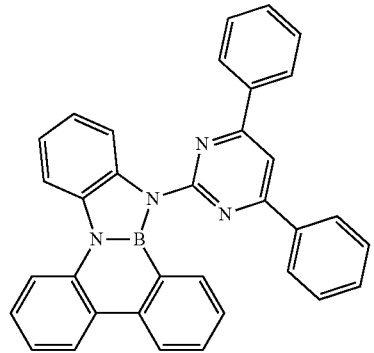

-continued 1-4
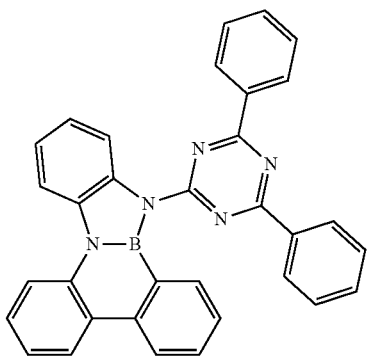

1-5
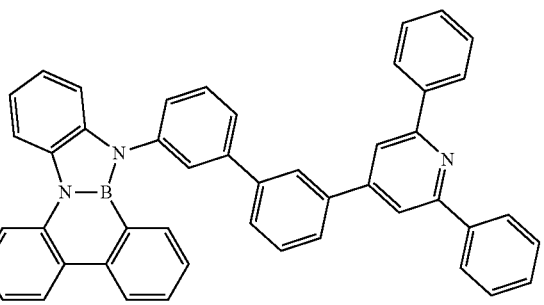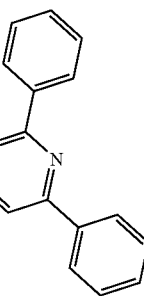

1-6
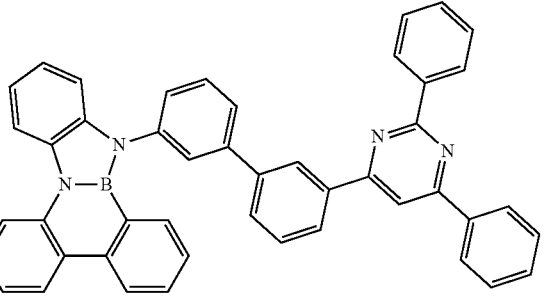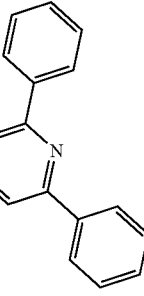

1-7
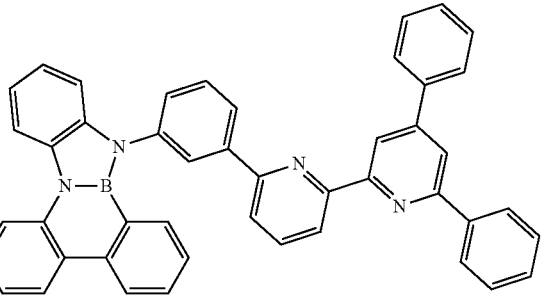

1-8
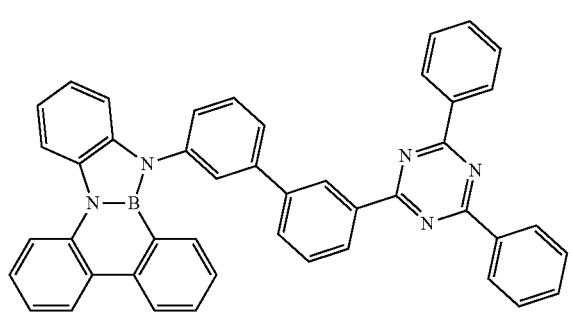
1-9
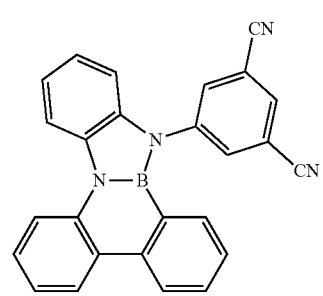
1-10
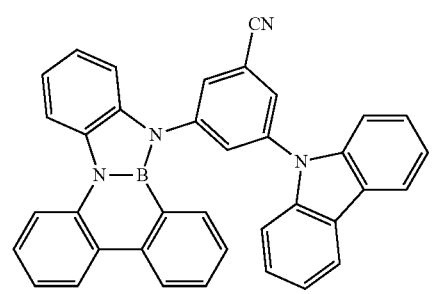
1-11
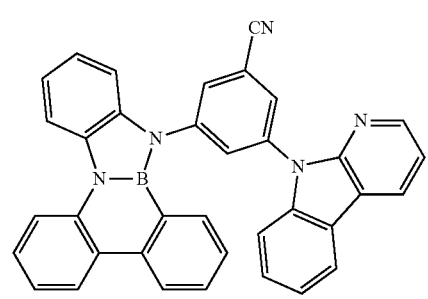
1-14
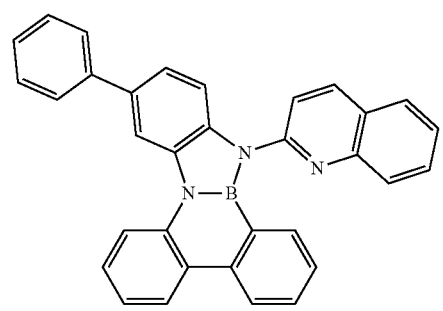
1-15
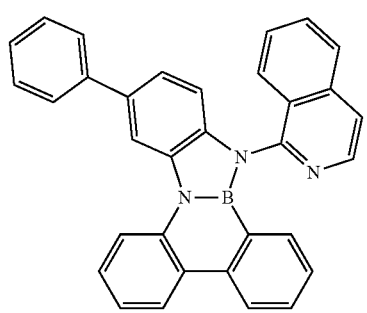
1-16
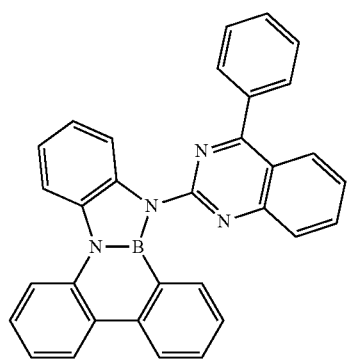
1-17
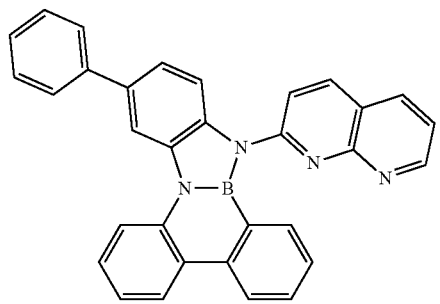
1-18
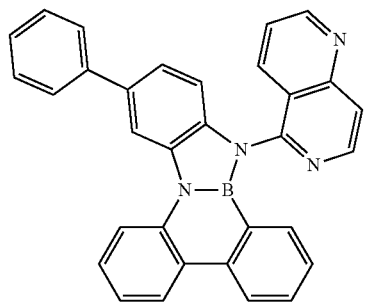
1-19
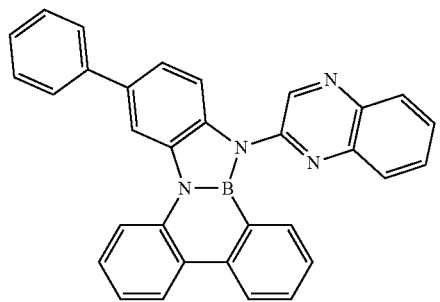

1-20 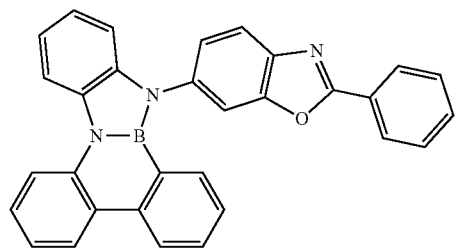
1-21 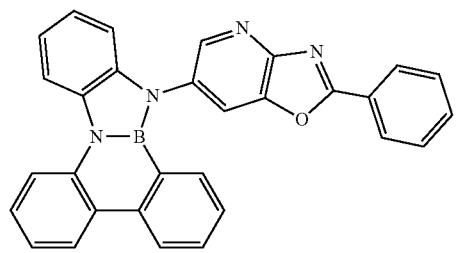
1-22 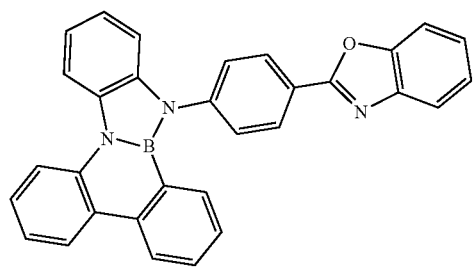
1-23 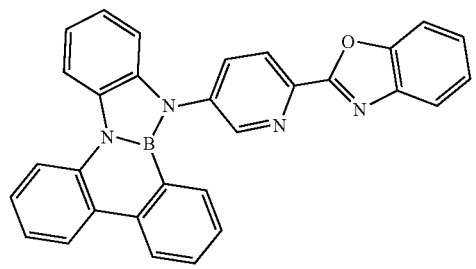
1-24 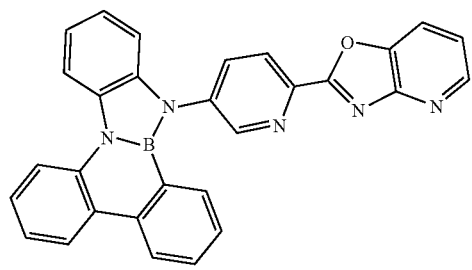
1-25 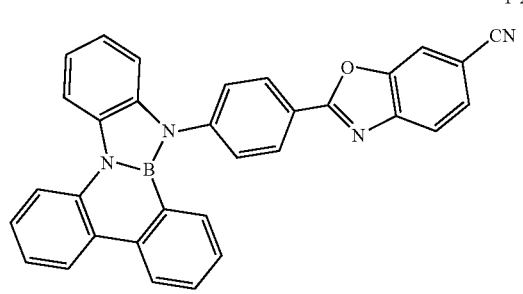
1-26 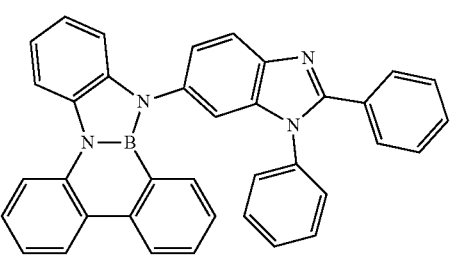
1-27 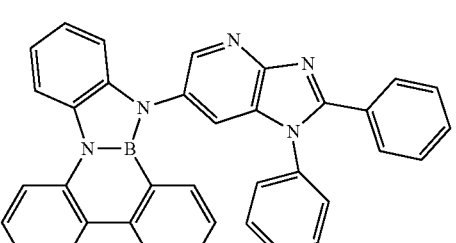
1-28 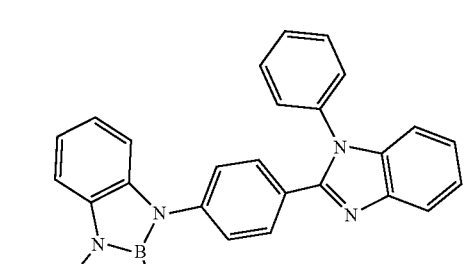
1-29 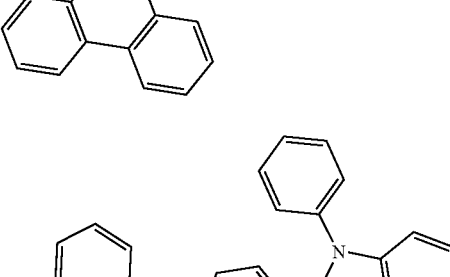
1-30 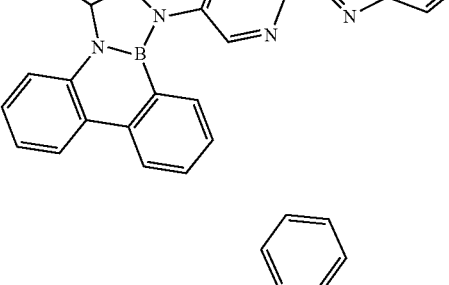
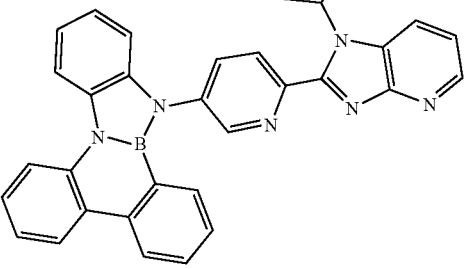

-continued
1-31
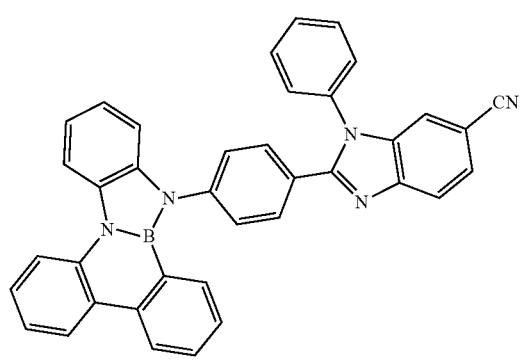
1-32
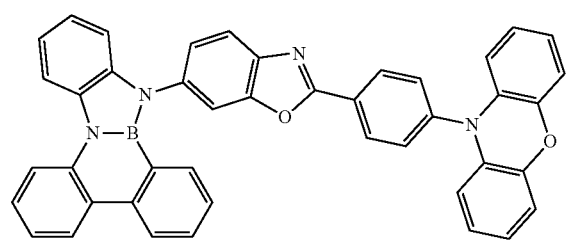
1-33
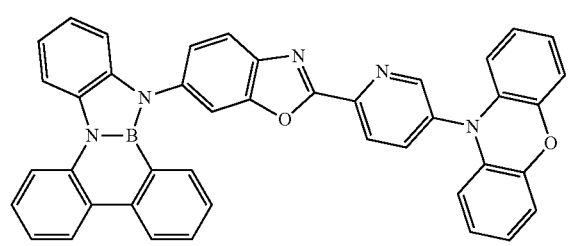
1-34
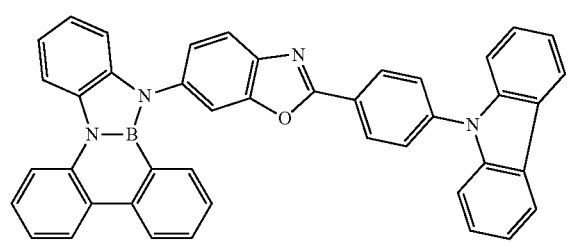
1-35
-continued
1-36
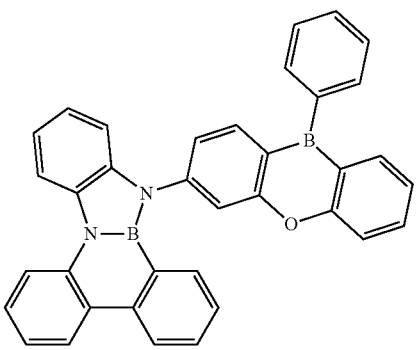
1-37
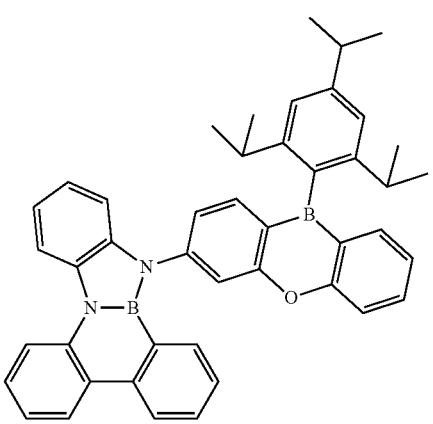
1-38
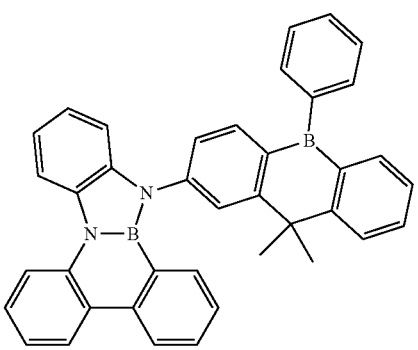
1-39
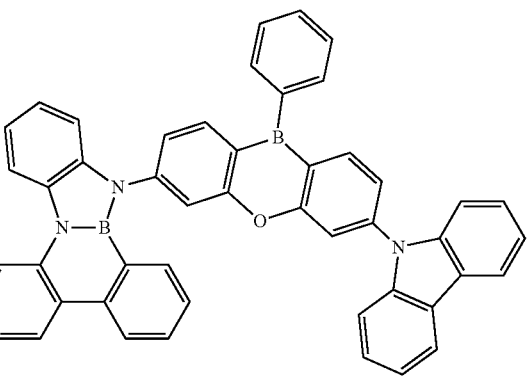

1-40
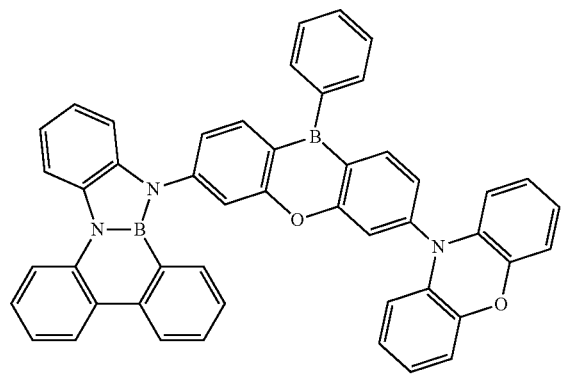
1-41
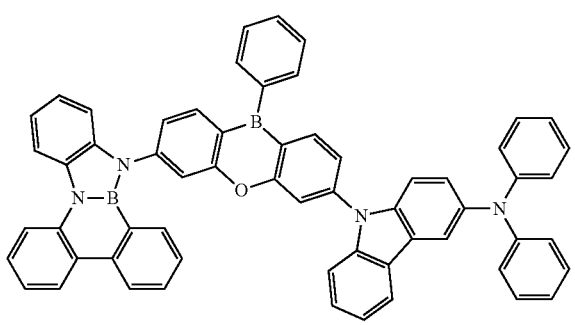
1-42
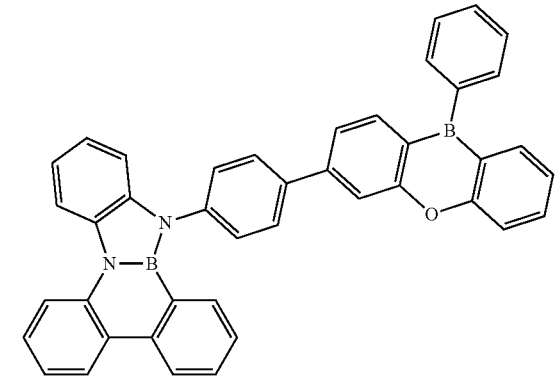
1-43
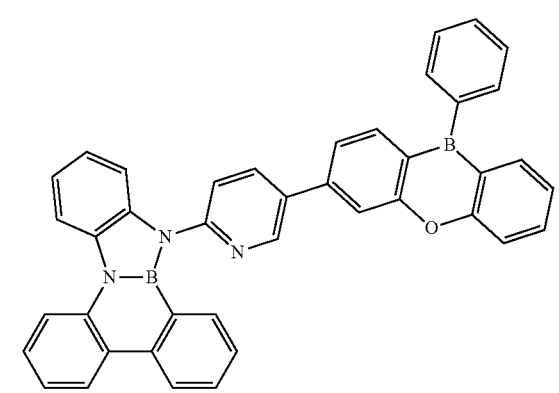
1-44
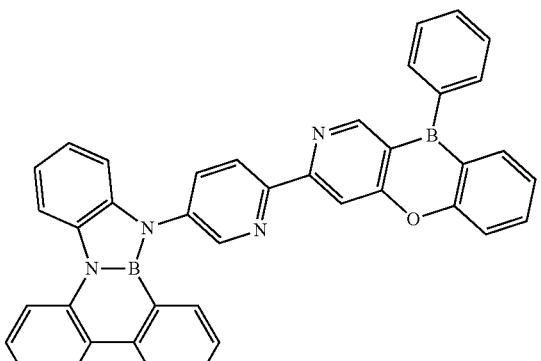
1-45
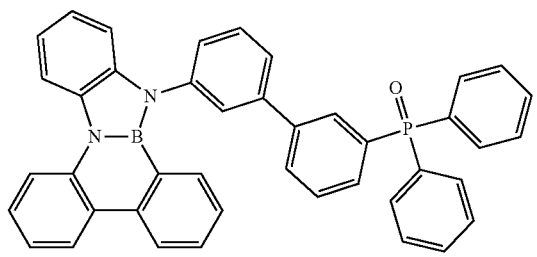
1-46
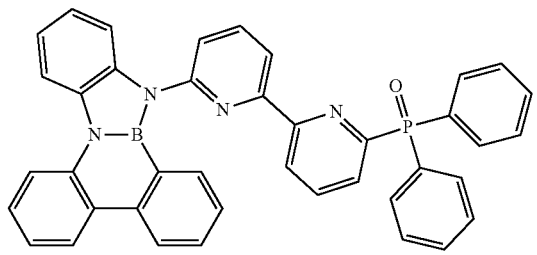
1-47
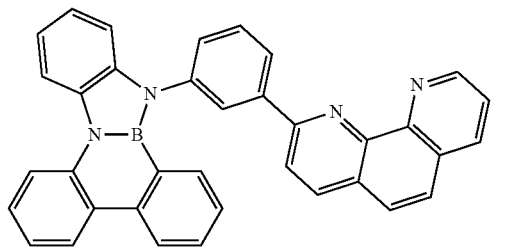
1-48
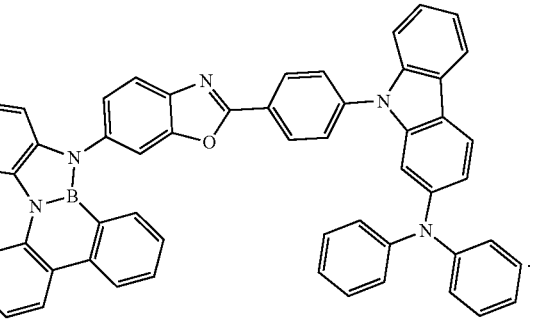

20. The polycyclic compound of claim 15, wherein Formula 1 comprises at least one selected from compounds represented in Compound Group 2:
Compound Group 2
2-1
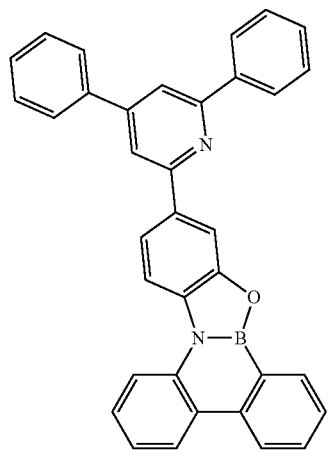
2-2
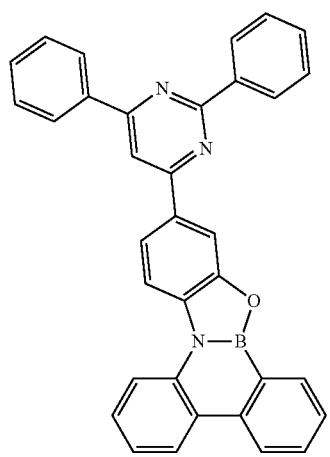
2-3
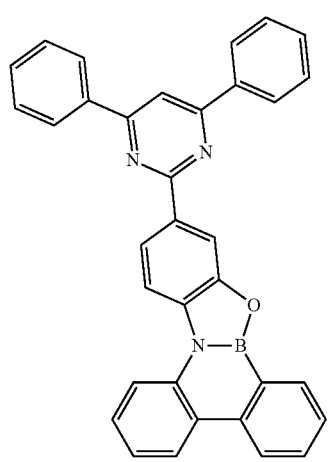
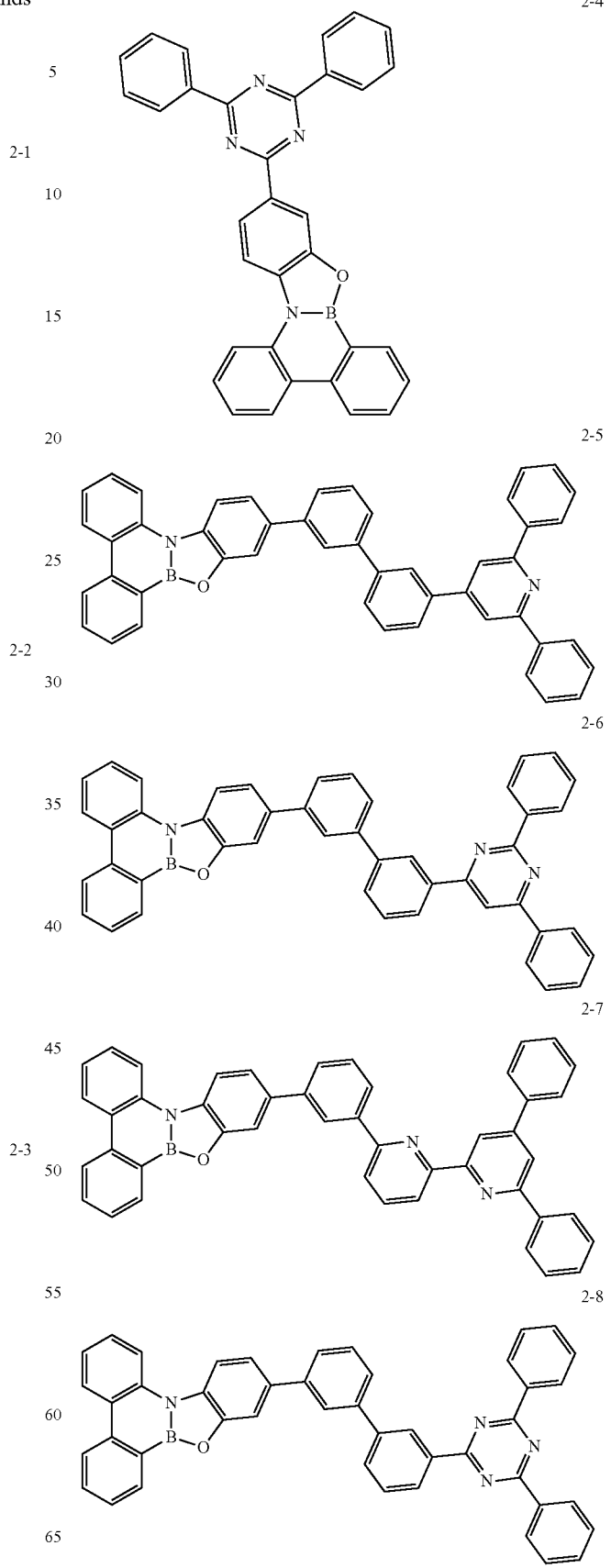

2-9
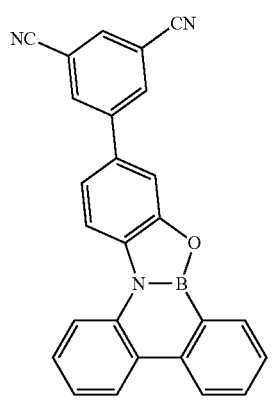
2-12
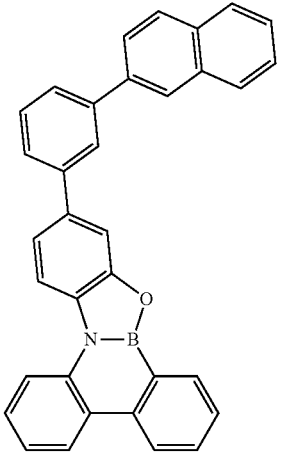
2-10
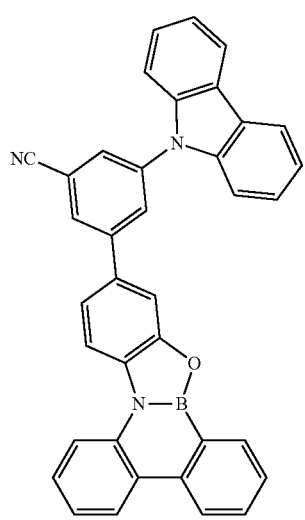
2-13
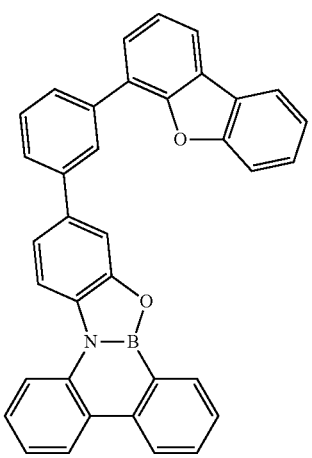
2-11
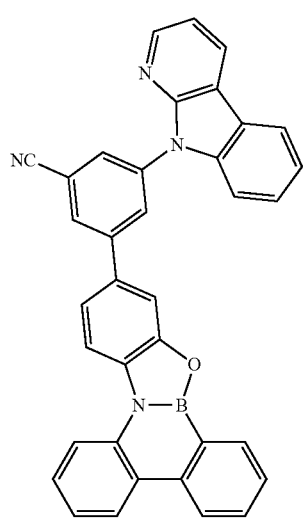
2-14
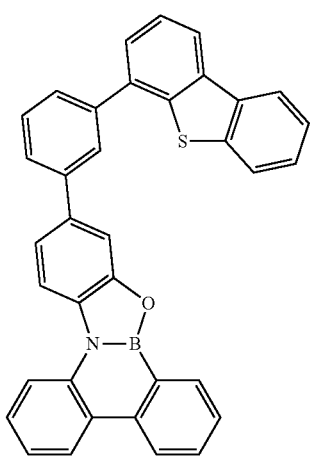

-continued
2-16
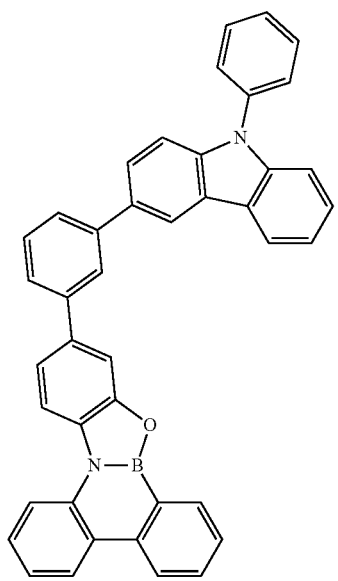
2-17
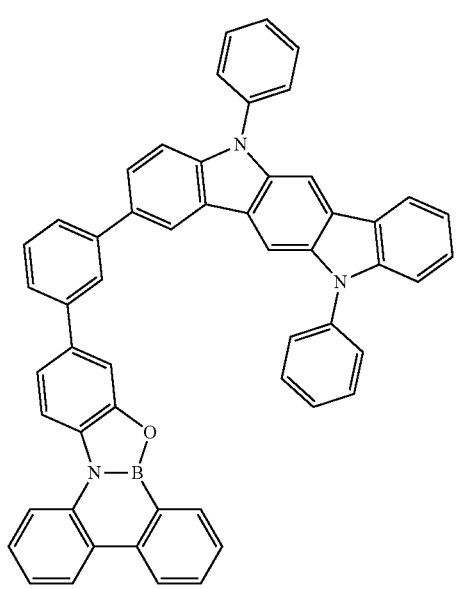
2-18
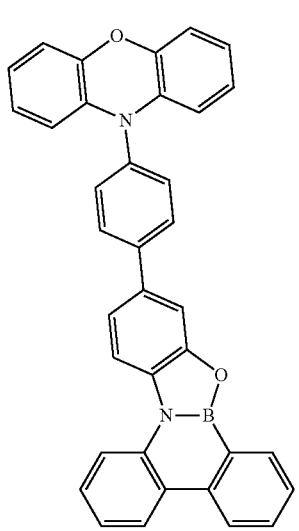
-continued
2-19
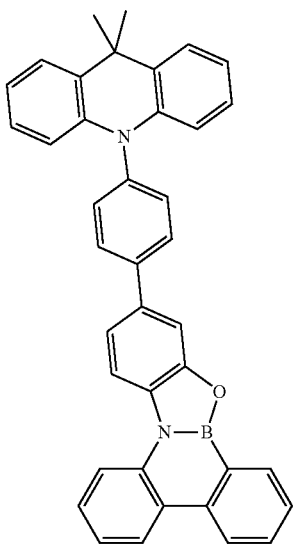
2-20
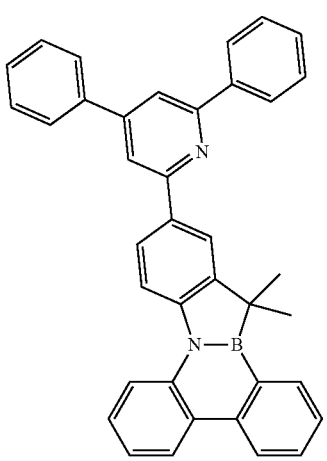
2-21
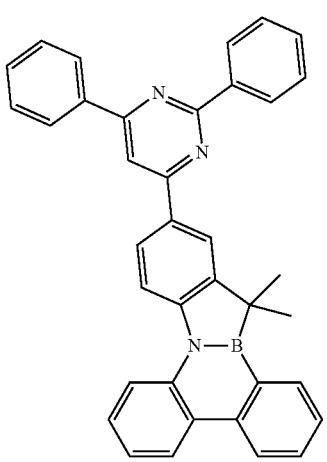

2-22
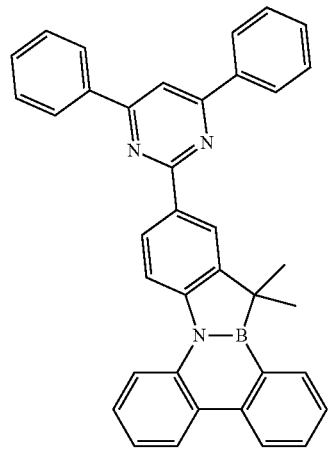
2-23
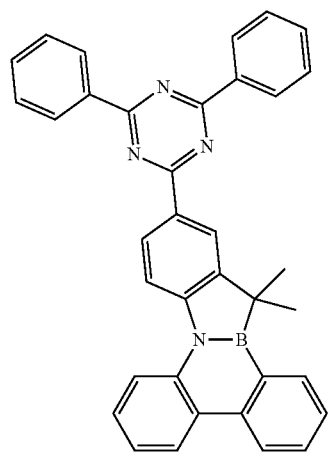
2-24
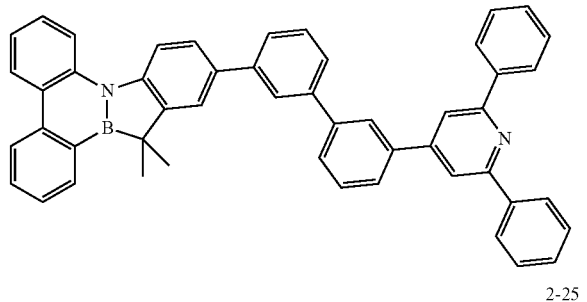
2-25
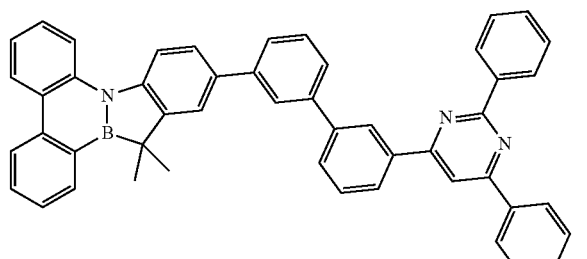
2-26
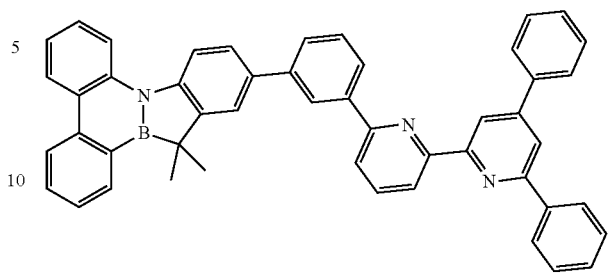
2-27
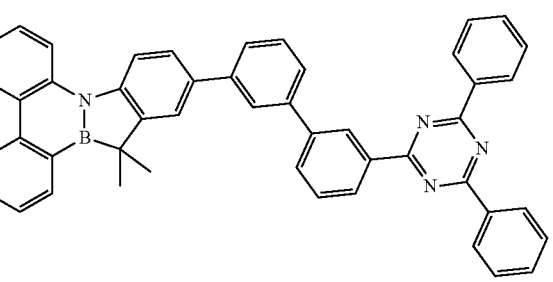
2-28
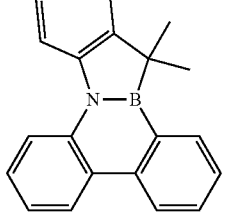
2-29
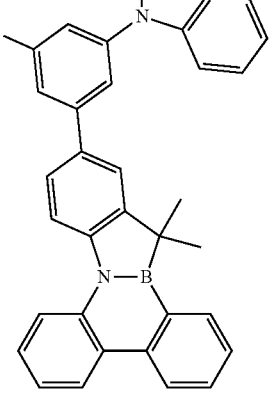

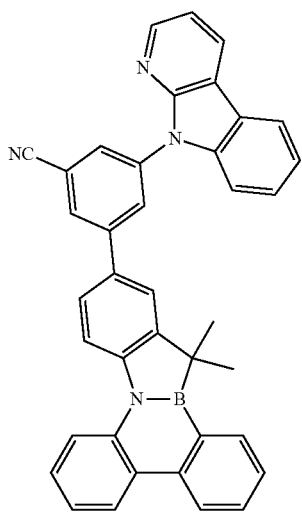
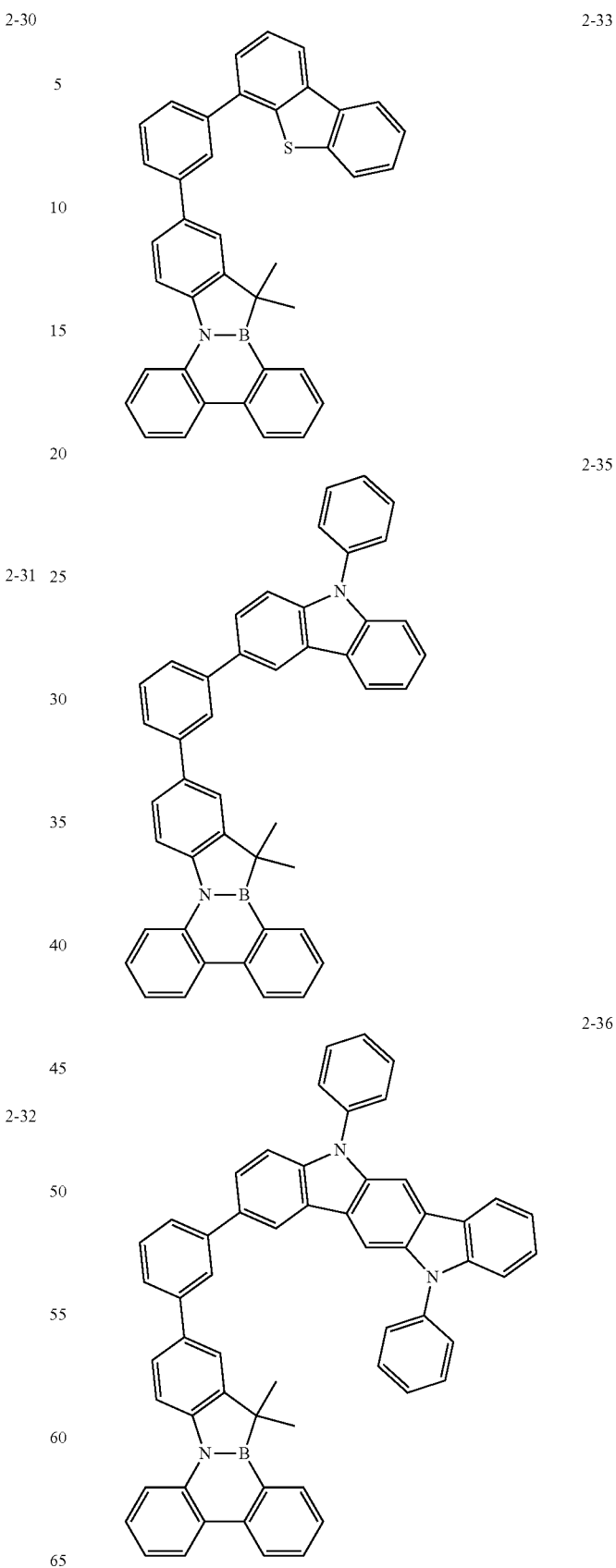

2-37
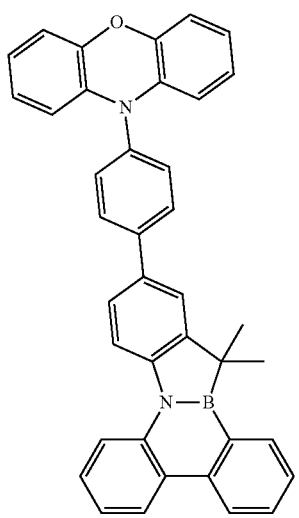
2-38
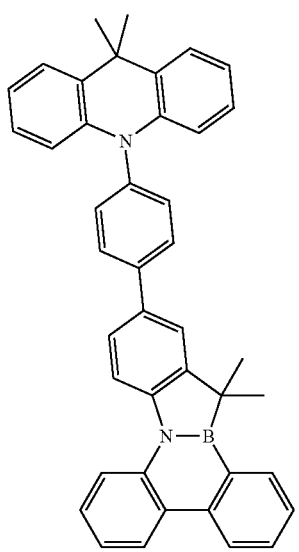
2-39
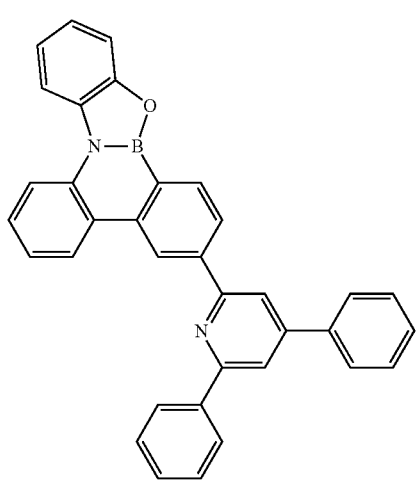
2-40
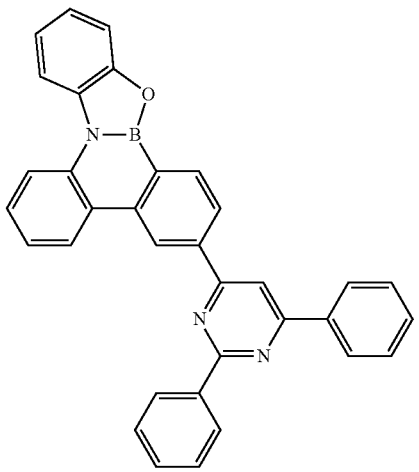
2-41
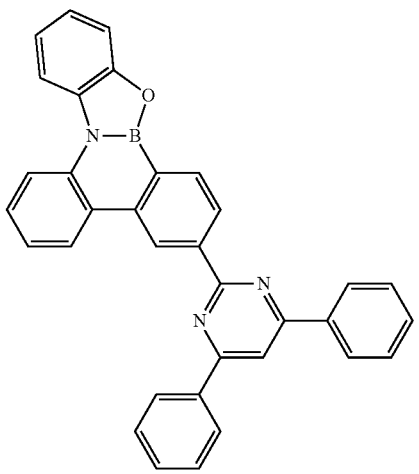
2-42
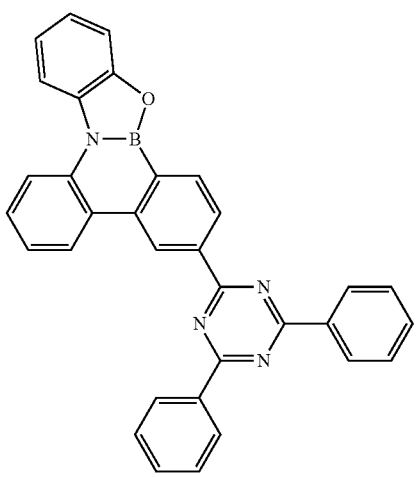

-continued
2-43
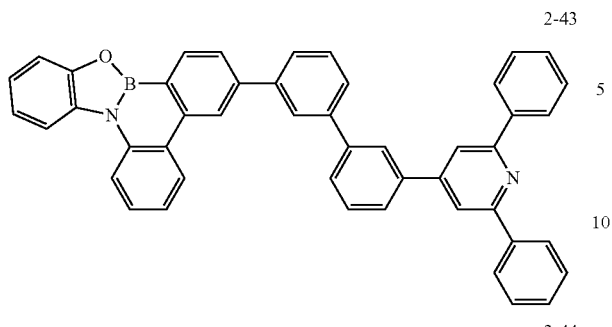
2-44
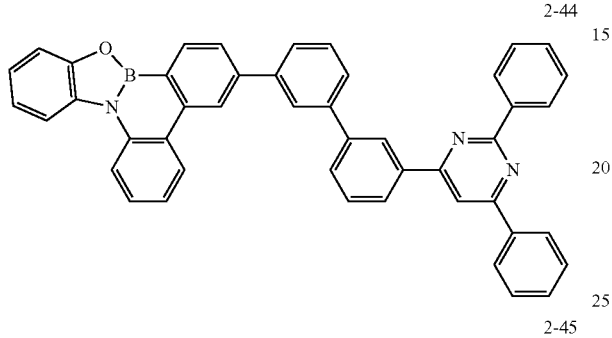
2-45
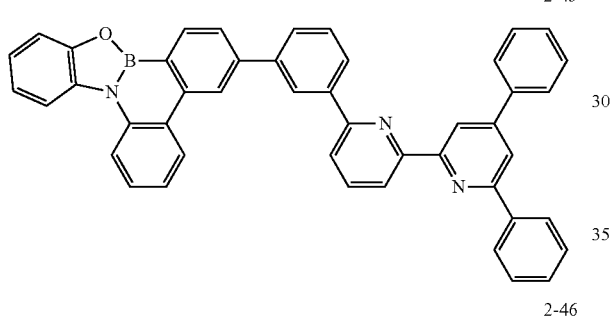
2-46
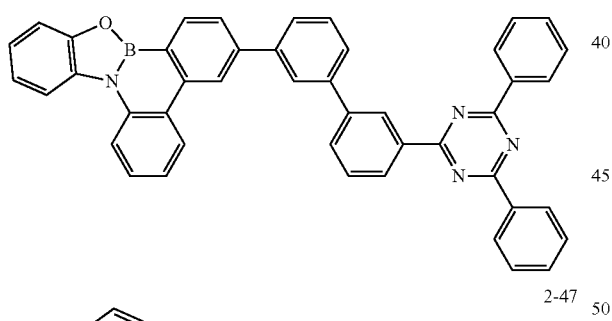
2-47
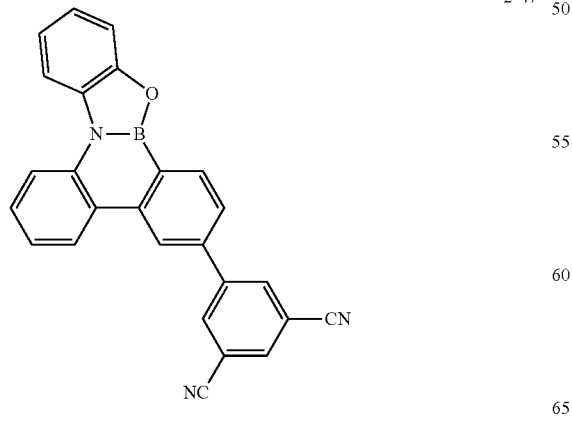
-continued
2-48
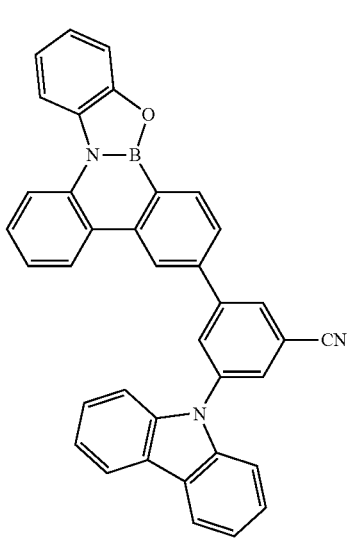
2-49
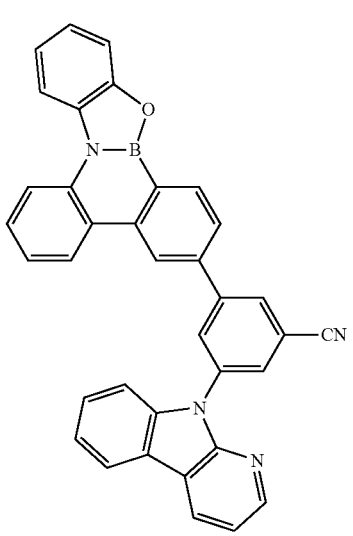
2-50

-continued
2-51
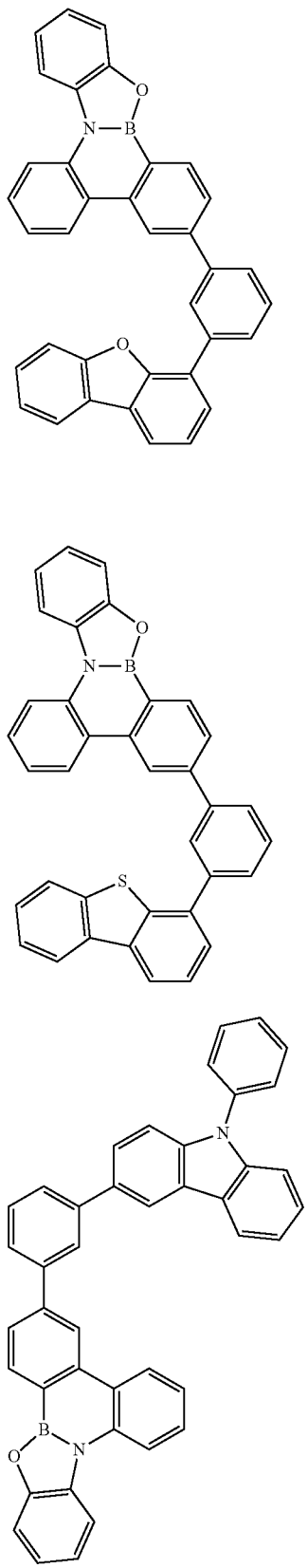
2-52
2-54
2-55
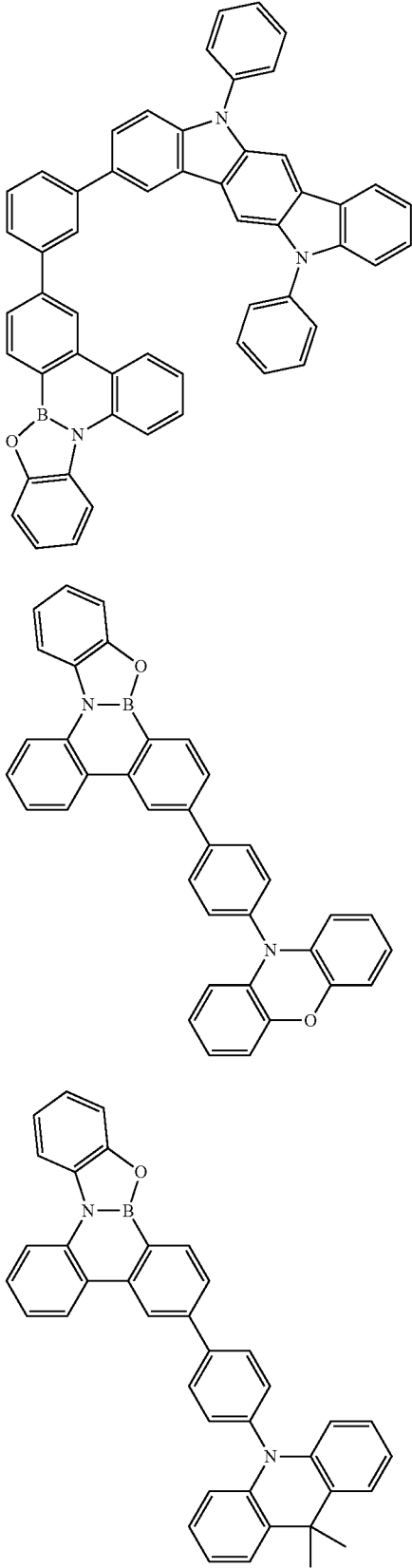
2-56
2-57

2-58
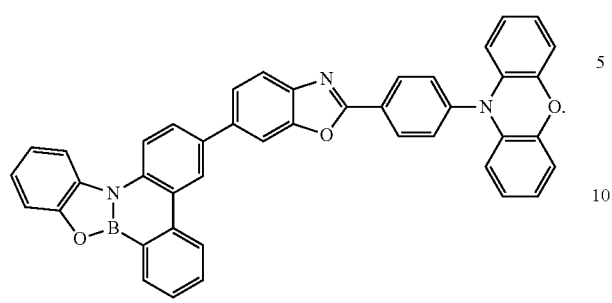
* * * * *